(12) United States Patent
Baek et al.

(10) Patent No.: US 10,911,277 B2
(45) Date of Patent: *Feb. 2, 2021

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Jongseob Baek, Seoul (KR); Jongwoong Shin, Seoul (KR); Jaehyung Kim, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/847,143

(22) Filed: Apr. 13, 2020

(65) Prior Publication Data
US 2020/0244496 A1 Jul. 30, 2020

Related U.S. Application Data

(63) Continuation of application No. 16/421,961, filed on Jun. 3, 2019, now Pat. No. 10,623,221, which is a
(Continued)

(51) Int. Cl.
*H04L 27/26* (2006.01)
*H04L 1/00* (2006.01)
(Continued)

(52) U.S. Cl.
CPC ........ *H04L 27/2602* (2013.01); *H03M 13/27* (2013.01); *H03M 13/2742* (2013.01);
(Continued)

(58) Field of Classification Search
CPC ............. H04L 27/2602; H04L 27/2627; H04L 1/0071; H04L 27/2626; H04L 27/2634;
(Continued)

(56) References Cited

U.S. PATENT DOCUMENTS 6,622,281 B1 9/2003 Yun et al.
7,991,062 B2 8/2011 Cho
(Continued)

FOREIGN PATENT DOCUMENTS

CN 101425996 A 5/2009
CN 101582739 A 11/2009
(Continued)

OTHER PUBLICATIONS

Digital Video Broadcasting (DVB); Frame structure channel coding and modulation for a second generation digital terrestrial television broadcasting system (DVB-T2), Draft ETSI EN 302 755 v1.3.2a (Sep. 2013), 188 pages,XP017842202.
(Continued)

*Primary Examiner* — Hirdepal Singh
(74) *Attorney, Agent, or Firm* — Dentons US LLP

(57) ABSTRACT

A method and an apparatus for transmitting broadcast signals thereof are disclosed. The apparatus for transmitting broadcast signals comprises an encoder for encoding service data, a mapper for mapping the encoded service data into a plurality of OFDM (Orthogonal Frequency Division Multiplex) symbols to build at least one signal frame, a frequency interleaver for frequency interleaving data in the at least one signal frame by using a different interleaving-seed which is used for every OFDM symbol pair comprised of two
(Continued)

sequential OFDM symbols, a modulator for modulating the frequency interleaved data by an OFDM scheme and a transmitter for transmitting the broadcast signals having the modulated data, wherein the different interleaving-seed is generated based on a cyclic shifting value and wherein an interleaving seed is variable based on an FFT size of the modulating.

12 Claims, 102 Drawing Sheets

Related U.S. Application Data continuation of application No. 16/125,440, filed on Sep. 7, 2018, now Pat. No. 10,367,668, which is a continuation of application No. 15/654,329, filed on Jul. 19, 2017, now Pat. No. 10,097,392, which is a continuation of application No. 14/969,749, filed on Dec. 15, 2015, now Pat. No. 9,755,873, which is a continuation of application No. 14/538,123, filed on Nov. 11, 2014, now Pat. No. 9,246,635.

(60) Provisional application No. 61/902,302, filed on Nov. 11, 2013, provisional application No. 61/902,303, filed on Nov. 11, 2013, provisional application No. 61/902,304, filed on Nov. 11, 2013, provisional application No. 61/902,300, filed on Nov. 11, 2013.

(51) Int. Cl.

| | |
|---|---|
| *H04L 5/00* | (2006.01) |
| *H03M 13/27* | (2006.01) |
| *H03M 13/09* | (2006.01) |
| *H03M 13/11* | (2006.01) |
| *H03M 13/15* | (2006.01) |
| *H03M 13/25* | (2006.01) |
| *H03M 13/29* | (2006.01) |

(52) U.S. Cl.
CPC .......... *H04L 1/0071* (2013.01); *H04L 1/0083* (2013.01); *H04L 5/0053* (2013.01); *H04L 27/2605* (2013.01); *H04L 27/265* (2013.01); *H04L 27/2626* (2013.01); *H04L 27/2627* (2013.01); *H04L 27/2634* (2013.01); *H03M 13/09* (2013.01); *H03M 13/1102* (2013.01); *H03M 13/152* (2013.01); *H03M 13/255* (2013.01); *H03M 13/271* (2013.01); *H03M 13/2778* (2013.01); *H03M 13/2906* (2013.01); *H04L 1/0041* (2013.01); *H04L 1/0045* (2013.01); *H04L 2001/0093* (2013.01)

(58) Field of Classification Search
CPC . H04L 5/0053; H04L 27/2605; H04L 1/0083; H04L 27/265; H04L 1/0041; H04L 1/0045; H04L 2001/0093; H03M 13/2742; H03M 13/27; H03M 13/271; H03M 13/255; H03M 13/2906; H03M 13/09; H03M 13/1102; H03M 13/152; H03M 13/2778
USPC ........................................................ 375/260
See application file for complete search history.

(56) References Cited

U.S. PATENT DOCUMENTS

| | | | |
|---|---|---|---|
| 8,175,142 B2 | 5/2012 | Atungsiri et al. | |
| 8,274,885 B2 | 9/2012 | Wu | |
| 8,472,540 B2 | 6/2013 | Gamage | |
| 8,605,802 B2 | 12/2013 | Lee et al. | |
| 9,225,416 B2 | 12/2015 | Gorokhov | |
| 9,595,978 B2 | 3/2017 | Myung et al. | |
| 9,654,323 B2 | 5/2017 | Agee et al. | |
| 9,762,347 B2 | 9/2017 | Shelby et al. | |
| 2004/0151109 A1 | 8/2004 | Batra et al. | |
| 2005/0058217 A1 | 3/2005 | Sandhu et al. | |
| 2006/0164973 A1* | 7/2006 | Lee | H04L 27/2608 370/208 |
| 2007/0053449 A1* | 3/2007 | Adachi | H04L 1/0083 375/260 |
| 2007/0280098 A1 | 12/2007 | Bhatt | H04L 27/2656 370/208 |
| 2008/0225965 A1 | 9/2008 | Pi et al. | |
| 2008/0232343 A1 | 9/2008 | Nguyen | H04L 27/2657 370/347 |
| 2008/0304590 A1 | 12/2008 | Sundberg | |
| 2009/0003462 A1 | 1/2009 | Chen | |
| 2009/0086713 A1 | 4/2009 | Luo | |
| 2009/0125780 A1 | 5/2009 | Taylor | |
| 2015/0263765 A1 | 5/2009 | Zhang | |
| 2009/0259913 A1 | 10/2009 | Myung et al. | |
| 2009/0296838 A1 | 12/2009 | Atungsiri et al. | |
| 2009/0296840 A1 | 12/2009 | Atungsiri | |
| 2010/0054223 A1 | 3/2010 | Zhang | |
| 2010/0110874 A1 | 5/2010 | Kang et al. | |
| 2010/0180173 A1 | 7/2010 | Batra | |
| 2011/0028103 A1* | 2/2011 | Rofougaran | H01Q 1/2291 455/77 |
| 2011/0051825 A1 | 3/2011 | Tao et al. | |
| 2011/0103516 A1 | 5/2011 | Bao | |
| 2011/0280332 A1* | 11/2011 | Yonge, III | H04L 12/413 375/288 |
| 2012/0051400 A1 | 3/2012 | Shin | |
| 2012/0155648 A1 | 6/2012 | Tupala | |
| 2012/0189079 A1 | 7/2012 | Taylor et al. | |
| 2012/0250777 A1 | 10/2012 | Peron | |
| 2012/0320994 A1 | 12/2012 | Loghin | |
| 2014/0294130 A1 | 10/2014 | Umeda | H04L 25/022 375/349 |
| 2014/0307612 A1* | 10/2014 | Vermani | H04L 27/2613 370/312 |
| 2014/0314177 A1 | 10/2014 | Choi | |
| 2015/0036759 A1* | 2/2015 | Piesinger | H04L 1/0008 375/261 |
| 2015/0092882 A1 | 4/2015 | Lee | H04L 27/2602 375/295 |
| 2016/0028505 A1 | 1/2016 | Pi | |
| 2016/0094895 A1 | 3/2016 | Stadelmeier | H04H 20/59 725/33 |
| 2016/0218905 A1 | 7/2016 | Roh et al. | |
| 2017/0013582 A1 | 1/2017 | Takekawa et al. | |
| 2017/0324600 A1 | 11/2017 | Atungsiri | H04L 27/2607 |

FOREIGN PATENT DOCUMENTS

| | | |
|---|---|---|
| CN | 101594332 A | 12/2009 |
| EP | 2129065 A2 | 12/2009 |
| EP | 3136670 A1 | 3/2017 |
| GB | 2462749 A | 2/2010 |
| JP | 2009112009 A | 5/2009 |
| JP | 2011199859 A | 10/2011 |
| JP | 2016553197 A | 12/2016 |
| KR | 1020130122756 A | 11/2013 |
| WO | 2015023149 A1 | 2/2015 |
| WO | 2015023150 A1 | 2/2015 |
| WO | 2015069092 A1 | 5/2015 |
| WO | 2015072791 A1 | 5/2015 |

OTHER PUBLICATIONS

Digital Video Broadcasting (DVB); Frame structure channel coding and modulation for a second generation digital terrestrial television broadcasting system (DVB-T2), Final draft ETSI EN 302 755 v1.3.1 (Nov. 2011), 89 pages.

(56) References Cited

OTHER PUBLICATIONS

Digital Video Broadcasting (DVB); Next Generation broadcasting system to Handheld, physical layer specification (DVB-NGH)', DVB Document A160, Nov. 2012, 295 pages.

* cited by examiner

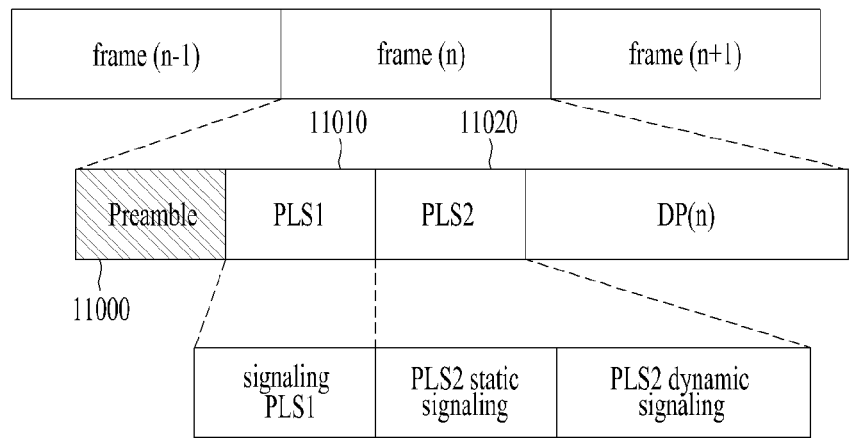

FIG. 13

| Content | Bits |
|---|---|
| PREAMBLE_DATA | 20 |
| NUM_FRAME_FRU | 2 |
| PAYLOAD_TYPE | 3 |
| NUM_FSS | 2 |
| SYSTEM_VERSION | 8 |
| CELL_ID | 16 |
| NETWORK_ID | 16 |
| SYSTEM_ID | 16 |
| for i = 0:3 | |
|     FRU_PHY_PROFILE | 3 |
|     FRU_FRAME_LENGTH | 2 |
|     FRU_GI_FRACTION | 3 |
|     RESERVED | 4 |
| end | |
| PLS2_FEC_TYPE | 2 |
| PLS2_MOD | 3 |
| PLS2_SIZE_CELL | 15 |
| PLS2_STAT_SIZE_BIT | 14 |
| PLS2_SYN_SIZE_BIT | 14 |
| PLS2_REP_FLAG | 1 |
| PLS2_REP_SIZE_CELL | 15 |
| PLS2_NEXT_FEC_TYPE | 2 |
| PLS2_NEXT_MOD | 3 |
| PLS2_NEXT_REP_FLAG | 1 |
| PLS2_NEXT_REP_SIZE_CELL | 15 |
| PLS2_NEXT_REP_STAT_SIZE_BIT | 14 |
| PLS2_NEXT_REP_DYN_SIZE_BIT | 14 |
| PLS2_AP_MODE | 2 |
| PLS2_AP_SIZE_CELL | 15 |
| PLS2_NEXT_AP_MODE | 2 |
| PLS2_NEXT_AP_SIZE_CELL | 15 |
| RESERVED | 32 |
| CRC 32 | 32 |

FIG. 14

| Content | Bits |
|---|---|
| FIC_FLAG | 1 |
| AUX_FLAG | 1 |
| NUM_DP | 6 |
| for i = 1 : NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
| | |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for - 1 : NUM_AUX | |
|         AUX_STREAM_TYPE | 4 |
|         AUX_PRIVATE_CONF | 28 |
|     end | |
| end | |

| Content | | | Bit |
|---|---|---|---|
| FRAME_INDEX | | | 5 |
| PLS_CHANGE_COUNTER | | | 4 |
| FIC_CHANGE_COUNTER | | | 4 |
| RESERVED | | | 16 |
| for i = 1: NUM_DP | | | |
| | | DP_ID | 6 |
| | | DP_START | 15 (or 13) |
| | | DP_NUM_BLOCK | 10 |
| end | | RESERVED | 8 |
| EAC_FLAG | | | 1 |
| EAS_WAKE_UP_VERSION_NUM | | | 8 |
| if EAC_FLAG == 1 | | | |
| | | EAC_LENGTH_BYTE | 12 |
| else | | | |
| | | EAC_COUNTER | 12 |
| end | | | |
| for i=1:NUM_AUX | | | |
| | | AUX_PRIVATE_DYN | 48 |
| end | | | |
| CRC 32 | | | 32 |

FIG. 29
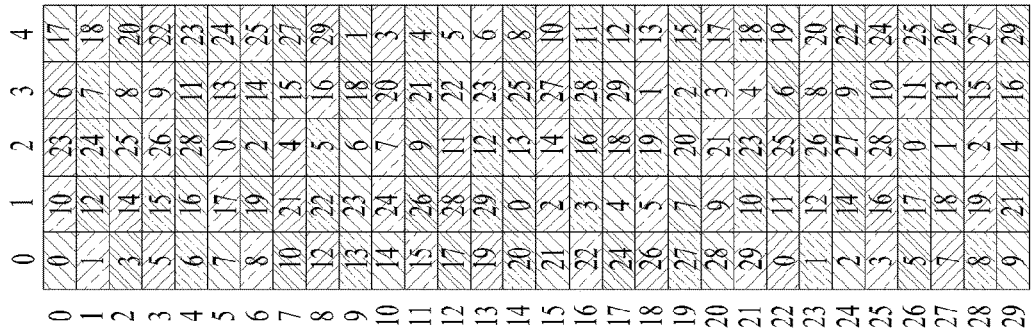
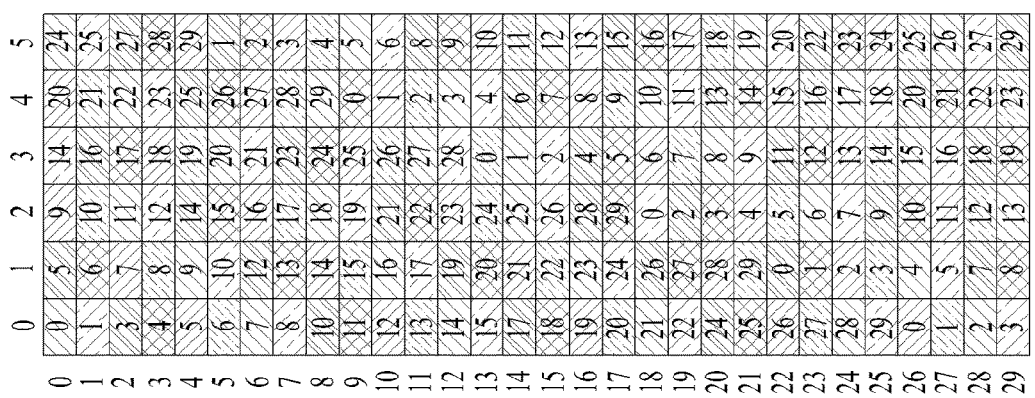
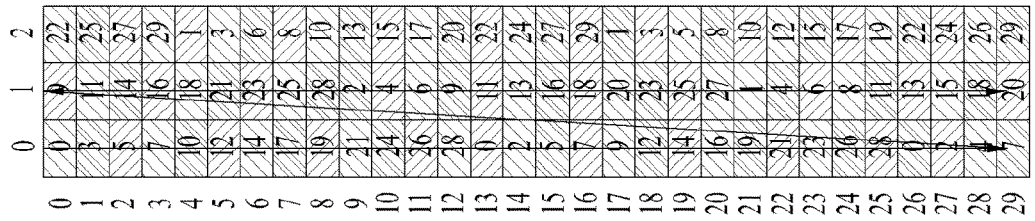

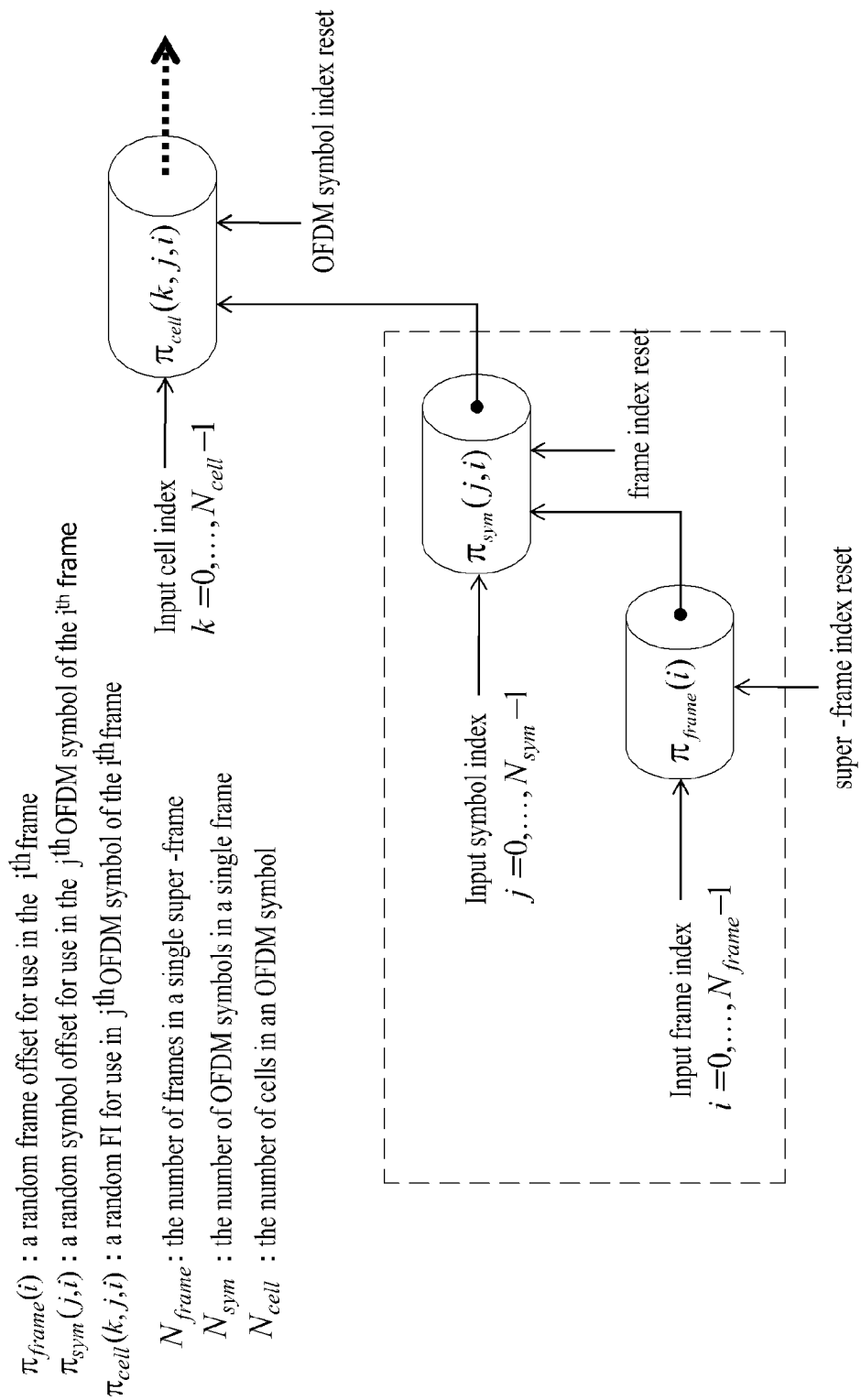

FIG. 34

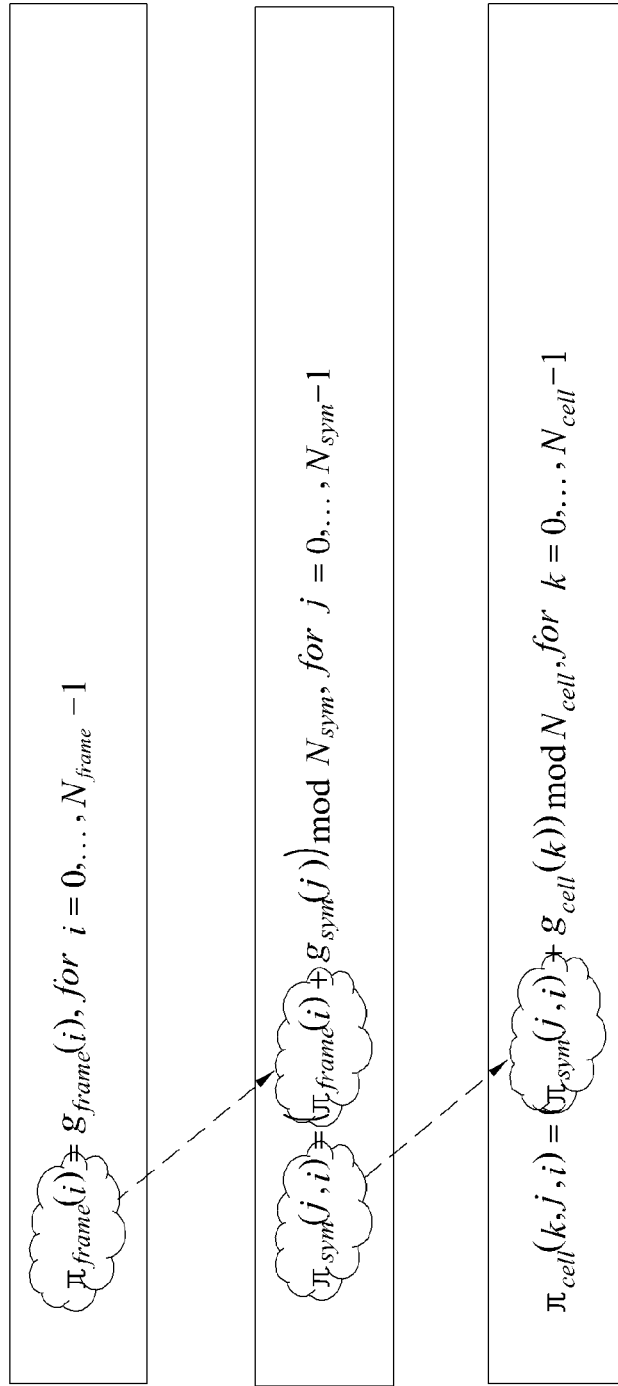

$\pi_{frame}(i) = g_{frame}(i), \text{ for } i = 0,\ldots,N_{frame} - 1$ $\pi_{sym}(j,i) = (\pi_{frame}(i) + g_{sym}(j)) \bmod N_{sym}, \text{ for } j = 0,\ldots,N_{sym}-1$ $\pi_{cell}(k,j,i) = (\pi_{sym}(j,i) + g_{cell}(k)) \bmod N_{cell}, \text{ for } k = 0,\ldots,N_{cell}-1$ $g_{frame}$ : a random frame offset generator for used in frame interleaver
$g_{sym}$ : a random symbol offset generator for used in symbol interleaver
$g_{cell}$ : a random generator for used in cell interleaver

- The associated 11th primitive polynomial, $f(x)=1+x^9+x^{11}$
- Operation of the PN generator for $0 \leq l < N_{max}(4096)$ $0 \leq l < 2$
$$R^l_{[10,9,8,7,6,5,4,3,2,1,0]} = 0,0,0,0,0,0,0,0,0,0,0$$
$l = 2$
$$R^2_{[10,9,8,7,6,5,4,3,2,1,0]} = 0,0,0,0,0,0,0,0,1,0,1$$
$2 < l < N_{max}$
$$R^l_{[9,8,7,6,5,4,3,2,1,0]} = R^{l-1}_{[10,9,8,7,6,5,4,3,2,1]}$$
$$R^l_{10} = R^{l-1}_0 \oplus R^{l-1}_2$$

```
k = 0;
for (l = 0; l < N_max; l = l + 1)
{
    H(l) = P_data(l) + Σ_{n=0}^{10} (2^n × R^l_n);
    if H(l) < N_data
    {
        T(k) = H(l);
        C_j(k) = (T(k) + S_{⌊j/2⌋}) mod N_data;
        k = k + 1;
    }
}
```

FIG. 45
The associated 12 th primitive polynomial, $f(x)=1+x^6+x^8+x^{11}+x^{12}$
Operation of the PN generator for $0 \leq n < \lceil N_{sym}/2 \rceil$
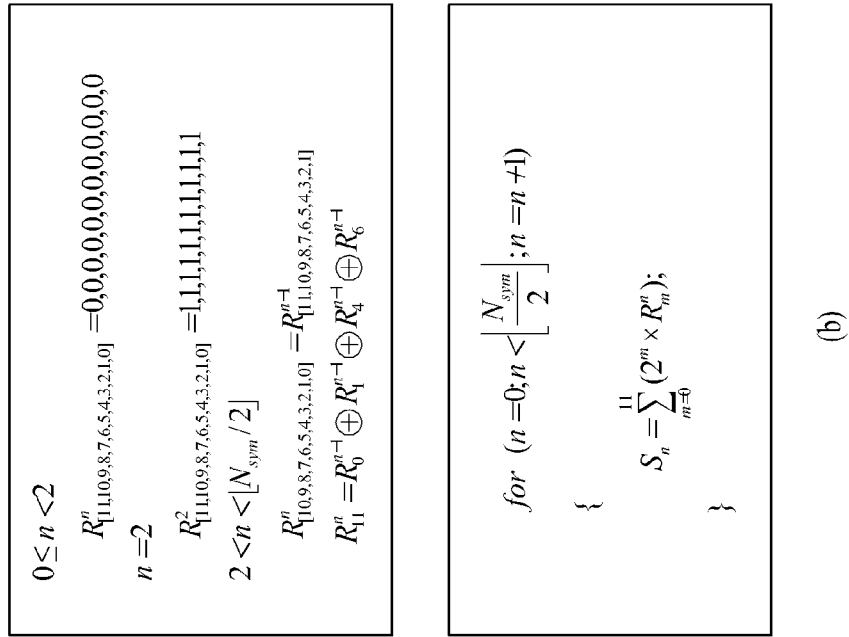
$0 \leq n < 2$
$R^n_{[11,10,9,8,7,6,5,4,3,2,1,0]} = 0,0,0,0,0,0,0,0,0,0,0,0$
$n=2$
$R^2_{[11,10,9,8,7,6,5,4,3,2,1,0]} = 1,1,1,1,1,1,1,1,1,1,1,1$
$2 < n < \lceil N_{sym}/2 \rceil$
$R^n_{[10,9,8,7,6,5,4,3,2,1,0]} = R^{n-1}_{[11,10,9,8,7,6,5,4,3,2,1]}$
$R^n_{11} = R^{n-1}_0 \oplus R^{n-1}_1 \oplus R^{n-1}_4 \oplus R^{n-1}_6$
for $(n=0; n < \lceil \frac{N_{sym}}{2} \rceil; n = n+1)$
{
$S_n = \sum_{m=0}^{11}(2^m \times R^n_m);$
}
(b)
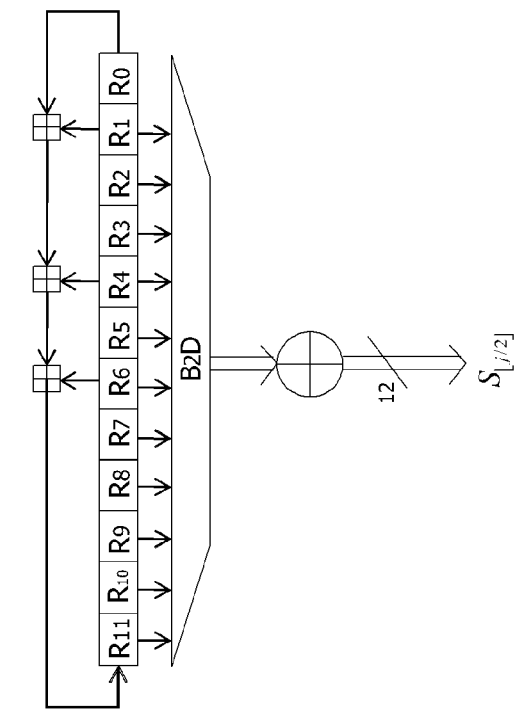
(a)

(a)

(b)

The associated 9th primitive polynomial, $f(x) = 1 + x^5 + x^9$
Operation of the PN generator for $0 \leq l < N_{max}$ $0 \leq l < 8$
$R^l_{[8,7,6,5,4,3,2,1,0]} = 0,0,0,0,0,0,0,0,0$
$l = 8$
$R^8_{[8,7,6,5,4,3,2,1,0]} = 0,0,0,0,0,0,0,0,1$
$8 < l < N_{max}$
$R^{l-1}_{[7,6,5,4,3,2,1,0]} = R^{l-1}_{[8,7,6,5,4,3,2,1]}$
$R^l_8 = R^{l-1}_0 \oplus R^{l-1}_5$ $k = 0; \ \bar{R}^l_n \leftarrow R^l_n \ (bit \ shuffling)$
$for \ (l = 0; l < N_{max}; l = l+1)$
{
$H(l) = P_{data}(l) + \sum_{n=0}^{9}(2^n \times \bar{R}^l_n);$
$if \ H(l) < N_{data}$
{
$T(k) = H(l);$
$C_j(k) = (T(k) + S_{[j/2]}) \bmod N_{data};$
$k = k+1;$
}
}

The associated 12th primitive polynomial, $f(x)=1+x^6+x^8+x^{11}+x^{12}$
Operation of the PN generator for $0 \leq l < N_{max}(8192)$ $0 \leq l < 2$ $R^l_{[11,10,9,8,7,6,5,4,3,2,1,0]} = 0,0,0,0,0,0,0,0,0,0,0,0$ $l = 2$ $R^2_{[11,10,9,8,7,6,5,4,3,2,1,0]} = 0,0,0,0,0,1,0,1,0,0,1,1$ $2 < l < N_{max}$ $R^l_{[10,9,8,7,6,5,4,3,2,1,0]} = R^{l-1}_{[11,10,9,8,7,6,5,4,3,2,1]}$ $R^l_{11} = R^{l-1}_0 \oplus R^{l-1}_1 \oplus R^{l-1}_4 \oplus R^{l-1}_6$

---

$k = 0;$ for $(l = 0; l < N_{max}; l = l + 1)$

{

$\quad H(l) = P_{data}(l) + \sum_{n=0}^{11} (2^n \times R^l_n);$ $\quad$ if $H(l) < N_{data}$ $\quad\quad$ {

$\quad\quad\quad T(k) = H(l);$ $\quad\quad\quad C_j(k) = (T(k) + S_{\lfloor j/2 \rfloor}) \bmod N_{data};$ $\quad\quad\quad k = k + 1;$ $\quad\quad$ }

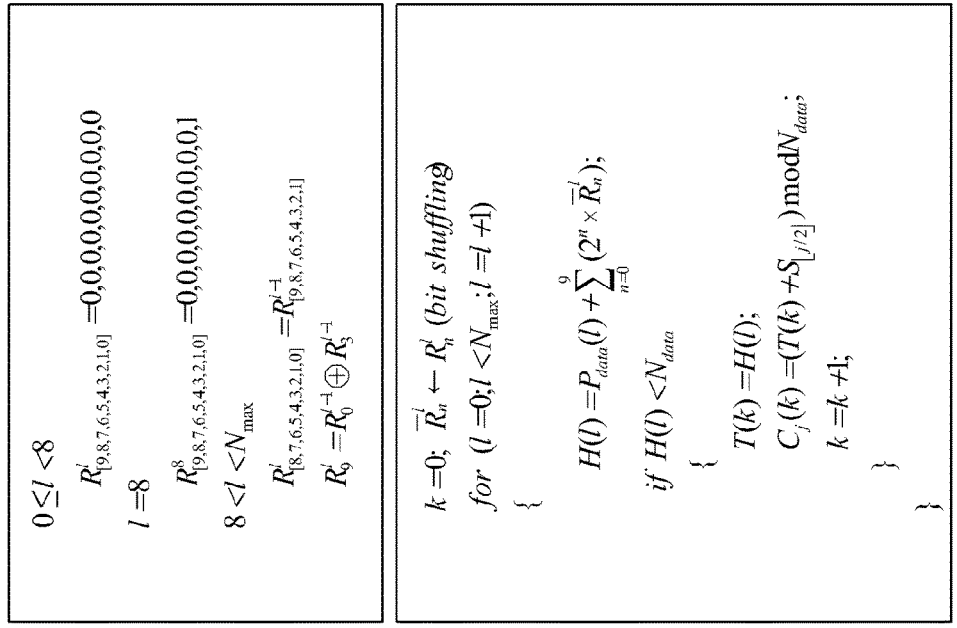

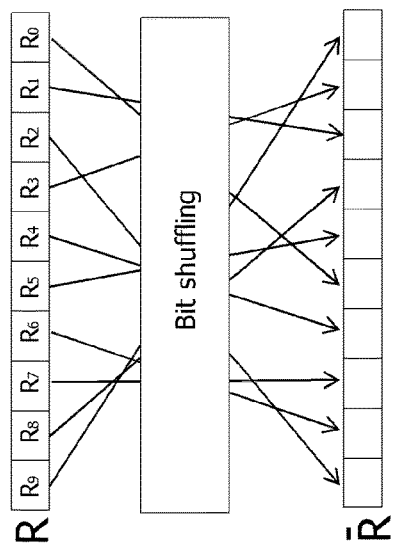

(a)

The associated 10th primitive polynomial,
$f(x) = 1 + x^7 + x^{10}$
Operation of the PN generator for $0 \leq l < N_{max}$ $0 \leq l < 8$
$R^l_{[9,8,7,6,5,4,3,2,1,0]} = 0,0,0,0,0,0,0,0,0,0$
$l = 8$
$R^8_{[9,8,7,6,5,4,3,2,1,0]} = 0,0,0,0,0,0,0,0,0,1$
$8 < l < N_{max}$
$R^l_{[8,7,6,5,4,3,2,1,0]} = R^{l-1}_{[9,8,7,6,5,4,3,2,1]}$
$R^l_9 = R^{l-1}_0 \oplus R^{l-1}_3$ $k = 0; \bar{R}^l_n \leftarrow R^l_n \text{ (bit shuffling)}$
for $(l = 0; l < N_{max}; l = l+1)$
{
$\quad H(l) = P_{data}(l) + \sum_{n=0}^{9}(2^n \times \bar{R}^l_n);$
$\quad \text{if } H(l) < N_{data}$
$\quad \{$
$\quad\quad T(k) = H(l);$
$\quad\quad C_j(k) = (T(k) + S_{\lfloor j/2 \rfloor}) \bmod N_{data};$
$\quad\quad k = k+1;$
$\quad \}$
}

The associated 13th primitive polynomial, $f(x)=1+x^2+x^4+x^8+x^9-x^{12}+x^{13}$
Operation of the PN generator for $0 \leq l < N_{max} (16384)$ $0 \leq l < 2$ $\quad R^l_{[12,11,10,9,8,7,6,5,4,3,2,1,0]} = 0,0,0,0,0,0,0,0,0,0,0,0,0$ $l = 2$ $\quad R^2_{[12,11,10,9,8,7,6,5,4,3,2,1,0]} = 0,1,0,1,0,0,0,1,1,0,0,1,1$ $2 < l < N_{max}$ $\quad R^l_{[11,10,9,8,7,6,5,4,3,2,1,0]} = R^{l-1}_{[12,11,10,9,8,7,6,5,4,3,2,1]}$ $\quad R^l_{12} = R^{l-1}_0 \oplus R^{l-1}_1 \oplus R^{l-1}_4 \oplus R^{l-1}_5 \oplus R^{l-1}_9 \oplus R^{l-1}_{11}$

---

$k = 0;$ for $(l = 0; l < N_{max}; l = l + 1)$ $\{$ $\quad H(l) = P_{data}(l) + \sum_{n=0}^{12} (2^n \times R^l_n);$ $\quad$ if $H(l) < N_{data}$ $\quad \{$ $\quad\quad T(k) = H(l);$ $\quad\quad C_j(k) = (T(k) + S_{\lfloor j/2 \rfloor}) \mod N_{data};$ $\quad\quad k = k + 1;$ $\quad \}$ $\}$ The associated 14th primitive polynomial,
$f(x)=1+x^2+x^{12}+x^{13}+x^{14}$
Operation of the PN generator for $0 \leq n < \lfloor N_{sym}/2 \rfloor$ $n=0$
$R^0_{[13,12,11,10,9,8,7,6,5,4,3,2,1,0]} = 0,0,0,0,0,0,0,0,0,0,0,0,0,0$ $n=1$
$R^1_{[13,12,11,10,9,8,7,6,5,4,3,2,1,0]} = 1,1,1,1,1,1,1,1,1,1,1,1,1,1$ $1 < n < \lfloor N_{sym}/2 \rfloor$
$R^n_{[12,11,10,9,8,7,6,5,4,3,2,1,0]} = R^{n-1}_{[13,12,11,10,9,8,7,6,5,4,3,2,1,0]}$
$R^n_{13} = R^{n-1}_0 \oplus R^{n-1}_1 \oplus R^{n-1}_2 \oplus R^{n-1}_{12}$ for $(n=0; n < \lfloor \frac{N_{sym}}{2} \rfloor ; n=n+1)$
{
$\quad S_n = \sum_{m=0}^{13} (2^m \times R^n_m);$
}

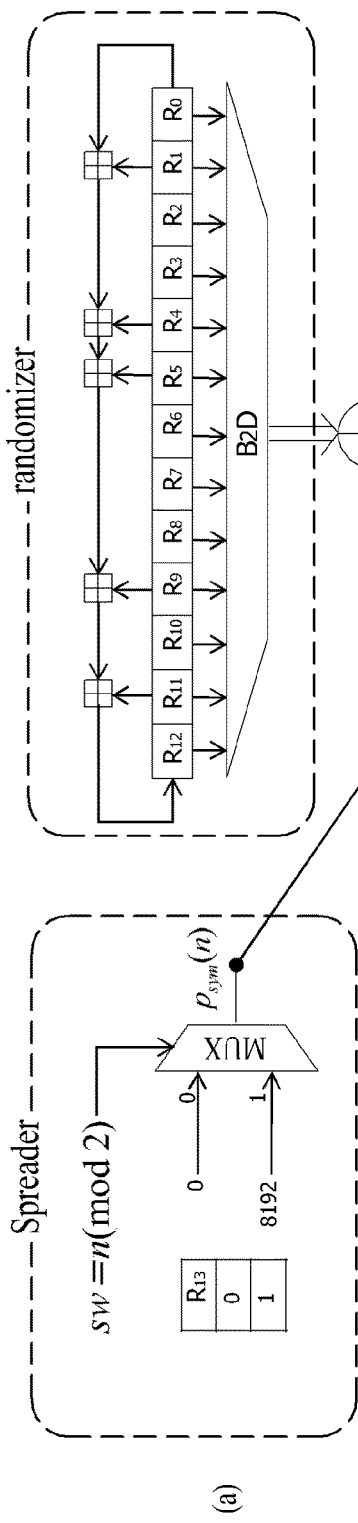

(a)

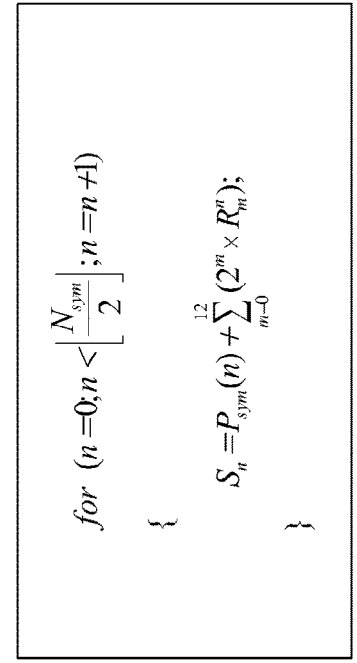

$$\text{for } (n=0; n < \lfloor \frac{N_{sym}}{2} \rfloor; n = n+1)$$
$$\{$$
$$S_n = P_{sym}(n) + \sum_{m=0}^{12} (2^m \times R_m^n);$$
$$\}$$

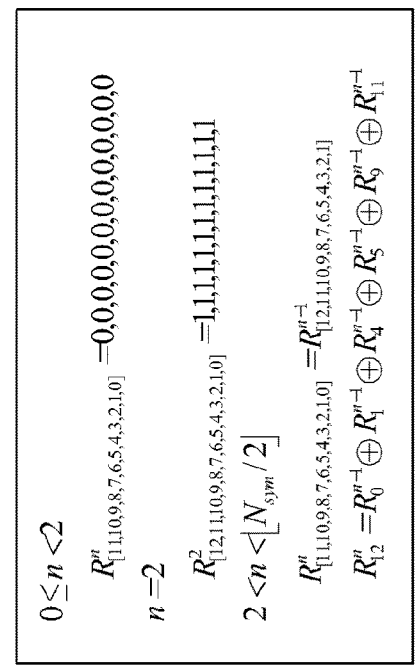

$0 \leq n < 2$
$R_{[11,10,9,8,7,6,5,4,3,2,1,0]}^n = 0,0,0,0,0,0,0,0,0,0,0,0$
$n=2$
$R_{[12,11,10,9,8,7,6,5,4,3,2,1,0]}^2 = 1,1,1,1,1,1,1,1,1,1,1,1,1$
$2 < n < \lfloor N_{sym}/2 \rfloor$
$R_{[11,10,9,8,7,6,5,4,3,2,1,0]}^n = R_{[12,11,10,9,8,7,6,5,4,3,2,1]}^{n-1}$
$R_{12}^n = R_0^{n-1} \oplus R_1^{n-1} \oplus R_4^{n-1} \oplus R_5^{n-1} \oplus R_9^{n-1} \oplus R_{11}^{n-1}$ The associated 13th primitive polynomial, $f(x)=1+x^2+x^4+x^8+x^9+x^{12}+x^{13}$
Operation of the PN generator for $0 \leq n < \lfloor N_{sym}/2 \rfloor$ (b)

FIG. 71

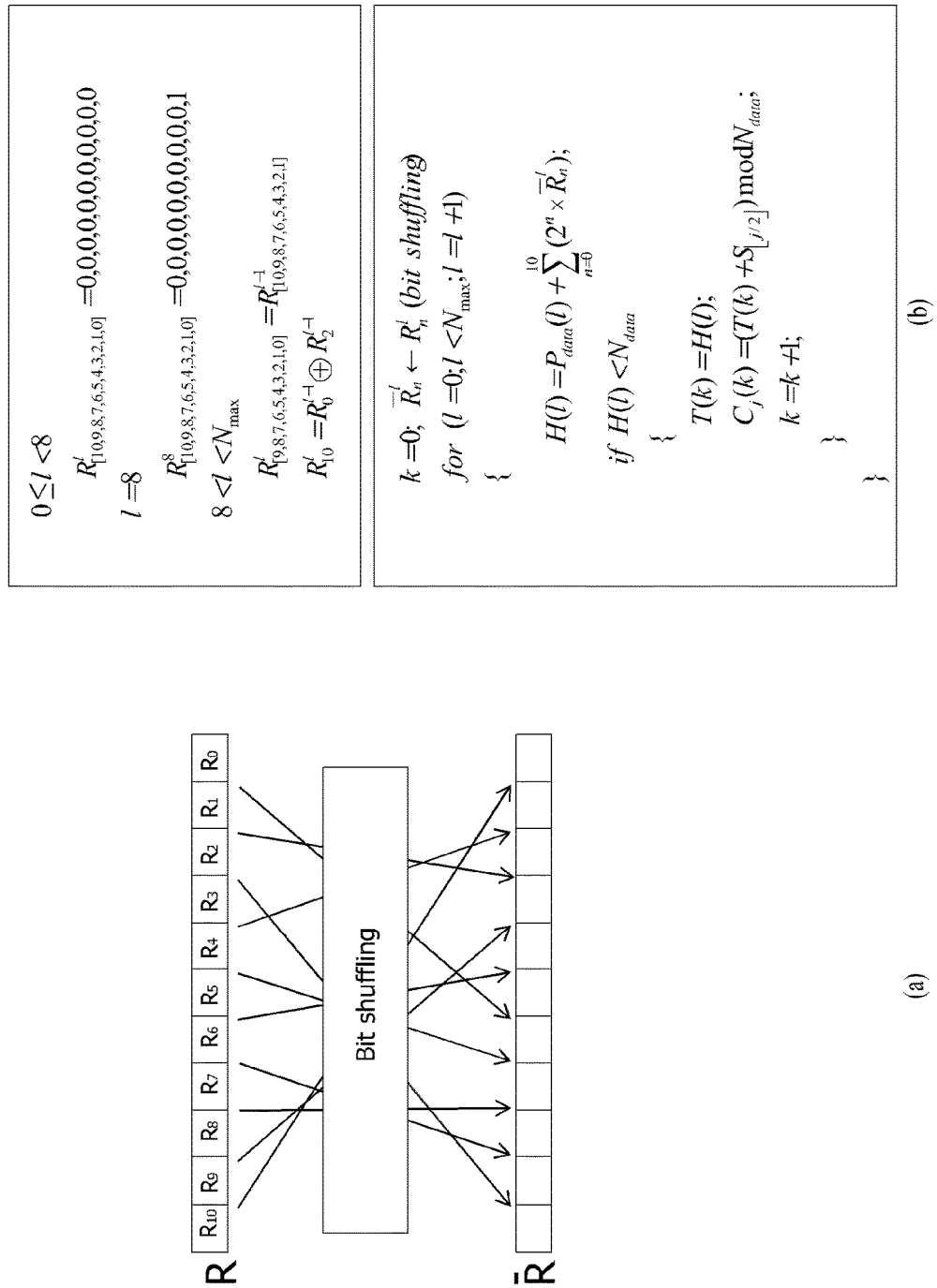

The associated 11th primitive polynomial,
$f(x) = 1 + x^9 + x^{11}$
Operation of the PN generator for $0 \leq l < N_{max}$ $0 \leq l < 8$
$R^l_{[10,9,8,7,6,5,4,3,2,1,0]} = 0,0,0,0,0,0,0,0,0,0,0$ $l = 8$
$R^8_{[10,9,8,7,6,5,4,3,2,1,0]} = 0,0,0,0,0,0,0,0,0,0,1$ $8 < l < N_{max}$
$R^l_{[9,8,7,6,5,4,3,2,1,0]} = R^{l-1}_{[10,9,8,7,6,5,4,3,2,1]}$
$R^l_{10} = R^{l-1}_0 \oplus R^{l-1}_2$ $k = 0; \ \overline{R}^l_n \leftarrow R^l_n \ (bit \ shuffling)$
for $(l = 0; l < N_{max}; l = l+1)$
{
$\quad H(l) = P_{data}(l) + \sum_{n=0}^{10} (2^n \times \overline{R}^l_n);$
$\quad if \ H(l) < N_{data}$
$\quad \{$
$\quad\quad T(k) = H(l);$
$\quad\quad C_j(k) = (T(k) + S_{[j/2]}) mod N_{data};$
$\quad\quad k = k+1;$
$\quad \}$
}

The associated 14$^{th}$ polynomial, $f(x)=1+x^2+x^{12}+x^{13}+x^{14}$
Operation of the PN generator for $0 \leq l < N_{max}(32768)$

---

$0 \leq l < 2$ $\quad R^l_{[13,12,11,10,9,8,7,6,5,4,3,2,1,0]} = 0,0,0,0,0,0,0,0,0,0,0,0,0,0$ $l = 2$ $\quad R^2_{[13,12,11,10,9,8,7,6,5,4,3,2,1,0]} = 0,0,1,0,0,0,0,0,0,0,0,1,1,1$ $2 < l < N_{max}$ $\quad R^l_{[11,10,9,8,7,6,5,4,3,2,1,0]} = R^{l-1}_{[13,12,11,10,9,8,7,6,5,4,3,2,1]}$ $\quad R^l_{13} = R^{l-1}_0 \oplus R^{l-1}_1 \oplus R^{l-1}_2 \oplus R^{l-1}_{12}$

---

$k = 0;$ for $(l=0; l<N_{max}; l=l+1)$ $\{$ $\quad H(l) = P_{data}(l) + \sum_{n=0}^{12} (2^n \times R^l_n);$ $\quad$ if $H(l) < N_{data}$ $\quad \quad \{$ $\quad \quad \quad T(k) = H(l);$ $\quad \quad \quad C_j(k) = (T(k) + S_{\lfloor j/2 \rfloor}) \bmod N_{data};$ $\quad \quad \quad k = k+1;$ $\quad \quad \}$ $\}$

FIG. 83

For the first OFDM symbol, i.e., $(j \bmod 2) = 0$ of the ith OFDM symbol pair for $j = 0, 1, \ldots, N_{sym}$ and for $k = 0, 1, \ldots, N_{max}$ $F_j(H_j(k)) = X_j(k)$ where $H_j(k) = (T(k) + S_{[j/2]}) \bmod N_{max}$ $T(k)$ is a random sequence generated by a random generator, used in the main FI $S_{[j/2]}$ is a random symbol offset generated by a random generator, used in the jth OFDM symbol pair For the second OFDM symbol, i.e., $(j \bmod 2) = 1$ of the ith OFDM symbol pair for $j = 0, 1, \ldots, N_{sym}$ and $k = 0, 1, \ldots, N_{max}$ $F_j(k) = X_j(H_j(k))$ where $C_j(k)$ is the same random seed used for the first symbol

FIG. 85

- The associated 11$^{th}$ primitive polynomial, $f(x)=1+x^9+x^{11}$
- Operation of the PN generator for $0 \leq l < N_{max}(4096)$ $0 \leq l < 2$ $\quad R^l_{[10,9,8,7,6,5,4,3,2,1,0]} = 0,0,0,0,0,0,0,0,0,0,0$ $l = 2$ $\quad R^2_{[10,9,8,7,6,5,4,3,2,1,0]} = 0,0,0,0,0,0,0,0,1,0,1$ $2 < l < N_{max}$ $\quad R^l_{[9,8,7,6,5,4,3,2,1,0]} = R^{l-1}_{[10,9,8,7,6,5,4,3,2,1]}$ $\quad R^l_{10} = R^{l-1}_0 \oplus R^{l-1}_2$

---

```
k = 0;
for (l = 0; l < N_max; l = l+1)
{
```
$\quad T(l) = P_{data}(l) + \sum_{n=0}^{10}(2^n \times R^l_n);$ $\quad C_j(l) = (T(l) + S_{\lfloor j/2 \rfloor}) \bmod N_{max};$ $\quad$ if $C_j(l) < N_{data}$
```
    {
```
$\quad\quad H_j(k) = C_j(l);$
$\quad\quad k = k+1;$
```
    }
}
```

FIG. 88
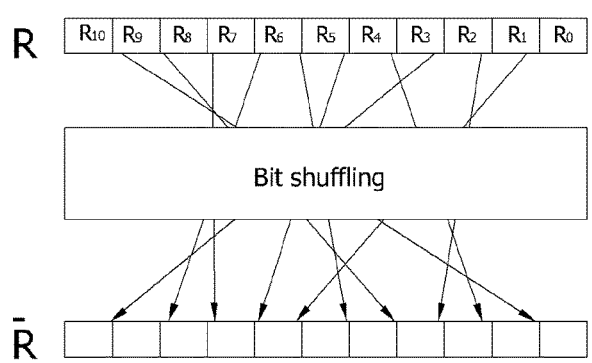
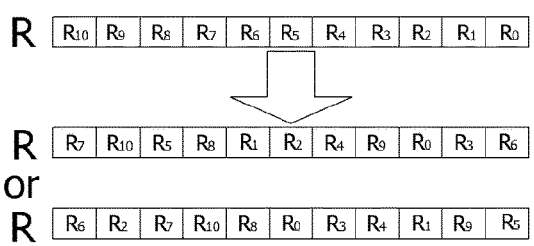
(a)
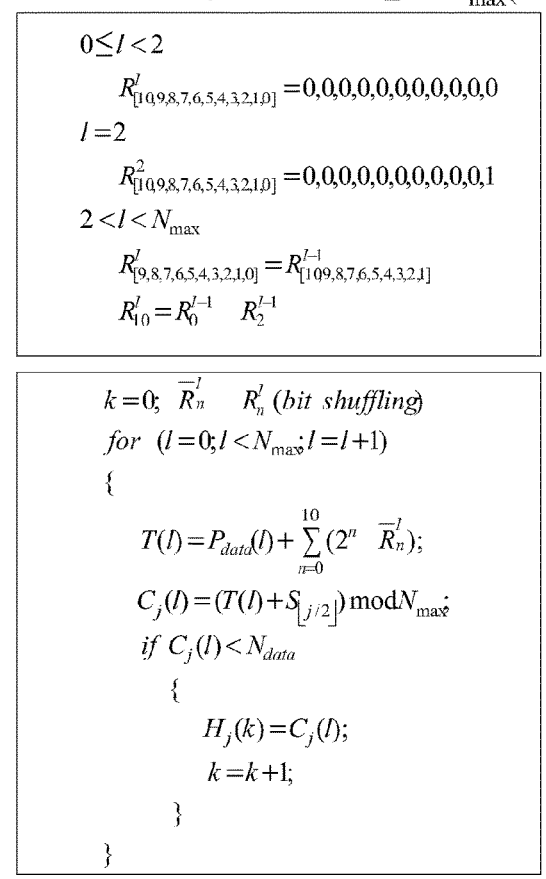
(b)

FIG. 90

The associated 12$^{th}$ primitive polynomial, $f(x)=1+x^6+x^8+x^{11}+x^{12}$
Operation of the PN generator for $0 \leq l < N_{max}(8192)$ $0 \leq l < 2$ $\quad R^l_{[11,10,9,8,7,6,5,4,3,2,1,0]} = 0,0,0,0,0,0,0,0,0,0,0,0$ $l = 2$ $\quad R^2_{[11,10,9,8,7,6,5,4,3,2,1,0]} = 0,0,0,0,0,1,0,1,0,0,1,1$ $2 < l < N_{max}$ $\quad R^l_{[10,9,8,7,6,5,4,3,2,1,0]} = R^{l-1}_{[11,10,9,8,7,6,5,4,3,2,1]}$ $\quad R^l_{11} = R^{l-1}_0 \oplus R^{l-1}_1 \oplus R^{l-1}_4 \oplus R^{l-1}_6$

---

$k = 0;$
for $(l=0; l<N_{max}; l=l+1)$
{

$\quad T(l) = P_{data}(l) + \sum\limits_{n=0}^{11}(2^n \times R^l_n);$ $\quad C_j(l) = (T(l) + S_{\lfloor j/2 \rfloor}) \bmod N_{max};$ $\quad$ if $C_j(l) < N_{data}$
$\quad$ {
$\quad\quad H_j(k) = C_j(l);$
$\quad\quad k = k+1;$
$\quad$ }
}

FIG. 95

The associated 13th primitive polynomial, $f(x)=1+x^2+x^4+x^8+x^9-x^{12}+x^{13}$
Operation of the PN generator for $0 \leq l < N_{max}(16384)$

---

$0 \leq l < 2$ $R^l_{[12,11,10,9,8,7,6,5,4,3,2,1,0]} = 0,0,0,0,0,0,0,0,0,0,0,0,0$ $l = 2$ $R^2_{[12,11,10,9,8,7,6,5,4,3,2,1,0]} = 0,1,0,1,0,0,0,1,1,0,0,1,1$ $2 < l < N_{max}$ $R^l_{[11,10,9,8,7,6,5,4,3,2,1,0]} = R^{l-1}_{[12,11,10,9,8,7,6,5,4,3,2,1]}$ $R^l_{12} = R^{l-1}_0 \oplus R^{l-1}_1 \oplus R^{l-1}_4 \oplus R^{l-1}_5 \oplus R^{l-1}_9 \oplus R^{l-1}_{11}$

---

$k = 0;$ for $(l=0; l<N_{max}; l=l+1)$

{

$T(l) = P_{data}(l) + \sum_{n=0}^{12}(2^n \times R^l_n);$ $C_j(l) = (T(l) + S_{\lfloor j/2 \rfloor}) \bmod N_{max};$ if $C_j(l) < N_{data}$

{

$H_j(k) = C_j(l);$ $k = k+1;$

}

}

FIG. 98
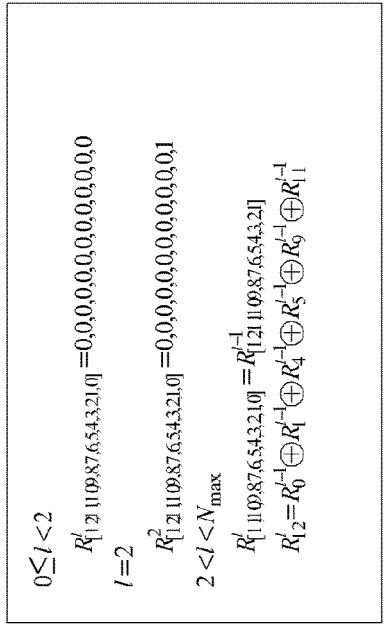
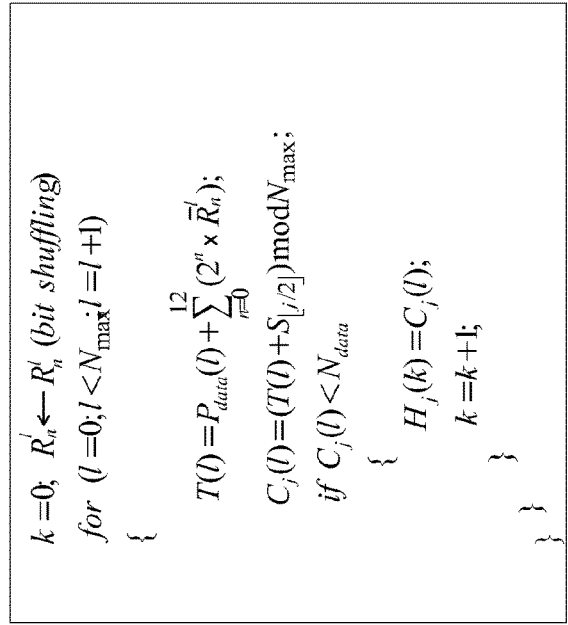
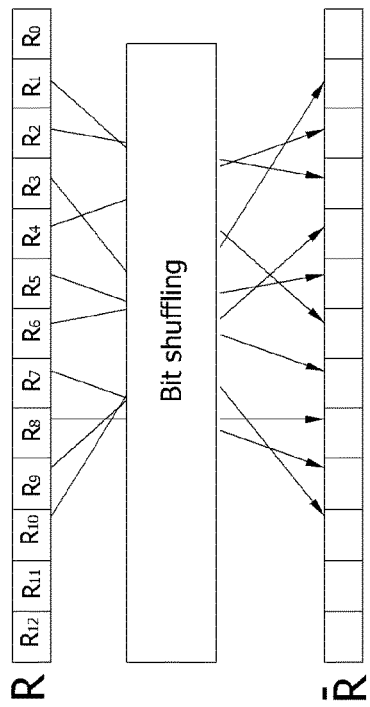

FIG. 100

The associated 14$^{th}$ polynomial, $f(x)=1+x^2+x^{12}+x^{13}+x^{14}$
Operation of the PN generator for $0 \leq l < N_{max}(32768)$

---

$0 \leq l < 2$ $\quad R^l_{[13,12,11,10,9,8,7,6,5,4,3,2,1,0]} = 0,0,0,0,0,0,0,0,0,0,0,0,0,0$ $l = 2$ $\quad R^2_{[13,12,11,10,9,8,7,6,5,4,3,2,1,0]} = 0,0,1,0,0,0,0,0,0,0,0,1,1,1$ $2 < l < N_{max}$ $\quad R^l_{[11,10,9,8,7,6,5,4,3,2,1,0]} = R^{l-1}_{[13,12,11,10,9,8,7,6,5,4,3,2,1]}$ $\quad R^l_{13} = R^{l-1}_0 \oplus R^{l-1}_1 \oplus R^{l-1}_2 \oplus R^{l-1}_{12}$

---

$k = 0;$ for $(l=0; l<N_{max}; l=l+1)$

{

$\quad T(l) = P_{data}(l) + \sum_{n=0}^{13}(2^n \times R^l_n);$ $\quad C_j(l) = (T(l) + S_{\lfloor j/2 \rfloor}) \bmod N_{max};$ $\quad$ if $C_j(l) < N_{data}$ $\quad$ {

$\quad\quad H_j(k) = C_j(l);$ $\quad\quad k = k+1;$ $\quad$ }

}

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application is a continuation of U.S. patent application Ser. No. 16/429,961 filed Jun. 3, 2019, which is a continuation of U.S. patent application Ser. No. 16/125,440 filed Sep. 7, 2018, now allowed, which is a continuation of U.S. patent application Ser. No. 15/654,329 filed on Jul. 19, 2017, now U.S. Pat. No. 10,097,392, which is a continuation of U.S. patent application Ser. No. 14/969,749 filed on Dec. 15, 2015, now U.S. Pat. No. 9,755,873, which is a continuation of U.S. patent application Ser. No. 14/538,123 filed on Nov. 11, 2014, now U.S. Pat. No. 9,246,635; which claims priority to U.S. Provisional Application No. 61/902,300 filed on Nov. 11, 2013, U.S. Provisional Application No. 61/902,302 filed on Nov. 11, 2013, U.S. Provisional Application No. 61/902,303 filed on Nov. 11, 2013, and U.S. Provisional Application No. 61/902,304 filed on Nov. 11, 2013, all of which are incorporated by reference in their entirety herein.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, a method for transmitting broadcast signals includes encoding service data, mapping the encoded service data into a plurality of OFDM (Orthogonal Frequency Division Multiplex) symbols to build at least one signal frame, frequency interleaving data in the at least one signal frame by using a different interleaving-seed which is used for every OFDM symbol pair comprised of two sequential OFDM symbols, modulating the frequency interleaved data by the OFDM scheme; and transmitting the broadcast signals having the modulated data, wherein the different interleaving-seed is generated based on a cyclic shifting value and wherein an interleaving seed is variable based on an FFT size of the modulating.

Advantageous Effects

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 11 illustrates a signaling hierarchy structure of the frame according to an embodiment of the present invention.

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 29 illustrates interleaved XFECBLOCKs from each interleaving array according to an embodiment of the present invention.

FIG. 33 is a view illustrating logical operation mechanism of frequency interleaving applied to a single super-frame according to an embodiment of the present invention.

FIG. 34 illustrates expressions of logical operation mechanism of frequency interleaving applied to a single super-frame according to an embodiment of the present invention.

FIG. 45 illustrates expressions showing operations of a random symbol-offset generator and a random Symbol-offset generator for 4K FFT mode including a 0 bits-spreader and a 12 bits-PN generator according to an embodiment of the present invention.

FIG. 54 illustrates expressions representing an operation of an 8K FFT mode random seed generator according to an embodiment of the present invention.

FIG. 61 is expressions representing operations of 8K FFT mode bit shuffling and 8K FFT mode quasi-random interleaving seed generator according to an embodiment of the present invention.

FIG. 64 illustrates expressions representing an operation of a 16K FFT mode random seed generator according to an embodiment of the present invention.

FIG. 67 illustrates expressions illustrating operations of a random symbol-offset generator and a random Symbol-offset generator for 16K FFT mode including a 1 bits-spreader and a 13 bits-PN generator according to an embodiment of the present invention.

FIG. 71 is expressions representing operations of 16K FFT mode bit shuffling and 16K FFT mode quasi-random interleaving seed generator according to an embodiment of the present invention.

FIG. 74 illustrates expressions representing an operation of a 32K FFT mode random seed generator according to an embodiment of the present invention.

FIG. 83 is a change procedure for an interleaving seed in each memory bank according to another embodiment of the present invention.

FIG. 85 illustrates expressions representing an operation of a 4K FFT mode random interleaving-sequence generator according to an embodiment of the present invention.

FIG. 88 is expressions representing operations of 4K FFT mode bit shuffling and 4K FFT mode random interleaving-sequence generator according to another embodiment of the present invention.

FIG. 90 illustrates expressions representing an operation of an 8K FFT mode random interleaving-sequence generator according to an embodiment of the present invention.

FIG. 95 illustrates expressions representing an operation of a 16K FFT mode random interleaving-sequence generator according to an embodiment of the present invention.

FIG. 98 is expressions representing operations of 16K FFT mode bit shuffling and 16K FFT mode random interleaving-sequence generator according to another embodiment of the present invention.

FIG. 100 illustrates expressions representing an operation of a 32K FFT mode random interleaving-sequence generator according to an embodiment of the present invention.

BEST MODE

Figure 1:
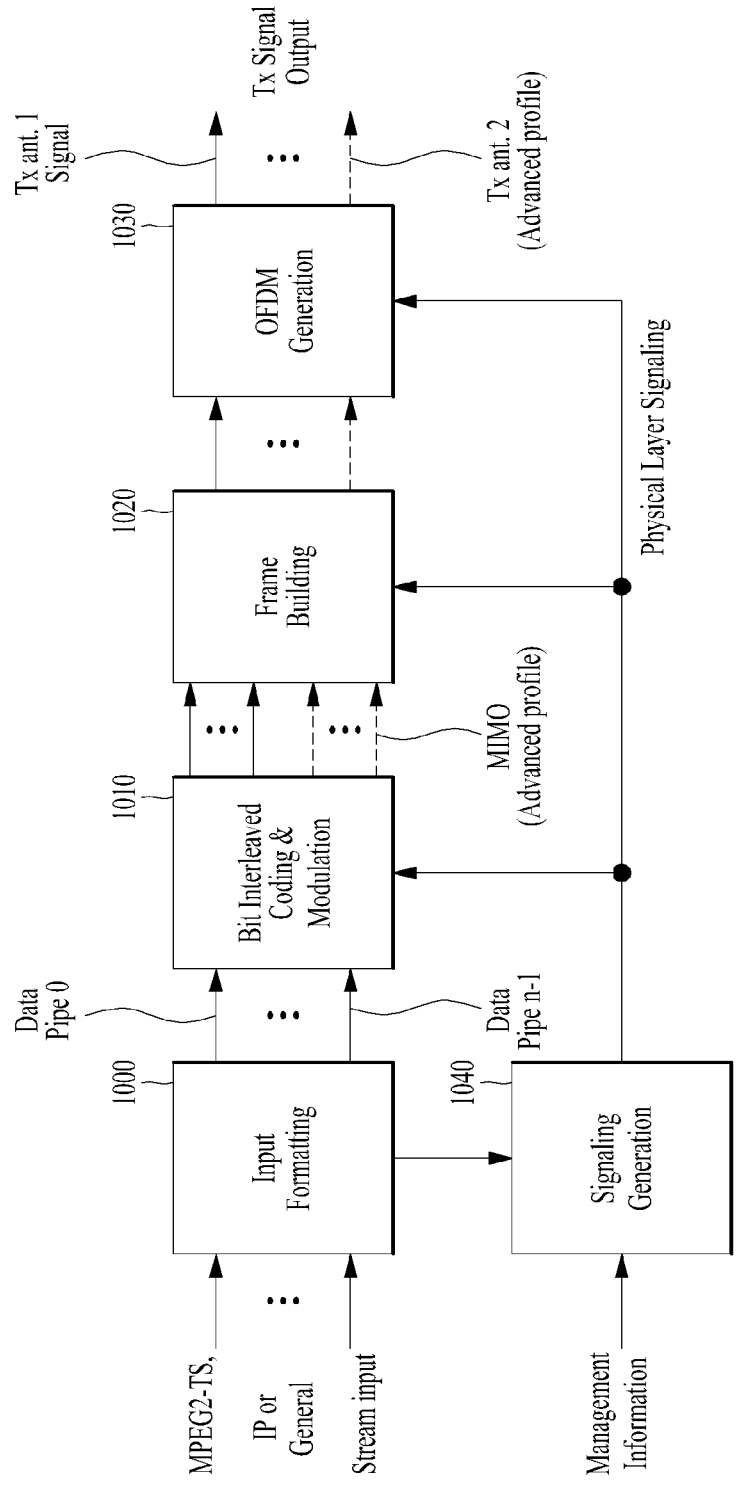
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | $\leq 2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | ≤$2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | ≤$2^{19}$ data cells |
| Pilot patterns | Pilot pattern for fixed reception |
| FFT size | 16K, 32K points |

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of $K_{bch}$ bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period $T_S$ expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of $N_{cells}$ cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
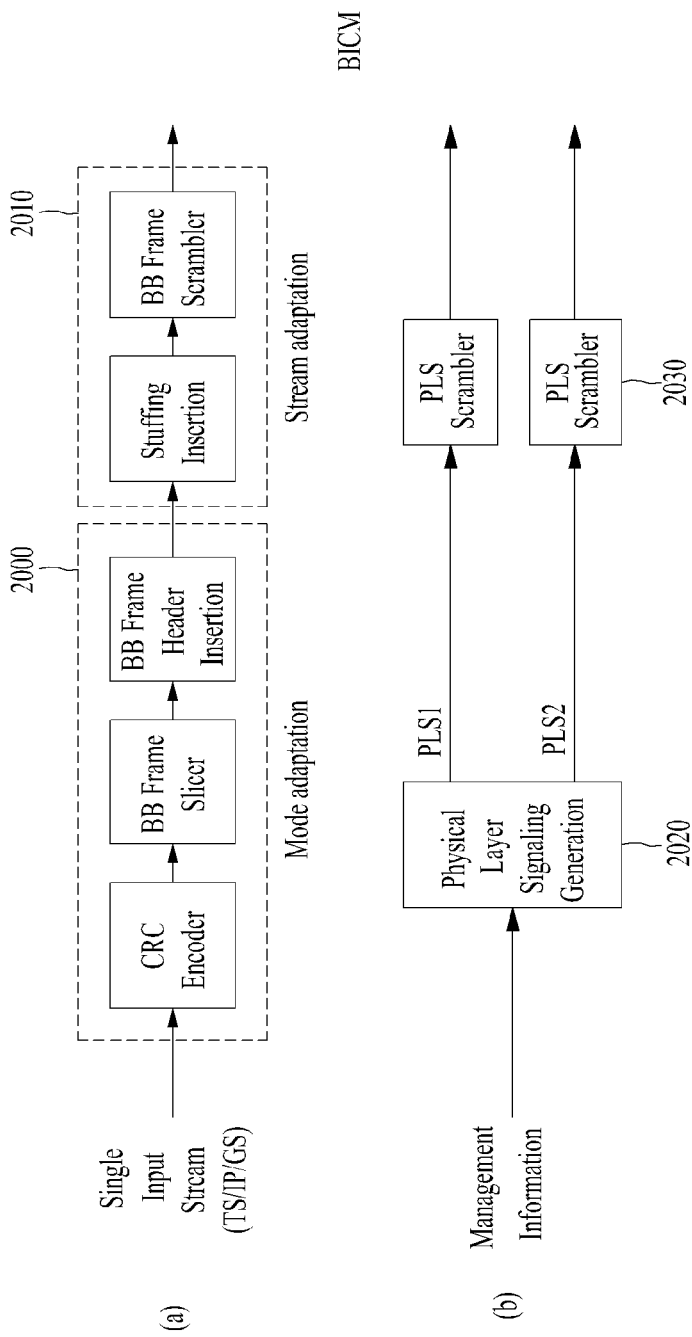
FIG. 2 illustrates an input formatting block according to one embodiment of the present invention.
Figure 3:
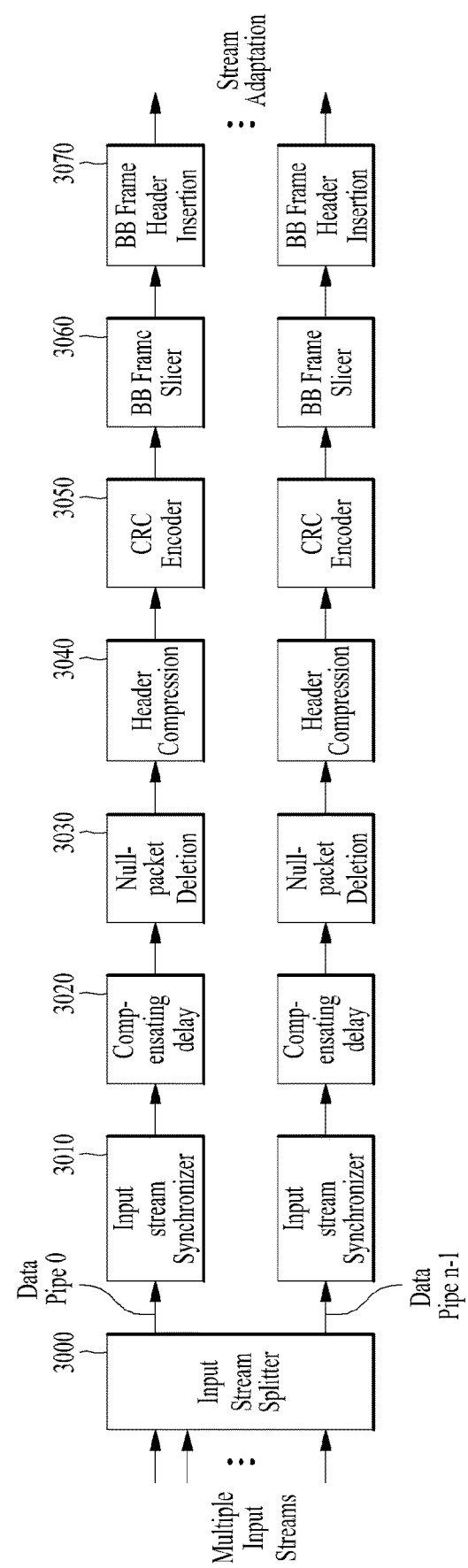
FIG. 3 illustrates an input formatting block according to another embodiment of the present invention.
Figure 4:
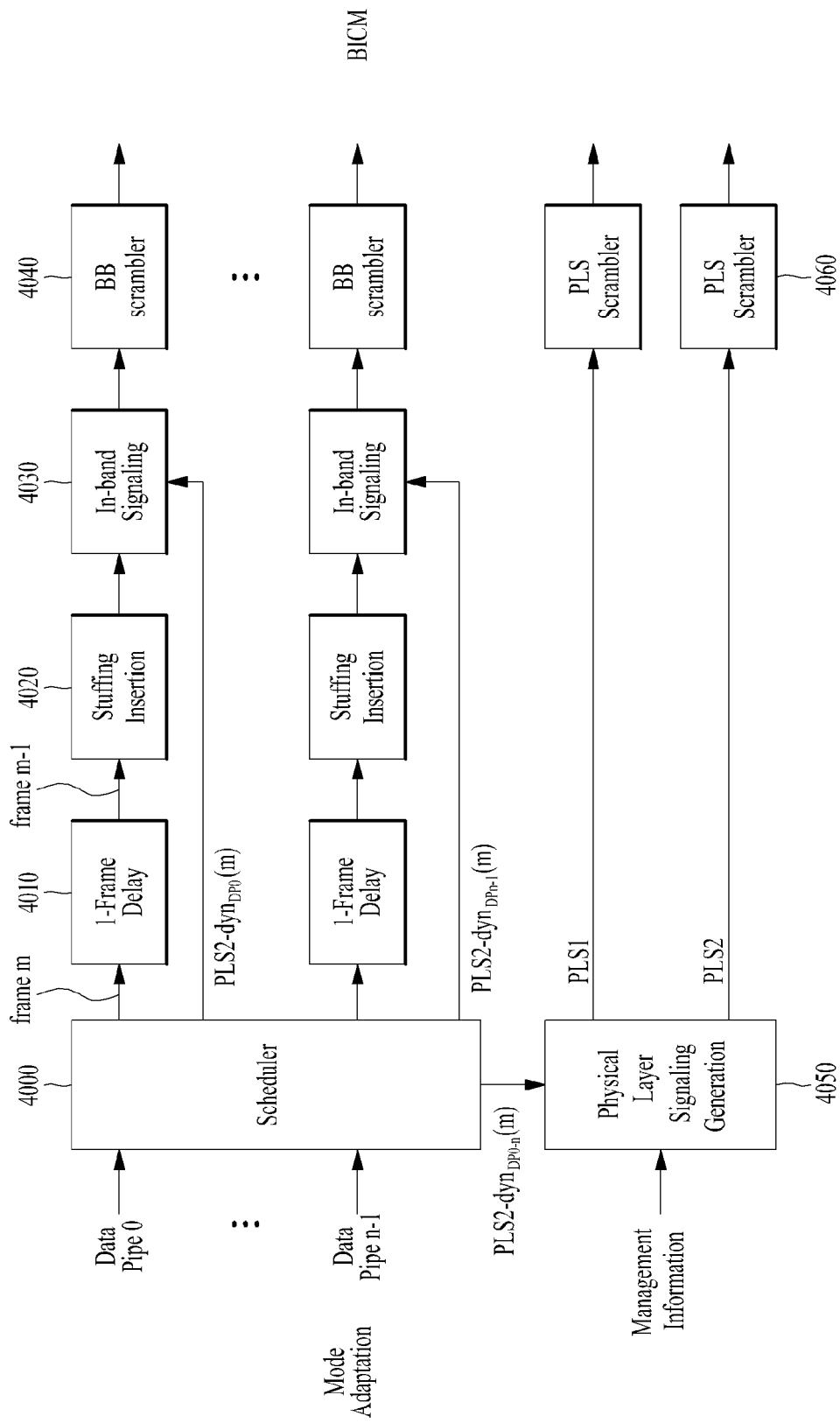
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNOD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FEC-BLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
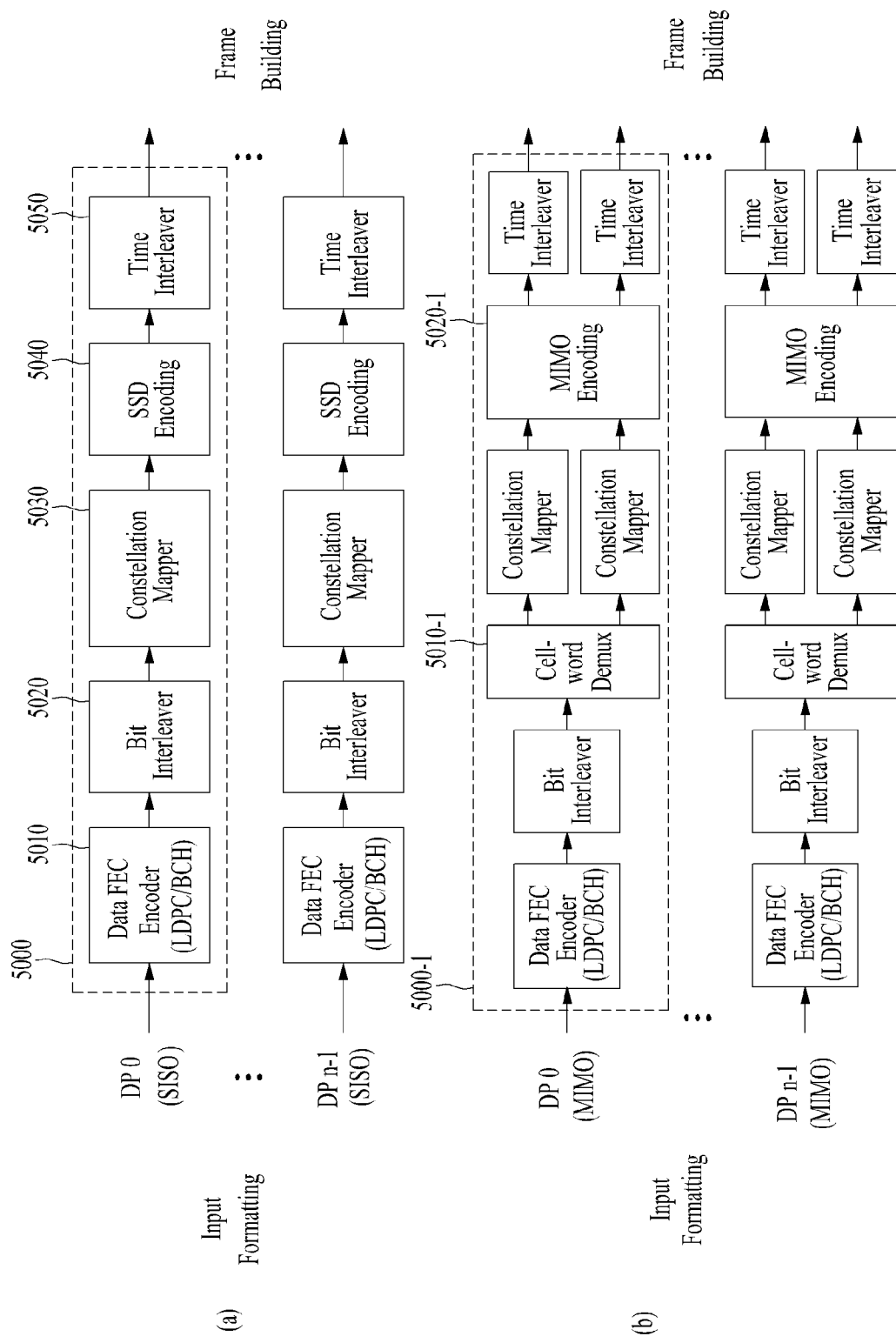
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, $e_l$. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ ($e_{1,i}$ and $e_{2,i}$) are fed to the input of the MIMO Encoder. Paired MIMO Encoder output (g1,i and g2,i) is transmitted by the same carrier k and OFDM symbol I of their respective TX antennas.

The above-described blocks may be omitted or replaced by blocks having similar or identical functions.

Figure 6:
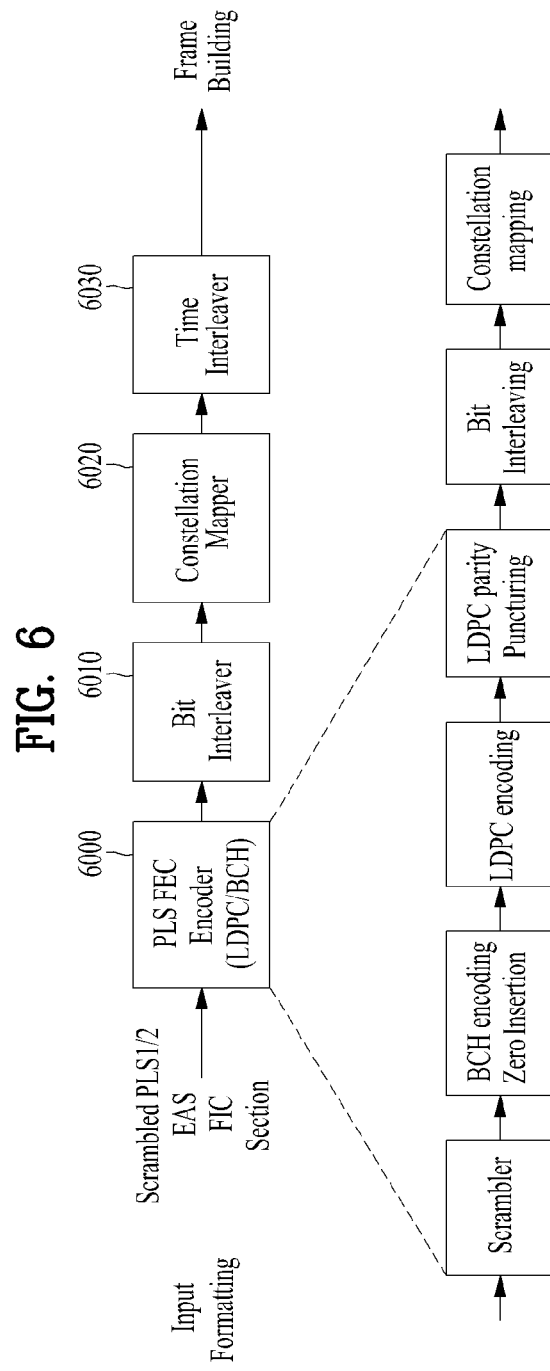
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and a time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, $C_{ldpc}$, parity bits, $P_{ldpc}$ are encoded systematically from each zero-inserted PLS information block, $I_{ldpc}$ and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$

【Expression 1】

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ ($=N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The time interleaver 6030 can interleave the mapped PLS1 data and PLS2 data. The time interleaver 6030 can be omitted.

The above-described blocks may be omitted or replaced by blocks having similar or identical functions.

Figure 7:
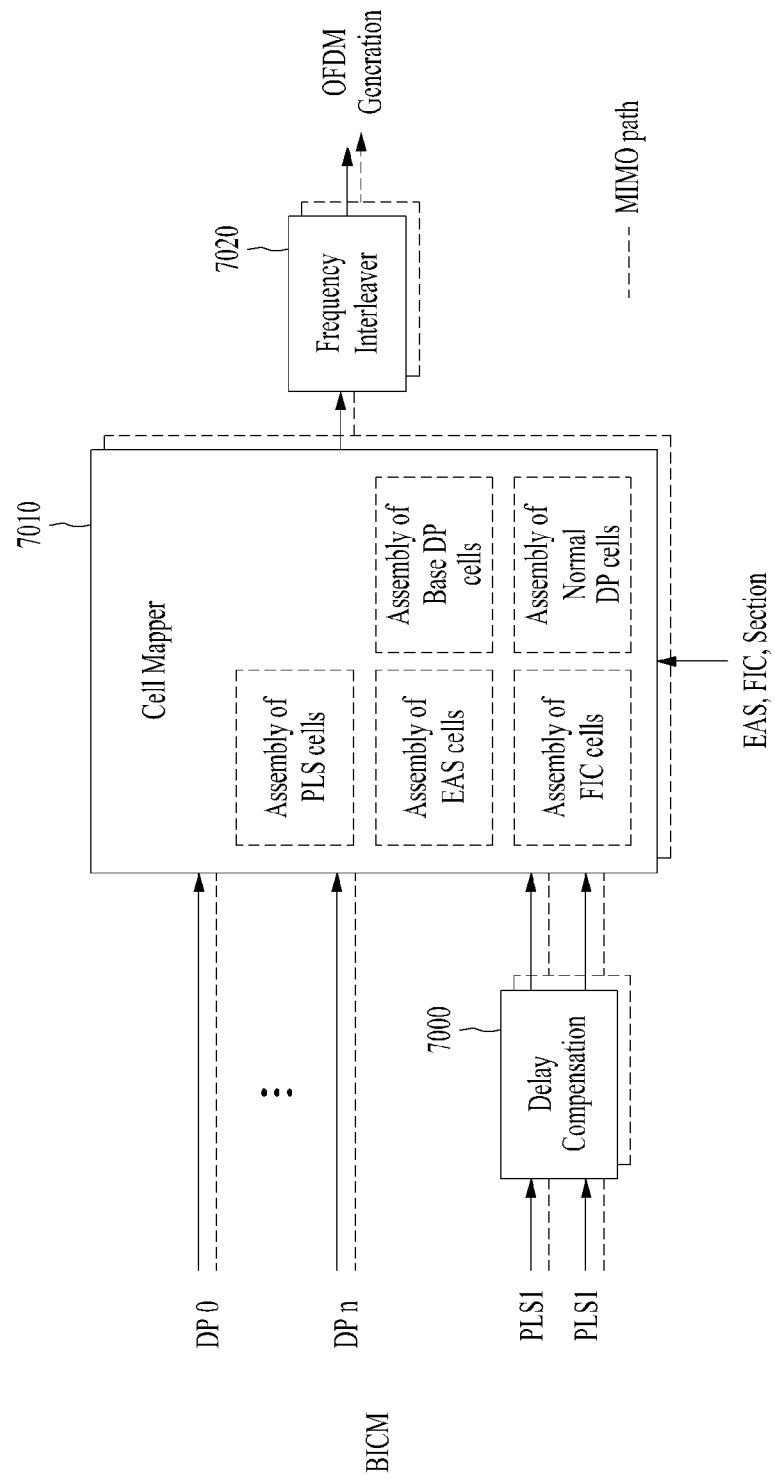
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

Figure 8:
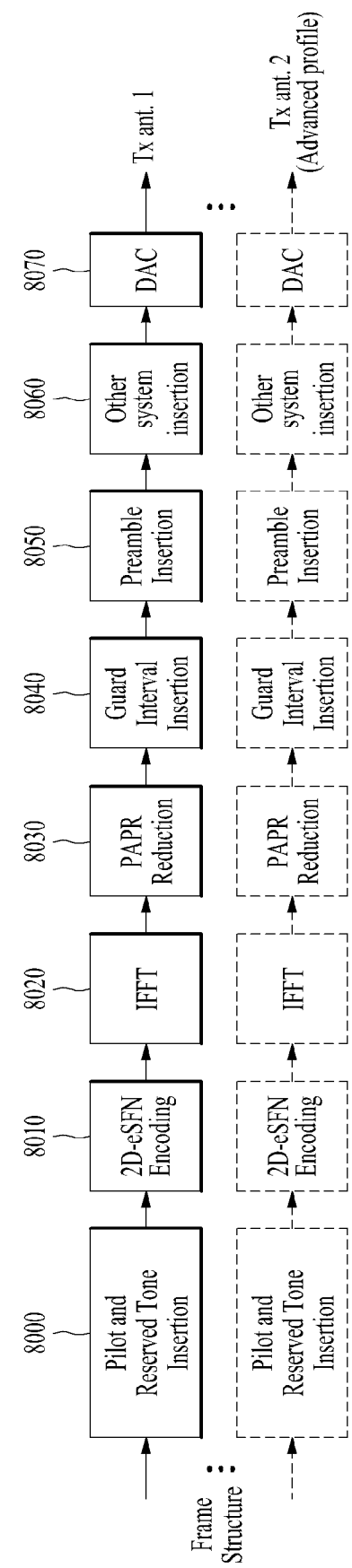
FIG. 8 illustrates an OFDM generation block according to an embodiment of the present invention.

FIG. 8 illustrates an OFDM generation block according to an embodiment of the present invention.

The OFDM generation block illustrated in FIG. 8 corresponds to an embodiment of the OFDM generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
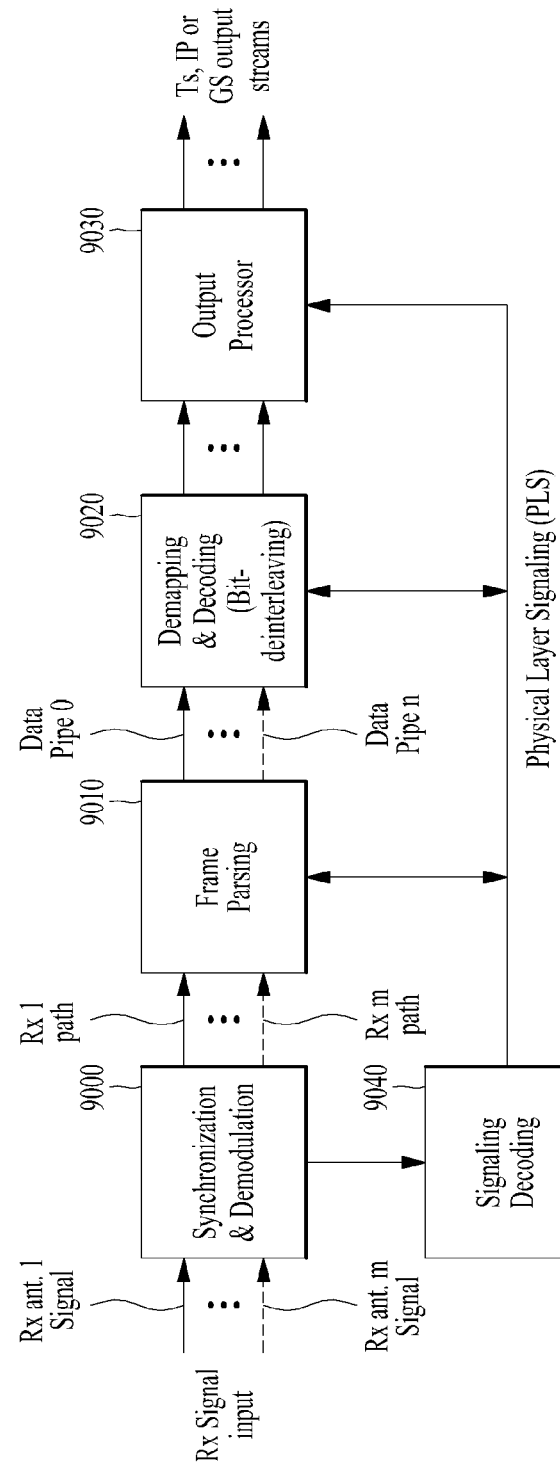
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9100 can parse input signal frames and extract data through which a service selected by a user is transmitted. If the apparatus for transmitting broadcast signals performs interleaving, the frame parsing module 9100 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9200 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9200 can obtain transmission parameters necessary for demapping and decoding by decoding the data output from the signaling decoding module 9400.

The output processor 9300 can perform reverse procedures of various compression/signal processing procedures which are applied by the apparatus for transmitting broadcast signals to improve transmission efficiency. In this case, the output processor 9300 can acquire necessary control information from data output from the signaling decoding module 9400. The output of the output processor 8300 corresponds to a signal input to the apparatus for transmitting broadcast signals and may be MPEG-TSs, IP streams (v4 or v6) and generic streams.

The signaling decoding module 9400 can obtain PLS information from the signal demodulated by the synchronization & demodulation module 9000. As described above, the frame parsing module 9100, demapping & decoding module 9200 and output processor 9300 can execute functions thereof using the data output from the signaling decoding module 9400.

Figure 10:
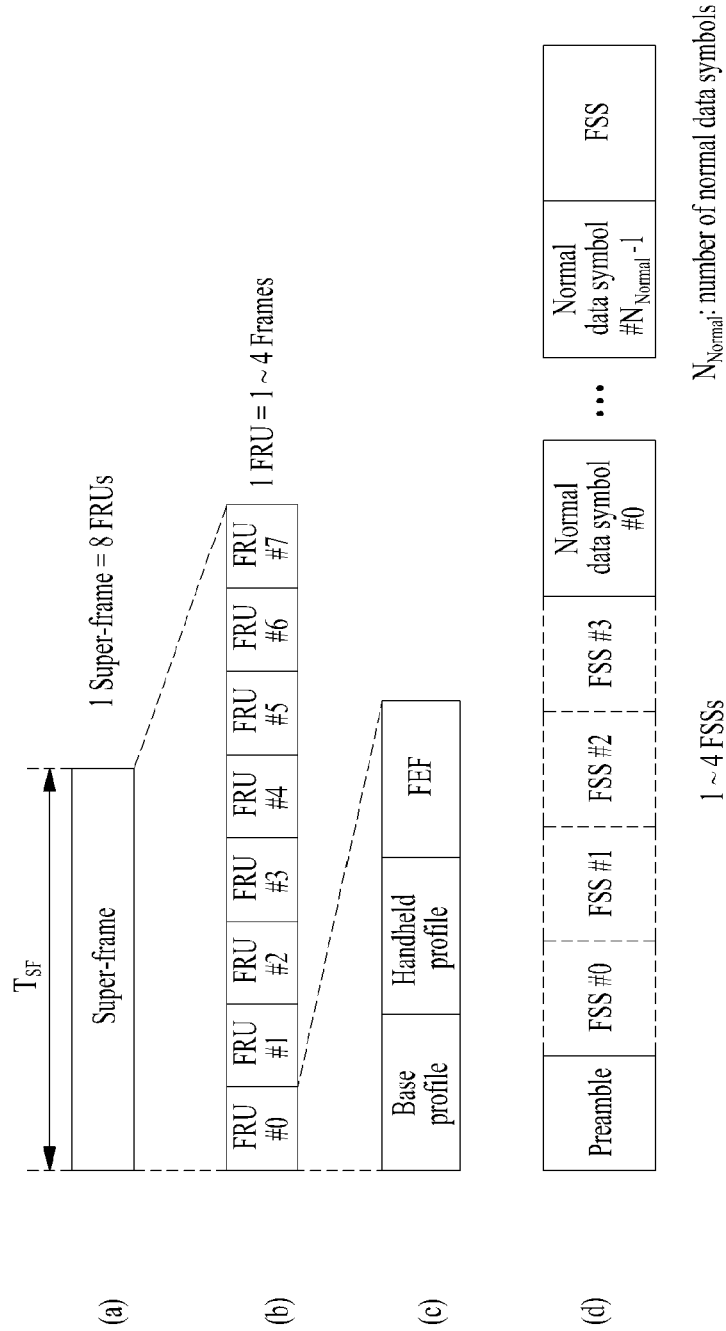
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Future-cast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the $(i+1)^{th}$ (i is the loop index) frame of the associated FRU. This field uses the same signaling format as shown in the table 8.

FRU_FRAME_LENGTH: This 2-bit field indicates the length of the $(i+1)^{th}$ frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the $(i+1)^{th}$ frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
|---|---|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|---|---|
| 000 | BPSK |
| 001 | QPSK |
| 010 | QAM-16 |
| 011 | NUQ-64 |
| 100~111 | Reserved |

PLS2_SIZE_CELL: This 15-bit field indicates $C_{total\_partial\_block}$, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates $C_{total\_partial\_block}$, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates $C_{total\_full\_block}$, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates $P_I$, the number of the frames to which each TI group is mapped, and there is one TI-block per TI group ($N_{TI}$=1). The allowed $P_I$ values with 2-bit field are defined in the below table 18.

If the DP_TI_TYPE is set to the value '0', this field indicates the number of TI-blocks $N_{TI}$ per TI group, and there is one TI group per frame ($P_I$=1). The allowed $P_I$ values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval ($I_{JUMP}$) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
| --- | --- |
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_ TYPE Is_TS | If DP_PAYLOAD_ TYPE Is_IP | If DP_PAYLOAD_ TYPE Is_GS |
| --- | --- | --- | --- |
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
| --- | --- |
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
| --- | --- |
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
| --- | --- |
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
| --- | --- |
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
| --- | --- |
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

(a) DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

(b) RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

(c) AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
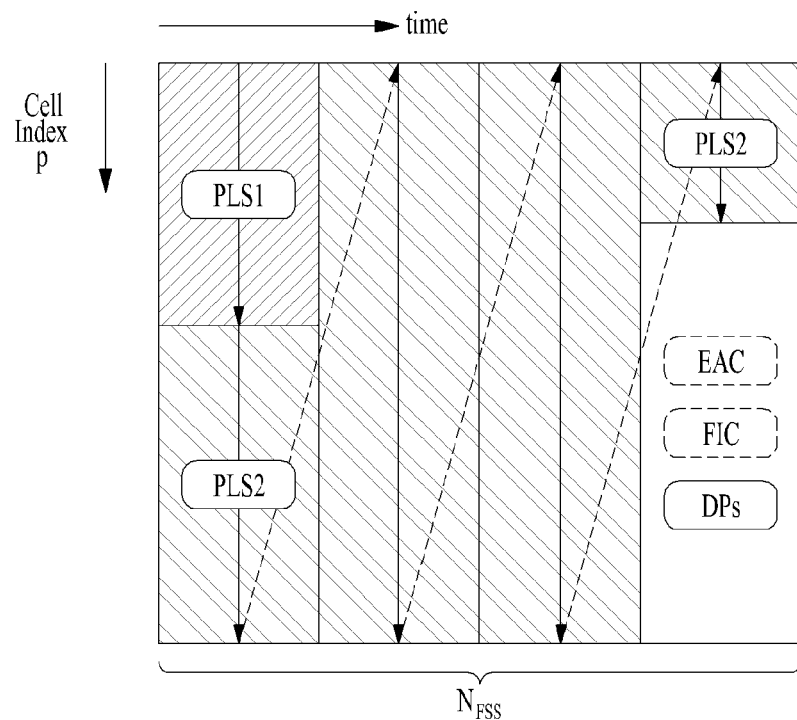
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) $N_{FSS}$ is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the $N_{FSS}$ FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
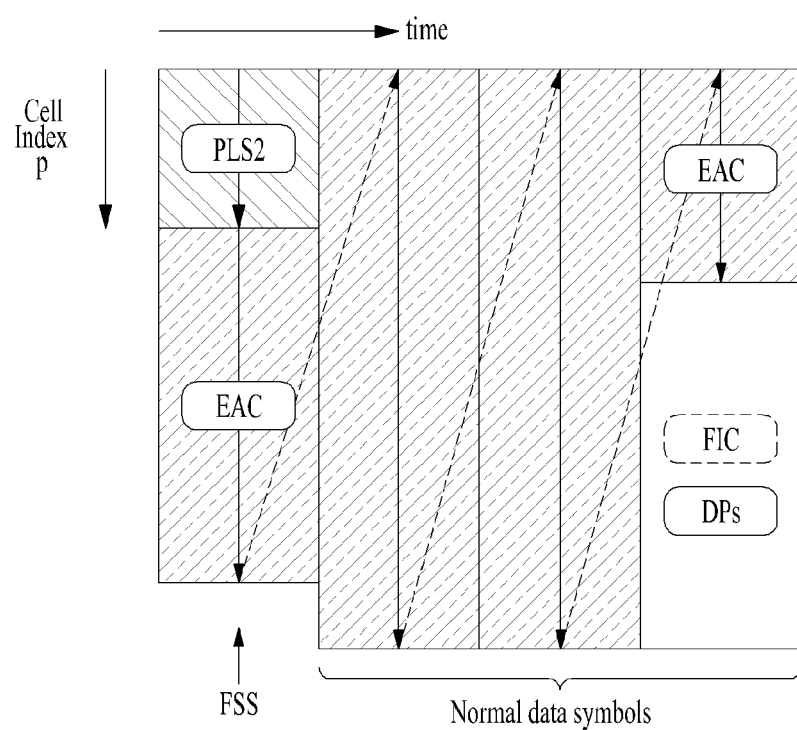
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
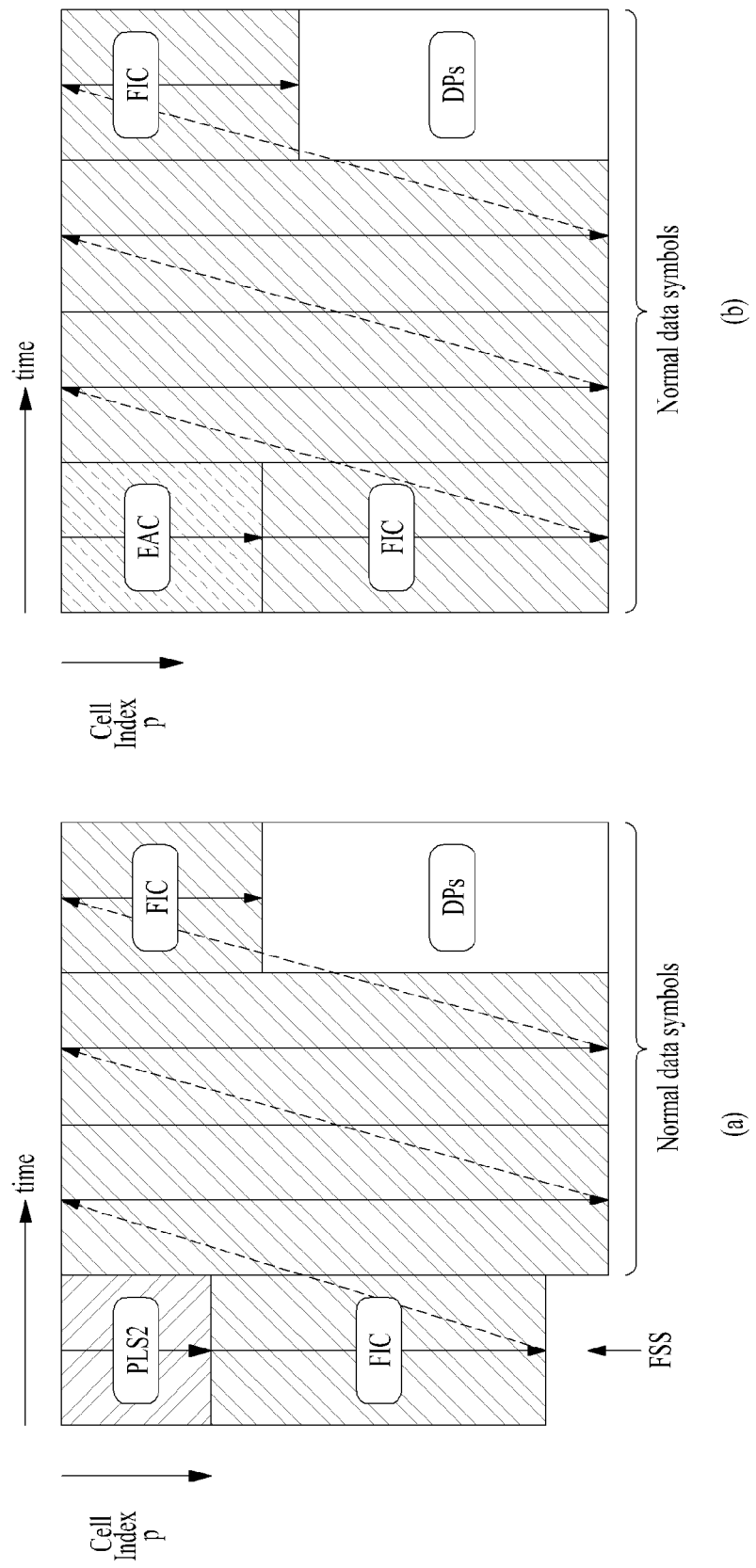
FIG. 19 illustrates FIC mapping according to an embodiment of the present invention.

FIG. 19 illustrates FIC mapping according to an embodiment of the present invention.

(d) shows an example mapping of FIC cell without EAC and
(b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
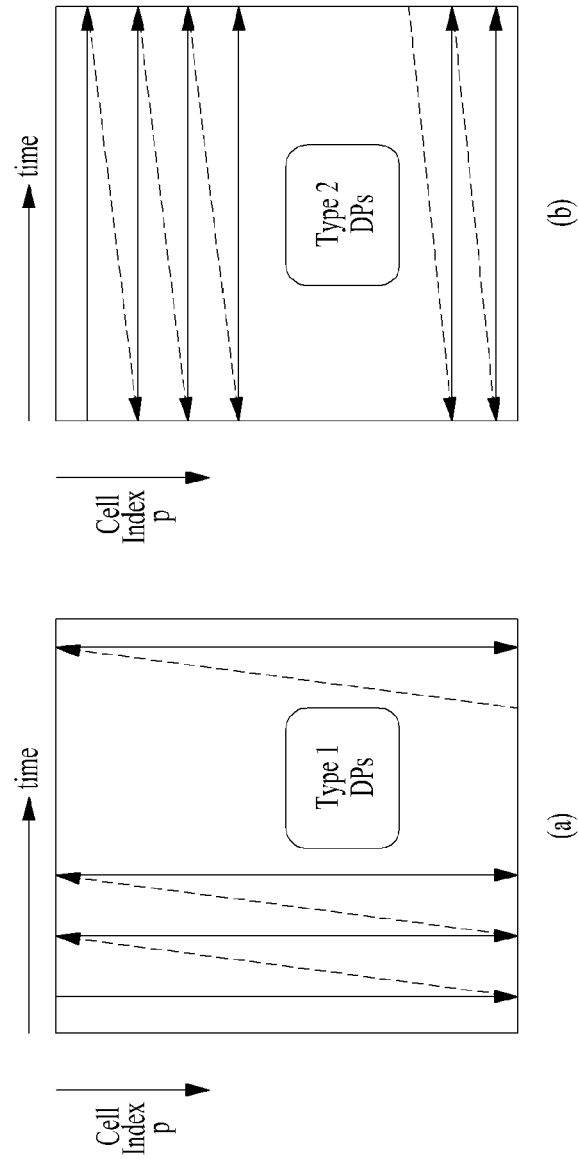
FIG. 20 illustrates a type of DP according to an embodiment of the present invention.

FIG. 20 illustrates a type of DP according to an embodiment of the present invention.

(e) shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \qquad \square \text{Expression 2V}$$

where $D_{DP1}$ is the number of OFDM cells occupied by Type 1 DPs, $D_{DP2}$ is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
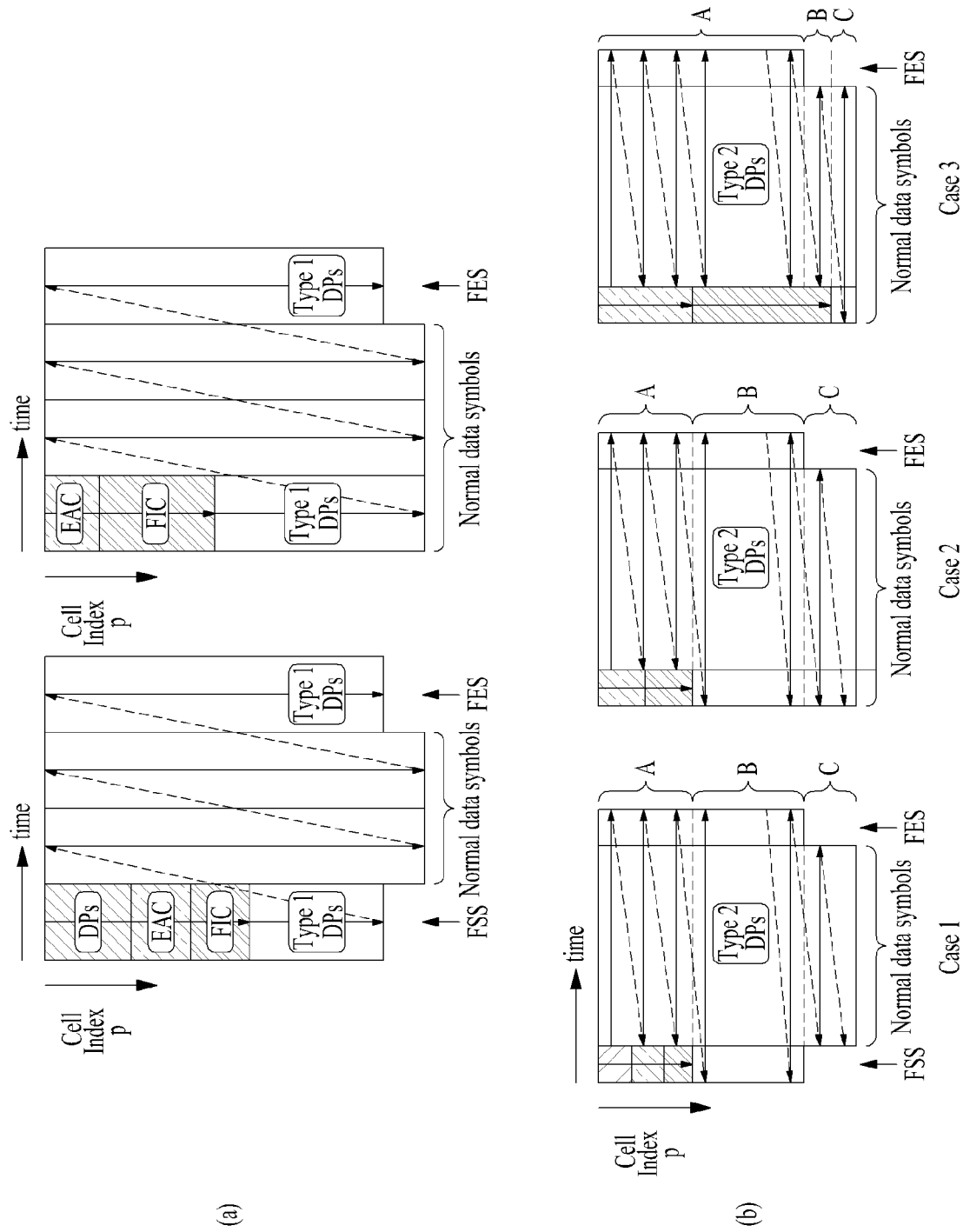
FIG. 21 illustrates DP mapping according to an embodiment of the present invention.

FIG. 21 illustrates DP mapping according to an embodiment of the present invention.

(f) shows an addressing of OFDM cells for mapping type 1 DPs and (b) shows an an addressing of OFDM cells for mapping for type 2 DPs.

Addressing of OFDM cells for mapping Type 1 DPs $(0, \ldots, D_{DP1}-1)$ is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs $(0, \ldots, D_{DP2}-1)$ is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than $C_{FSS}$. The third case, shown on the right side in (b), is the same as the second case except that the number of FIC cells mapped on that symbol exceeds $C_{FSS}$.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, $N_{cells}$, is dependent on the FECBLOCK size, $N_{ldpc}$, and the number of transmitted bits per constellation symbol. A DPU is defined as the greatest common divisor of all possible values of the number of cells in a XFECBLOCK, $N_{cells}$, supported in a given PHY profile. The length of a DPU in cells is defined as $L_{DPU}$. Since each PHY profile supports different combinations of FECBLOCK size and a different number of bits per constellation symbol, $L_{DPU}$ is defined on a PHY profile basis.

Figure 22:
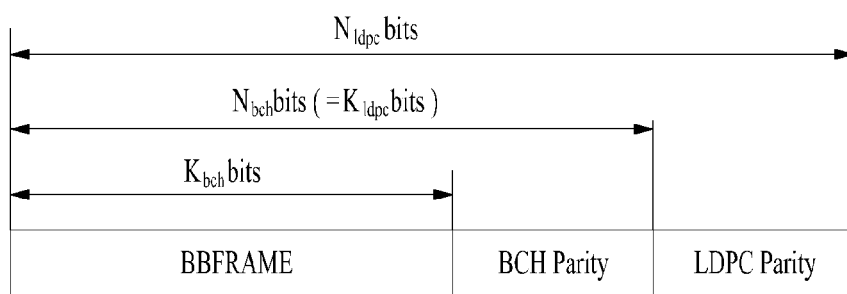
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF ($K_{bch}$ bits), and then LDPC encoding is applied to BCH-encoded BBF ($K_{ldpc}$ bits=$N_{bch}$ bits) as illustrated in FIG. 22.

The value of $N_{ldpc}$ is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch} - K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed $B_{ldpc}$ (FECBLOCK), $P_{ldpc}$ (parity bits) is encoded systematically from each $I_{ldpc}$ (BCH-encoded BBF), and appended to $I_{ldpc}$. The completed $B_{ldpc}$ (FECBLOCK) are expressed as follow Expression.

$$B_{ldpc}=[I_{ldpc}\ P_{ldpc}]=[i_0, i_1, \ldots, i_{K_{ldpc}-1}, p_0, p_1, \ldots, p_{N_{ldpc}-K_{ldpc}-1}]$$ 
Expression 3V The parameters for long FECBLOCK and short FECBLOCK are given in the above table 28 and 29, respectively.

The detailed procedure to calculate $N_{ldpc}-K_{ldpc}$ parity bits for long FECBLOCK, is as follows:

1) Initialize the parity bits, $$p_0=p_1=p_2=\ldots=p_{N_{ldpc}-K_{ldpc}-1}=0$$
Expression 4V 2) Accumulate the first information bit $-i_0$, at parity bit addresses specified in the first row of an addresses of parity check matrix. The details of addresses of parity check matrix will be described later. For example, for rate 13/15:

$$p_{983}=p_{983}\oplus i_0\ p_{2815}=p_{2815}\oplus i_0$$

$$p_{4837}=p_{4837}\oplus i_0\ p_{4989}=p_{4989}\oplus i_0$$

$$p_{6138}=p_{6138}\oplus i_0\ p_{6458}=p_{6458}\oplus i_0$$

$$p_{6921}=p_{6921}\oplus i_0\ p_{6974}=p_{6974}\oplus i_0$$

$$p_{7572}=p_{7572}\oplus i_0\ p_{8260}=p_{8260}\oplus i_0$$

$$p_{8496}=p_{8496}\oplus i_0$$
Expression 5V

3) For the next 359 information bits, $i_s$, s=1, 2, ..., 359 accumulate $i_s$ at parity bit addresses using following Expression.

$$\{x+(s \bmod 360)\times Q_{ldpc}\} \bmod (N_{ldpc}-K_{ldpc})$$
Expression 6V where x denotes the address of the parity bit accumulator corresponding to the first bit $i_0$, and $Q_{ldpc}$ is a code rate dependent constant specified in the addresses of parity check matrix. Continuing with the example, $Q_{ldpc}=24$ for rate 13/15, so for information bit $i_1$, the following operations are performed:

$$p_{1007}=p_{1007}\oplus i_1\ p_{2839}=p_{2839}\oplus i_1$$

$$p_{4861}=p_{4861}\oplus i_1\ p_{5013}=p_{5013}\oplus i_1$$

$$p_{6162}=p_{6162}\oplus i_1\ p_{6482}=p_{6482}\oplus i_1$$

$$p_{6945}=p_{6945}\oplus i_1\ p_{6998}=p_{6998}\oplus i_1$$

$$p_{7596}=p_{7596}\oplus i_1\ p_{8284}=p_{8284}\oplus i_1$$

$$p_{8520}=p_{8520}\oplus i_1$$
Expression 7V

4) For the 361$^{st}$ information bit $i_{360}$, the addresses of the parity bit accumulators are given in the second row of the addresses of parity check matrix. In a similar manner the addresses of the parity bit accumulators for the following 359 information bits $i_s$, s=361, 362, ..., 719 are obtained using the Expression 6, where x denotes the address of the parity bit accumulator corresponding to the information bit $i_{360}$, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i=p_i\oplus p_{i-1}, i=1, 2, \ldots, N_{ldpc}-K_{ldpc}-1$$
Expression 8V where final content of $p_i$, i=0, 1, ... $N_{ldpc}-K_{ldpc}-1$ is equal to the parity bit $p_i$.

TABLE 30

| Code Rate | $Q_{ldpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
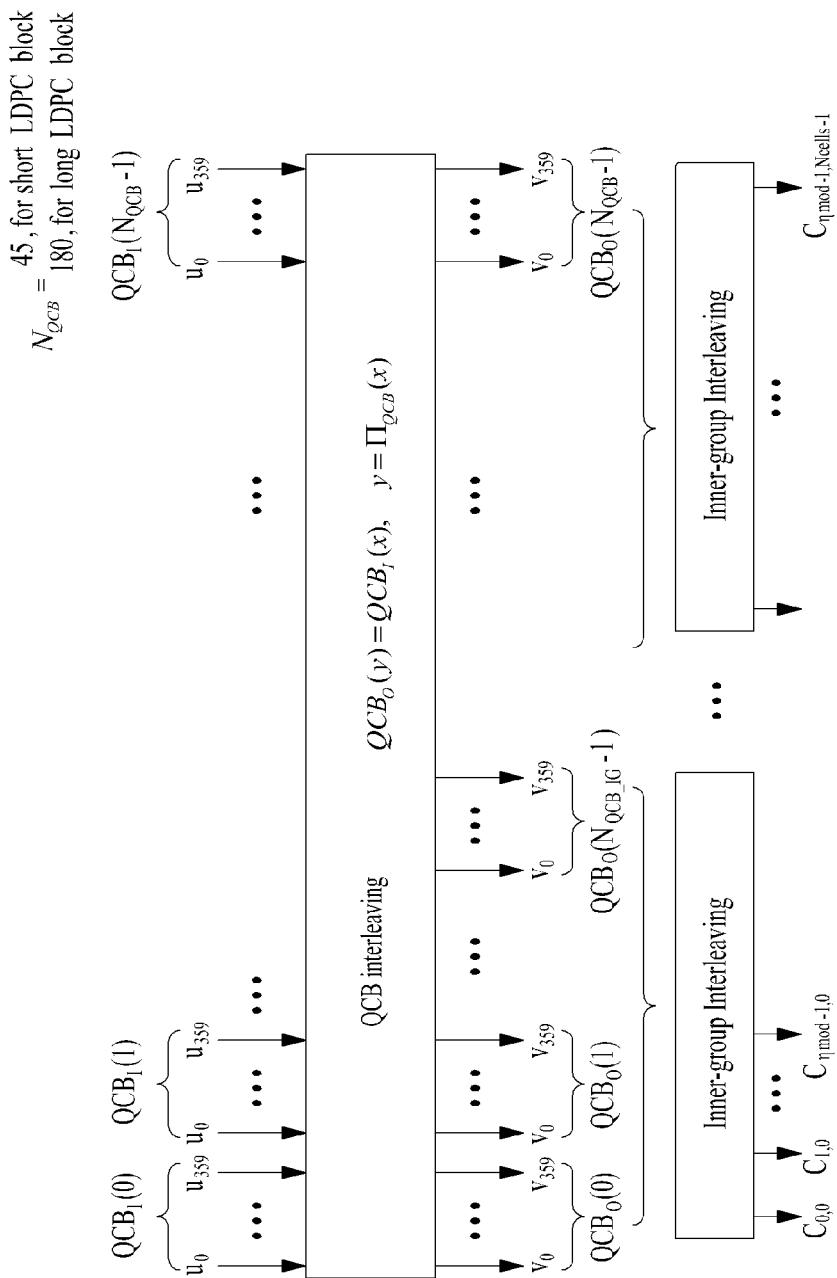
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

(g) shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where $N_{cells}=64800/\eta_{mod}$ or $16200/\eta_{mod}$ according to the FECBLOCK length. The QCB interleaving pattern is unique to each combination of modulation type and LDPC code rate.

After QCB interleaving, inner-group interleaving is performed according to modulation type and order ($\eta_{mod}$) which is defined in the below table 32. The number of QC blocks for one inner-group, $N_{QCB\_IG}$, is also defined.

TABLE 32

| Modulation type | $\eta_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |

TABLE 32-continued

| Modulation type | $\eta_{mod}$ | $N_{QCB\_IG}$ |
|---|---|---|
| NUC-256 | 8 | 8 |
| NUQ-1024 | 10 | 5 |
| NUC-1024 | 10 | 10 |

The inner-group interleaving process is performed with $N_{QCB\_IG}$ QC blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ.

Figure 24:
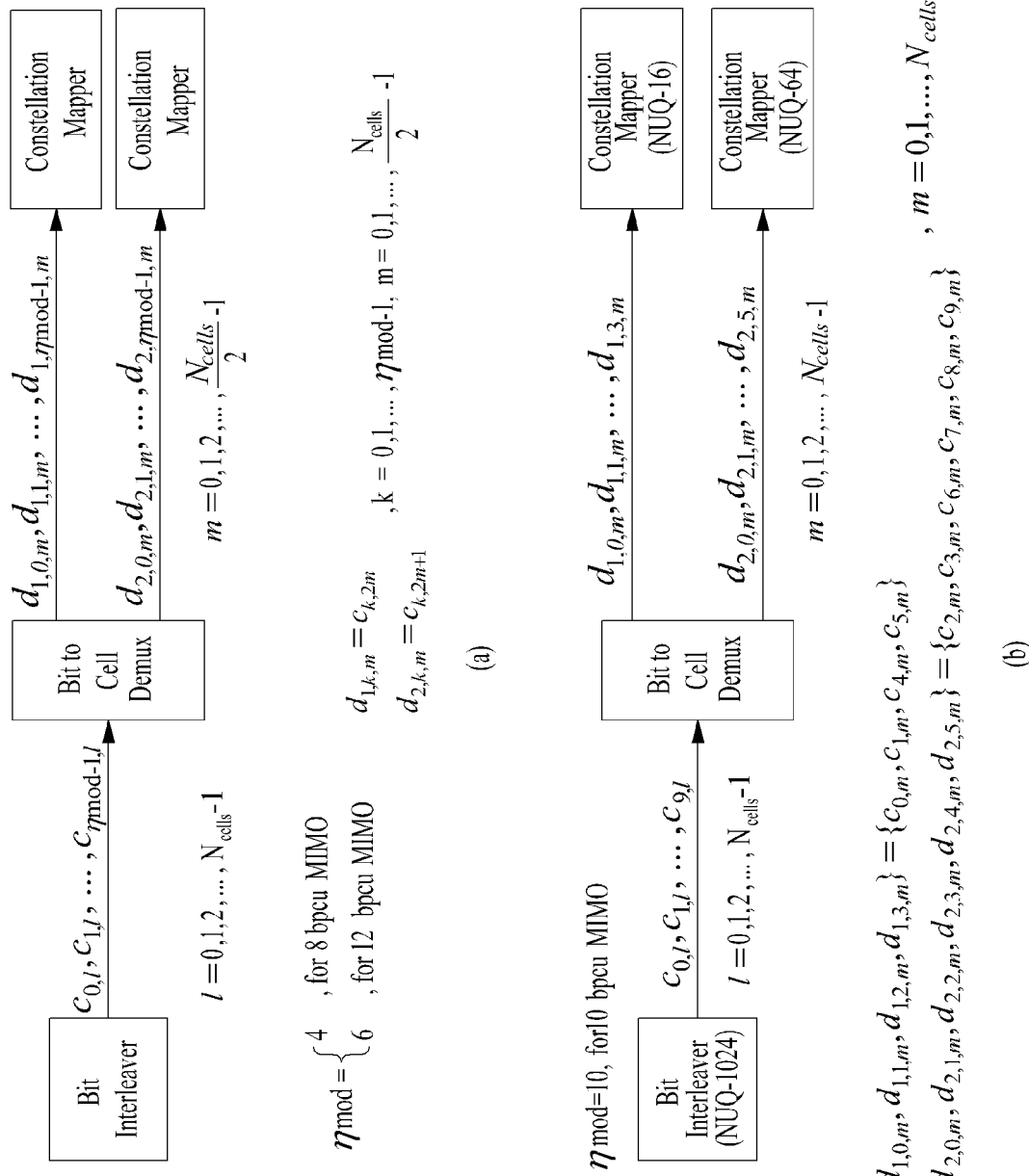
FIG. 24 illustrates a cell-word demultiplexing according to an embodiment of the present invention.

FIG. 24 illustrates a cell-word demultiplexing according to an embodiment of the present invention.

(h) shows a cell-word demultiplexing for 8 and 12 bpcu MIMO and (b) shows a cell-word demultiplexing for 10 bpcu MIMO.

Each cell word ($c_{0,l}$, $c_{1,l}$, ..., $c_{\eta mod-1,l}$) of the bit interleaving output is demultiplexed into ($d_{1,0,m}$, $d_{1,1,m}$ ..., $d_{1,\eta mod-1,m}$) and ($d_{2,0,m}$, $d_{2,1,m}$ ..., $d_{2,\eta mod-1,m}$) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word ($c_{0,l}$, $c_{1,l}$, ..., $c_{9,l}$) of the Bit Interleaver output is demultiplexed into ($d_{1,0,m}$, $d_{1,1,m}$ ..., $d_{1,3,m}$) and ($d_{2,0,m}$, $d_{2,1,m}$ ..., $d_{2,5,m}$), as shown in (b).

Figure 25:
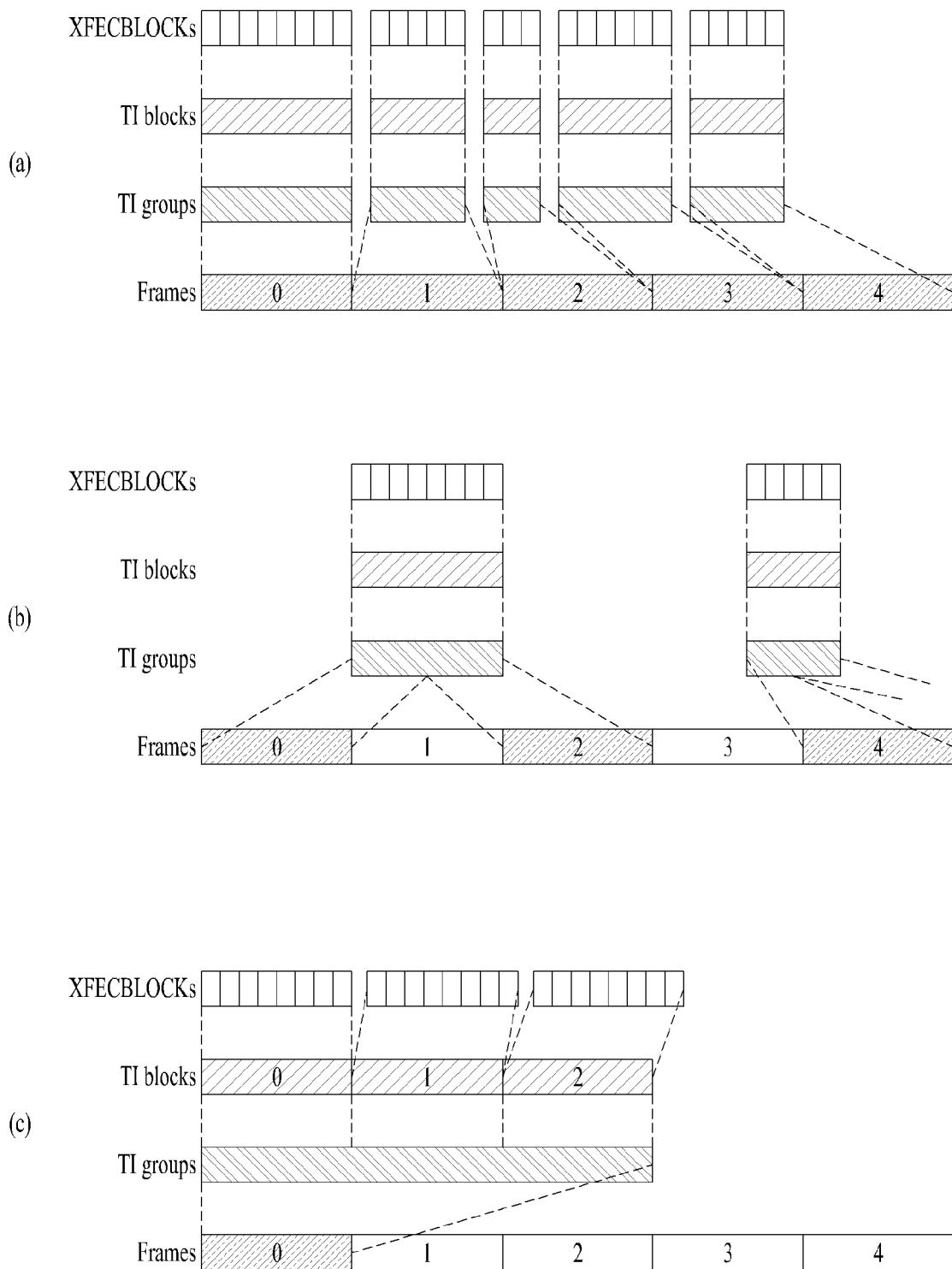
FIG. 25 illustrates a time interleaving according to an embodiment of the present invention.

FIG. 25 illustrates a time interleaving according to an embodiment of the present invention.

(i) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks $N_{TI}$ per TI group. For DP_TI_TYPE='1', this parameter is the number of frames $P_I$ spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames $I_{JUMP}$ between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFEC-BLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by $N_{xBLOCK\_Group}(n)$ and is signaled as DP_NUM_BLOCK in the PLS2-DYN data. Note that $N_{xBLOCK\_Group}(n)$ may vary from the minimum value of 0 to the maximum value $N_{xBLOCK\_Group\_MAX}$ (corresponding to DP_NUM_BLOCK_MAX) of which the largest value is 1023.

Each TI group is either mapped directly onto one frame or spread over $P_I$ frames. Each TI group is also divided into more than one TI blocks ($N_{TI}$), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1'($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

In each DP, the TI memory stores the input XFEC-BLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1}, \ldots, d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the $q^{th}$ cell of the $r^{th}$ XFECBLOCK in the $s^{th}$ TI block of the $n^{th}$ TI group and represents the outputs of SSD and MIMO encodings as follows $$d_{n,s,r,q} = \begin{cases} f_{n,s,r,q}, & \text{the output of } SSD \ldots \text{ encoding} \\ g_{n,s,r,q}, & \text{the output of } MIMO \text{ encoding} \end{cases}.$$

In addition, assume that output XFECBLOCKs from the time interleaver 5050 are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the $i^{th}$ output cell (for $i=0, \ldots, N_{xBLOCK\_TI}(n,s) \times N_{cells}-1$) in the $s^{th}$ TI block of the $n^{th}$ TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the $s^{th}$ TI block of the $n^{th}$ TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

Figure 26:
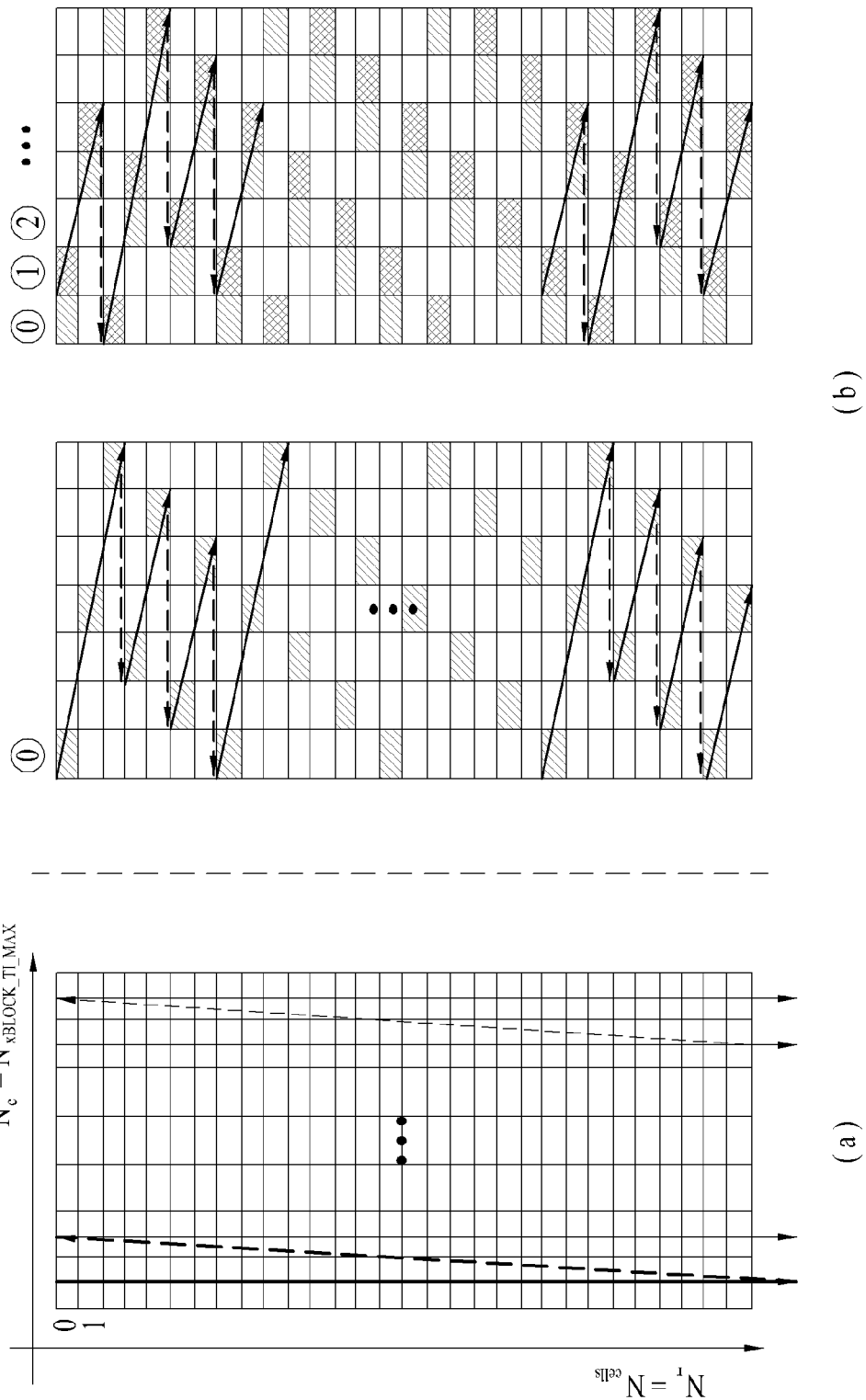
FIG. 26 illustrates the basic operation of a twisted row-column block interleaver according to an embodiment of the present invention.

FIG. 26 illustrates the basic operation of a twisted row-column block interleaver according to an embodiment of the present invention.

(j) shows a writing operation in the time interleaver 5050 and (b) shows a reading operation in the time interleaver 5050. The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,i}$ ($i=0, \ldots, N_r N_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

$$\text{GENERATE}(R_{n,s,i}, C_{n,s,i}) = \qquad \text{[Expression 9]}$$
$$\{$$
$$R_{n,s,i} = \mod(i, N_r),$$
$$T_{n,s,i} = \mod(S_{shift} \times R_{n,s,i}, N_c),$$
$$C_{n,s,i} = \mod\left(T_{n,s,i} + \left\lfloor \frac{i}{N_r} \right\rfloor, N_c\right)$$
$$\}$$

where $S_{shift}$ is a common shift value for the diagonal-wise reading process regardless of $N_{xBLOCK\_TI}(n,s)$, and it is determined by $N_{xBLOCK\_TI\_MAX}$ given in the PLS2-STAT as follows expression.

$$\text{for} \qquad \text{[Expression 10]}$$
$$\begin{cases} N'_{xBLOCK\_TI\_MAX} = \\ \quad N_{xBLOCK\_TI\_MAX} + 1, & \text{if } N_{xBLOCK\_TI\_MAX} \mod 2 = 0 \\ N'_{xBLOCK\_TI\_MAX} = \\ \quad N_{xBLOCK\_TI\_MAX}, & \text{if } N_{xBLOCK\_TI\_MAX} \mod 2 = 1 \end{cases},$$

$$S_{shift} = \frac{N'_{xBLOCK\_TI\_MAX} - 1}{2}.$$

As a result, the cell positions to be read are calculated by a coordinate as $z_{n,s,i} = N_r C_{n,s,i} + R_{n,s,i}$.

Figure 27:
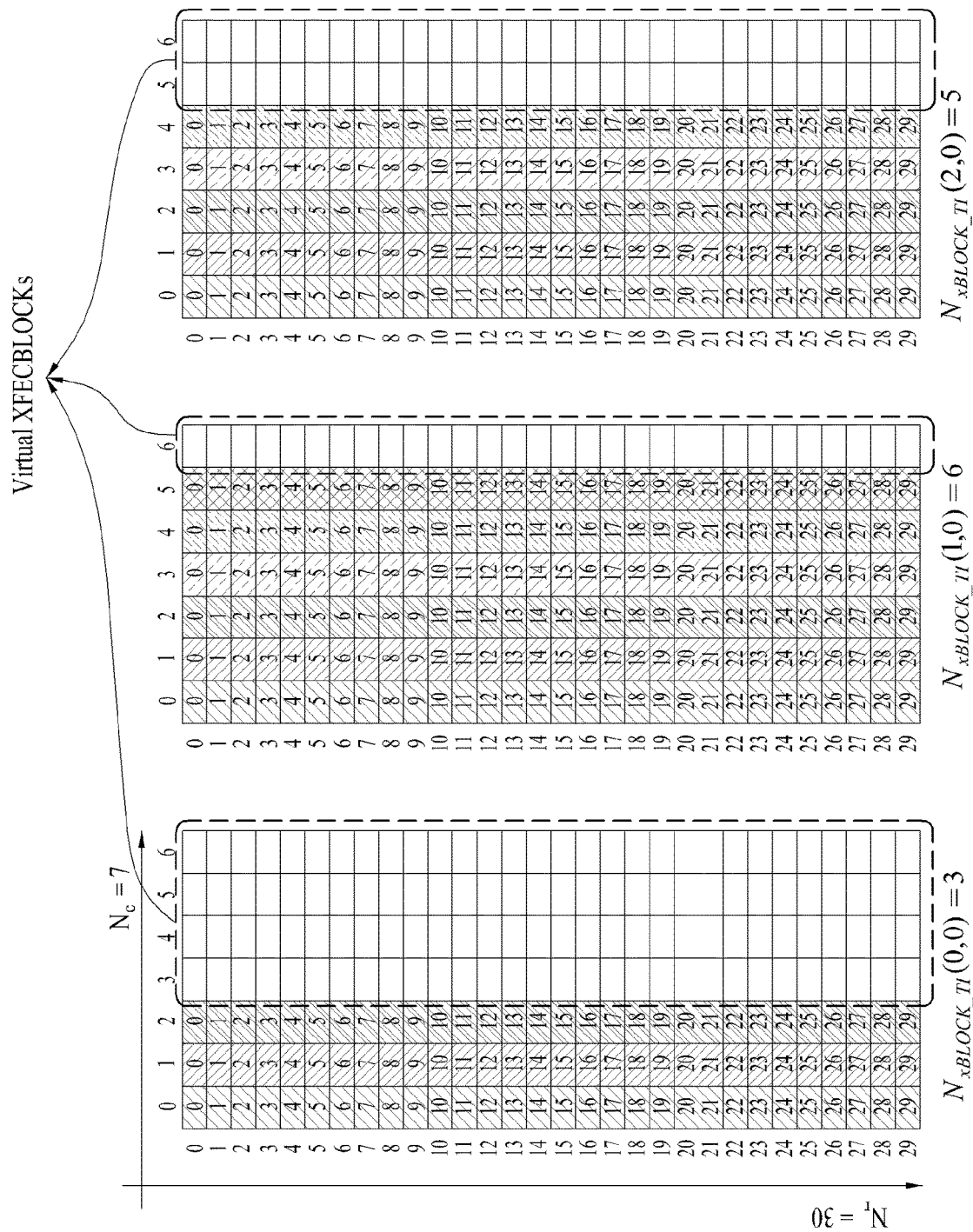
FIG. 27 illustrates an operation of a twisted row-column block interleaver according to another embodiment of the present invention.

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s)=N_r$ will be less than or equal to $N'_{xBLOCK\_TI\_MAX}$. Thus, in order to achieve a single-memory deinterleaving at the receiver side, regardless of $N_{xBLOCK\_TI}(n,s)$, the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

[Expression 11]

$$p = 0;$$
$$\text{for } i = 0; i < N_{cells}N'_{xBLOCK\_TI\_MAX}; i = i+1$$
$$\{\text{GENERATE } (R_{n,s,i}, C_{n,s,i});$$
$$V_i = N_r C_{n,s,j} + R_{n,s,j}$$
$$\quad \text{if } V_i < N_{cells}N_{xBLOCK\_TI}(n, s)$$
$$\quad \{$$
$$\quad\quad Z_{n,s,p} = V_i; p = p+1;$$
$$\quad \}$$
$$\}$$

The number of TI groups is set to 3. The option of time interleaver is signaled in the PLS2-STAT data by DP_TI_TYPE='0', DP_FRAME_INTERVAL='1', and DP_TI_LENGTH='1', i.e., $N_{TI}=1$, $I_{JUMP}=1$, and $P_I=1$. The number of XFECBLOCKs, each of which has $N_{cells}=30$ cells, per TI group is signaled in the PLS2-DYN data by $N_{xBLOCK\_TI}(0,0)=3$, $N_{xBLOCK\_TI}(1,0)=6$, and $N_{xBLOCK\_TI}(2,0)=5$, respectively. The maximum number of XFECBLOCK is signaled in the PLS2-STAT data by $N_{xBLOCK\_Group\_MAX}$, which leads to $\lfloor N_{xBLOCK\_Group\_MAX}/N_{TI} \rfloor = N_{xBLOCK\_TI\_MAX} = 6$.

Figure 28:
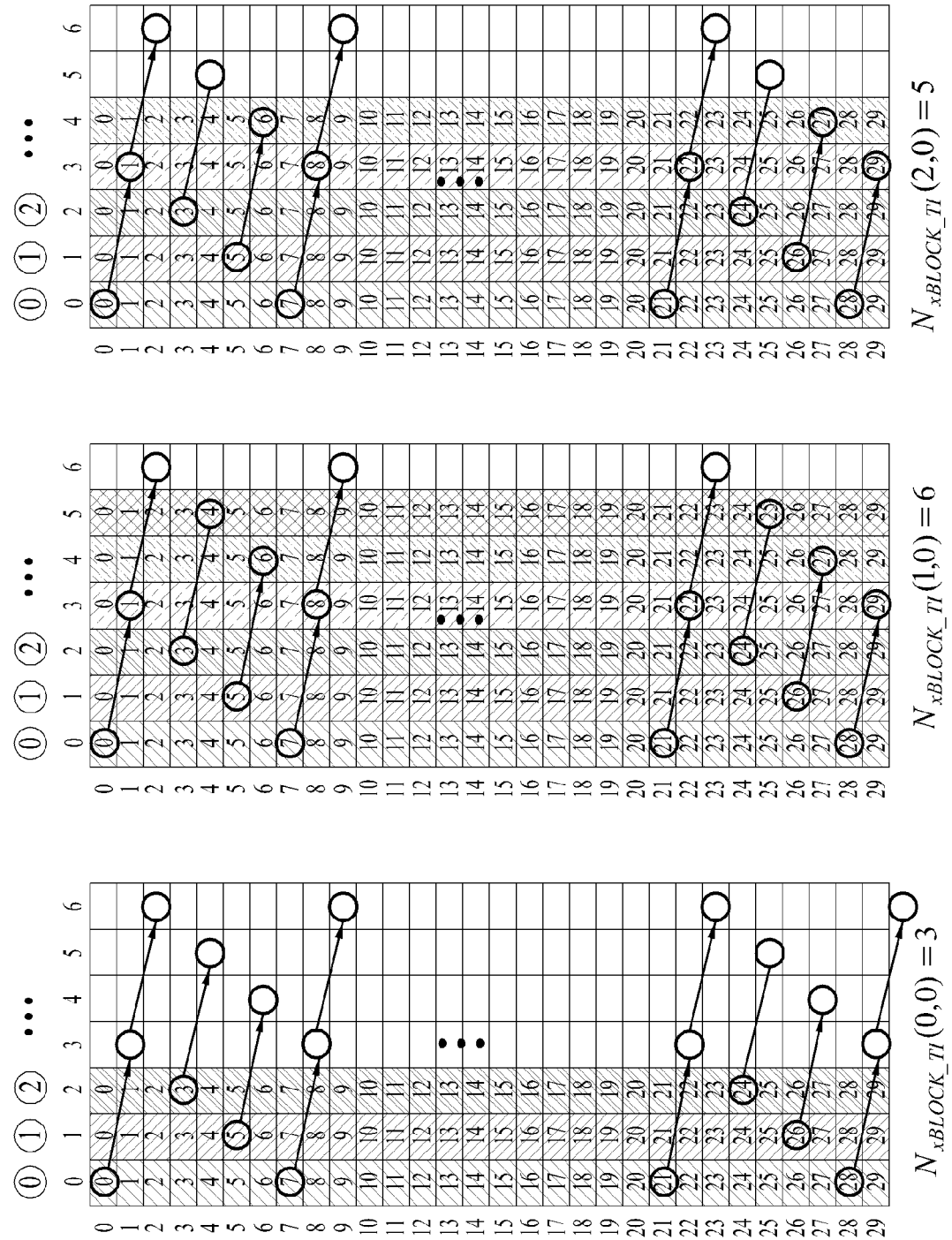
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N'_{xBLOCK\_TI\_MAX}=7$ and $S_{shift}=(7-1)/2=3$. Note that in the reading process shown as pseudocode above, if $V_i \geq N_{cells} N_{xBLOCK\_TI}(n,s)$, the value of $V_i$ is skipped and the next calculated value of $V_i$ is used.

FIG. 29 illustrates interleaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and $S_{shift}=3$.

Hereinafter, a frequency interleaving procedure according to an embodiment of the present invention will be described.

The purpose of the frequency interleaver 7020 in the present invention, which operates on a single OFDM symbol, is to provide frequency diversity by randomly interleaving data cells received from the cell mapper 7010. In order to get maximum interleaving gain in a single signal frame (or frame), a different interleaving-seed is used for every OFDM symbol pair comprised of two sequential OFDM symbols.

The frequency interleaver 7020 may interleave cells in a transport block as a unit of a signal frame to acquire additional diversity gain. According to an embodiment of the present invention, the frequency interleaver 7020 may apply different interleaving seeds to at least one OFDM symbol or apply different interleaving seeds to a frame including a plurality of OFDM symbols.

In the present invention, the aforementioned frequency interleaving method may be referred to as random frequency interleaving (random FI).

In addition, according to an embodiment of the present invention, the random FI may be applied to a super-frame structure including a plurality of signal frames with a plurality of OFDM symbols.

As described above, a broadcast signal transmitting apparatus or a frequency interleaver 7020 therein according to an embodiment of the present invention may apply different interleaving seeds (or interleaving patterns) for at least one OFDM symbol, that is, for each OFDM symbol or each of pair-wise OFDM symbols (or each OFDM symbol pair) and perform the random FI, thereby acquiring frequency diversity. In addition, the frequency interleaver 7020 according to an embodiment of the present invention may apply different interleaving seed for each respective signal frame and perform the random FI, thereby acquiring additional frequency diversity.

Accordingly, a broadcast transmitting apparatus or a frequency interleaver 7020 according to an embodiment of the present invention may have a ping-pong frequency interleaver 7020 structure that perform frequency interleaving in units of one pair of consecutive OFDM symbols (pair-wise OFDM symbol) using two memory banks. Hereinafter, an interleaving operation of the frequency interleaver 7020 according to an embodiment of the present invention may be referred to as pair-wise symbol FI (or pair-wise FI) or ping-pong FI (ping-pong interleaving). The aforementioned interleaving operation corresponds to an embodiment of the random FI, which can be changed according to a designer's intention.

Even-indexed pair-wise OFDM symbols and odd pair-wise OFDM symbols may be intermittently interleaved via different FI memory banks. In addition, the frequency interleaver 7020 according to an embodiment of the present invention may simultaneously perform reading and writing operations on one pair of consecutive OFDM symbols input to each memory bank using an arbitrary interleaving seed. A detailed operation will be described below.

In addition, according to an embodiment of the present invention, as a logical frequency interleaving operation for logically and effectively interleaving all OFDM symbols in a super-frame, an interleaving seed is basically changed in units of one pair of OFDM symbols.

In this case, according to an embodiment of the present invention, the interleaving seed may be generated by an arbitrary random generator or a random generator formed by a combination of various random generators. In addition, according to an embodiment of the present invention, various interleaving seeds may be generated by cyclic-shifting one main interleaving seed in order to effectively change an interleaving seed. In this case, a cyclic-shifting rule may be hierarchically defined in consideration of OFDM symbol and signal frame units. That is different interleaving seed to be used every OFDM symbol pair can be generated by cyclic-shifting one interleaving seed (main interleaving seed). Therefore, the symbol offset according to the present invention may be referred as a cyclic shifting value. This can be changed according to a designer's intention, which will be described in detail.

A broadcast signal receiving apparatus according to an embodiment of the present invention may perform an inverse procedure of the aforementioned random frequency interleaving. In this case, the broadcast signal receiving apparatus or a frequency deinterleaver thereof according to an embodiment of the present invention may not use a ping-pong structure using a double-memory and may perform deinterleaving on consecutive input OFDM symbols via a single-memory. Accordingly, memory use efficiency can be enhanced. In addition, reading and writing operations are still required, which is called as a single-memory deinterleaving operation. Such a deinterleaving scheme is very efficient in a memory-use aspect.

Figure 30:
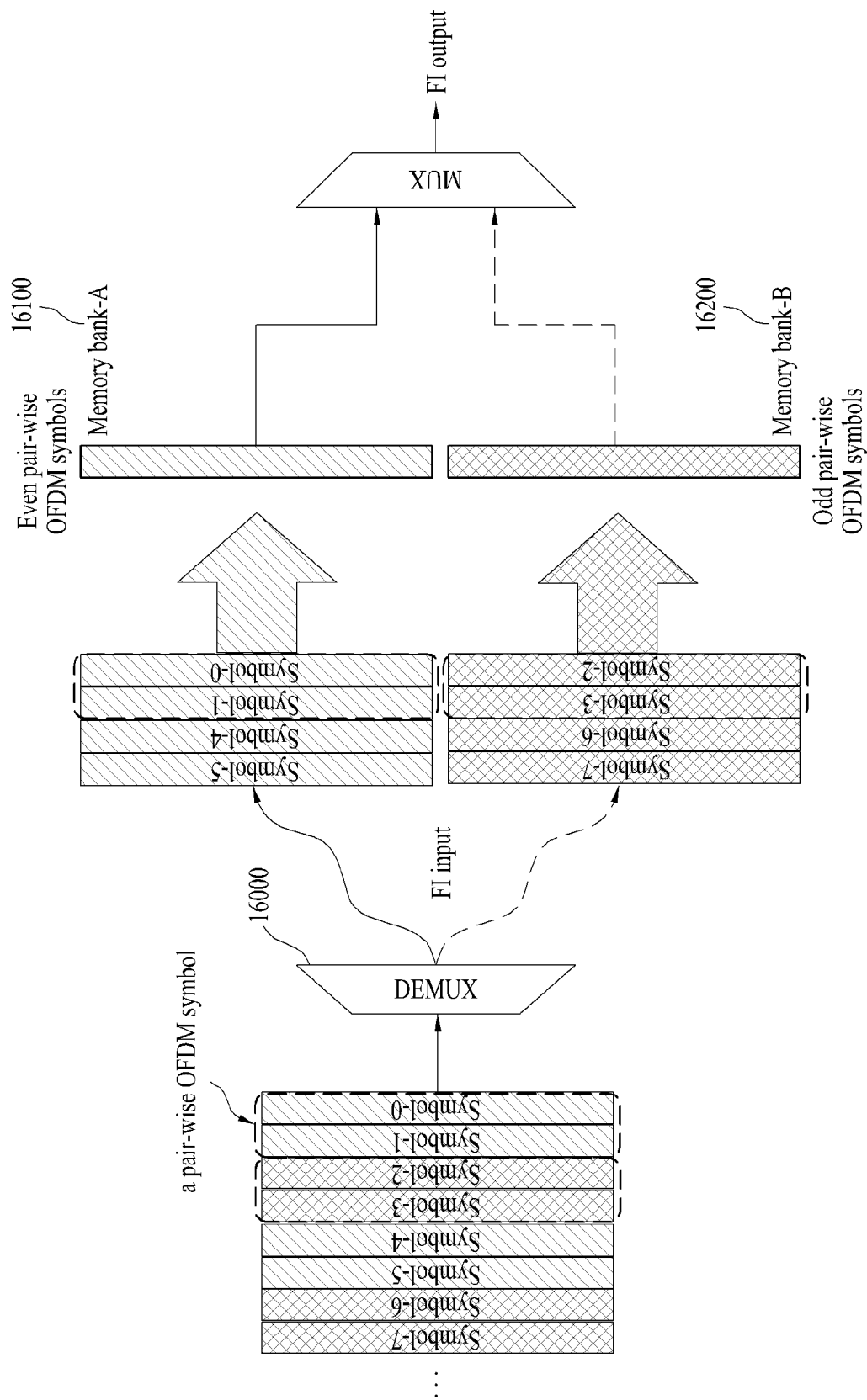
FIG. 30 is a view illustrating an operation of a frequency interleaver 7020 according to an embodiment of the present invention.

FIG. 30 is a view illustrating an operation of a frequency interleaver 7020 according to an embodiment of the present invention.

FIG. 30 illustrates the basic operation of the frequency interleaver 7020 using two memory banks at the transmitter, which enables a single-memory deinterleaving at the receiver.

As described above, the frequency interleaver 7020 according to an embodiment of the present invention may perform a ping-pong interleaving operation.

Typically, ping-pong interleaving operation is accomplished by means of two memory banks. In the proposed FI operation, two memory banks are for each pair-wise OFDM symbol.

The maximum memory ROM (Read Only Memory) size for interleaving is approximately two times to a maximum FFT size. At a transmit side, the ROM size increase is rather less critical, compared to a receiver side.

As described above, odd pair-wise OFDM symbols and odd pair-wise OFDM symbols may be intermittently interleaved via different FI memory-banks. That is, the second (odd-indexed) pair-wise OFDM symbol is interleaved in the second bank, while the first (even-indexed) pair-wise OFDM symbol is interleaved in the first bank and so on. For each pair-wise OFDM symbol, a single interleaving seed is used. Based on the interleaving seed and reading-writing (or writing-reading) operation, two OFDM symbols are sequentially interleaved.

Reading-writing operations according to an embodiment of the present invention are simultaneously accomplished without a collision. Writing-reading operations according to an embodiment of the present invention are simultaneously accomplished without a collision.

FIG. 30 illustrates an operation of the aforementioned frequency interleaver 7020. As illustrated in FIG. 30, the frequency interleaver 7020 may include a demux 16000, two memory banks, a memory bank-A 16100 and a memory bank-B 16200, and a demux 16300.

First, the frequency interleaver 7020 according to an embodiment of the present invention may perform a demultiplexing processing to the input sequential OFDM symbols for the pair-wise OFDM symbol FI. Then the frequency interleaver 7020 according to an embodiment of the present invention performs a reading-writing FI operation in each memory bank A and B with a single interleaving seed. As shown in FIG. 30, two memory banks are used for each OFDM symbol pair. Operationally, the first (even-indexed) OFDM symbol pair is interleaved in memory bank-A, while the second (odd-indexed) OFDM symbol pair is interleaved in memory bank-B and so on, alternating between A and B.

Then the frequency interleaver 7020 according to an embodiment of the present invention may perform a multiplexing processing to ping-pong FI outputs for sequential OFDM symbol transmission.

Figure 31:
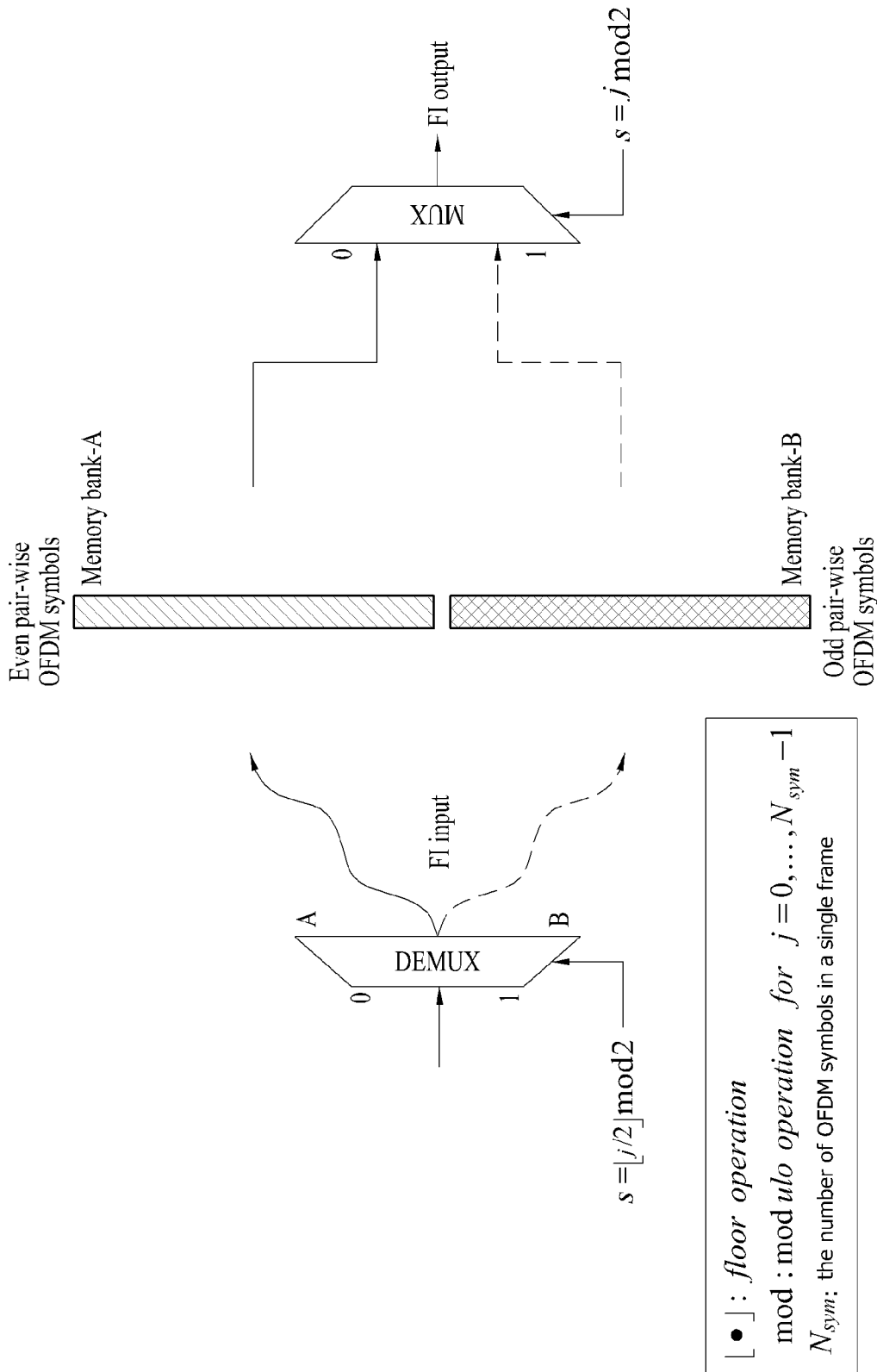
FIG. 31 illustrates a basic switch model for MUX and DEMUX procedures according to an embodiment of the present invention.

FIG. 31 illustrates a basic switch model for MUX and DEMUX procedures according to an embodiment of the present invention.

FIG. 31 illustrates simple operations the DEMUX and MUX applied input and output of memory-bank-A/-B in the aforementioned ping-pong FI structure.

The DEMUX and MUX may control the input sequential OFDM symbols to be interleaved, and the output OFDM symbol pair to be transmitted, respectively. Different interleaving seeds are used for every OFDM symbol pair.

Hereinafter, reading-writing operations of frequency interleaving according to an embodiment of the present invention will be described.

A frequency interleaver 7020 according to an embodiment of the present invention may select or use a single interleaving see and use the interleaving seed in writing and reading operations for the first and second OFDM symbols, respectively. That is, the frequency interleaver 7020 according to an embodiment of the present invention may use the one selected arbitrary interleaving seed in an operation of writing a first OFDM symbol of a pair-wise OFDM symbol, and use a second OFDM symbol in a reading operation, thereby achieving effective interleaving. Virtually, it seems like that two different interleaving seeds are applied to two OFDM symbols, respectively.

Details of the reading-writing operation according to an embodiment of the present invention are as follows:

For the first OFDM symbol, the frequency interleaver 7020 according to an embodiment of the present invention may perform random writing into memory (according to an interleaving seed) and perform then linear reading. For the second OFDM symbol, the frequency interleaver 7020 according to an embodiment of the present invention may perform linear writing into memory, (affected by the linear reading operation for the first OFDM symbol), simultaneously. Also, the frequency interleaver 7020 according to an embodiment of the present invention may perform then random reading (according to an interleaving seed).

As described above, the broadcast signal receiving apparatus according to an embodiment of the present invention may continuously transmit a plurality of frames on the time axis. In the present invention, a set of signal frames transmitted for a predetermined period of time may be referred to as a super-frame. Accordingly, one super-frame may include N signal frames and each signal frame may include a plurality of OFDM symbols.

Figure 32:
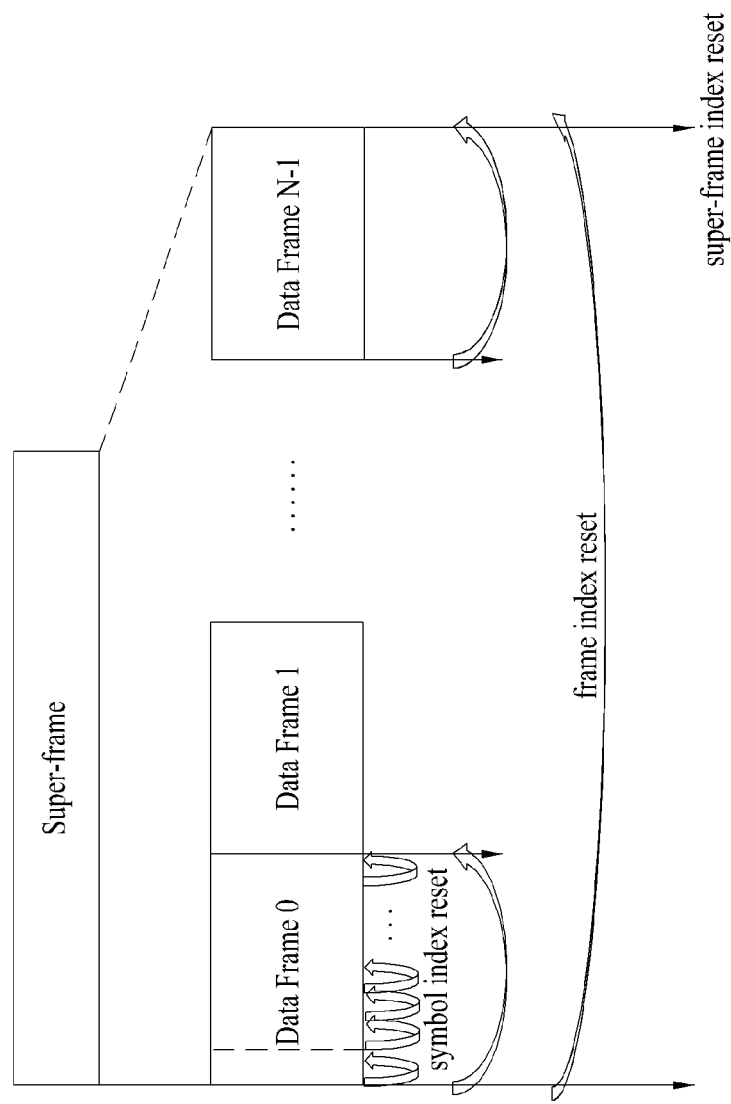
FIG. 32 is a view illustrating a concept of frequency interleaving applied to a single super-frame according to an embodiment of the present invention.

FIG. 32 is a view illustrating a concept of frequency interleaving applied to a single super-frame according to an embodiment of the present invention.

A frequency interleaver 7020 according to an embodiment of the present invention may change interleaving seed every pair-wise OFDM symbol in a single signal frame (symbol index reset) and change interleaving seed to be used in a single signal frame by every frame (frame index reset). Consequently, the frequency interleaver 7020 according to an embodiment of the present invention may change interleaving seed in a super-frame (super-frame index reset).

Accordingly, the frequency interleaver 7020 according to an embodiment of the present may logically and effectively interleave all OFDM symbols in a super-frame.

FIG. 33 is a view illustrating logical operation mechanism of frequency interleaving applied to a single super-frame according to an embodiment of the present invention.

FIG. 33 illustrates logical operation mechanism of a frequency interleaver 7020 and related parameter thereof, for effectively changing interleaving seeds to be used the one super-frame described with reference to FIG. 32.

As described above, in the present invention, various interleaving seeds may be effectively generated by cyclic-shifting one main interleaving seed by as much as an arbitrary offset. As illustrated in FIG. 33, according to an embodiment of the present invention, the aforementioned offset may be differently generated for each frame and each of pair-wise OFDM symbol to generate different interleaving seeds. Hereinafter, the logical operation mechanism will be described.

As illustrated in a lower block of FIG. 33, a frequency interleaver 7020 according to an embodiment of the present invention may randomly generate a frame offset for each signal frame using an input frame index. The frame offset according to an embodiment of the present invention may be generated by a frame offset generator included in a frequency interleaver 7020. In this case, when super-frame index is reset, a frame offset applied to each frame is generated for each signal frame in each super-frame identified according to a super-frame index.

As illustrated in a middle block of FIG. 33, a frequency interleaver 7020 according to an embodiment of the present invention may randomly generate a symbol offset to be applied to each OFDM symbol included in each signal frame using an input symbol index. The symbol offset according to an embodiment of the present invention may be generated by a symbol offset generator included in a frequency interleaver 7020. In this case, when a frame index is reset, a symbol offset for each symbol is generated for symbols in each signal frame identified according to a frame index. In addition, the frequency interleaver 7020 according to an embodiment of the present invention may generate various interleaving seeds by cyclic-shifting a main interleaving seed on each OFDM symbol by as much as a symbol offset.

Then, as illustrated in an upper block of FIG. 33, a frequency interleaver 7020 according to an embodiment of the present invention may perform random FI on cells included in each OFDM symbol using an input cell index. A random FI parameter according to an embodiment of the present invention may be generated by a random FI generator included in the frequency interleaver 7020.

FIG. 34 illustrates expressions of logical operation mechanism of frequency interleaving applied to a single super-frame according to an embodiment of the present invention.

In detail, FIG. 34 illustrates a correlation of the aforementioned frame offset parameter, symbol offset, parameter, and random FI applied to a cell included in each OFDM. As illustrated in FIG. 34, an offset to be used in an OFDM symbol may be generated through a hierarchical structure of the aforementioned frame offset generator and the aforementioned symbol offset generator. In this case, the frame offset generator and the symbol offset generator may be designed using an arbitrary random generator.

Figure 35:
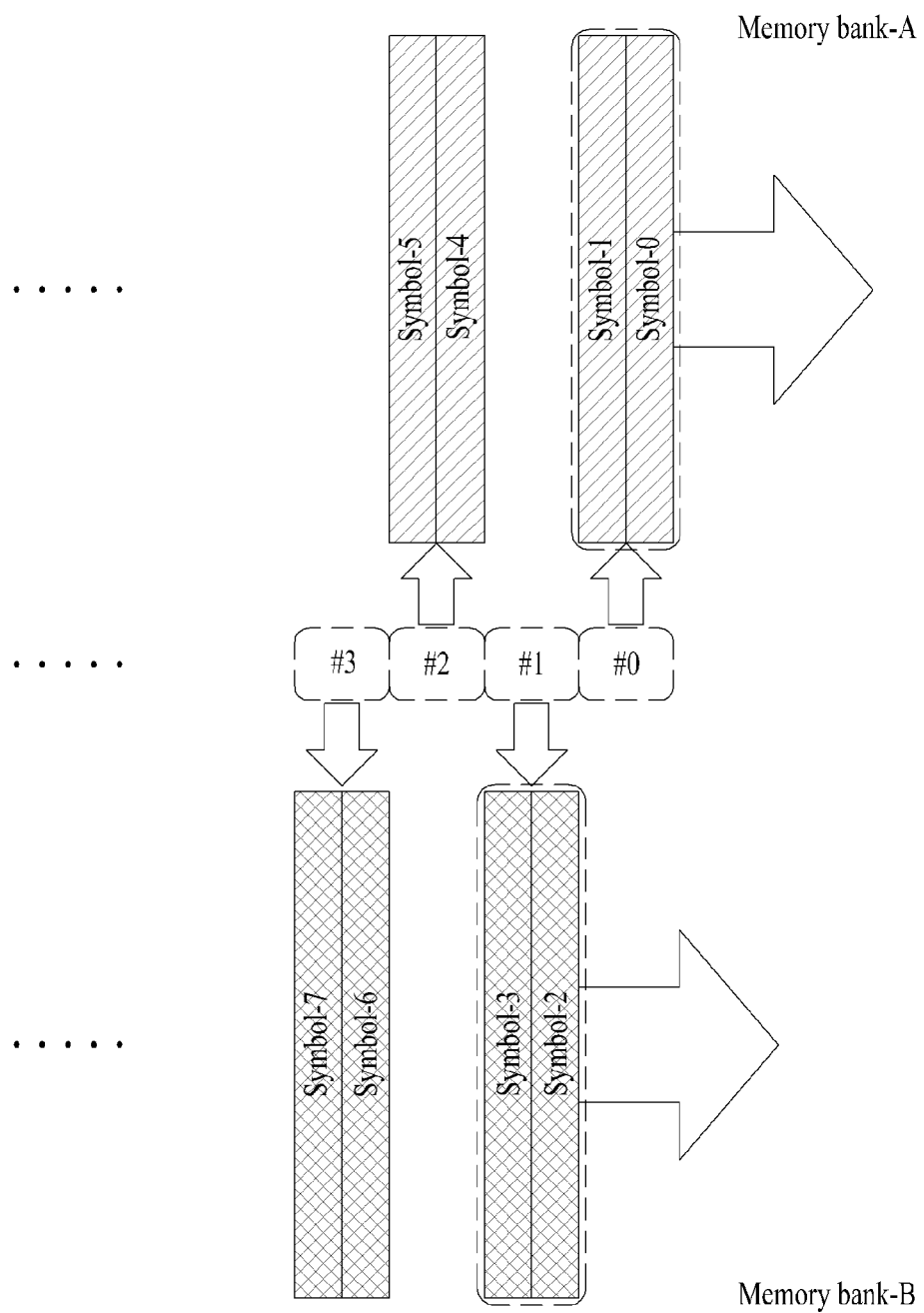
FIG. 35 illustrates an operation of a memory bank according to an embodiment of the present invention.

FIG. 35 illustrates an operation of a memory bank according to an embodiment of the present invention.

As described above, two memory banks according to an embodiment of the present invention may apply an arbitrary interleaving seed generated via the aforementioned procedure to each pair-wise OFDM symbol. In addition, each memory bank may change interleaving seed every pair-wise OFDM symbol.

Figure 36:
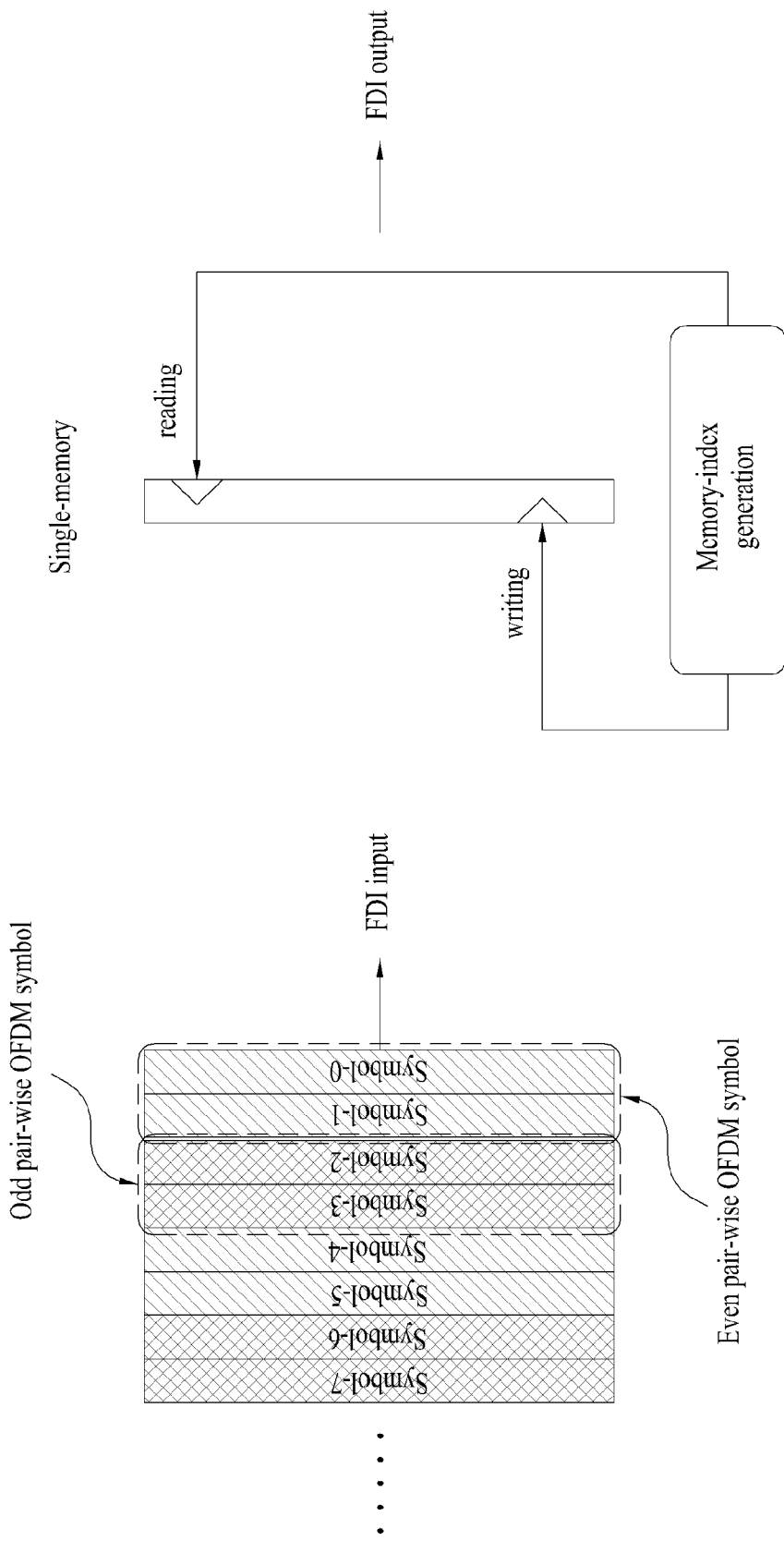
FIG. 36 illustrates a frequency deinterleaving procedure according to an embodiment of the present invention.

FIG. 36 illustrates a frequency deinterleaving procedure according to an embodiment of the present invention.

A broadcast signal receiving apparatus according to an embodiment of the present invention may perform an inverse procedure of the aforementioned frequency interleaving procedure. FIG. 36 illustrates single-memory deinterleaving (FDI) for input sequential OFDM symbols.

Basically, frequency deinterleaving operation follows to the inverse processing of frequency interleaving operation. For a single-memory use, no further processing is required.

When pair-wise OFDM symbols illustrated in a left portion of FIG. 36 are input, the broadcast signal receiving apparatus according to an embodiment of the present invention may perform the aforementioned reading and writing operation using a single memory, as illustrated in a right portion of FIG. 36. In this case, the broadcast signal receiving apparatus according to an embodiment of the present invention may generate a memory-index and perform frequency deinterleaving (reading and writing) corresponding to an inverse procedure of frequency interleaving (writing and reading) performed by a broadcast signal transmitting apparatus. The benefit is inherently caused by the proposed pair-wise ping-pong interleaving architecture.

The following mathematical formulae show the aforementioned reading-writing operation.

for $j=0, 1, \ldots, N_{sym}$ and $k=0, 1, \ldots, N_{data}$ $$F_j(C_j(k))=X_j(k) \qquad \text{[Expression 12]}$$

where $C_j(k)$ is a random seed generated by a random generator, in the ith pair-wise OFDM symbol $F_j=[F_j(0), F_j(1), \ldots, F_j(N_{data}-2), F_j(N_{data}-1)]$, where $N_{data}$ is the number of data cells $X_j=[X_j(0), X_j(1), \ldots, X_j(N_{data}-2), X_j(N_{data}-1)]$ for $j=0, 1, \ldots, N_{sym}$ and $k=0, 1, \ldots, N_{data}$ $$F_j(k)=X_j(C_j(k)) \qquad \text{[Expression 13]}$$

where $C_j(k)$ is the same random seed used for the first symbol $F_j=[F_j(0), F_j(1), \ldots, F_j(N_{data}-2), F_j(N_{data}-1)]$, where $N_{data}$ is the number of data cells $X_j=[X_j(0), X_j(1), \ldots, X_j(N_{data}-2), X_j(N_{data}-1)]$ The above expression 12 is for the first OFDM symbol, i.e., (j mod 2)=0 of the ith pair-wise OFDM symbol. The above expression 13 is for the second OFDM symbol, i.e., (j mod 2)=1 of the ith pair-wise OFDM symbol. Fj denotes an interleaved vector of the jth OFDM symbol (vector) and Xj denotes an input vector of the jth OFDM symbol (vector). As shown in the expressions, the reading-writing operation according to an embodiment of the present invention may be performed by applying one random seed generated by an arbitrary random generator to a pair-wise OFDM symbol.

Figure 37:
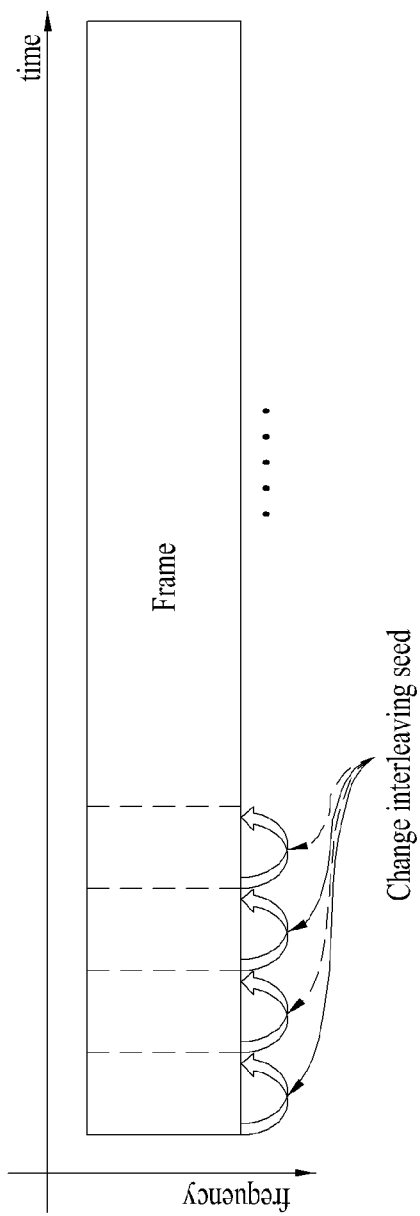
FIG. 37 is a view illustrates concept of frequency interleaving applied to a single signal frame according to an embodiment of the present invention.

FIG. 37 is a view illustrates concept of frequency interleaving applied to a single signal frame according to an embodiment of the present invention.

As described above, a frequency interleaver 7020 according to an embodiment of the present invention may change interleaving seed every pair-wise OFDM symbol in a single frame. Details thereof will be described below.

Figure 38:
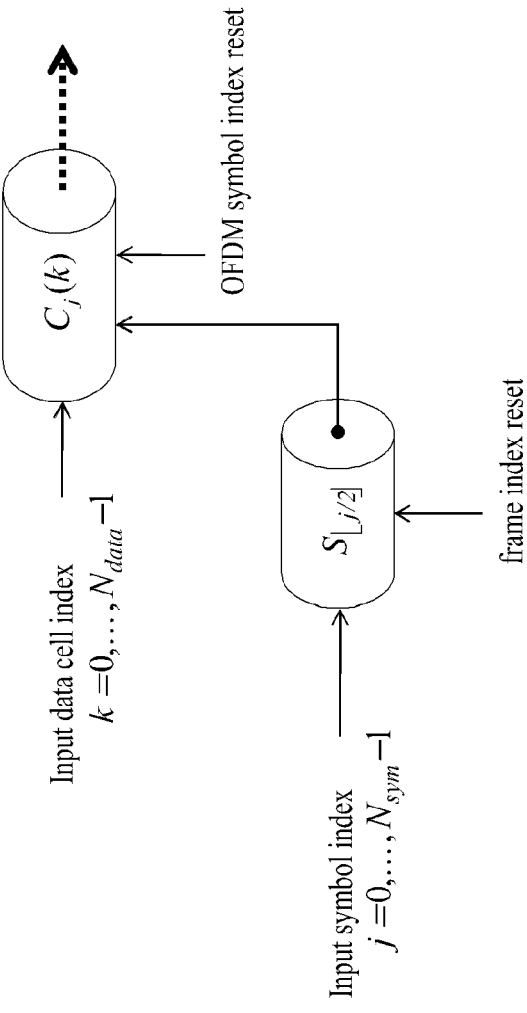
FIG. 38 is a view illustrating logical operation mechanism of frequency interleaving applied to a single signal frame according to an embodiment of the present invention.

FIG. 38 is a view illustrating logical operation mechanism of frequency interleaving applied to a single signal frame according to an embodiment of the present invention.

FIG. 38 illustrates logical operation mechanism of a frequency interleaver 7020 and related parameter thereof, for effectively changing interleaving seeds to be used the one single signal frame described with reference to FIG. 37.

As described above, in the present invention, various interleaving seed can be effectively generated by cyclic-shifting one main interleaving seed by as much as an arbitrary symbol offset. As illustrated in FIG. 38, according to an embodiment of the present invention, the aforementioned symbol offset may be differently generated for each pair-wise OFDM symbol to generate different interleaving seeds. In this case, the symbol offset may be differently generated for each pair-wise OFDM symbol using an arbitrary random symbol offset generator.

Hereinafter, the logical operation mechanism will be described.

As illustrated in a lower block of FIG. 38, a frequency interleaver 7020 according to an embodiment of the present invention may randomly generate a symbol offset to be applied to each OFDM symbol included in each signal frame using an input symbol index. The symbol offset (or a random symbol offset) according to an embodiment of the present invention may be generated by an arbitrary random symbol offset generator (or a symbol offset generator) included in a frequency interleaver 7020. In this case, when a frame index is reset, the symbol offset for each symbol is generated for symbols in each signal frame identified according to a frame index. In addition, the frequency interleaver 7020 according to an embodiment of the present invention may generate various interleaving seeds by cyclic-shifting a main interleaving seed for each OFDM symbol by as much as the generated symbol offset.

Then, as illustrated in an upper block of FIG. 38, a frequency interleaver 7020 according to an embodiment of the present invention may perform random FI on cells included in each OFDM symbol using an input cell index. A random FI parameter according to an embodiment of the present invention may be generated by a random FI generator included in a frequency interleaver 7020.

Figure 39:
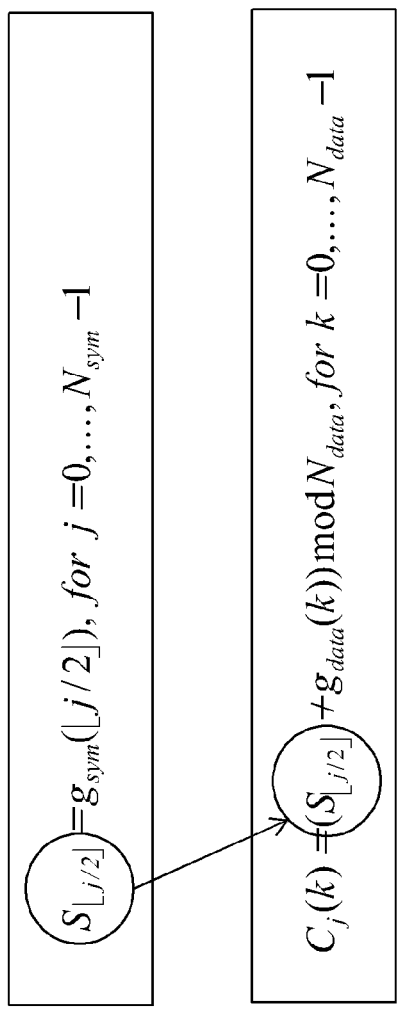
FIG. 39 illustrates expressions of logical operation mechanism of frequency interleaving applied to a single signal frame according to an embodiment of the present invention.

FIG. 39 illustrates expressions of logical operation mechanism of frequency interleaving applied to a single signal frame according to an embodiment of the present invention.

FIG. 39 illustrates a correlation of the aforementioned symbol offset parameter and a parameter of random FI applied to a cell included in each OFDM. As illustrated in FIG. 39, an offset to be used in each OFDM symbol may be generated through a hierarchical structure of the aforementioned symbol offset generator. In this ca se, the symbol offset generator may be designed using an arbitrary random generator.

The following expression shows a change procedure of interleaving seed in each of the aforementioned memory banks.

for $j=0, 1, \ldots, N_{sym}$ and for $k=0, 1, \ldots, N_{data}$, $$F_j(C_j(k))=X_j(k) \quad \text{[Expression 14]}$$

where $C_j(k)=(T(k)+S_{\lfloor j/2 \rfloor}) \bmod N_{data}$

T(k) is a main interleaving seed generated by a random generator, used in the main FI $S_{\lfloor j/2 \rfloor}$ is a random symbol offset generated by a random generator, used in the jth pair-wise OFDM symbol for $j=0, 1, \ldots, N_{sym}$ and $k=0, 1, \ldots, N_{data}$ $$F_j(k)=X_j(C_j(k)) \quad \text{[Expression 15]}$$

where $C_j(k)$ is the same random seed used for the first symbol

The above expression 14 is for the first OFDM symbol, i.e., (j mod 2)=0 of the ith pair-wise OFDM symbol and the above expression 15 is for the second OFDM symbol, i.e., (j mod 2)=1 of the ith pair-wise OFDM symbol.

Figure 40:
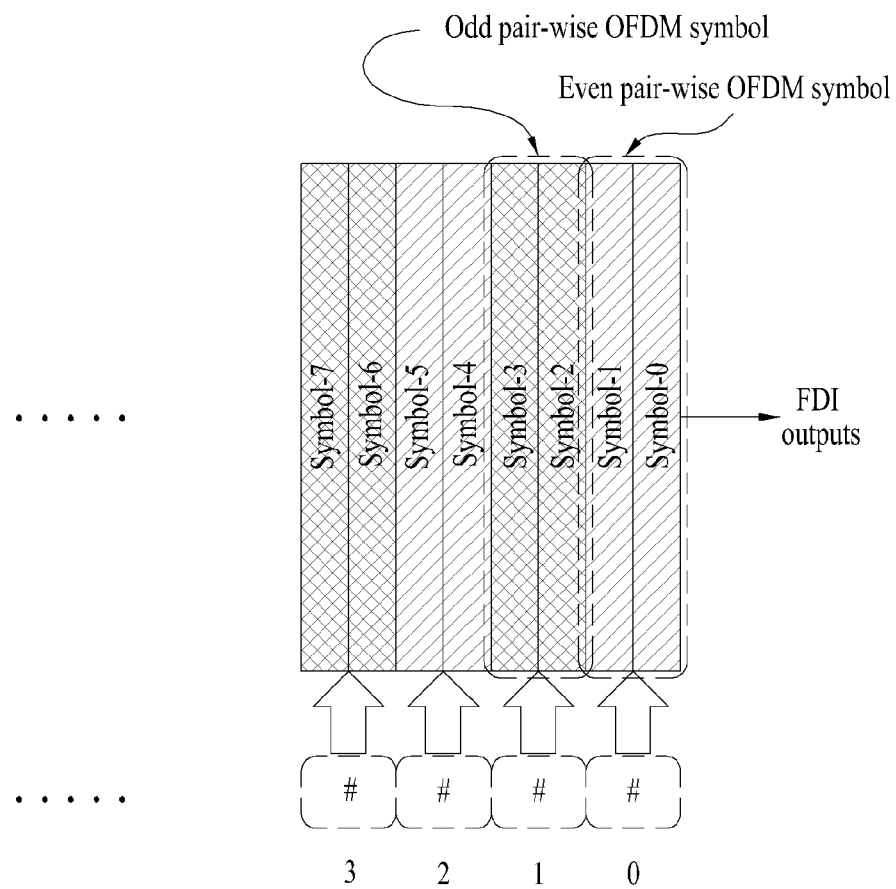
FIG. 40 is a view illustrating single-memory deinterleaving for input sequential OFDM symbols.

FIG. 40 is a view illustrating single-memory deinterleaving for input sequential OFDM symbols.

FIG. 40 is a view illustrating concept of a broadcast signal receiving apparatus or a frequency deinterleaver thereof, for applying interleaving seed used in a broadcast signal transmitting apparatus (or a frequency interleaver 7020) to each pair-wise OFDM symbol to perform deinterleaving.

As described above, the broadcast signal receiving apparatus according to an embodiment of the present invention may perform an inverse procedure of the aforementioned frequency interleaving procedure using a single memory. FIG. 40 illustrates an operation of the broadcast signal receiving apparatus for processing single-memory deinterleaving (FDI) for input sequential OFDM symbols.

The broadcast signal receiving apparatus according to an embodiment of the present invention may perform an inverse procedure of the aforementioned operation of a frequency interleaver 7020. Thus, deinterleaving seeds correspond to the aforementioned interleaving seed.

As described above, an OFDM generation block 1030 may perform FFT transformation on input data. According to an embodiment of the present invention, an FFT size may be 4K, 8K, 16K, 32K, or the like, and an FFT mode indicating the FFT size may be defined. The aforementioned FFT mode may be signaled via a preamble (or a preamble signal, a preamble symbol) in a signal frame or signal via PLS-pre or PLS-prost. The FFT size may be changed according to a designer's intention.

A frequency interleaver 7020 or an interleaving seed generator included therein according to an embodiment of the present invention may perform an operation according to the aforementioned FFT mode. In addition, an interleaving seed generator according to an embodiment of the present invention may include a random seed generator or a quasi-random interleaving seed generator. The quasi-random interleaving seed generator may be an embodiment of the random seed generator. The random seed generator and the quasi-random interleaving seed generator may be referred as an interleaving address generator and it may be changed by the designer's intention. Also, both of the random seed generator and the quasi-random interleaving seed generator may include a first generator and a second generator. The first generator is for generating a main interleaving seed generator and the second generator is for generating a symbol offset. The name of the first generator and the second generator can be changed according to the designer's indention. Hereinafter, an operation of the interleaving seed generator according to each FFT mode is divided into an operation of the random seed generator and an operation of the quasi-random interleaving seed generator and will be described.

Hereinafter, the random seed generator for a 4K FFT mode will be described.

As described above, the random seed generator according to an embodiment of the present invention may apply different interleaving seeds to respective OFDM symbols to acquire frequency diversity. Logical composition of the random seed generator may include a random main-seed generator (or a random main interleaving-seed generator) $(C_j(K))$ for interleaving cells in a single OFDM symbol and a random symbol-offset generator $(S_{\lfloor j/2 \rfloor})$ for changing a symbol offset.

The random main-seed generator may generate the aforementioned random FI parameter. That is, the random main-seed generator may generate seed for interleaving cells in a single OFDM symbol.

The random main-seed generator according to an embodiment of the present invention may include a spreader and a randomizer and perform rendering a full randomness in frequency-domain. According to an embodiment of the present invention, in the case of 4K FFT mode, the random main-seed generator may include a 1 bit spreader and an 11 bit-randomizer. The random main-seed generator or the randomizer according to an embodiment of the present invention may be referred as a main-PRBS (Pseudo Random Bit Stream) generator which is defined based on the 11-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 4K FFT mode, a (12-k) bit-randomizer may be used. The (X-k)

bits-randomizer according to an embodiment of the present invention may be referred as a sub-PRBS generator which is defined based on (12-k) bit binary word sequence (or binary sequence).

The aforementioned spreader and randomizer may be used to achieve spreading and random effects during generation of the interleaving seed.

Figure 41:
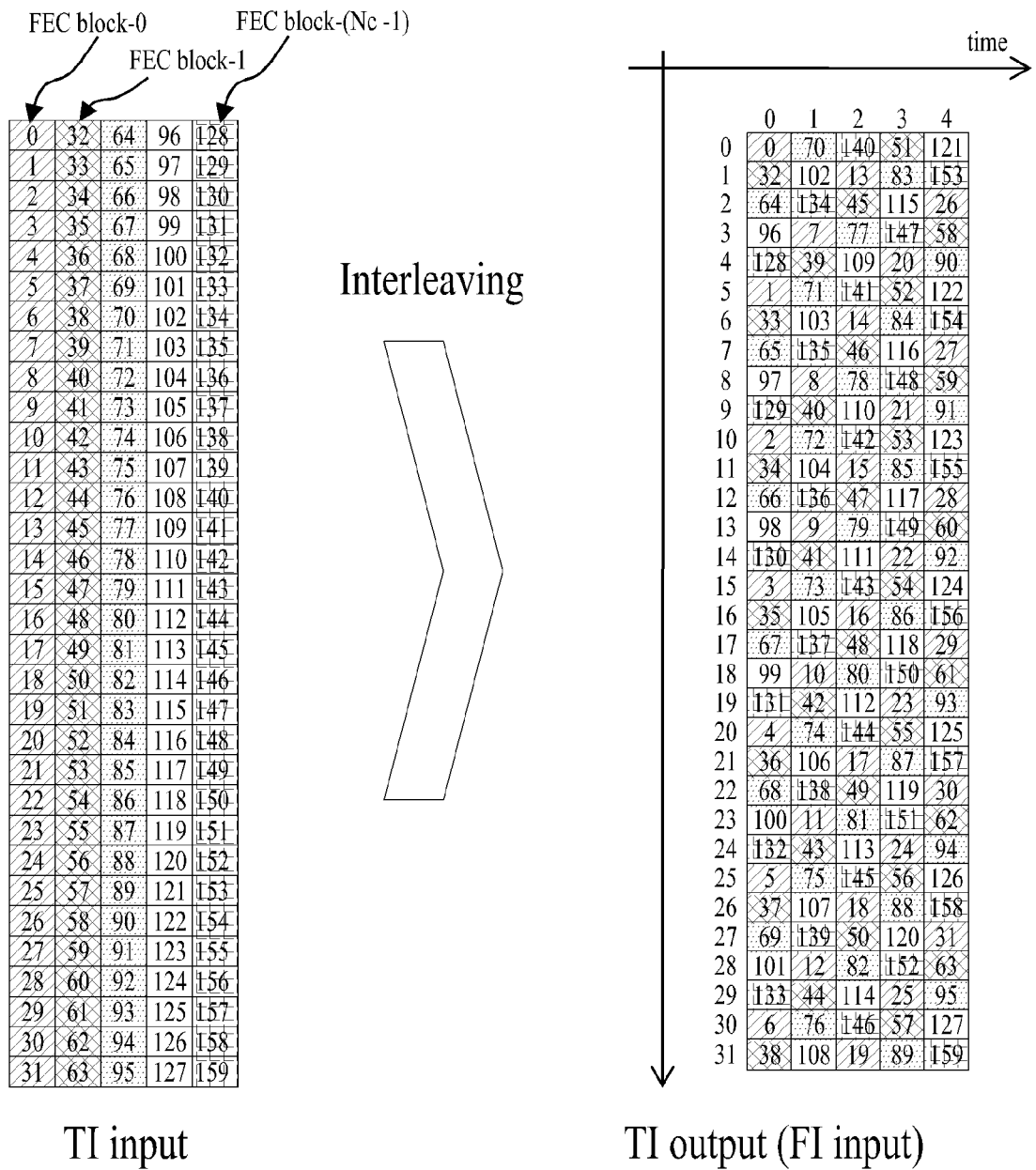
FIG. 41 is a view illustrating an output signal of a time interleaver according to an embodiment of the present invention.

FIG. 41 is a view illustrating an output signal of a time interleaver according to an embodiment of the present invention.

As above described, the time interleaver according to an embodiment of the present invention may perform a column-wise writing operation and a row-wise reading operation on one FEC block, as illustrated in a left portion of FIG. 41. A right block of FIG. 41 indicates an output signal of the time interleaver and the output signal is input to a frequency interleaver 7020 according to an embodiment of the present invention.

Thus, one FEC block is periodically spread in each FI block. Accordingly, in order to increase the robustness of a channel with strong periodic properties, the aforementioned random interleaving seed generator may be used.

Figure 42:
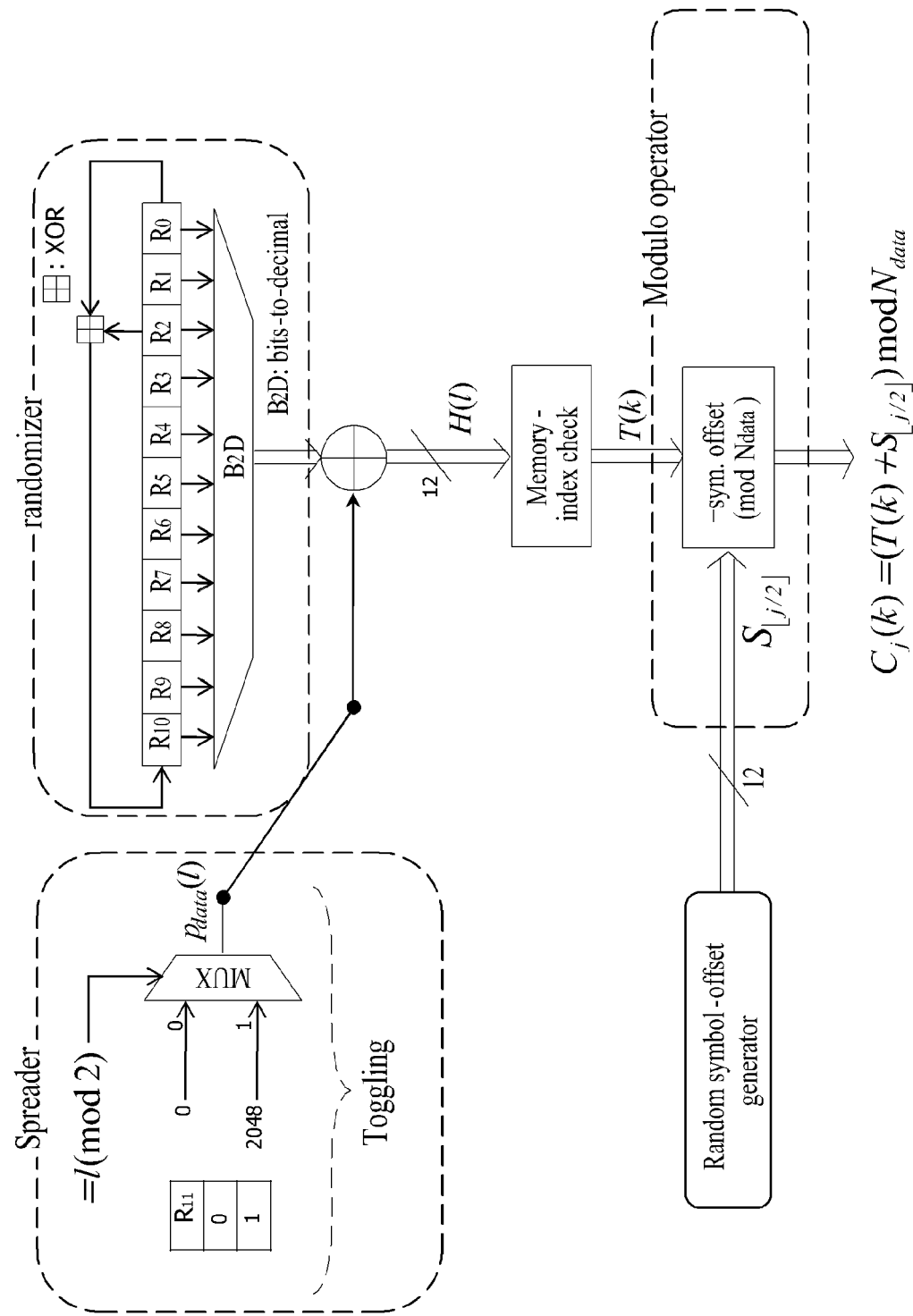
FIG. 42 is a view of a 4K FFT mode random seed generator according to an embodiment of the present invention.

FIG. 42 is a view of a 4K FFT mode random seed generator according to an embodiment of the present invention.

The 4K FFT mode random seed generator according to an embodiment of the present invention may include a spreader (1-bit toggling), a randomizer, a memory-index check, a random symbol-offset generator, and a modulo operator. As described above, the random main-seed generator may include a spreader and a randomizer. Hereinafter, an operation of each block will be described.

The (cell) spreader may be operated using an upper portion of n-bit of total 12-bit and may function as a multiplexer based on a look-up table. In the case of 4K FFT mode, the (cell) spreader may be a 1-bit multiplexer (or toggling).

The randomizer may be operated via a PN generator and may provide full randomness during interleaving. As described above, in the case of 4K FFT mode, the randomizer may be a PN generator that considers 11-bit. This can be changed according to a designer's intention. Also the spreader and the randomizer are operated through multiplexer and PN generator, respectively.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$. The $N_{data}$ according to the embodiment of the present invention is equal to the number of the data cells.

The random symbol-offset generator may generate a symbol-offset for cyclic-shifting main interleaving-seed generated by the main-interleaving seed generator for each pair-wise OFDM symbol. A detailed operation will be described below.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

Figure 43:
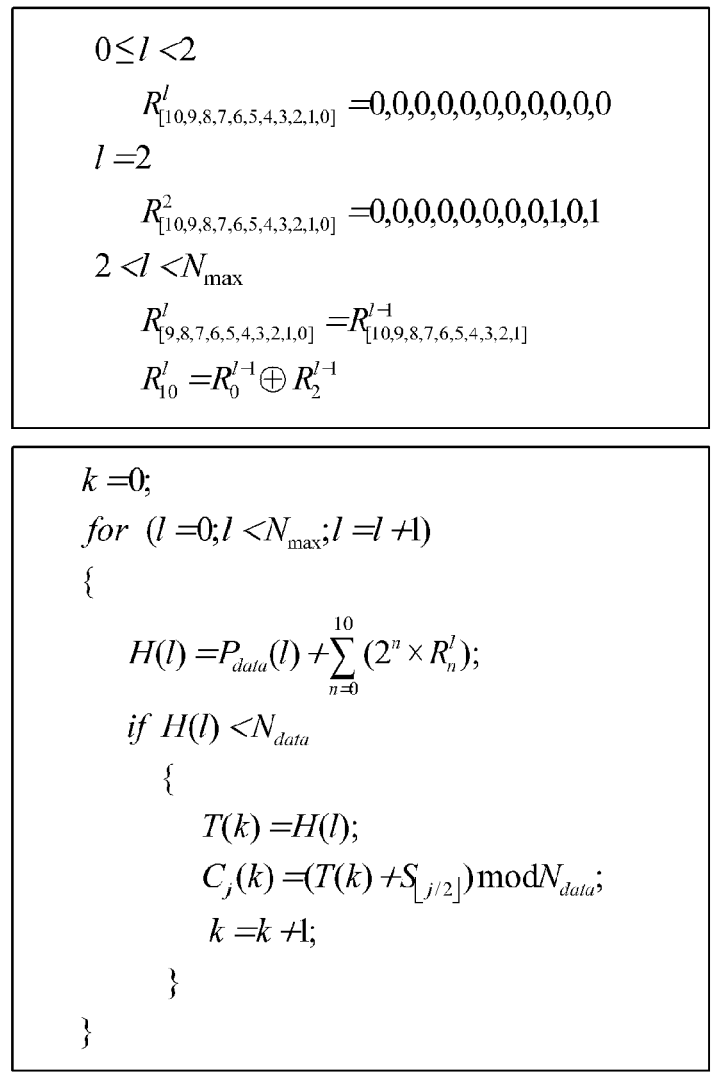
FIG. 43 illustrates expressions representing an operation of a 4K FFT mode random seed generator according to an embodiment of the present invention.

FIG. 43 illustrates expressions representing an operation of a 4K FFT mode random seed generator according to an embodiment of the present invention.

The expressions illustrated in an upper portion of FIG. 43 show initial value setting and primitive polynomial of a randomizer. In this case, the primitive polynomial may be $11^{th}$ primitive polynomial and the initial value may be changed by arbitrary values.

The expressions illustrated in a lower portion of FIG. 43 show procedures of calculating and outputting main-interleaving seed for an output signal of the spreader and the randomizer. As illustrated in the expression, one random symbol-offset may be applied to each pair-wise OFDM in the same way.

Figure 44:
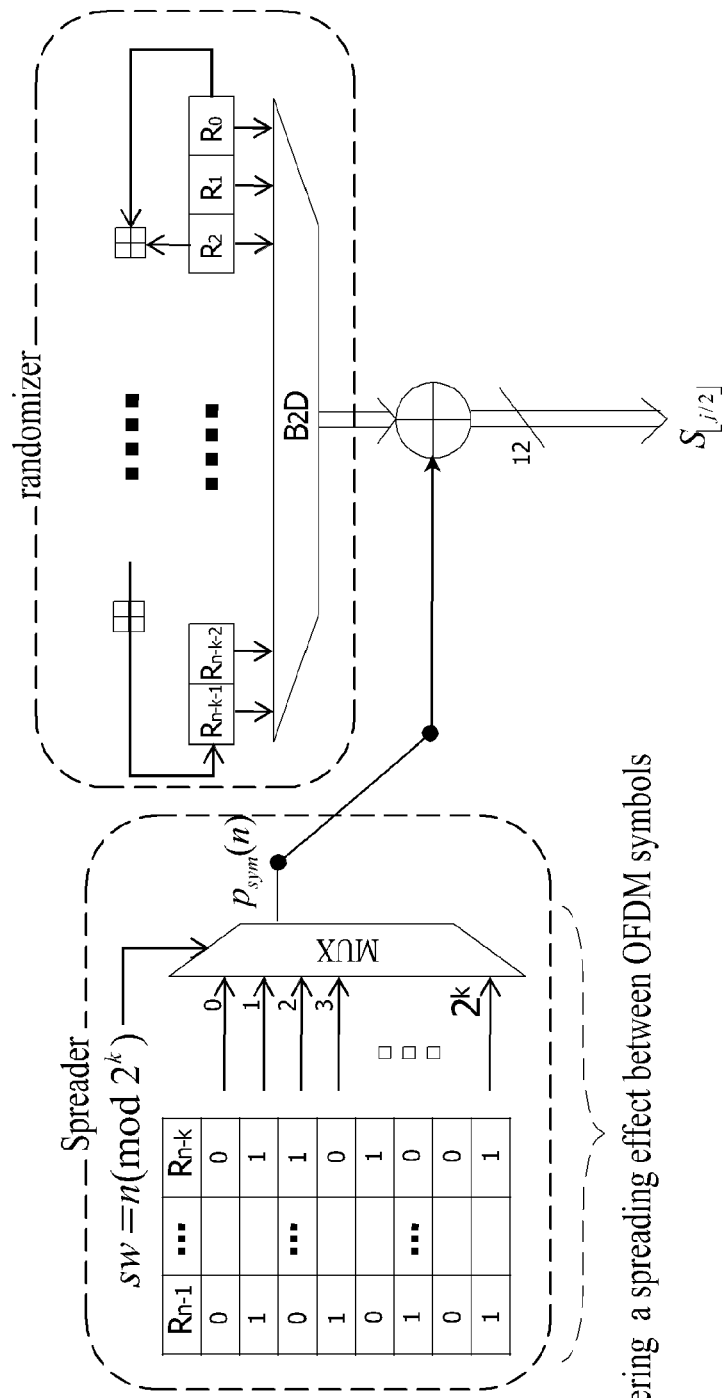
FIG. 44 is a view illustrating a 4K FFT mode random symbol-offset generator according to an embodiment of the present invention.

FIG. 44 is a view illustrating a 4K FFT mode random symbol-offset generator according to an embodiment of the present invention.

As above described, the random symbol-offset generator according to an embodiment of the present invention may include k bits-spreader and (X-k) bits-randomizer.

Hereinafter, each block will be described.

The k bits-spreader may be operated through a $2^k$ multiplexer and may be optimally designed to maximize inter-symbol spreading properties (or to minimize correlation properties).

The randomizer may be operated through a N bits-PN generator and designed to provide randomness.

The 4K FFT mode random symbol-offset generator may include a 0/1/2 bits-spreader and a 12/11/10 bits-random generator (or a PN generator). Details will be described below.

FIG. 45 illustrates expressions showing operations of a random symbol-offset generator and a random Symbol-offset generator for 4K FFT mode including a 0 bits-spreader and a 12 bits-PN generator according to an embodiment of the present invention.

(a) illustrates a random symbol-offset generator including a 0 bits-spreader and a 12 bits-PN generator. (b) illustrates an operation of a 4K FFT mode random Symbol-offset generator.

The random symbol-offset generator illustrated in (a) may be operated for each pair-wise OFDM symbol.

An expression illustrated in an upper portion of (b) shows initial value setting and primitive polynomial of the randomizer. In this case, the primitive polynomial may be $12^{th}$ primitive polynomial and the initial value may be changed by arbitrary values.

An expression illustrated in a lower portion of (b) shows a procedure for calculating and outputting a symbol-offset for output signals of a spreader and a randomizer. As illustrated in the expression, the random symbol-offset generator may be operated for each pair-wise OFDM symbol. Accordingly, the length of an entire output offset may correspond to half of the length of an entire OFDM symbol.

Figure 46:
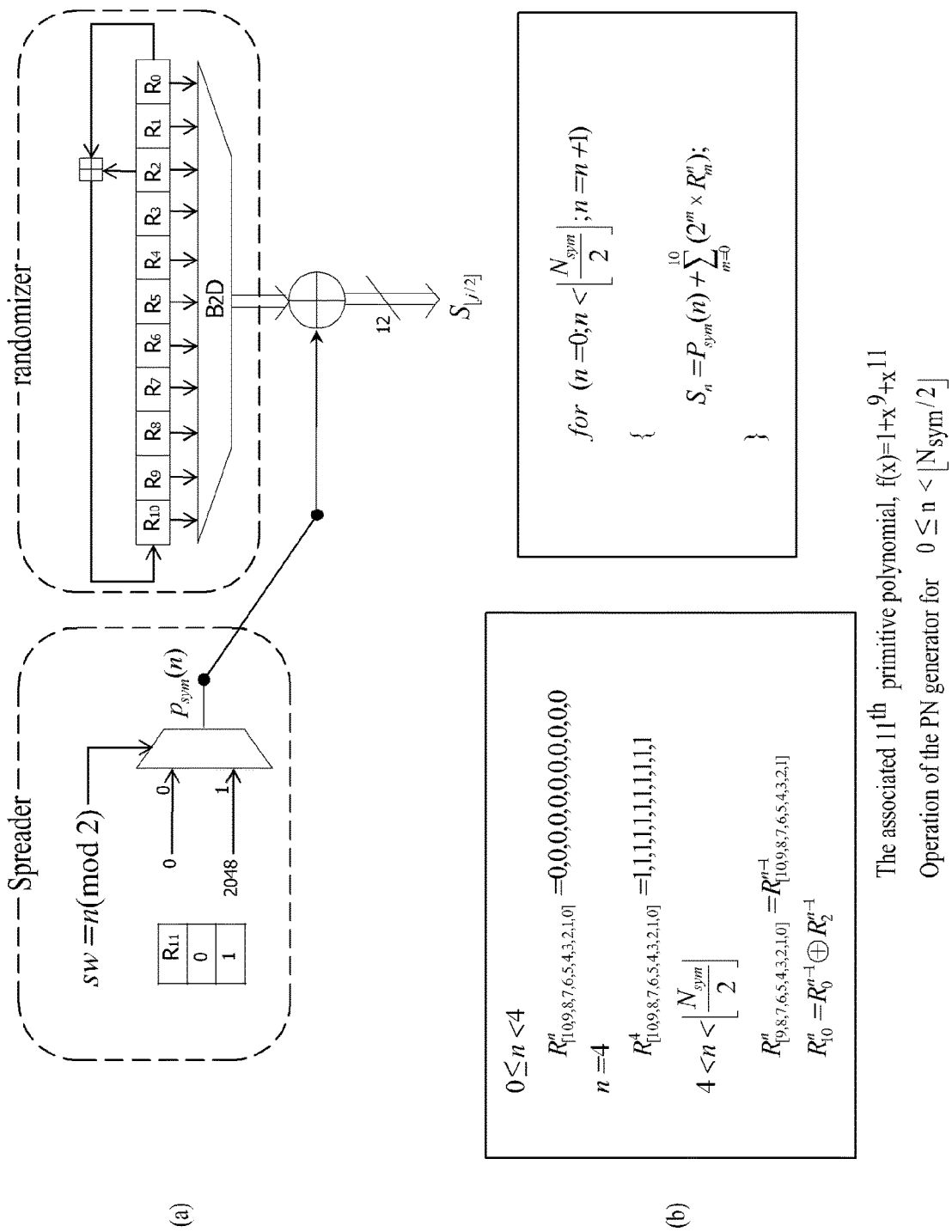
FIG. 46 illustrates expressions illustrating operations of a random symbol-offset generator and a random Symbol-offset generator for 4K FFT mode including a 1 bits-spreader and an 11 bits-PN generator according to an embodiment of the present invention.

FIG. 46 illustrates expressions illustrating operations of a random symbol-offset generator and a random Symbol-offset generator for 4K FFT mode including a 1 bits-spreader and an 11 bits-PN generator according to an embodiment of the present invention.

(a) shows the random symbol-offset generator including a 1 bits-spreader and an 11 bits-PN generator. (b) shows an expression representing an operation of a 4K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $11^{th}$ primitive polynomial and the initial value may be changed by arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 47:
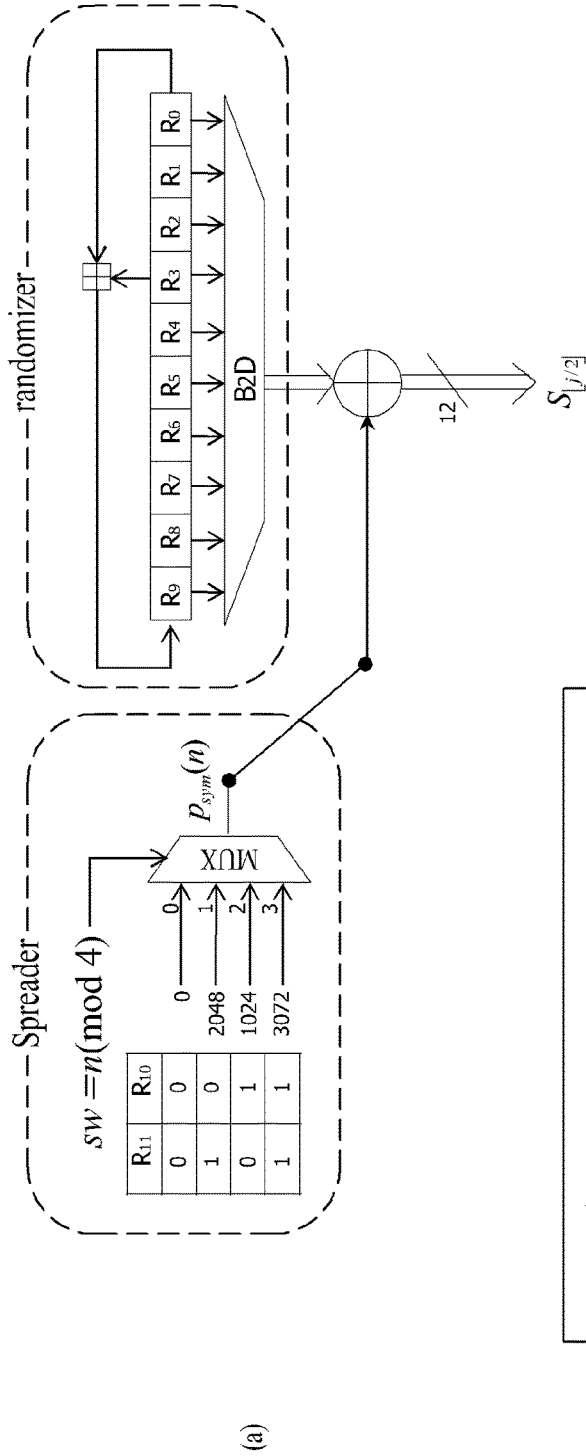
FIG. 47 illustrates expressions illustrating operations of a random symbol-offset generator and a random Symbol-offset generator for 4K FFT mode including a 2 bits-spreader and a 10 bits-PN generator according to an embodiment of the present invention.

FIG. 47 illustrates expressions illustrating operations of a random symbol-offset generator and a random Symbol-offset generator for 4K FFT mode including a 2 bits-spreader and a 10 bits-PN generator according to an embodiment of the present invention.

(a) shows the random Symbol-offset generator including a 2 bits-spreader and a 10 bits-PN generator. (b) shows an expression representing an operation of a 4K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $10^{th}$ primitive polynomial and the initial value may include arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 48:
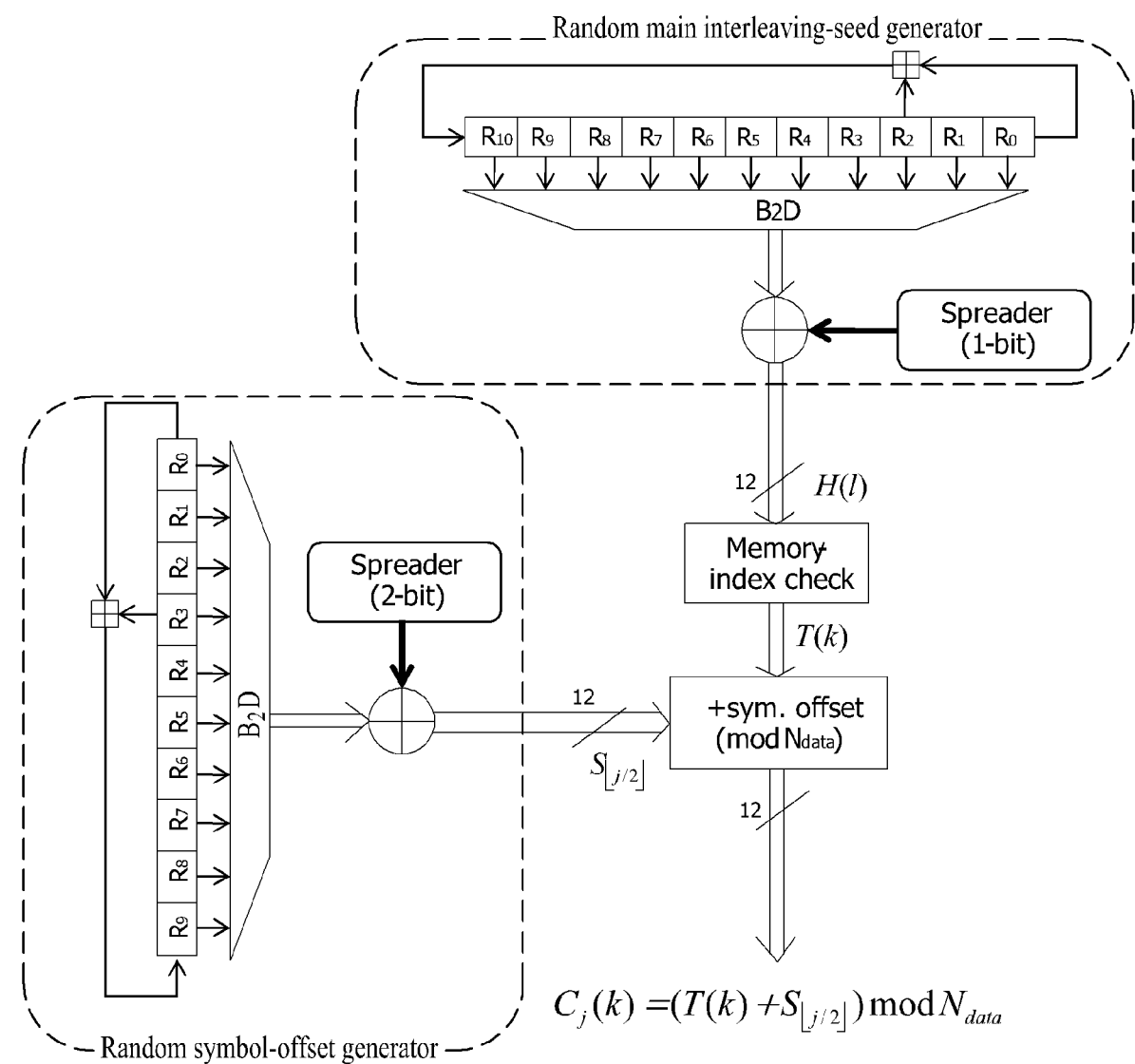
FIG. 48 is a view illustrating logical composition of a 4K FFT mode random seed generator according to an embodiment of the present invention.

FIG. 48 is a view illustrating logical composition of a 4K FFT mode random seed generator according to an embodiment of the present invention.

As described above, the 4K FFT mode random seed generator according to an embodiment of the present invention may include a random main interleaving-seed generator, a random symbol-offset generator, a memory index check, and a modulo operator.

FIG. 48 illustrates the logical composition of a 4K FFT mode random seed generator formed by combining a random main interleaving-seed generator and a random symbol-offset generator. FIG. 48 illustrates an embodiment of the random main interleaving-seed generator including a 1 bit-spreader and an 11 bits-randomizer, and an embodiment of the random symbol-offset generator including a 2 bits-spreader and a 10 bits-randomizer. Details thereof have been described above and thus will be omitted here.

Hereinafter, a quasi-random interleaving seed generator for 4K FFT mode will be described.

As described above, the quasi-random interleaving seed generator according to an embodiment of the present invention may apply different interleaving seeds to respective OFDM symbols to acquire frequency diversity. The logical composition of the quasi-random interleaving seed generator may include a main quasi-random seed generator ((or quasi-random main interleaving-seed generator) ($C_j(K)$) for interleaving cells in a single OFDM symbol and a random symbol-offset generator ($S_{\lfloor j/2 \rfloor}$) for changing a symbol offset.

The main quasi-random seed generator may generate the aforementioned random FI parameter. That is, the main quasi-random seed generator may generate seed for interleaving cells in a single OFDM symbol.

The main quasi-random seed generator according to an embodiment of the present invention may include a spreader and a randomizer and perform rendering a full randomness in frequency-domain. According to an embodiment of the present invention, in the case of 4K FFT mode, the main quasi-random seed generator may include a 3 bit spreader and a 9 bit-randomizer. The main quasi-random seed generator or the randomizer according to an embodiment of the present invention may be referred as a main-PRBS generator which is defined based on the 11-bit binary word sequence (or binary sequence).

The random symbol-offset generator according to an embodiment of the present invention may change a symbol offset for each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for respective FFT modes. According to an embodiment of the present invention, in the case of 4K FFT mode, a (12-k) bits-randomizer may be used. The (X-k) bits-randomizer according to an embodiment of the present invention may be referred as a sub-PRBS generator which is defined based on (12-k) bit binary word sequence (or binary sequence).

The main roles of the spreader and the randomizer are as follows.

Spreader: rendering a spreading effect to frequency interleaving (FI)

Randomizer: rendering a random effect to FI

Figure 49:
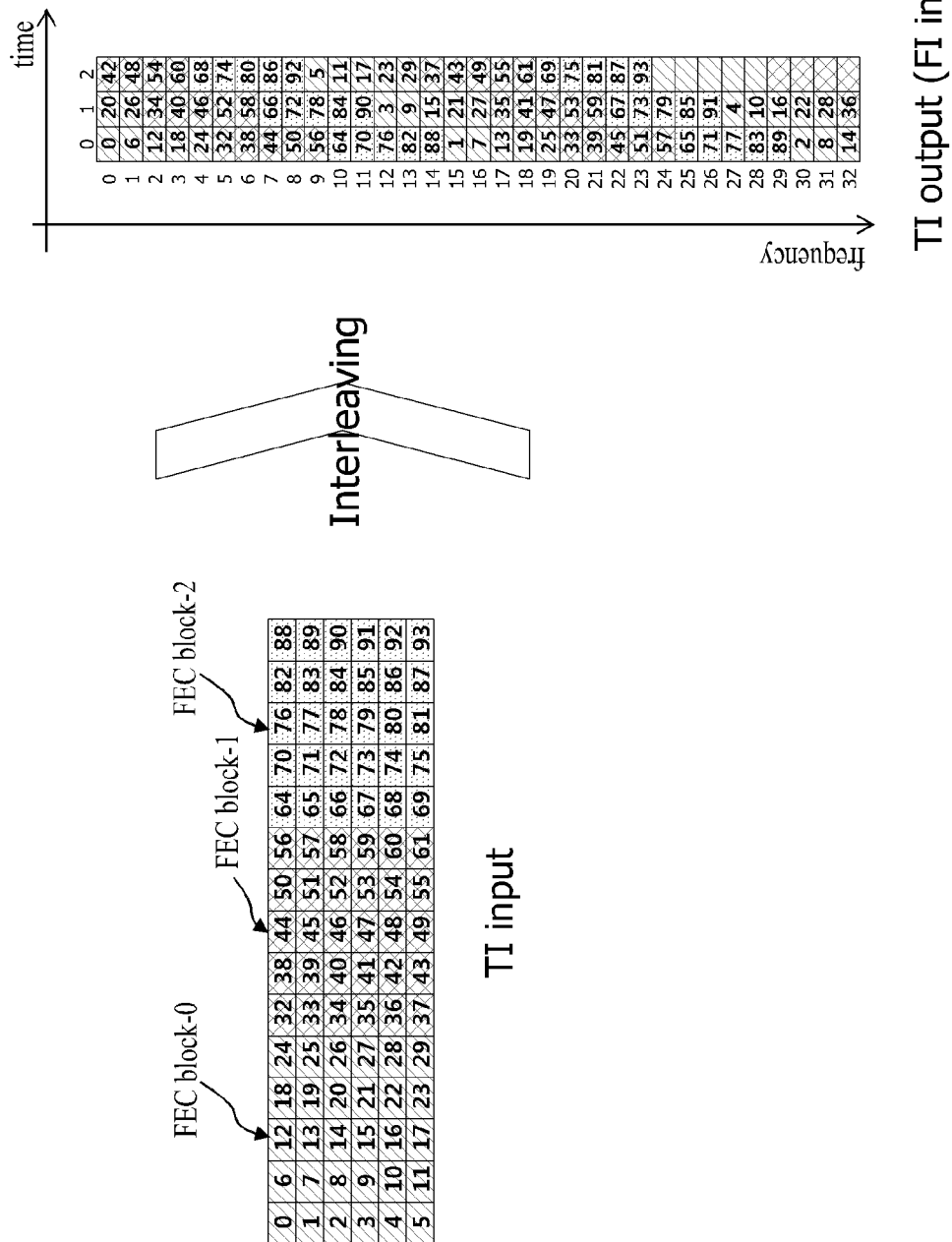
FIG. 49 is a view illustrating an output signal of a time interleaver according to another embodiment of the present invention.

FIG. 49 is a view illustrating an output signal of a time interleaver according to another embodiment of the present invention.

The time interleaver according to an embodiment of the present invention may perform a column-wise writing operation and a row-wise reading operation on each FEC block with a size of 5, as illustrated in a left portion of FIG. 49. A right block of FIG. 49 indicates an output signal of the time interleaver and the output signal is input to a frequency interleaver 7020 according to an embodiment of the present invention.

Thus, one FEC block has a length of 5 in each FI block and agglomerate in a burst form. Thus, in order to increase the robustness of a channel with strong burst error properties, interleaving seed having high spreading properties as well as high randomness is required. Accordingly, the aforementioned quasi-random interleaving seed generator may be used.

Figure 50:
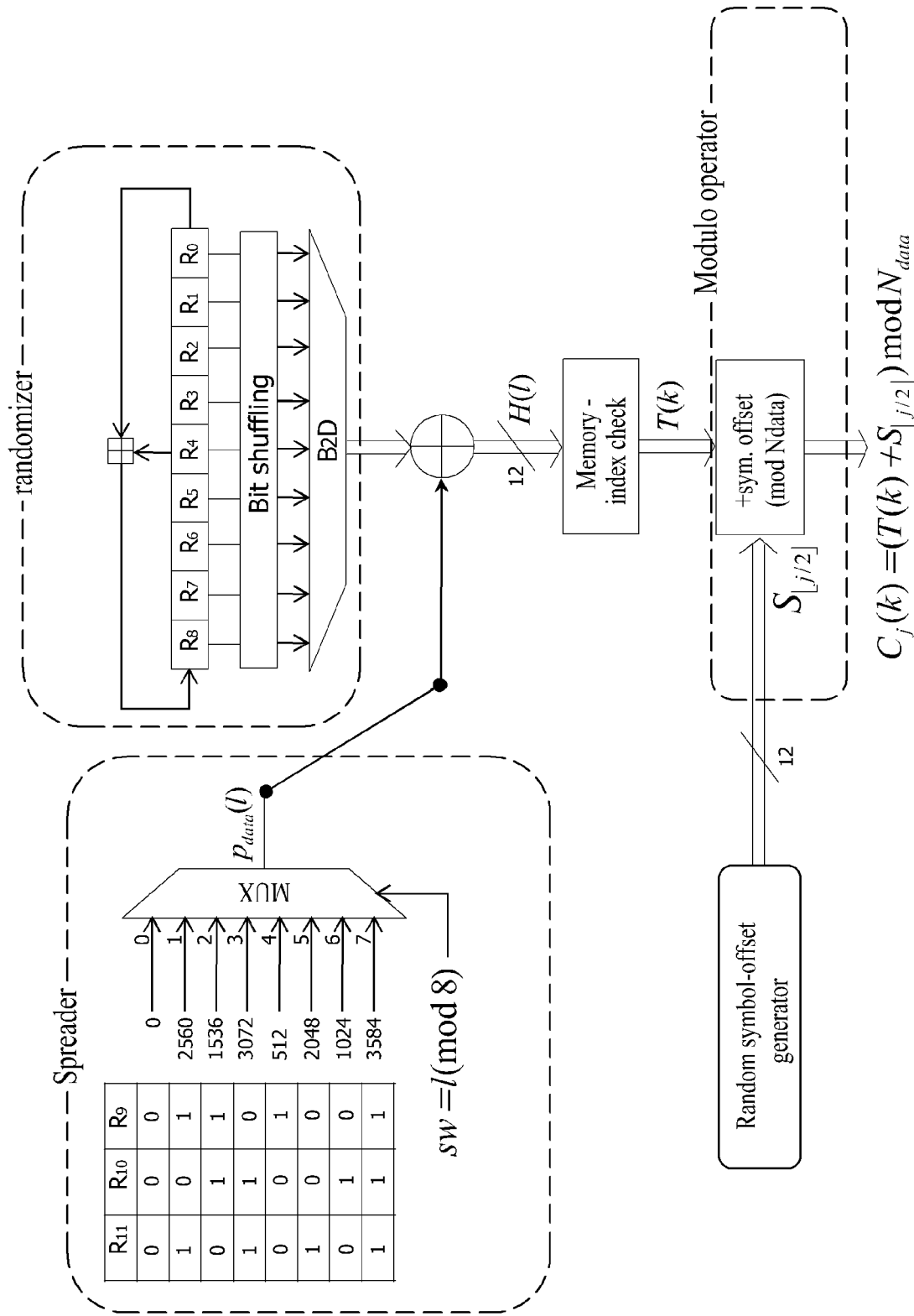
FIG. 50 is a view illustrating a 4K FFT mode quasi-random interleaving-seed generator according to an embodiment of the present invention.

FIG. 50 is a view illustrating a 4K FFT mode quasi-random interleaving-seed generator according to an embodiment of the present invention.

The 4K FFT mode quasi-random interleaving-seed generator according to an embodiment of the present invention may include a spreader (3-bit toggling), a randomizer, a memory-index check, a random symbol-offset generator, and a modulo operator. As described above, the quasi-random main interleaving-seed generator may include a spreader and a randomizer. Hereinafter, an operation of each block will be described.

The spreader may be operated through an n-bit multiplexer and may maximize (or minimize inter-cell correlation) inter-cell spreading. In the case of 4K FFT mode, the spreader may use a look-up table that considers 3-bit.

The randomizer may be operated as a (12-n) bits-PN generator and may provide randomness (or correlation properties). The randomizer according to an embodiment of the present invention may include bit shuffling. The bit shuffling optimizes spreading properties or random properties and is designed in consideration of $N_{data}$. In the case of 4K FFT mode, the bit shuffling may use a 9-bit PN generator, which can be changed.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$.

The random symbol-offset generator may generate a symbol-offset for cyclic-shifting main interleaving-seed generated by the main-interleaving seed generator for each pair-wise OFDM symbol. A detailed operation has been described with regard to the 4K FFT mode random main-seed generator and is not described again here.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

Figure 51:
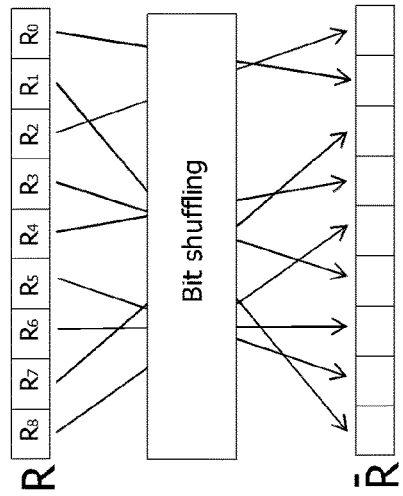
FIG. 51 is expressions representing operations of 4K FFT mode bit shuffling and 4K FFT mode quasi-random interleaving seed generator according to an embodiment of the present invention.

FIG. 51 is expressions representing operations of 4K FFT mode bit shuffling and 4K FFT mode quasi-random interleaving seed generator according to an embodiment of the present invention.

(a) illustrates an expression representing an operation of the 4K FFT mode bit shuffling and (b) illustrates an expression representing an operation of the 4K FFT mode quasi-random interleaving seed generator.

As illustrated in (a), the 4K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $9^{th}$ primitive polynomial and the initial value may be changed by arbitrary values.

An expression illustrated in a lower portion of (b) shows a procedure of calculating and outputting main-interleaving seed for an output signal of the spreader and the randomizer. As illustrated in the expression, one random symbol-offset may be applied to each pair-wise OFDM symbol in the same way.

Figure 52:
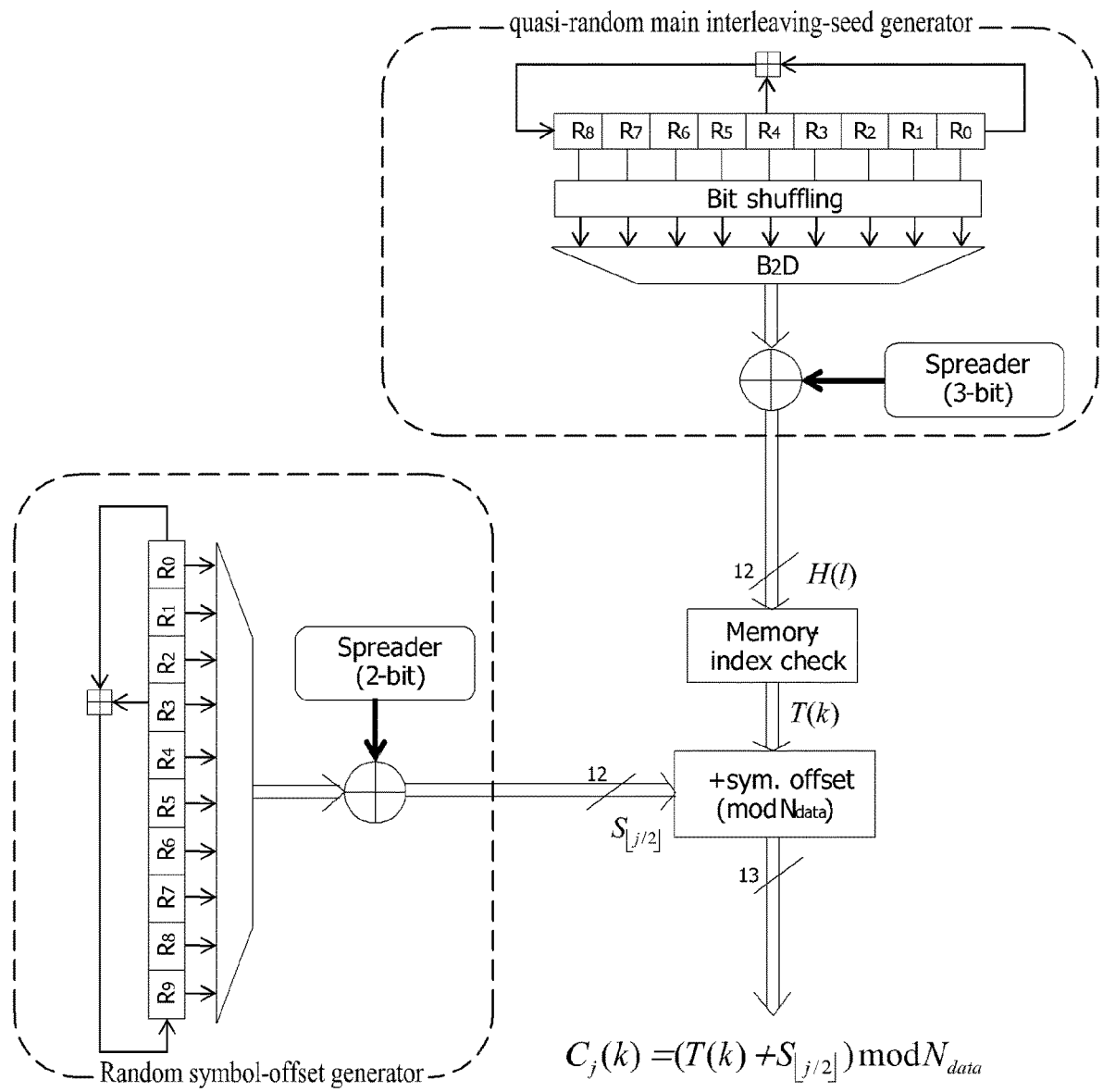
FIG. 52 is a view illustrating logical composition of a 4K FFT mode quasi-random interleaving seed generator according to an embodiment of the present invention.

FIG. 52 is a view illustrating logical composition of a 4K FFT mode quasi-random interleaving seed generator according to an embodiment of the present invention.

As described above, the 4K FFT mode quasi-random main interleaving-seed generator according to an embodiment of the present invention may include a quasi-random main interleaving-seed generator, a random symbol-offset generator, a memory index check, and a modulo operator.

FIG. 52 illustrates the logical composition of a 4K FFT mode quasi-random interleaving seed generator formed by combining a quasi-random main interleaving-seed generator and a random symbol-offset generator. FIG. 52 illustrates an embodiment of the quasi-random main interleaving-seed generator including a 3 bit-spreader and a 9 bits-randomizer and an embodiment of the random symbol-offset generator including a 2 bits-spreader and a 10 bits-randomizer. Details thereof have been described above and thus will be omitted here.

Hereinafter, the random seed generator for an 8K FFT mode will be described.

As described above, the random seed generator according to an embodiment of the present invention may apply different interleaving seeds to respective OFDM symbols to acquire frequency diversity. Logical composition of the random seed generator may include a random main-seed generator (or a random main interleaving-seed generator) ($C_j(K)$) for interleaving cells in a single OFDM symbol and a random symbol-offset generator ($S_{\lfloor j/2 \rfloor}$) for changing a symbol offset.

The random main-seed generator may generate the aforementioned random FI parameter. That is, the random main-seed generator may generate seed for interleaving cells in a single OFDM symbol.

The random main-seed generator according to an embodiment of the present invention may include a spreader and a randomizer and perform rendering a full randomness in frequency-domain. According to an embodiment of the present invention, in the case of 8K FFT mode, the random main-seed generator may include a 1 bit spreader and an 12 bit-randomizer. The random main-seed generator or the randomizer according to an embodiment of the present invention may be referred as a main-PRBS generator which is defined based on the 12-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 8K FFT mode, a (13-k) bit-randomizer may be used. The (X-k) bits-randomizer according to an embodiment of the present invention may be referred as a sub-PRBS generator which is defined based on (13-k) bit binary word sequence (or binary sequence).

The aforementioned spreader and randomizer may be used to achieve spreading and random effects during generation of the interleaving seed.

Details of the output signal of a time interleaver according to an embodiment of the present invention have been described above.

Figure 53:
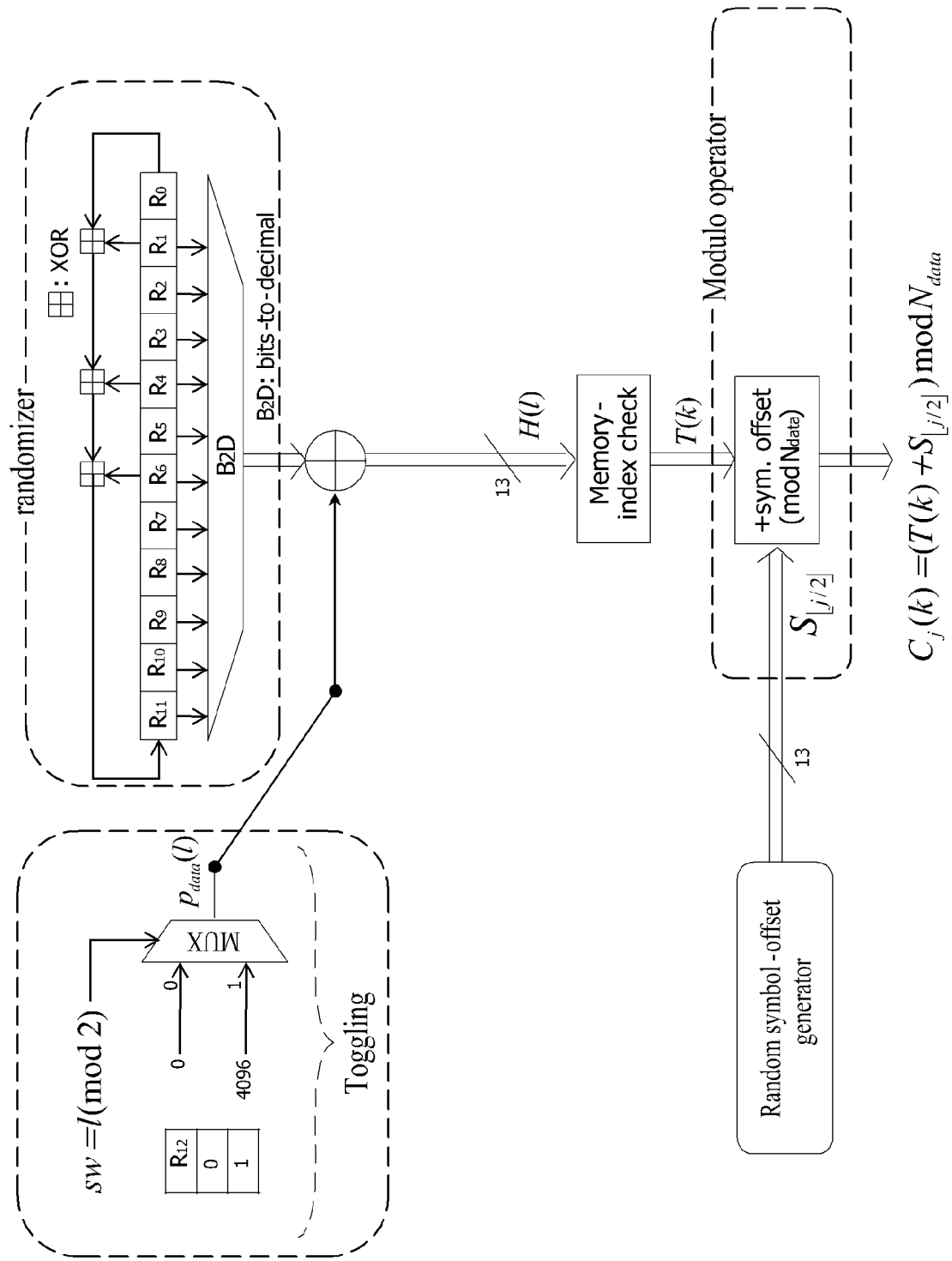
FIG. 53 is a view of an 8K FFT mode random seed generator according to an embodiment of the present invention.

FIG. 53 is a view of an 8K FFT mode random seed generator according to an embodiment of the present invention.

The 8K FFT mode random seed generator according to an embodiment of the present invention may include a spreader (1-bit toggling), a randomizer, a memory-index check, a random symbol-offset generator, and a modulo operator. As described above, the random main-seed generator may include a spreader and a randomizer. Hereinafter, an operation of each block will be described.

The (cell) spreader may be operated using an upper portion of n-bit of total 13-bit and may function as a multiplexer based on a look-up table. In the case of 8K FFT mode, the (cell) spreader may be a 1-bit multiplexer (or toggling).

The randomizer may be operated via a PN generator and may provide full randomness during interleaving. As described above, in the case of 8K FFT mode, the randomizer may be a PN generator that considers 12-bit. This can be changed according to a designer's intention. Also the spreader and the randomizer are operated through multiplexer and PN generator, respectively.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$. The $N_{data}$ according to the embodiment of the present invention is equal to the number of the data cells.

The random symbol-offset generator may generate a symbol-offset for cyclic-shifting main interleaving-seed generated by the main-interleaving seed generator for each pair-wise OFDM symbol. A detailed operation will be described below.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

FIG. 54 illustrates expressions representing an operation of an 8K FFT mode random seed generator according to an embodiment of the present invention.

The expressions illustrated in an upper portion of FIG. 54 show initial value setting and primitive polynomial of a randomizer. In this case, the primitive polynomial may be $12^{th}$ primitive polynomial and the initial value may be changed by arbitrary values.

The expressions illustrated in a lower portion of FIG. 54 show procedures of calculating and outputting main-interleaving seed for an output signal of the spreader and the randomizer. As illustrated in the expression, one random symbol-offset may be applied to each pair-wise OFDM in the same way.

Figure 55:
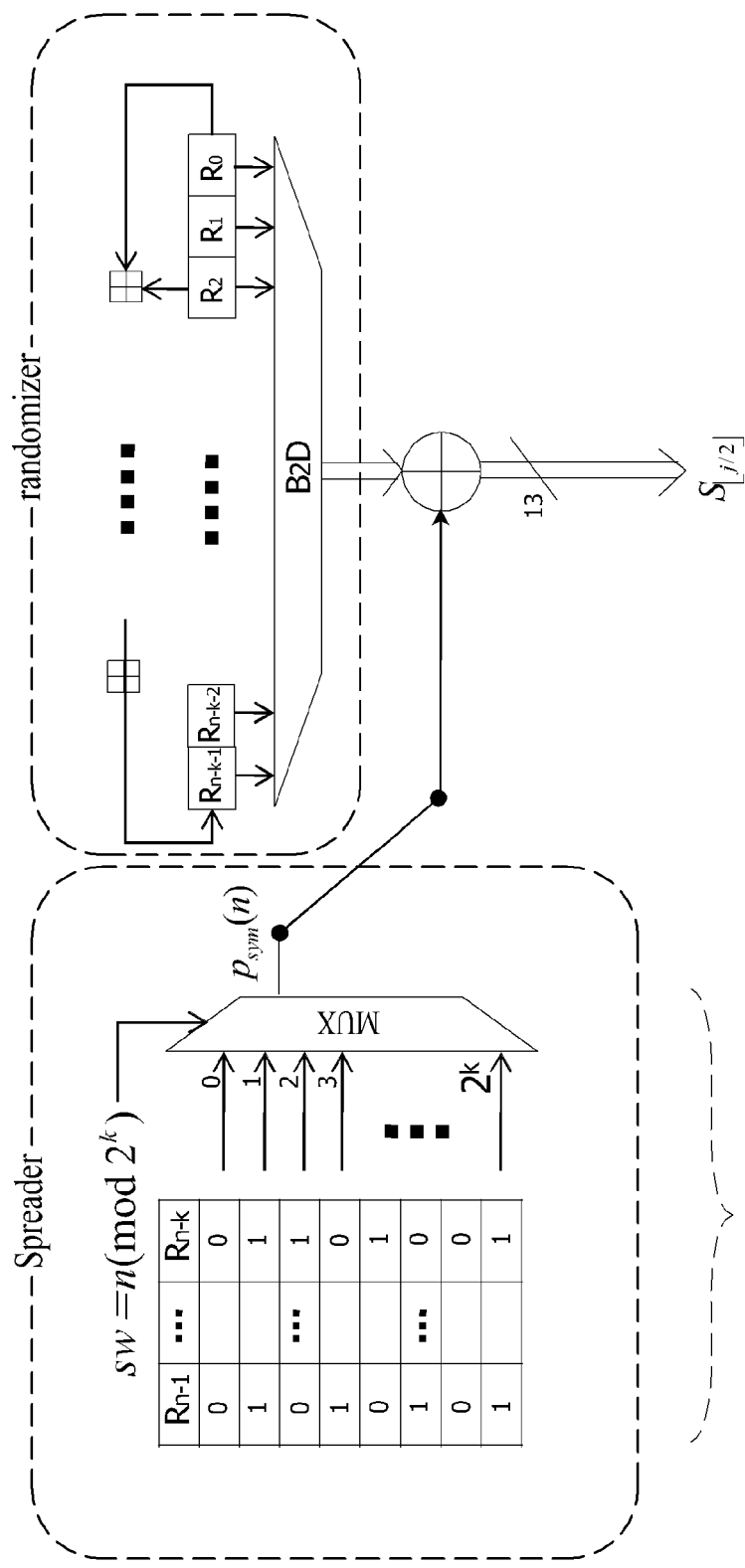
FIG. 55 is a view illustrating an 8K FFT mode random symbol-offset generator according to an embodiment of the present invention.

FIG. 55 is a view illustrating an 8K FFT mode random symbol-offset generator according to an embodiment of the present invention.

As above described, the random symbol-offset generator according to an embodiment of the present invention may include k bits-spreader and (X-k) bits-randomizer.

Hereinafter, each block will be described.

The k bits-spreader may be operated through a $2^k$ multiplexer and may be optimally designed to maximize inter-symbol spreading properties (or to minimize correlation properties).

The randomizer may be operated through a N bits-PN generator and designed to provide randomness.

The 8K FFT mode random symbol-offset generator may include a 0/1/2 bits-spreader and a 13/12/11 bits-random generator (or a PN generator). Details will be described below.

Figure 56:
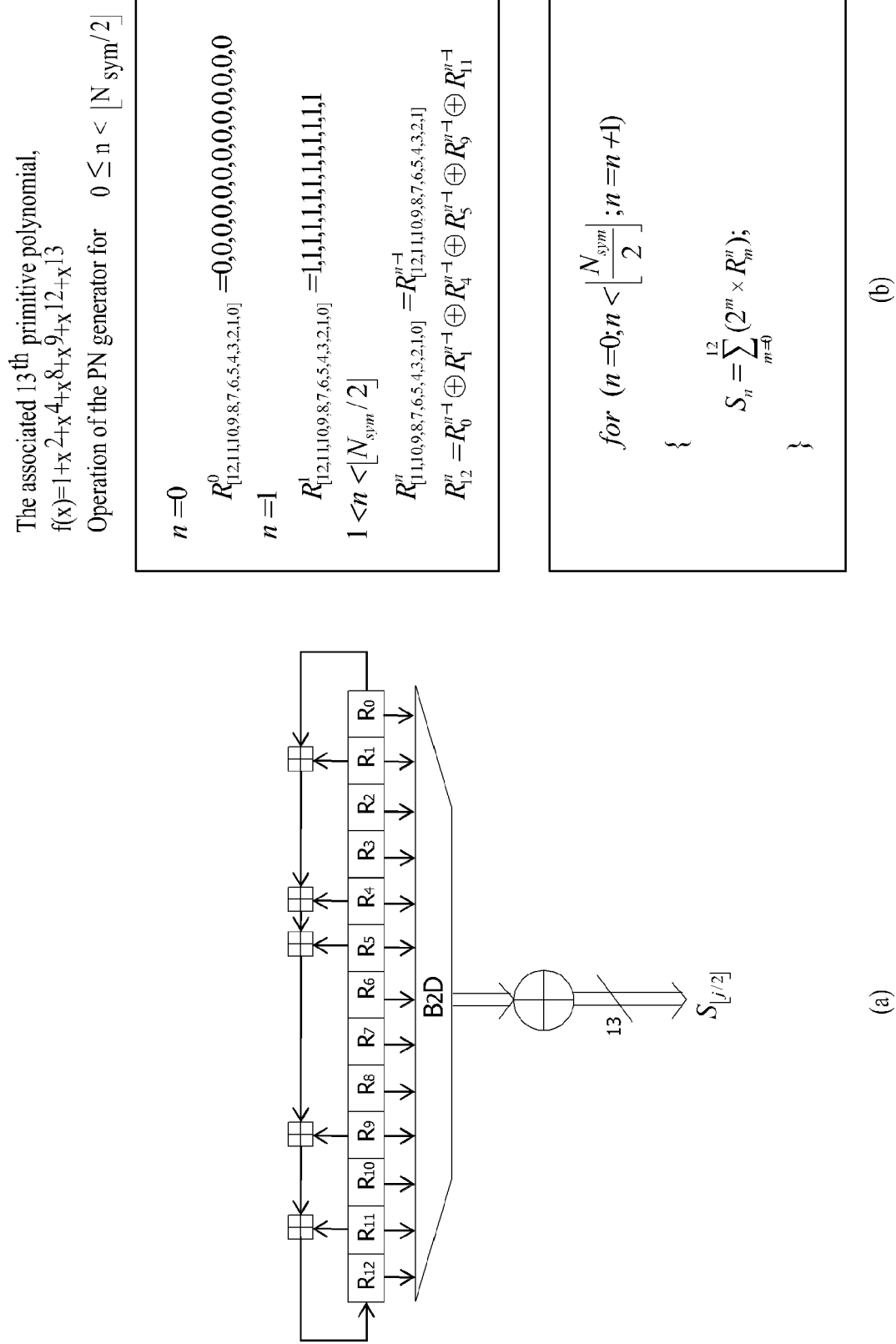
FIG. 56 illustrates expressions showing operations of a random symbol-offset generator and a random Symbol-offset generator for 8K FFT mode including a 0 bits-spreader and a 13 bits-PN generator according to an embodiment of the present invention.

FIG. 56 illustrates expressions showing operations of a random symbol-offset generator and a random Symbol-offset generator for 8K FFT mode including a 0 bits-spreader and a 13 bits-PN generator according to an embodiment of the present invention.

(a) illustrates a random symbol-offset generator including a 0 bits-spreader and a 13 bits-PN generator. (b) illustrates an operation of an 8K FFT mode random Symbol-offset generator.

The random symbol-offset generator illustrated in (a) may be operated for each pair-wise OFDM symbol.

An expression illustrated in an upper portion of (b) shows initial value setting and primitive polynomial of the randomizer. In this case, the primitive polynomial may be $13^{th}$ primitive polynomial and the initial value may be changed by arbitrary values.

An expression illustrated in a lower portion of (b) shows a procedure for calculating and outputting a symbol-offset for output signals of a spreader and a randomizer. As illustrated in the expression, the random symbol-offset generator may be operated for each pair-wise OFDM symbol. Accordingly, the length of an entire output offset may correspond to half of the length of an entire OFDM symbol.

Figure 57:
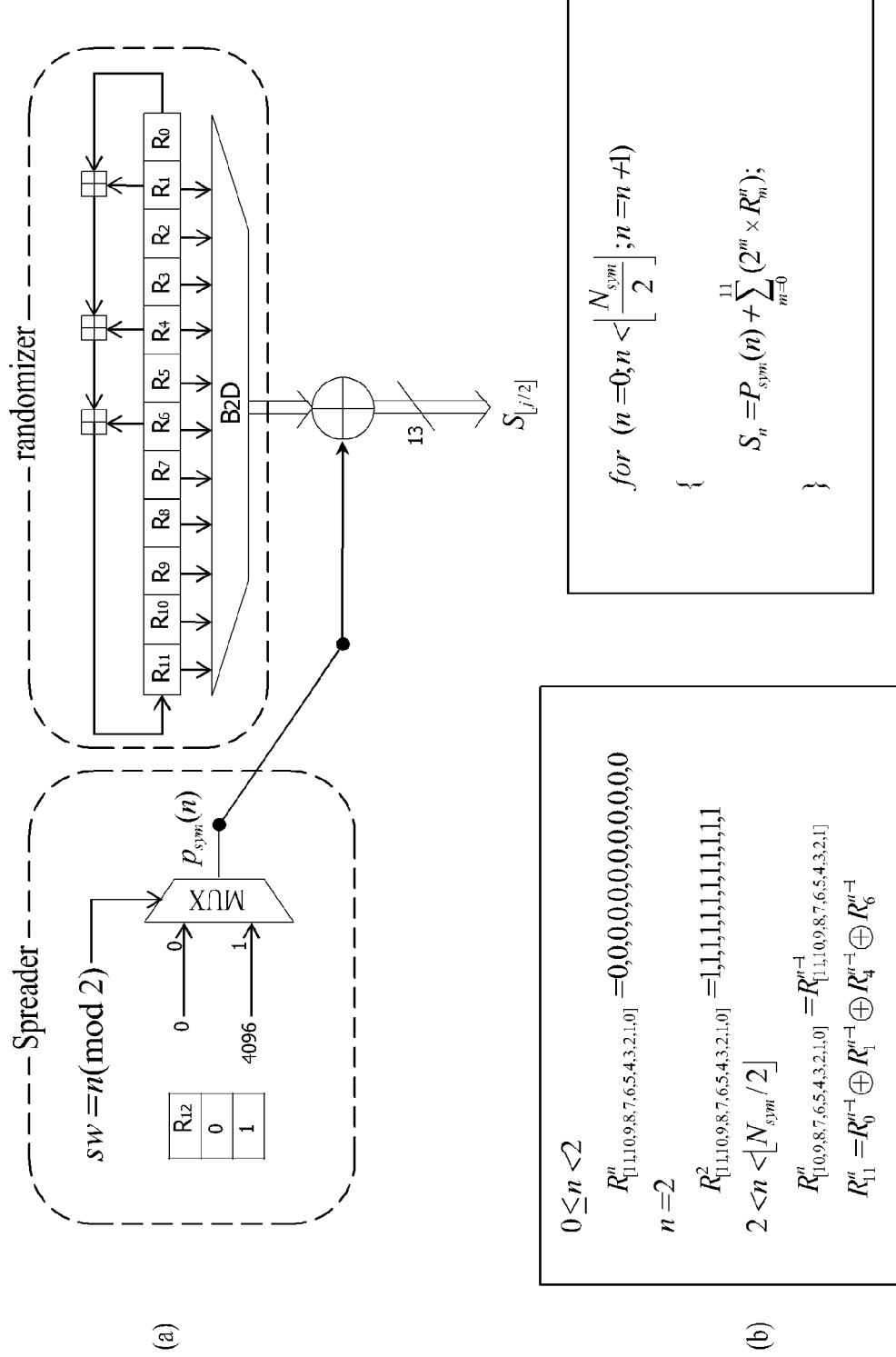
FIG. 57 illustrates expressions illustrating operations of a random symbol-offset generator and a random Symbol-offset generator for 8K FFT mode including a 1 bits-spreader and an 12 bits-PN generator according to an embodiment of the present invention.

FIG. 57 illustrates expressions illustrating operations of a random symbol-offset generator and a random Symbol-offset generator for 8K FFT mode including a 1 bits-spreader and an 12 bits-PN generator according to an embodiment of the present invention.

(a) shows the random symbol-offset generator including a 1 bits-spreader and a 12 bits-PN generator. (b) shows an expression representing an operation of an 8K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $12^{th}$ primitive polynomial and the initial value may be changed by arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 58:
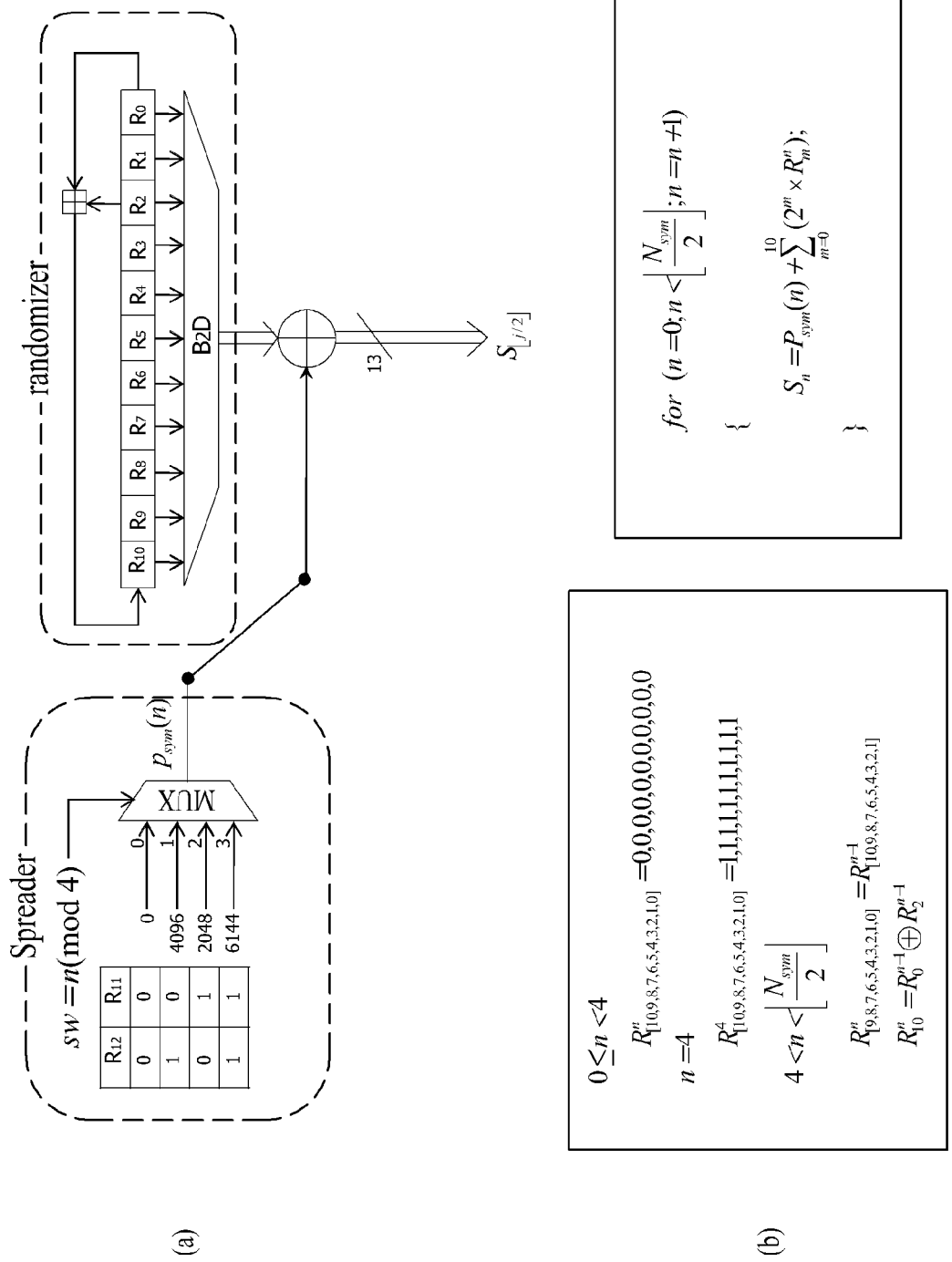
FIG. 58 illustrates expressions illustrating operations of a random symbol-offset generator and a random Symbol-offset generator for 8K FFT mode including a 2 bits-spreader and an 11 bits-PN generator according to an embodiment of the present invention.

FIG. 58 illustrates expressions illustrating operations of a random symbol-offset generator and a random Symbol-offset generator for 8K FFT mode including a 2 bits-spreader and an 11 bits-PN generator according to an embodiment of the present invention.

(a) shows the random Symbol-offset generator including a 2 bits-spreader and an 11 bits-PN generator. (b) shows an expression representing an operation of an 8K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $11^{th}$ primitive polynomial and the initial value may include arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 59:
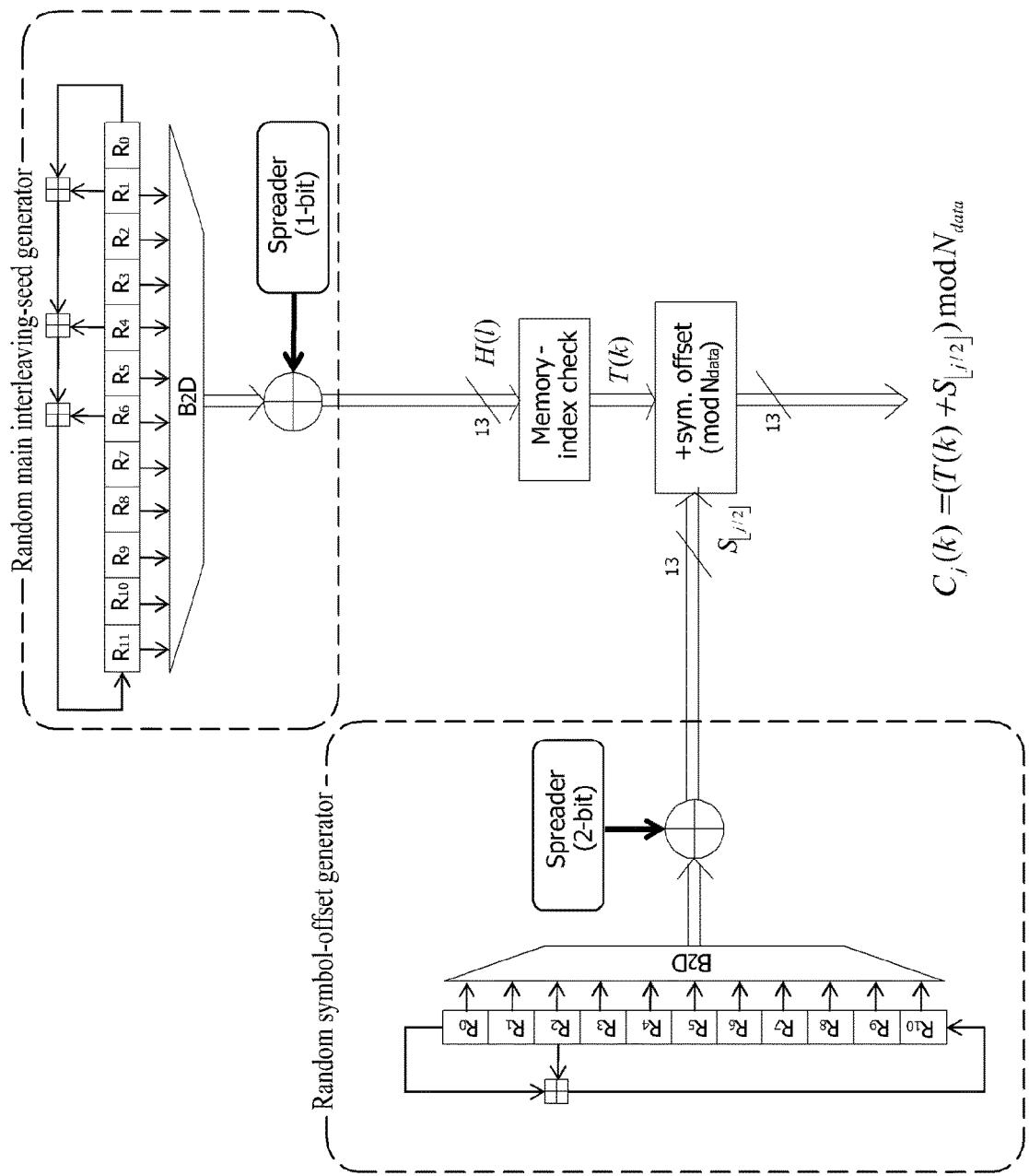
FIG. 59 is a view illustrating logical composition of an 8K FFT mode random seed generator according to an embodiment of the present invention.

FIG. 59 is a view illustrating logical composition of an 8K FFT mode random seed generator according to an embodiment of the present invention.

As described above, the 8K FFT random seed generator according to an embodiment of the present invention may include a random main interleaving-seed generator, a random symbol-offset generator, a memory index check, and a modulo operator.

FIG. 59 illustrates the logical composition of an 8K FFT mode random seed generator formed by combining a random main interleaving-seed generator and a random symbol-offset generator. FIG. 59 illustrates an embodiment of the random main interleaving-seed generator including a 1 bit-spreader and a 12 bits-randomizer, and an embodiment of the random symbol-offset generator including a 2 bits-spreader and an 11 bits-randomizer. Details thereof have been described above and thus will be omitted here.

Hereinafter, a quasi-random interleaving seed generator for 8K FFT mode will be described.

As described above, the quasi-random interleaving seed generator according to an embodiment of the present invention may apply different interleaving seeds to respective OFDM symbols to acquire frequency diversity. The logical composition of the quasi-random interleaving seed generator may include a main quasi-random seed generator (or quasi-random main interleaving-seed generator) ($C_j(K)$) for interleaving cells in a single OFDM symbol and a random symbol-offset generator ($S_{[j/2]}$) for changing a symbol offset.

The main quasi-random seed generator may generate the aforementioned random FI parameter. That is, the main quasi-random seed generator may generate seed for interleaving cells in a single OFDM symbol.

The main quasi-random seed generator according to an embodiment of the present invention may include a spreader and a randomizer and perform rendering a full randomness in frequency-domain. According to an embodiment of the present invention, in the case of 8K FFT mode, the main quasi-random seed generator may include a 3 bit spreader and a 10 bit-randomizer. The quasi-random seed generator or the randomizer according to an embodiment of the present invention may be referred as a main-PRBS generator which is defined based on the 10-bit binary word sequence (or binary sequence).

The random symbol-offset generator according to an embodiment of the present invention may change a symbol offset for each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for respective FFT modes. According to an embodiment of the present invention, in the case of 8K FFT mode, a (13-k) bits-randomizer may be used. The (X-k) bits-randomizer according to an embodiment of the present invention may be referred as a sub-PRBS generator which is defined based on (13-k) bit binary word sequence (or binary sequence).

The main roles of the spreader and the randomizer are as follows.

Spreader: rendering a spreading effect to frequency interleaving (FI)

Randomizer: rendering a random effect to FI

Details of the output signal of a time interleaver according to an embodiment of the present invention have been described above.

Figure 60:
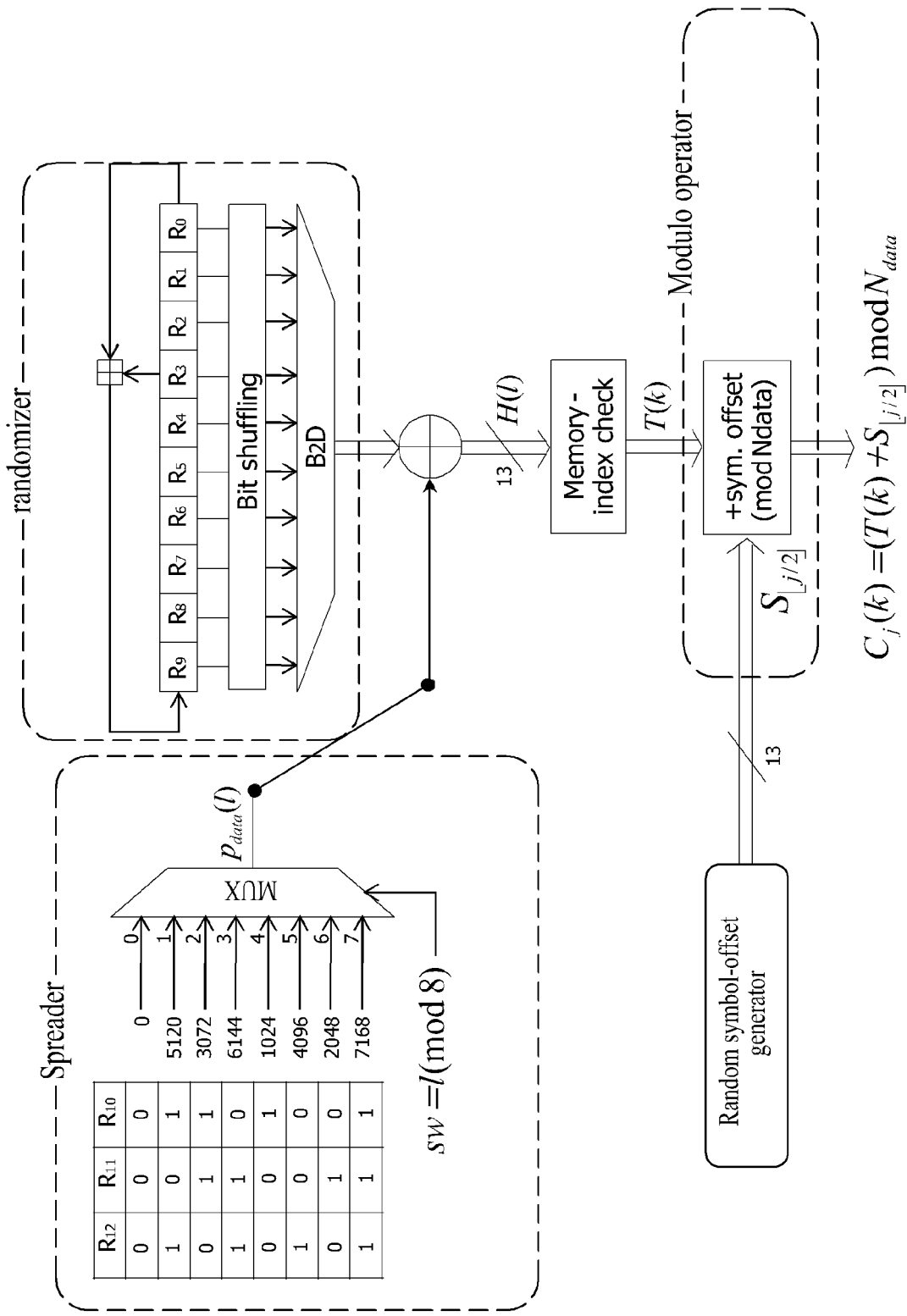
FIG. 60 is a view illustrating an 8K FFT mode quasi-random interleaving seed generator according to an embodiment of the present invention.

FIG. 60 is a view illustrating an 8K FFT mode quasi-random interleaving seed generator according to an embodiment of the present invention.

The 8K FFT mode quasi-random interleaving seed generator according to an embodiment of the present invention may include a spreader (3-bit toggling), a randomizer, a memory-index check, a random symbol-offset generator, and a modulo operator. As described above, the quasi-random main interleaving-seed generator may include a spreader and a randomizer. Hereinafter, an operation of each block will be described.

The spreader may be operated through an n-bit multiplexer and may maximize (or minimize inter-cell correlation) inter-cell spreading. In the case of 8K FFT mode, the spreader may use a look-up table that considers 3-bit.

The randomizer may be operated as a (13-n) bits-PN generator and may provide randomness (or correlation properties). The randomizer according to an embodiment of the present invention may include bit shuffling. The bit shuffling optimizes spreading properties or random properties and is designed in consideration of $N_{data}$. In the case of 8K FFT mode, the bit shuffling may use a 10-bit PN generator, which can be changed.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$.

The random symbol-offset generator may generate a symbol-offset for cyclic-shifting main interleaving-seed generated by the main-interleaving seed generator for each pair-wise OFDM symbol. A detailed operation has been described with regard to the 8K FFT mode random main-seed generator and is not described again here.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

FIG. 61 is expressions representing operations of 8K FFT mode bit shuffling and 8K FFT mode quasi-random interleaving seed generator according to an embodiment of the present invention.

(a) illustrates an expression representing an operation of the 8K FFT mode bit shuffling and (b) illustrates an expression representing an operation of the 8K FFT mode quasi-random interleaving seed generator.

As illustrated in (a), the 8K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $10^{th}$ primitive polynomial and the initial value may be changed by arbitrary values.

An expression illustrated in a lower portion of (b) shows a procedure of calculating and outputting main-interleaving seed for an output signal of the spreader and the randomizer. As illustrated in the expression, one random symbol-offset may be applied to each pair-wise OFDM symbol in the same way.

Figure 62:
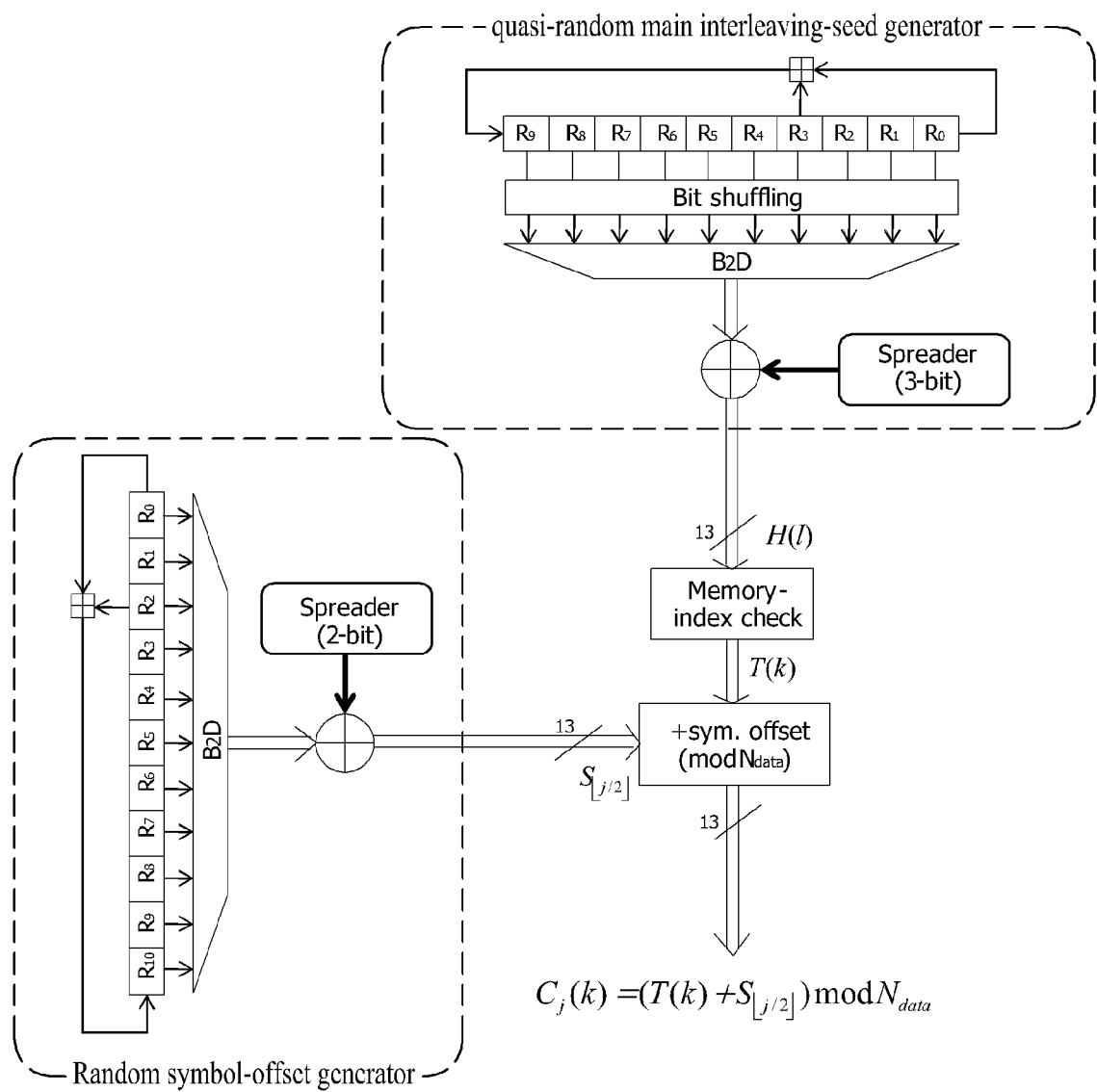
FIG. 62 is a view illustrating logical composition of an 8K FFT mode quasi-random interleaving seed generator according to an embodiment of the present invention.

FIG. 62 is a view illustrating logical composition of an 8K FFT mode quasi-random interleaving seed generator according to an embodiment of the present invention.

As described above, the 8K FFT mode quasi-random interleaving seed generator according to an embodiment of the present invention may include a quasi-random main interleaving-seed generator, a random symbol-offset generator, a memory index check, and a modulo operator.

FIG. 62 illustrates the logical composition of an 8K FFT mode quasi-random interleaving seed generator formed by combining a quasi-random main interleaving-seed generator and a random symbol-offset generator. FIG. 62 illustrates an embodiment of the quasi-random main interleaving-seed generator including a 3 bit-spreader and a 10 bits-randomizer and an embodiment of the random symbol-offset generator including a 2 bits-spreader and an 11 bits-randomizer. Details thereof have been described above and thus will be omitted here.

Hereinafter, the random seed generator for a 16K FFT mode will be described.

As described above, the random seed generator according to an embodiment of the present invention may apply different interleaving seeds to respective OFDM symbols to acquire frequency diversity. Logical composition of the random seed generator may include a random main-seed generator (or a random main interleaving-seed generator) ($C_j(K)$) for interleaving cells in a single OFDM symbol and a random symbol-offset generator ($S_{[j/2]}$) for changing a symbol offset.

The random main-seed generator may generate the aforementioned random FI parameter. That is, the random main-seed generator may generate seed for interleaving cells in a single OFDM symbol.

The random main-seed generator according to an embodiment of the present invention may include a spreader and a randomizer and perform rendering a full randomness in frequency-domain. According to an embodiment of the present invention, in the case of 16K FFT mode, the random main-seed generator may include a 1 bit spreader and an 13 bit-randomizer. The random main-seed generator or the randomizer according to an embodiment of the present invention may be referred as a main-PRBS generator which is defined based on the 13-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 16K FFT mode, a (14-k) bit-randomizer may be used. The (X-k) bits-randomizer according to an embodiment of the present invention may be referred as a sub-PRBS generator which is defined based on (14-k) bit binary word sequence (or binary sequence).

The aforementioned spreader and randomizer may be used to achieve spreading and random effects during generation of the interleaving seed.

Details of the output signal of a time interleaver according to an embodiment of the present invention have been described above.

Figure 63:
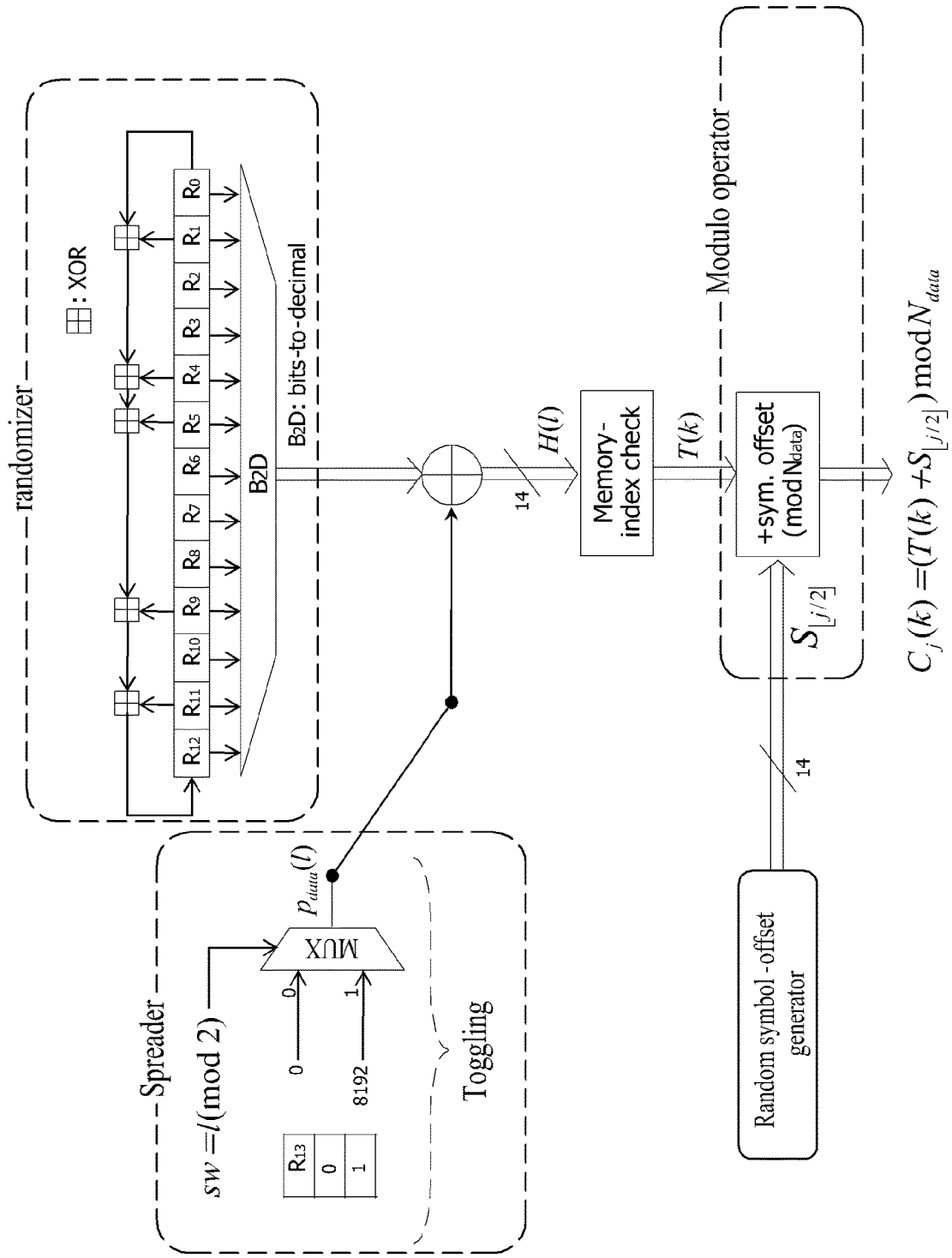
FIG. 63 is a view of a 16K FFT mode random seed generator according to an embodiment of the present invention.

FIG. 63 is a view of a 16K FFT mode random seed generator according to an embodiment of the present invention.

The 16K FFT mode random seed generator according to an embodiment of the present invention may include a spreader (1-bit toggling), a randomizer, a memory-index check, a random symbol-offset generator, and a modulo operator. As described above, the random main-seed generator may include a spreader and a randomizer. Hereinafter, an operation of each block will be described.

The (cell) spreader may be operated using an upper portion of n-bit of total 14-bit and may function as a multiplexer based on a look-up table. In the case of 16K FFT mode, the (cell) spreader may be a 1-bit multiplexer (or toggling).

The randomizer may be operated via a PN generator and may provide full randomness during interleaving. As described above, in the case of 16K FFT mode, the randomizer may be a PN generator that considers 13-bit. This can be changed according to a designer's intention. Also the spreader and the randomizer are operated through multiplexer and PN generator, respectively.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$. The $N_{data}$ according to the embodiment of the present invention is equal to the number of the data cells.

The random symbol-offset generator may generate a symbol-offset for cyclic-shifting main interleaving-seed generated by the main-interleaving seed generator for each pair-wise OFDM symbol. A detailed operation will be described below.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

FIG. 64 illustrates expressions representing an operation of a 16K FFT mode random seed generator according to an embodiment of the present invention.

The expressions illustrated in an upper portion of FIG. 64 show initial value setting and primitive polynomial of a randomizer. In this case, the primitive polynomial may be $13^{th}$ primitive polynomial and the initial value may be changed by arbitrary values.

The expressions illustrated in a lower portion of FIG. 64 show procedures of calculating and outputting main-interleaving seed for an output signal of the spreader and the randomizer. As illustrated in the expression, one random symbol-offset may be applied to each pair-wise OFDM in the same way.

Figure 65:
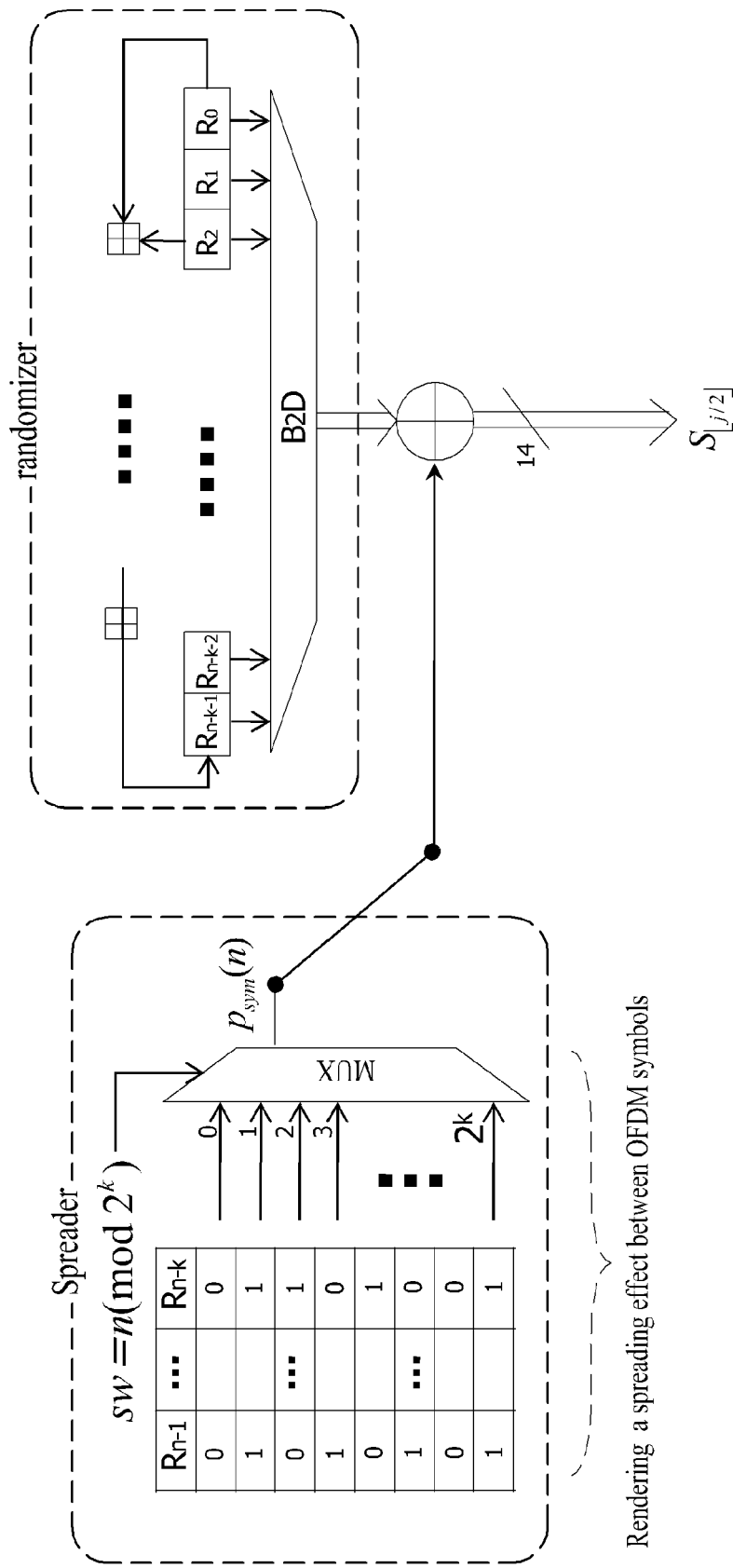
FIG. 65 is a view illustrating a 16K FFT mode random symbol-offset generator according to an embodiment of the present invention.

FIG. 65 is a view illustrating a 16K FFT mode random symbol-offset generator according to an embodiment of the present invention.

As above described, the random symbol-offset generator according to an embodiment of the present invention may include k bits-spreader and (X-k) bits-randomizer.

Hereinafter, each block will be described.

The k bits-spreader may be operated through a $2^k$ multiplexer and may be optimally designed to maximize inter-symbol spreading properties (or to minimize correlation properties).

The randomizer may be operated through a N bits-PN generator and designed to provide randomness.

The 16K FFT mode random symbol-offset generator may include a 0/1/2 bits-spreader and a 14/13/12 bits-random generator (or a PN generator). Details will be described below.

Figure 66:
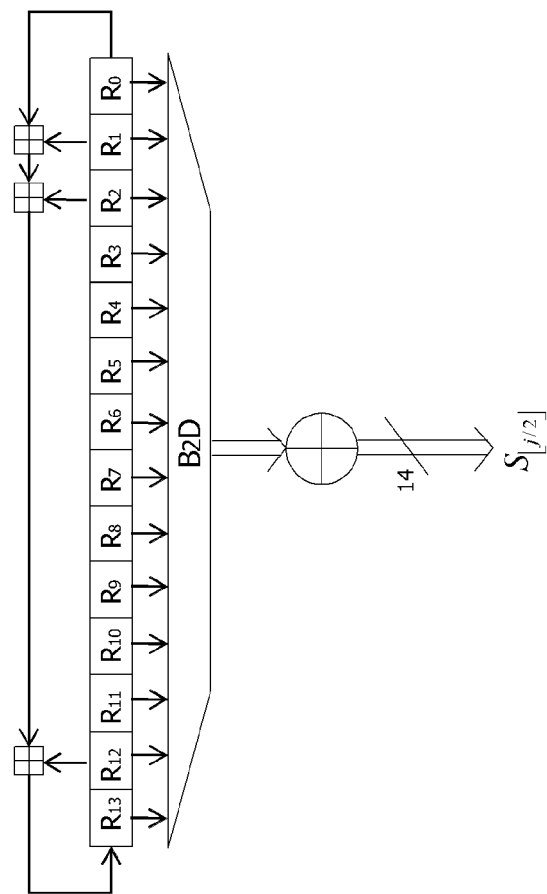
FIG. 66 illustrates expressions showing operations of a random symbol-offset generator and a random Symbol-offset generator for 16K FFT mode including a 0 bits-spreader and a 14 bits-PN generator according to an embodiment of the present invention.

FIG. 66 illustrates expressions showing operations of a random symbol-offset generator and a random Symbol-offset generator for 16K FFT mode including a 0 bits-spreader and a 14 bits-PN generator according to an embodiment of the present invention.

(a) illustrates a random symbol-offset generator including a 0 bits-spreader and a 14 bits-PN generator. (b) illustrates an operation of a 16K FFT mode random Symbol-offset generator.

The random symbol-offset generator illustrated in (a) may be operated for each pair-wise OFDM symbol.

An expression illustrated in an upper portion of (b) shows initial value setting and primitive polynomial of the randomizer. In this case, the primitive polynomial may be $14^{th}$ primitive polynomial and the initial value may be changed by arbitrary values.

An expression illustrated in a lower portion of (b) shows a procedure for calculating and outputting a symbol-offset for output signals of a spreader and a randomizer. As illustrated in the expression, the random symbol-offset generator may be operated for each pair-wise OFDM symbol.

Accordingly, the length of an entire output offset may correspond to half of the length of an entire OFDM symbol.

FIG. 67 illustrates expressions illustrating operations of a random symbol-offset generator and a random Symbol-offset generator for 16K FFT mode including a 1 bits-spreader and a 13 bits-PN generator according to an embodiment of the present invention.

(a) shows the random symbol-offset generator including a 1 bits-spreader and a 13 bits-PN generator. (b) shows an expression representing an operation of a 16K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $13^{th}$ primitive polynomial and the initial value may be changed by arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 68:
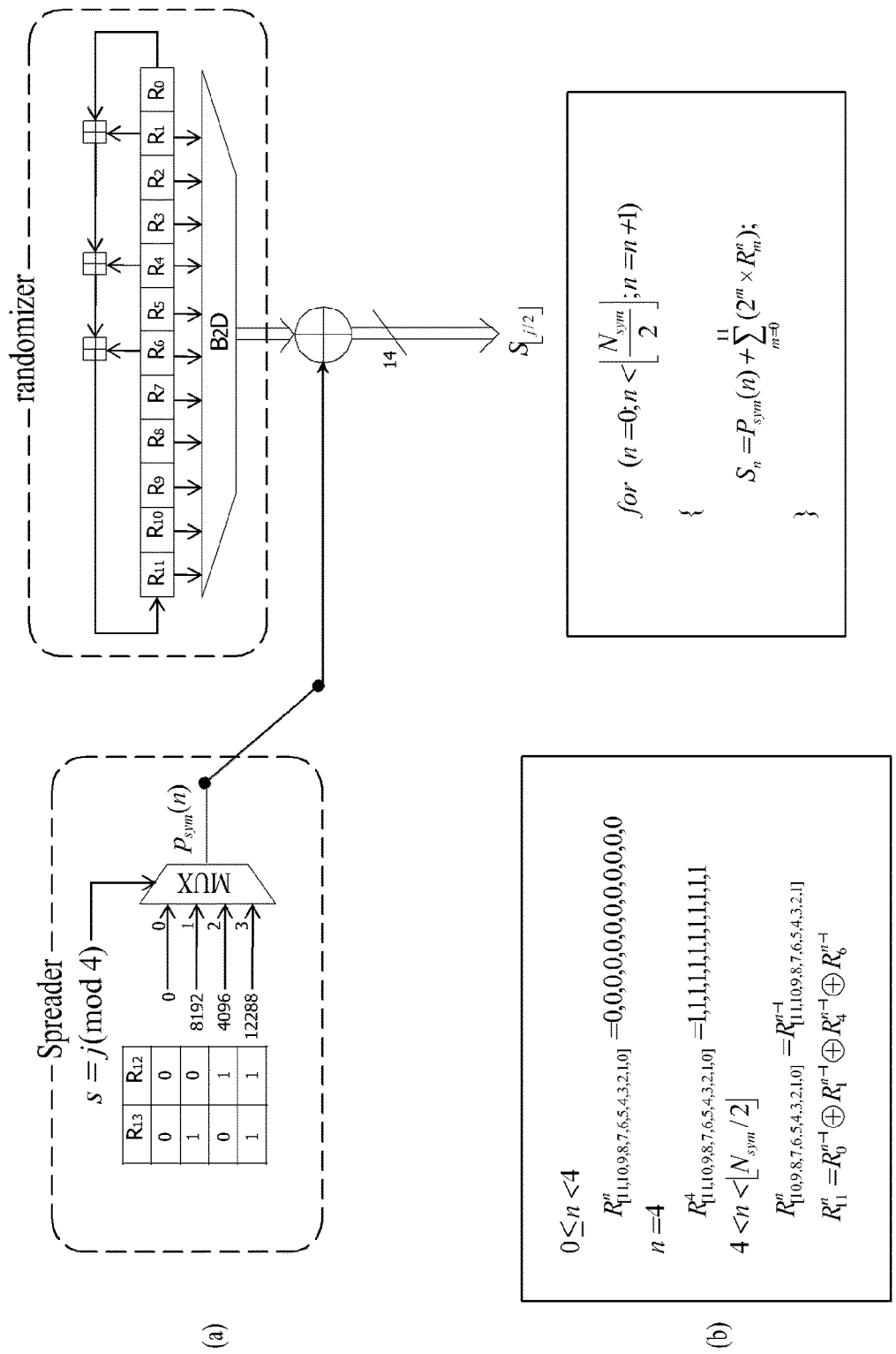
FIG. 68 illustrates expressions illustrating operations of a random symbol-offset generator and a random Symbol-offset generator for 16K FFT mode including a 2 bits-spreader and a 12 bits-PN generator according to an embodiment of the present invention.

FIG. 68 illustrates expressions illustrating operations of a random symbol-offset generator and a random Symbol-offset generator for 16K FFT mode including a 2 bits-spreader and a 12 bits-PN generator according to an embodiment of the present invention.

(a) shows the random Symbol-offset generator including a 2 bits-spreader and a 12 bits-PN generator. (b) shows an expression representing an operation of a 16K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $12^{th}$ primitive polynomial and the initial value may include arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 69:
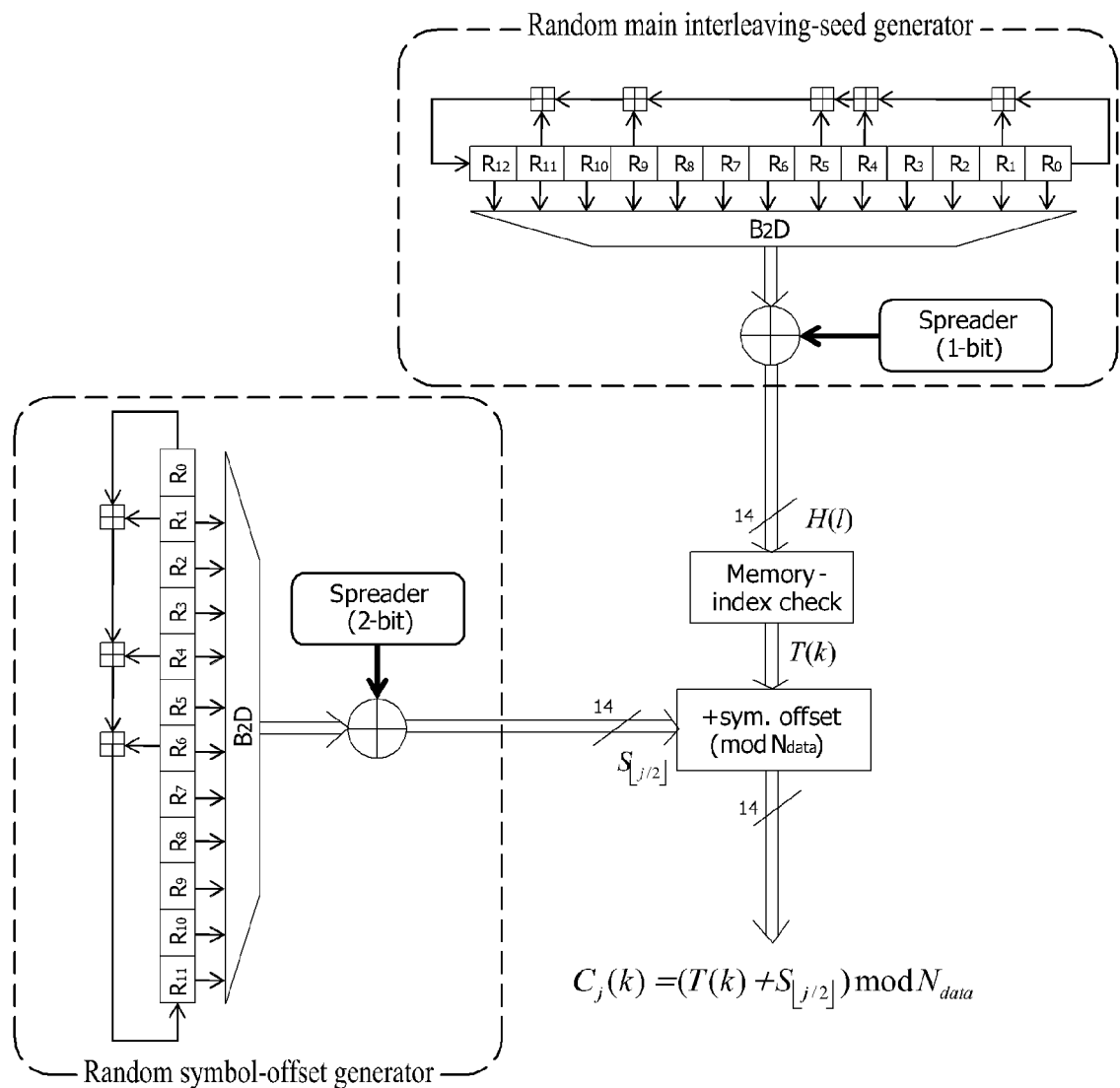
FIG. 69 is a view illustrating logical composition of a 16K FFT mode random seed generator according to an embodiment of the present invention.

FIG. 69 is a view illustrating logical composition of a 16K FFT mode random seed generator according to an embodiment of the present invention.

As described above, the 16K FFT mode random seed generator according to an embodiment of the present invention may include a random main interleaving-seed generator, a random symbol-offset generator, a memory index check, and a modulo operator.

FIG. 69 illustrates the logical composition of a 16K FFT mode random seed generator formed by combining a random main interleaving-seed generator and a random symbol-offset generator. FIG. 69 illustrates an embodiment of the random main interleaving-seed generator including a 1 bit-spreader and an 13 bits-randomizer, and an embodiment of the random symbol-offset generator including a 2 bits-spreader and a 12 bits-randomizer. Details thereof have been described above and thus will be omitted here.

Hereinafter, a quasi-random interleaving seed generator for 16K FFT mode will be described.

As described above, the quasi-random interleaving seed generator according to an embodiment of the present invention may apply different interleaving seeds to respective OFDM symbols to acquire frequency diversity. The logical composition of the quasi-random interleaving seed generator may include a main quasi-random seed generator (or quasi-random main interleaving-seed generator) ($C_j(K)$) for interleaving cells in a single OFDM symbol and a random symbol-offset generator ($S_{\lfloor j/2 \rfloor}$) for changing a symbol offset.

The main quasi-random seed generator may generate the aforementioned random FI parameter. That is, the main quasi-random seed generator may generate seed for interleaving cells in a single OFDM symbol.

The main quasi-random seed generator according to an embodiment of the present invention may include a spreader and a randomizer and perform rendering a full randomness in frequency-domain. According to an embodiment of the present invention, in the case of 16K FFT mode, the main quasi-random seed generator may include a 3 bit spreader and an 11 bit-randomizer. The main quasi-random seed generator or randomizer according to an embodiment of the present invention may be referred as a main-PRBS generator which is defined based on the 11-bit binary word sequence (or binary sequence).

The random symbol-offset generator according to an embodiment of the present invention may change a symbol offset for each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for respective FFT modes. According to an embodiment of the present invention, in the case of 16K FFT mode, a (14-k) bits-randomizer may be used. The (X-k) bits-randomizer according to an embodiment of the present invention may be referred as a sub-PRBS generator which is defined based on (14-k) bit binary word sequence (or binary sequence).

The main roles of the spreader and the randomizer are as follows.

Spreader: rendering a spreading effect to frequency interleaving (FI)

Randomizer: rendering a random effect to FI

Details of the output signal of a time interleaver according to an embodiment of the present invention have been described above.

Figure 70:
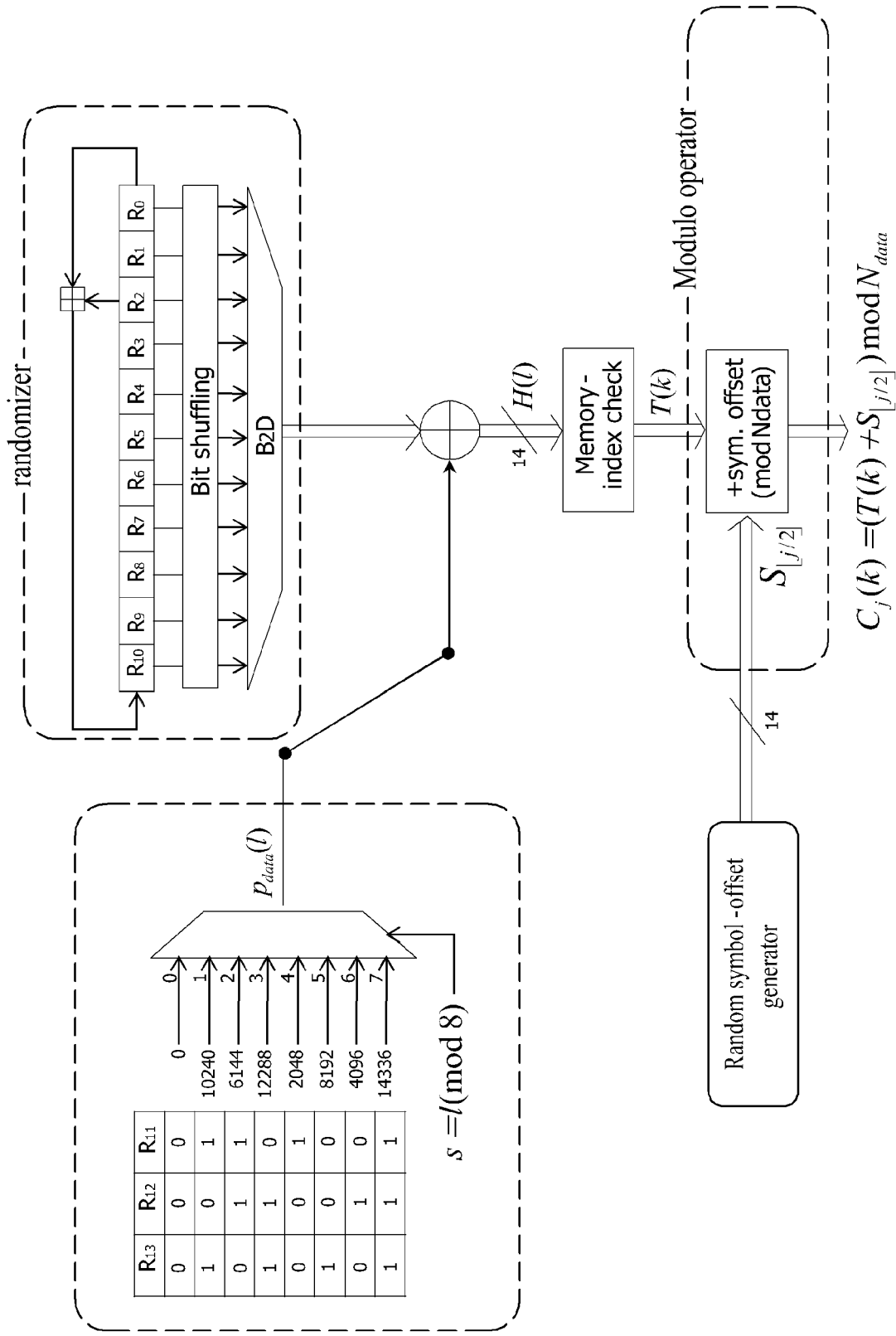
FIG. 70 is a view illustrating a 16K FFT mode quasi-random interleaving seed generator according to an embodiment of the present invention.

FIG. 70 is a view illustrating a 16K FFT mode quasi-random interleaving seed generator according to an embodiment of the present invention.

The 16K FFT mode quasi-random interleaving seed generator according to an embodiment of the present invention may include a spreader (3-bit toggling), a randomizer, a memory-index check, a random symbol-offset generator, and a modulo operator. As described above, the random main-seed generator may include a spreader and a randomizer. Hereinafter, an operation of each block will be described.

The spreader may be operated through an n-bit multiplexer and may maximize (or minimize inter-cell correlation) inter-cell spreading. In the case of 16K FFT mode, the spreader may use a look-up table that considers 3-bit.

The randomizer may be operated as a (14-n) bits-PN generator and may provide randomness (or correlation properties). The randomizer according to an embodiment of the present invention may include bit shuffling. The bit shuffling optimizes spreading properties or random properties and is designed in consideration of $N_{data}$. In the case of 16K FFT mode, the bit shuffling may use an 11-bit PN generator, which can be changed.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$.

The random symbol-offset generator may generate a symbol-offset for cyclic-shifting main interleaving-seed generated by the main-interleaving seed generator for each pair-wise OFDM symbol. A detailed operation has been described with regard to the 16K FFT mode random main-seed generator and is not described again here.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

FIG. 71 is expressions representing operations of 16K FFT mode bit shuffling and 16K FFT mode quasi-random interleaving seed generator according to an embodiment of the present invention.

(a) illustrates an expression representing an operation of the 16K FFT mode bit shuffling and (b) illustrates an expression representing an operation of the 16K FFT mode quasi-random interleaving seed generator.

As illustrated in (a), the 16K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $11^{th}$ primitive polynomial and the initial value may be changed by arbitrary values.

An expression illustrated in a lower portion of (b) shows a procedure of calculating and outputting main-interleaving seed for an output signal of the spreader and the randomizer. As illustrated in the expression, one random symbol-offset may be applied to each pair-wise OFDM symbol in the same way.

Figure 72:
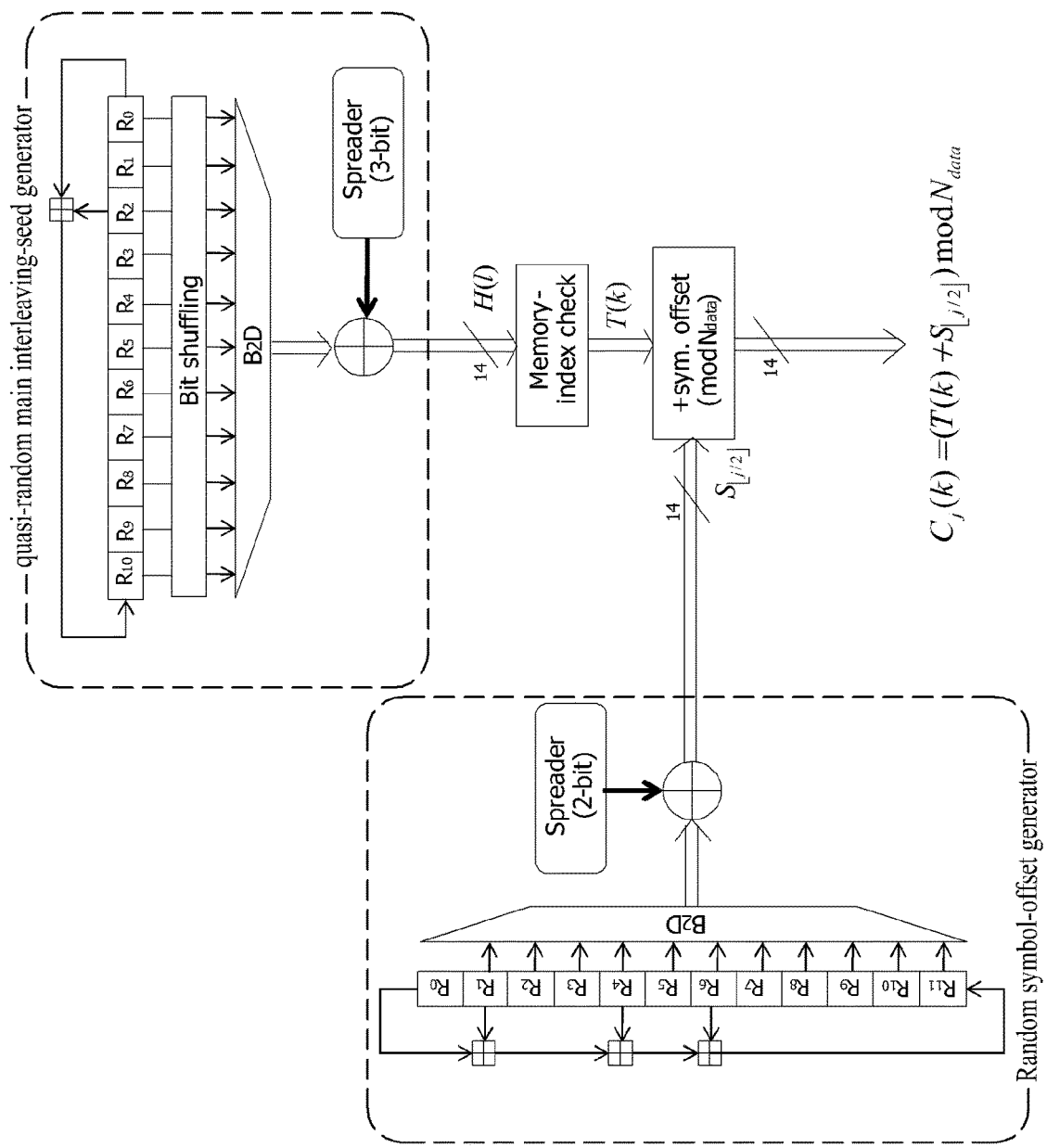
FIG. 72 is a view illustrating logical composition of a 16K FFT mode quasi-random interleaving seed generator according to an embodiment of the present invention.

FIG. 72 is a view illustrating logical composition of a 16K FFT mode quasi-random interleaving seed generator according to an embodiment of the present invention.

As described above, the 16K FFT mode quasi-random interleaving seed generator according to an embodiment of the present invention may include a quasi-random main interleaving-seed generator, a random symbol-offset generator, a memory index check, and a modulo operator.

FIG. 72 illustrates the logical composition of a 16K FFT mode quasi-random interleaving seed generator formed by combining a quasi-random main interleaving-seed generator and a random symbol-offset generator. FIG. 72 illustrates an embodiment of the quasi-random main interleaving-seed generator including a 3 bit-spreader and an 11 bits-randomizer and an embodiment of the random symbol-offset generator including a 2 bits-spreader and a 12 bits-randomizer. Details thereof have been described above and thus will be omitted here.

Hereinafter, the random seed generator for a 32K FFT mode will be described.

As described above, the random seed generator according to an embodiment of the present invention may apply different interleaving seeds to respective OFDM symbols to acquire frequency diversity. Logical composition of the random seed generator may include a random main-seed generator (or a random main interleaving-seed generator) ($C_j(K)$) for interleaving cells in a single OFDM symbol and a random symbol-offset generator ($S_{\lfloor j/2 \rfloor}$) for changing a symbol offset.

The random main-seed generator may generate the aforementioned random FI parameter. That is, the random main-seed generator may generate seed for interleaving cells in a single OFDM symbol.

The random main-seed generator according to an embodiment of the present invention may include a spreader and a randomizer and perform rendering a full randomness in frequency-domain. According to an embodiment of the present invention, in the case of 32K FFT mode, the random main-seed generator may include a 1 bit spreader and an 14 bit-randomizer. The random main-seed generator or the randomizer according to an embodiment of the present invention may be referred as a main-PRBS generator which is defined based on the 14-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 32K FFT mode, a (15-k) bit-randomizer may be used. The (X-k) bits-randomizer according to an embodiment of the present invention may be referred as a sub-PRBS generator which is defined based on (15-k) bit binary word sequence (or binary sequence).

The aforementioned spreader and randomizer may be used to achieve spreading and random effects during generation of the interleaving seed.

Details of the output signal of a time interleaver according to an embodiment of the present invention have been described above.

Figure 73:
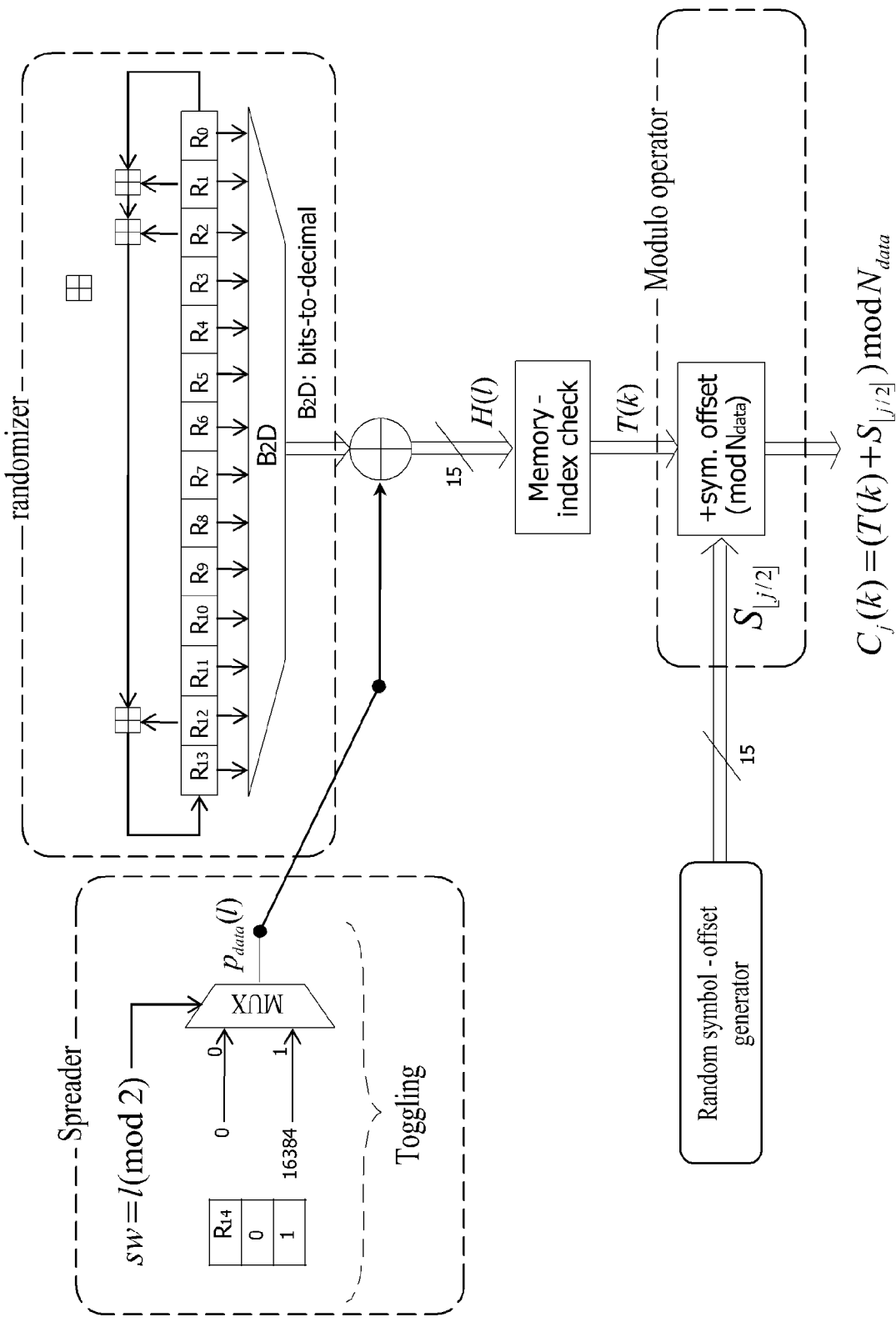
FIG. 73 is a view of a 32K FFT mode random seed generator according to an embodiment of the present invention.

FIG. 73 is a view of a 32K FFT mode random seed generator according to an embodiment of the present invention.

The 32K FFT mode random seed generator according to an embodiment of the present invention may include a spreader (1-bit toggling), a randomizer, a memory-index check, a random symbol-offset generator, and a modulo operator. As described above, the random main-seed generator may include a spreader and a randomizer. Hereinafter, an operation of each block will be described.

The (cell) spreader may be operated using an upper portion of n-bit of total 15-bit and may function as a multiplexer based on a look-up table. In the case of 32K FFT mode, the (cell) spreader may be a 1-bit multiplexer (or toggling).

The randomizer may be operated via a PN generator and may provide full randomness during interleaving. As described above, in the case of 32K FFT mode, the randomizer may be a PN generator that considers 14-bit. This can be changed according to a designer's intention. Also the spreader and the randomizer are operated through multiplexer and PN generator, respectively.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$. The $N_{data}$ according to the embodiment of the present invention is equal to the number of the data cells.

The random symbol-offset generator may generate a symbol-offset for cyclic-shifting main interleaving-seed generated by the main-interleaving seed generator for each pair-wise OFDM symbol. A detailed operation will be described below.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

FIG. 74 illustrates expressions representing an operation of a 32K FFT mode random seed generator according to an embodiment of the present invention.

The expressions illustrated in an upper portion of FIG. 74 show initial value setting and primitive polynomial of a randomizer. In this case, the primitive polynomial may be $14^{th}$ primitive polynomial and the initial value may be changed by arbitrary values.

The expressions illustrated in a lower portion of FIG. 74 show procedures of calculating and outputting main-interleaving seed for an output signal of the spreader and the randomizer. As illustrated in the expression, one random symbol-offset may be applied to each pair-wise OFDM in the same way.

Figure 75:
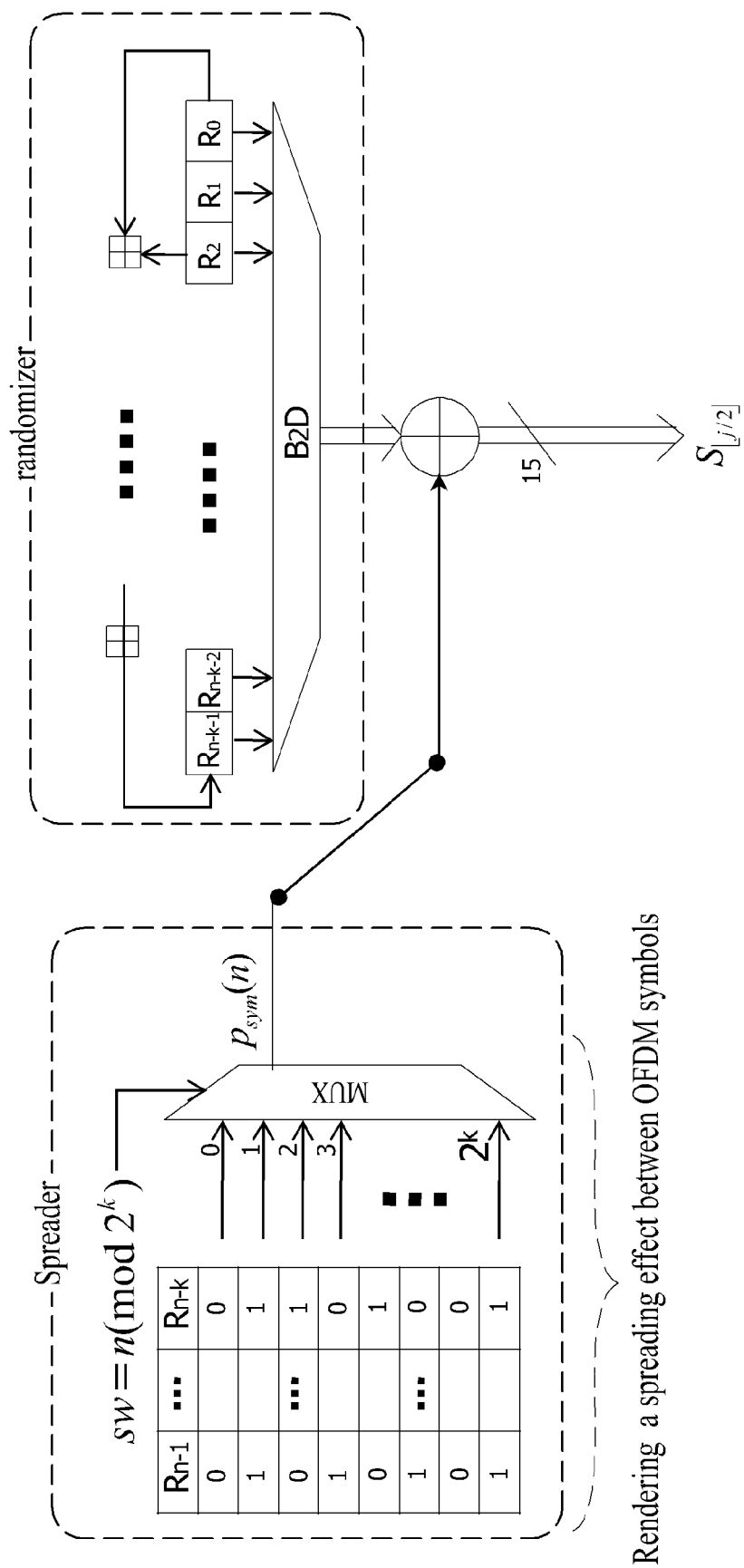
FIG. 75 is a view illustrating a 32K FFT mode random symbol-offset generator according to an embodiment of the present invention.

FIG. 75 is a view illustrating a 32K FFT mode random symbol-offset generator according to an embodiment of the present invention.

As above described, the random symbol-offset generator according to an embodiment of the present invention may include k bits-spreader and (X-k) bits-randomizer.

Hereinafter, each block will be described.

The k bits-spreader may be operated through a $2^k$ multiplexer and may be optimally designed to maximize inter-symbol spreading properties (or to minimize correlation properties).

The randomizer may be operated through a N bits-PN generator and designed to provide randomness.

The 32K FFT mode random symbol-offset generator may include a 0/1/2 bits-spreader and a 15/14/13 bits-random generator (or a PN generator). Details will be described below.

Figure 76:
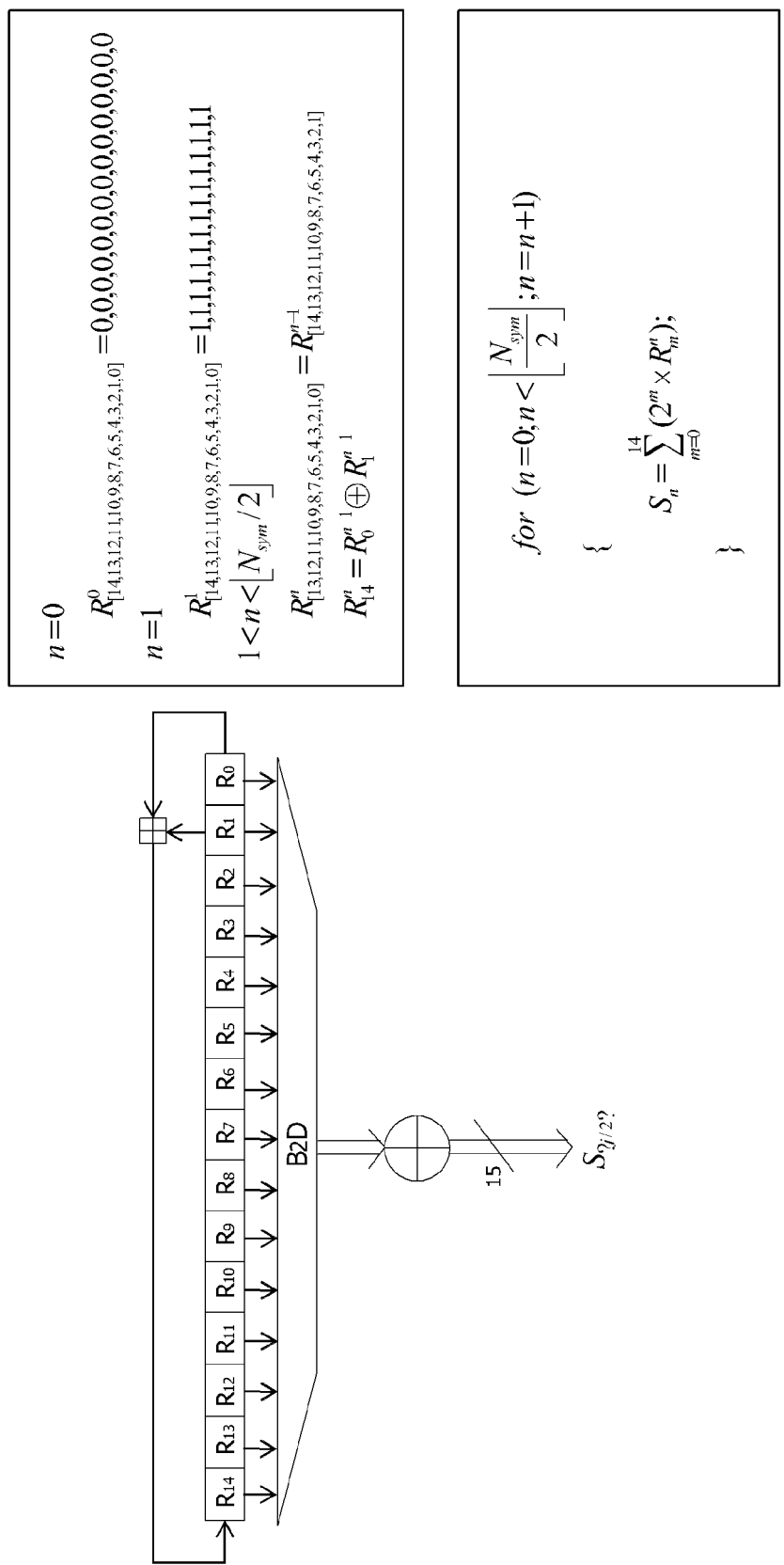
FIG. 76 illustrates expressions showing operations of a random symbol-offset generator and a random Symbol-offset generator for 32K FFT mode including a 0 bits-spreader and a 15 bits-PN generator according to an embodiment of the present invention.

FIG. 76 illustrates expressions showing operations of a random symbol-offset generator and a random Symbol-offset generator for 32K FFT mode including a 0 bits-spreader and a 15 bits-PN generator according to an embodiment of the present invention.

(a) illustrates a random symbol-offset generator including a 0 bits-spreader and a 15 bits-PN generator. (b) illustrates an operation of a 32K FFT mode random Symbol-offset generator.

The random symbol-offset generator illustrated in (a) may be operated for each pair-wise OFDM symbol.

An expression illustrated in an upper portion of (b) shows initial value setting and primitive polynomial of the randomizer. In this case, the primitive polynomial may be $12^{th}$ primitive polynomial and the initial value may be changed by arbitrary values.

An expression illustrated in a lower portion of (b) shows a procedure for calculating and outputting a symbol-offset for output signals of a spreader and a randomizer. As illustrated in the expression, the random symbol-offset generator may be operated for each pair-wise OFDM symbol. Accordingly, the length of an entire output offset may correspond to half of the length of an entire OFDM symbol.

Figure 77:
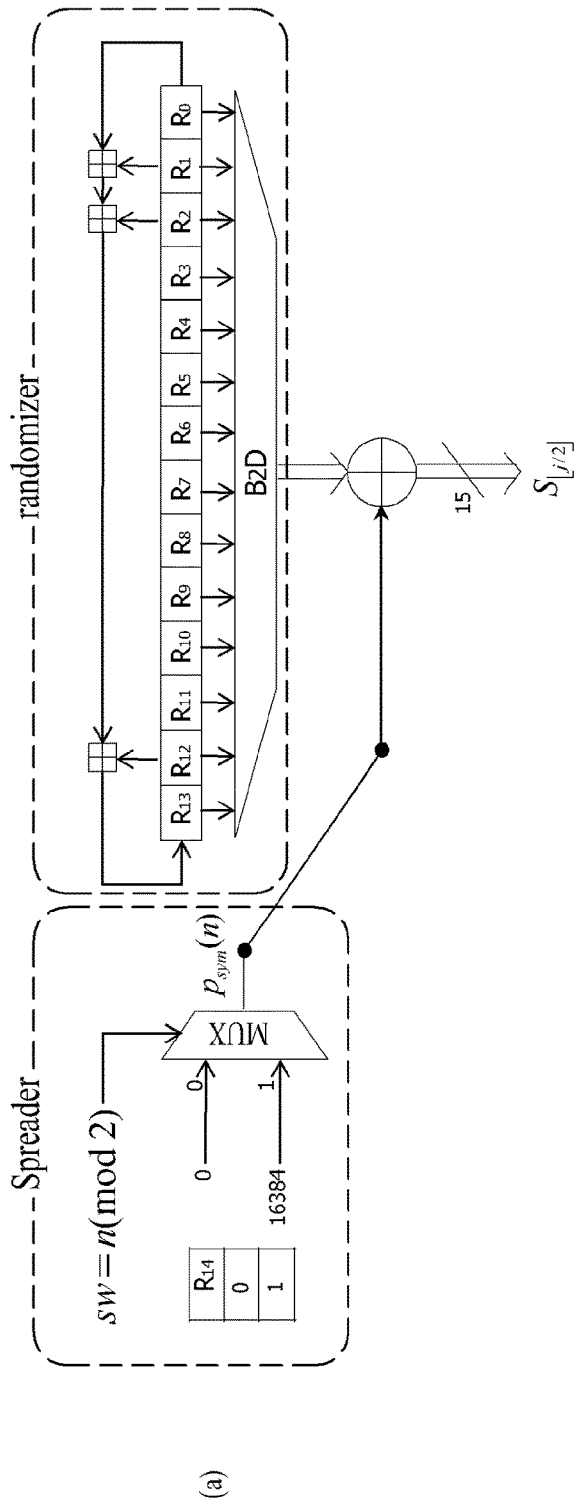
FIG. 77 illustrates expressions illustrating operations of a random symbol-offset generator and a random Symbol-offset generator for 32K FFT mode including a 1 bits-spreader and a 14 bits-PN generator according to an embodiment of the present invention.

FIG. 77 illustrates expressions illustrating operations of a random symbol-offset generator and a random Symbol-offset generator for 32K FFT mode including a 1 bits-spreader and an 14 bits-PN generator according to an embodiment of the present invention.

(a) shows the random symbol-offset generator including a 1 bits-spreader and an 14 bits-PN generator. (b) shows an expression representing an operation of a 32K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $14^{th}$ primitive polynomial and the initial value may be changed by arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 78:
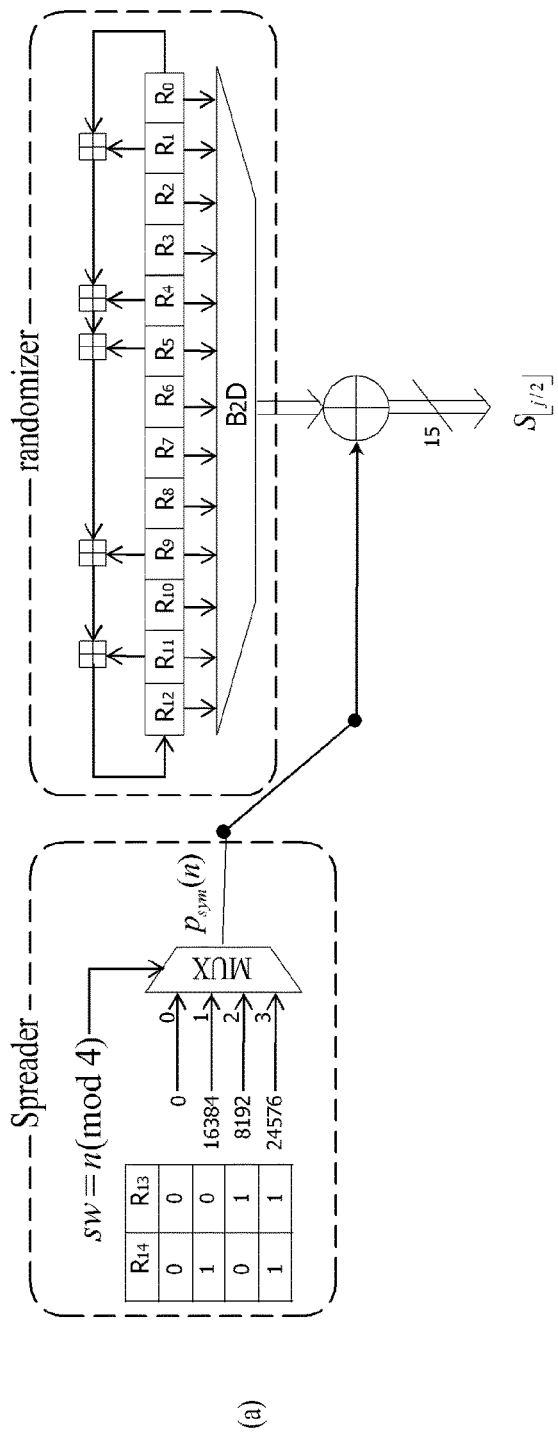
FIG. 78 illustrates expressions illustrating operations of a random symbol-offset generator and a random Symbol-offset generator for 32K FFT mode including a 2 bits-spreader and a 13 bits-PN generator according to an embodiment of the present invention.

FIG. 78 illustrates expressions illustrating operations of a random symbol-offset generator and a random Symbol-offset generator for 32K FFT mode including a 2 bits-spreader and a 13 bits-PN generator according to an embodiment of the present invention.

(a) shows the random Symbol-offset generator including a 2 bits-spreader and a 13 bits-PN generator. (b) shows an expression representing an operation of a 32K FFT mode random symbol-offset generator.

The random symbol-offset generator illustrated in (a) may be operated for each pair-wise OFDM symbol.

An expression illustrated in an upper portion of (b) shows initial value setting and primitive polynomial of a randomizer. In this case, the primitive polynomial may be $13^{th}$ primitive polynomial and the initial value may include arbitrary values.

An expression illustrated in a lower portion of (b) shows a procedure of calculating and outputting a symbol-offset for an output signal of the spreader and the randomizer. As illustrated in the expression, the random symbol-offset generator may be operated for each pair-wise OFDM symbol. Accordingly, the length of an entire output offset may correspond to half of the length of an entire OFDM symbol.

Figure 79:
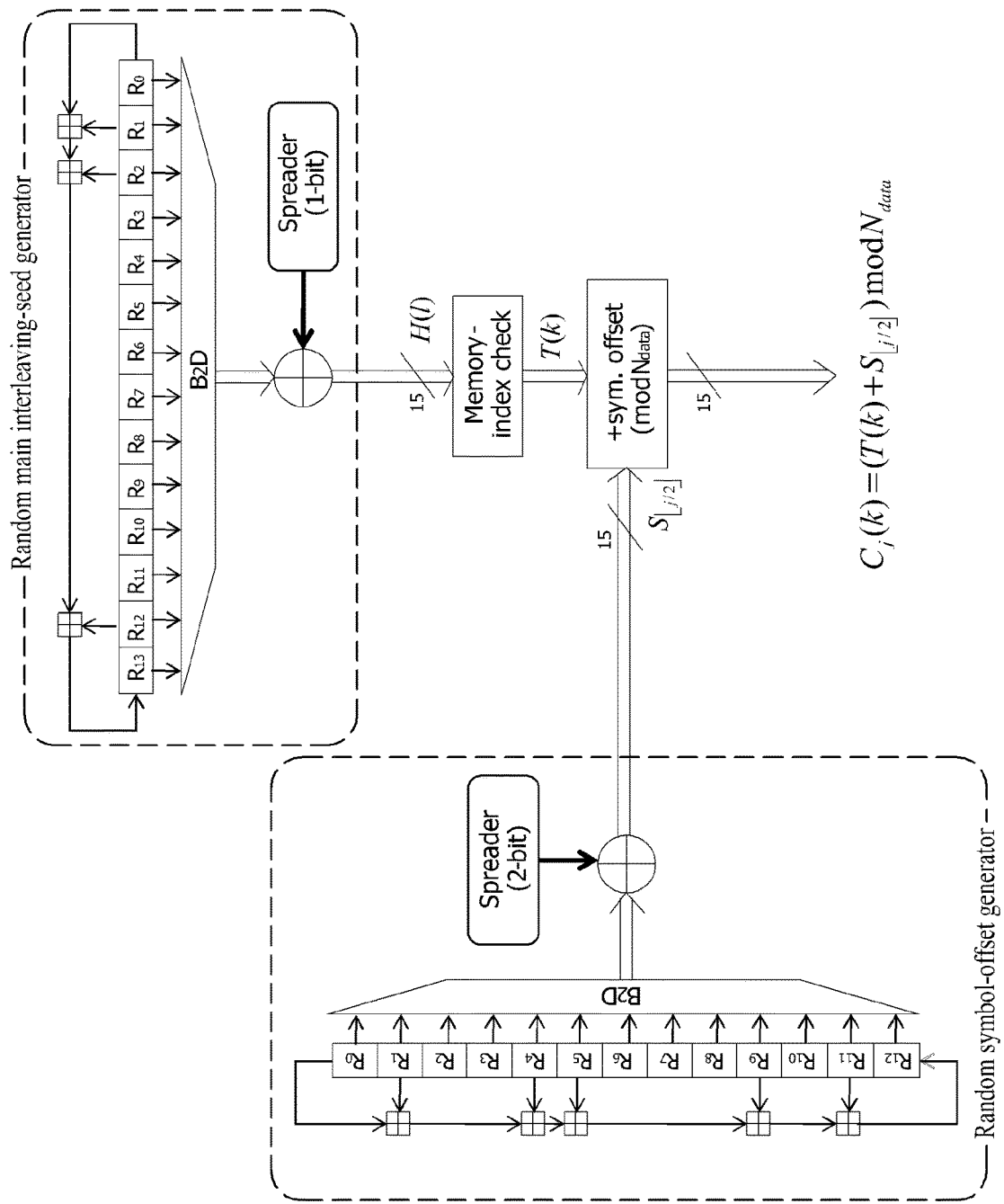
FIG. 79 is a view illustrating logical composition of a 32K FFT mode random seed generator according to an embodiment of the present invention.

FIG. 79 is a view illustrating logical composition of a 32K FFT mode random seed generator according to an embodiment of the present invention.

As described above, the 32K FFT mode random seed generator according to an embodiment of the present invention may include a random main interleaving-seed generator, a random symbol-offset generator, a memory index check, and a modulo operator.

FIG. 79 illustrates the logical composition of a 32K FFT mode random seed generator formed by combining a random main interleaving-seed generator and a random symbol-offset generator. FIG. 79 illustrates an embodiment of the random main interleaving-seed generator including a 1 bit-spreader and an 14 bits-randomizer, and an embodiment of the random symbol-offset generator including a 2 bits-spreader and a 13 bits-randomizer. Details thereof have been described above and thus will be omitted here.

Hereinafter, a quasi-random interleaving seed generator for 32K FFT mode will be described.

As described above, the quasi-random interleaving seed generator according to an embodiment of the present invention may apply different interleaving seeds to respective OFDM symbols to acquire frequency diversity. The logical composition of the quasi-random interleaving seed generator may include a main quasi-random seed generator (or quasi-random main interleaving-seed generator) ($C_j(K)$) for interleaving cells in a single OFDM symbol and a random symbol-offset generator ($S_{\lfloor j/2 \rfloor}$) for changing a symbol offset.

The main quasi-random seed generator may generate the aforementioned random FI parameter. That is, the main quasi-random seed generator may generate seed for interleaving cells in a single OFDM symbol.

The main quasi-random seed generator according to an embodiment of the present invention may include a spreader and a randomizer and perform rendering a full randomness in frequency-domain. According to an embodiment of the present invention, in the case of 32K FFT mode, the main quasi-random seed generator may include a 3 bit spreader and an 12 bit-randomizer. The main quasi-random seed generator or the randomizer according to an embodiment of the present invention may be referred as a main-PRBS generator which is defined based on the 12-bit binary word sequence (or binary sequence).

The random symbol-offset generator according to an embodiment of the present invention may change a symbol offset for each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for respective FFT modes. According to an embodiment of the present invention, in the case of 16K FFT mode, a (15-k) bits-randomizer may be used. The (X-k) bits-randomizer according to an embodiment of the present invention may be referred as a sub-PRBS generator which is defined based on (15-k) bit binary word sequence (or binary sequence).

The main roles of the spreader and the randomizer are as follows.

Spreader: rendering a spreading effect to frequency interleaving (FI)

Randomizer: rendering a random effect to FI

Details of the output signal of a time interleaver according to an embodiment of the present invention have been described above.

Figure 80:
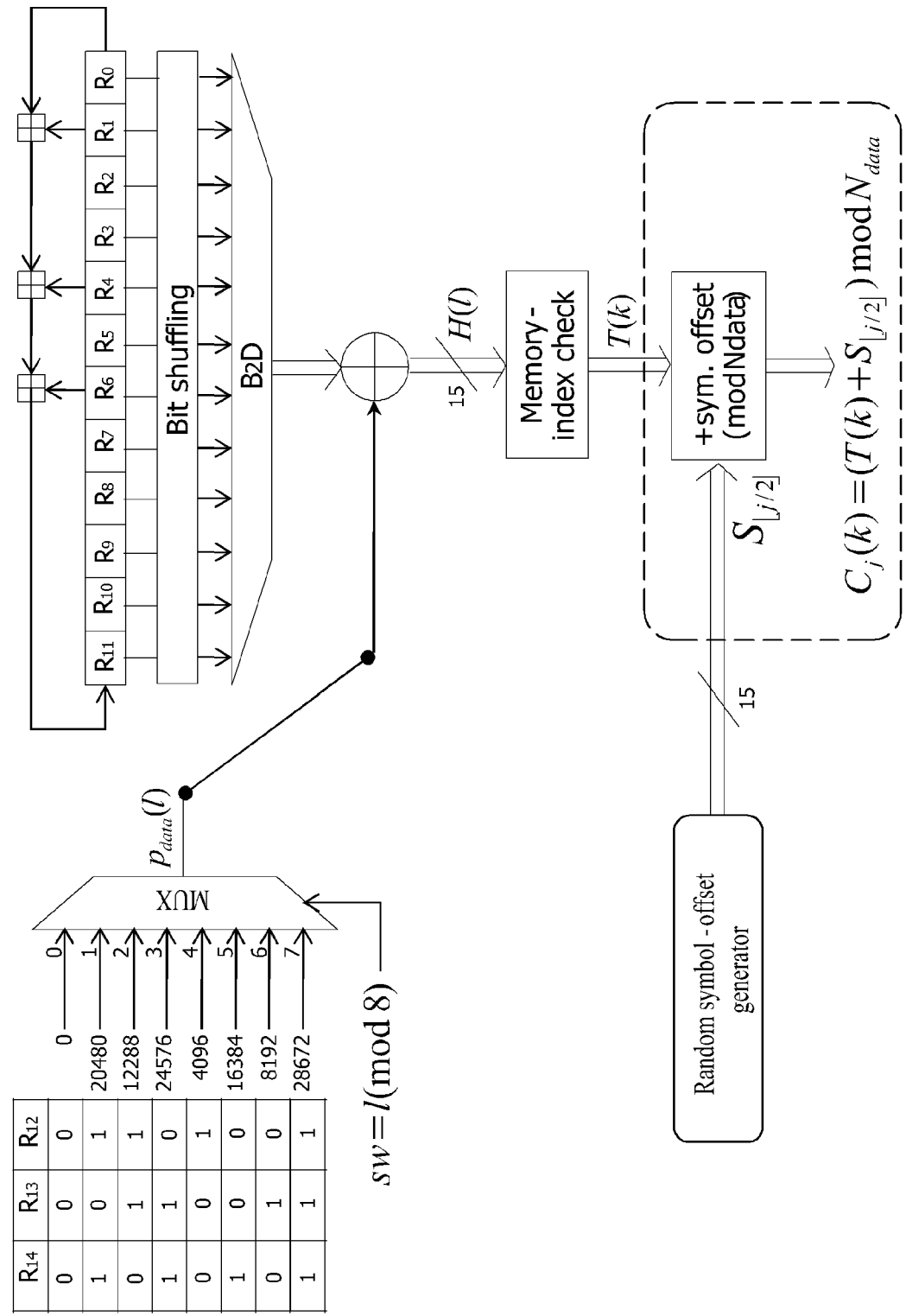
FIG. 80 is a view illustrating a 32K FFT mode quasi-random interleaving seed generator according to an embodiment of the present invention.

FIG. 80 is a view illustrating a 32K FFT mode quasi-random interleaving seed generator according to an embodiment of the present invention.

The 32K FFT mode quasi-random interleaving seed generator according to an embodiment of the present invention may include a spreader (3-bit toggling), a randomizer, a memory-index check, a random symbol-offset generator, and a modulo operator. As described above, the quasi-random main-seed generator may include a spreader and a randomizer. Hereinafter, an operation of each block will be described.

The spreader may be operated through an n-bit multiplexer and may maximize (or minimize inter-cell correlation) inter-cell spreading. In the case of 32K FFT mode, the spreader may use a look-up table that considers 3-bit.

The randomizer may be operated as a (15-n) bits-PN generator and may provide randomness (or correlation properties). The randomizer according to an embodiment of the present invention may include bit shuffling. The bit shuffling optimizes spreading properties or random properties and is designed in consideration of $N_{data}$. In the case of 32K FFT mode, the bit shuffling may use a 9-bit PN generator, which can be changed.

The memory-index check may not use seed when a memory-index generated by the spreader and the randomizer is greater than $N_{data}$ and may repeatedly operate the spreader and the randomizer to adjust the output memory-index such that the output memory-index does not exceed $N_{data}$.

The random symbol-offset generator may generate a symbol-offset for cyclic-shifting main interleaving-seed generated by the main-interleaving seed generator for each pair-wise OFDM symbol. A detailed operation has been described with regard to the 32K FFT mode random main-seed generator and is not described again here.

The modulo operator may be operated when a result value, obtained by adding a symbol-offset output by the random symbol-offset generator for each pair-wise OFDM symbol to the memory-index output by the memory-index check, exceeds $N_{data}$. Locations of the illustrated memory-index check and modulo operator can be changed according to a designer's intention.

Figure 81:
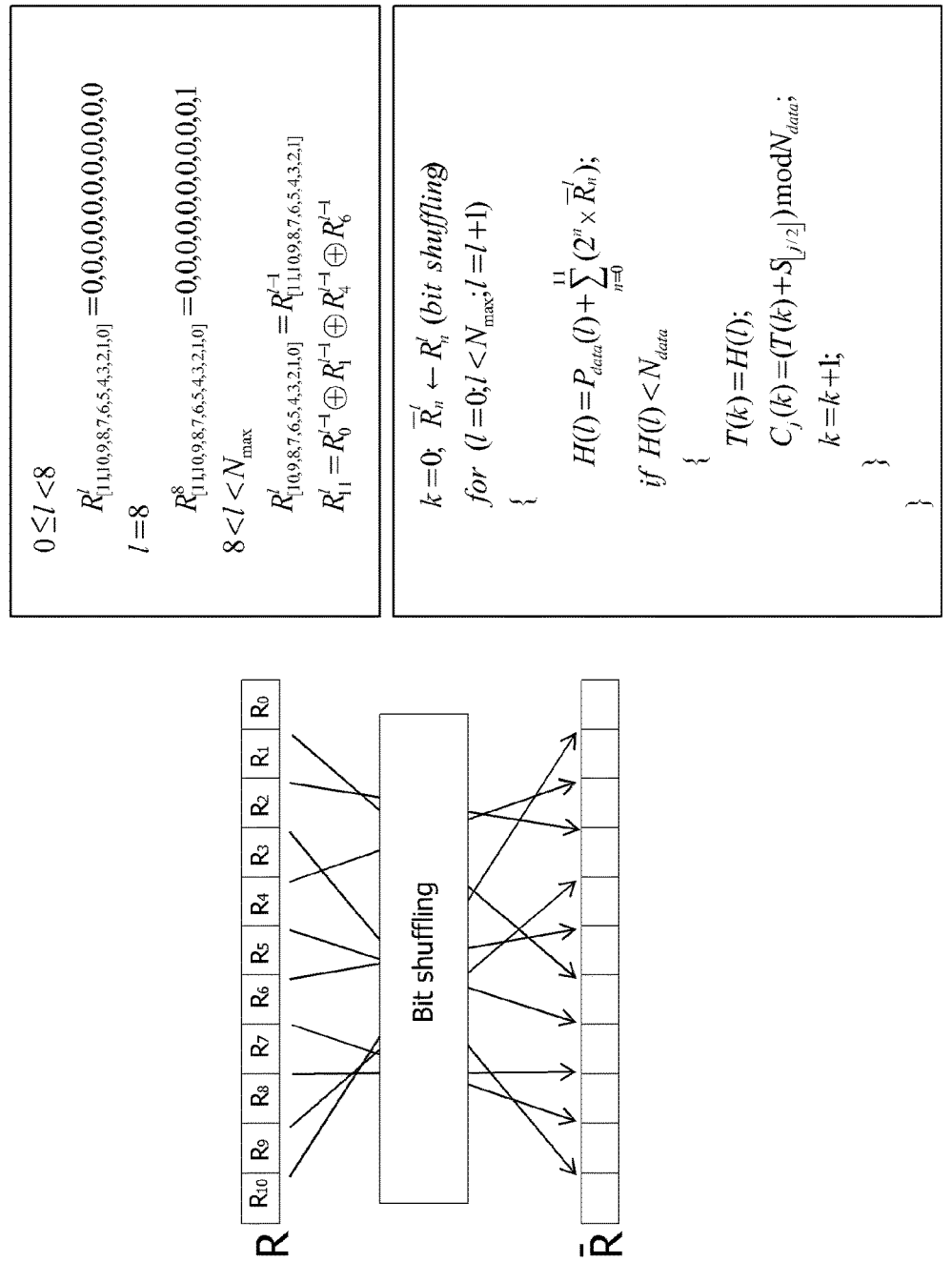
FIG. 81 is expressions representing operations of 32K FFT mode bit shuffling and 32K FFT mode quasi-random interleaving seed generator according to an embodiment of the present invention.

FIG. 81 is expressions representing operations of 32K FFT mode bit shuffling and 32K FFT mode quasi-random interleaving seed generator according to an embodiment of the present invention.

(a) illustrates an expression representing an operation of the 32K FFT mode bit shuffling and (b) illustrates an expression representing an operation of the 32K FFT mode quasi-random interleaving seed generator.

As illustrated in (a), the 32K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $12^{th}$ primitive polynomial and the initial value may be changed by arbitrary values.

An expression illustrated in a lower portion of (b) shows a procedure of calculating and outputting main-interleaving seed for an output signal of the spreader and the randomizer. As illustrated in the expression, one random symbol-offset may be applied to each pair-wise OFDM symbol in the same way.

Figure 82:
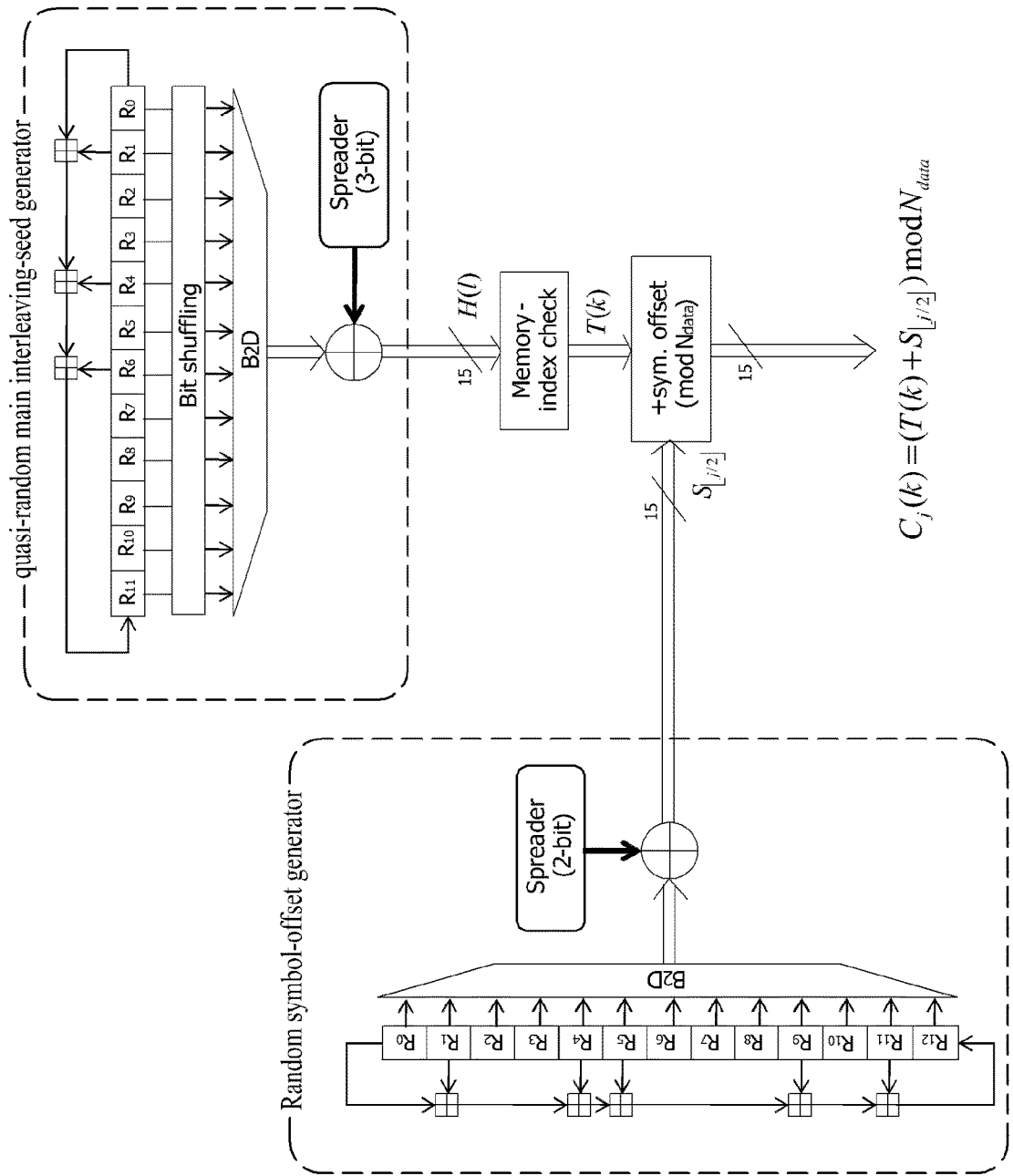
FIG. 82 is a view illustrating logical composition of a 32K FFT mode quasi-random interleaving seed generator according to an embodiment of the present invention.

FIG. 82 is a view illustrating logical composition of a 32K FFT mode quasi-random interleaving seed generator according to an embodiment of the present invention.

As described above, the 32K FFT mode quasi-random interleaving seed generator according to an embodiment of the present invention may include a quasi-random main interleaving-seed generator, a random symbol-offset generator, a memory index check, and a modulo operator.

FIG. 82 illustrates the logical composition of a 32K FFT mode quasi-random interleaving seed generator formed by combining a quasi-random main interleaving-seed generator and a random symbol-offset generator. FIG. 82 illustrates an embodiment of the quasi-random main interleaving-seed generator including a 3 bit-spreader and a 12 bits-randomizer and an embodiment of the random symbol-offset generator including a 2 bits-spreader and a 13 bits-randomizer. Details thereof have been described above and thus will be omitted here.

FIG. 83 is a change procedure for an interleaving seed in each memory bank according to another embodiment of the present invention.

The block illustrated in an upper portion of FIG. 83 shows expressions for the first OFDM symbol, i.e., (j mod 2)=0 of the ith OFDM symbol pair. The block illustrated in a lower portion of FIG. 83 shows expressions for the second OFDM symbol, i.e., (j mod 2)=1 of the ith OFDM symbol pair.

The word "a random generator" illustrated each portion of FIG. 83 may be a random interleaving-sequence generator described as follows. The random interleaving-sequence generator according to an embodiment of the present invention may be included in the frequency interleaver 7020.

T(k) illustrated in an upper portion of FIG. 83 is a random sequence, it can be used as a same concept of a main random interleaving sequence or a single interleaving seed (or an interleaving seed). The Random sequence may be generated in a random interleaving-sequence generator or a random main-sequence generator which will be described later. $S_{[j/2]}$ is a symbol offset and be referred as a cyclic shifting value. The cyclic shifting value can be generated based on sub PRBS sequence. The details will be described later.

The interleaving process for the OFDM symbol pair in each memory bank-A/B is described as above, exploiting a single interleaving-seed. The available data cells (the output cells from the cell mapper 7010) to be interleaved in one OFDM symbol. The $N_{data}$ according to the embodiment of the present invention is equal to the number of the data cells. The maximum value of the $N_{data}$ can be referred as $N_{max}$ and $N_{max}$ is differently defined according to each FFT mode. For the OFDM symbol pair in each memory bank, the interleaved OFDM symbol pair is shown in FIG. 83.

Hj(k) is the interleaving address for the interleaving seed generated by a random interleaving-sequence generator for each FFT mode. The composition of the random interleaving-sequence generator will be described later. As described above, the purpose of the frequency interleaver 7020, which operates on a single OFDM symbol, is to provide frequency diversity by randomly interleaving data cells. In order to get maximum interleaving gain in a single frame, a different interleaving-seed is used for every OFDM symbol pair comprised of two sequential OFDM symbols. As shown in FIG. 83, different interleaving seed can be generated based on the interleaving address generated by a random interleaving-sequence generator. Also, the different interleaving seed can be generated based on the cyclic shifting value as above mentioned. That means, the different interleaving address to be used every symbol pair may be generated by using the cyclic shifting value for every OFDM symbol pair.

As described above, an OFDM generation block 1030 may perform FFT transformation on input data. Hereinafter, an operation of the frequency interleaver 7020 having the random interleaving-sequence generator according to another embodiment will be described. The random interleaving-sequence generator may be another embodiment of the interleaving seed generator which is described above. Therefore, the random interleaving-sequence generator may be referred as the random seed generator or the quasi-random interleaving seed generator or the interleaving address generator and it may be changed by the designer's intention. The random interleaving-sequence generator may include a first generator and a second generator. The first generator is for generating a main interleaving seed generator and the second generator is for generating a symbol offset. The name of the first generator and the second generator can be changed according to the designer's indention.

As described above, an FFT size according to an embodiment of the present invention may be 4K, 8K, 16K, 32K, or the like, and it can be changed according to the designer's intention.

Hereinafter, the random interleaving-sequence generator for a 4K FFT mode will be described. The random interleaving-sequence generator according to an embodiment of the present invention may be included in the frequency interleaver 7020 and is similar to the random seed generator mentioned (mentioned above), the random interleaving-sequence generator has a different structure from the random seed generator.

The random interleaving-sequence generator according to an embodiment of the present invention may apply different interleaving seeds to respective OFDM symbols to acquire frequency diversity. Logical composition of the random interleaving-sequence generator may include a random main-sequence generator (or a random main interleaving-sequence generator or a random main-interleaving seed generator) ($C_j(K)$) for interleaving cells in a single OFDM symbol in one OFDM symbol pair and a random symbol-offset generator ($S_{[j/2]}$) for changing a symbol offset (This parameter can be referred as a cyclic shifting value). The random main-sequence generator according to an embodiment of the present invention is similar to the random seed generator (mentioned above), the random main-sequence generator has a different structure from the random main-seed generator. Also, the random main-sequence generator or a randomizer in the random main-sequence generator may be referred as a main-PRBS generator and it may be changed according to the designer's attention.

The random main-sequence generator may generate the aforementioned random FI parameter. That is, random main-sequence generator may generate seed for interleaving cells in a single OFDM symbol.

The random main-sequence generator according to an embodiment of the present invention may include a spreader and a randomizer and perform rendering a full randomness in frequency-domain. According to an embodiment of the present invention, in the case of 4K FFT mode, the random main-sequence generator may include a 1 bit spreader and an 11 bit-randomizer. The random main-sequence generator or the randomizer according to an embodiment of the present invention may be referred as a main-PRBS generator which is defined based on the 11-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 4K FFT mode, a (12-k) bit-randomizer may be used. The (X-k) bits-randomizer according to an embodiment of the present invention may be referred as a sub-PRBS generator which is defined based on (12-k) bit binary word sequence (or binary sequence).

The aforementioned spreader and randomizer may be used to achieve spreading and random effects during generation of the interleaving seed.

In this embodiment, in generating of interleaving-value, PRBS operation order is modified to cope with the case of that the number of active carriers vary at start and last OFDM symbols within a single frame.

Figure 84:
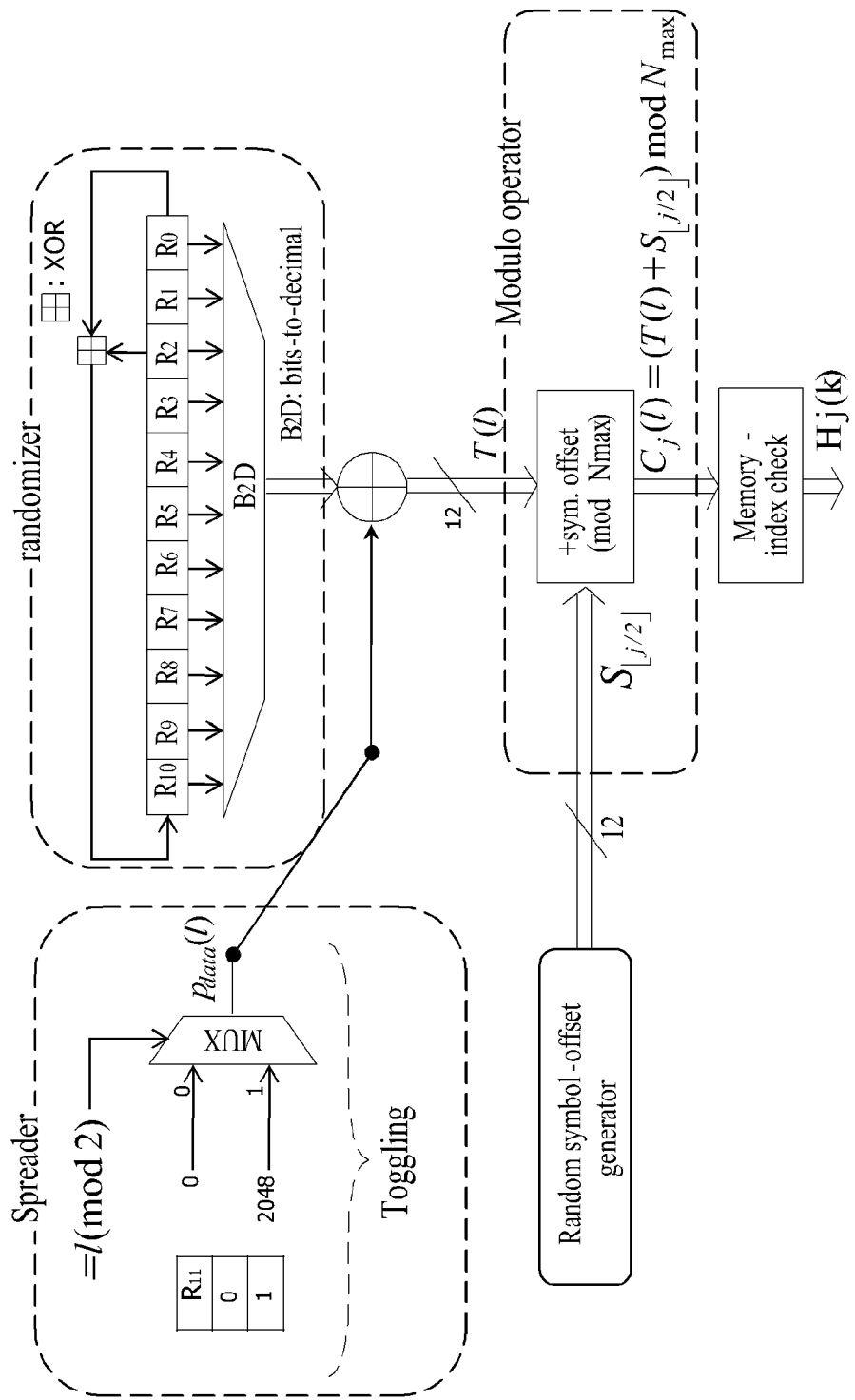
FIG. 84 is a view of a 4K FFT mode random interleaving-sequence generator according to an embodiment of the present invention.

FIG. 84 is a view of a 4K FFT mode random interleaving-sequence generator according to an embodiment of the present invention.

The 4K FFT mode random interleaving-sequence generator according to an embodiment of the present invention may include a spreader (1-bit toggling), a randomizer, a random symbol-offset generator, a modulo operator and a memory-index check. As described above, the random main-sequence generator may include a spreader and a randomizer.

As shown in FIG. 84, the locations of the modulo operator and the memory-index check is changed as compared with the 4K FFT mode random main-seed generator as described above.

The changed locations of the modulo operator and the memory-index check as shown in FIG. 84 is to increase a frequency deinterleaving performance of the frequency deinterleaver having single memory. As above described, a signal frame (or frame) according to the present invention may have normal data symbol (normal data symbol), frame edge symbol and frame signaling symbol and a length of the frame edge symbol and the frame signaling symbol may be shorter than the normal data symbol. For this reason, a frequency deinterleaving performance of the frequency deinterleaver having single memory can be decreased. In order to increase the frequency deinterleaving performance of the frequency deinterleaver with a single memory, the present invention may provide the changed locations of the modulo operator and the memory-index check.

Hereinafter, an operation of each block will be described.

The (cell) spreader may be operated using an upper portion of n-bit of total 12-bit and may function as a multiplexer based on a look-up table. In the case of 4K FFT mode, the (cell) spreader may be a 1-bit multiplexer (or toggling).

The randomizer may be operated via a PN generator and may provide full randomness during interleaving. As described above, in the case of 4K FFT mode, the randomizer may be a PN generator that considers 11-bit. This can be changed according to a designer's intention. Also the spreader and the randomizer are operated through multiplexer and PN generator, respectively.

The random symbol-offset generator may generate a symbol-offset for cyclic-shifting main interleaving-sequence generated by the main-interleaving sequence generator for each pair-wise OFDM symbol. A detailed operation is the same as those describe above and thus are not described here.

The modulo operator may be operated when input value exceeds $N_{data}$ or $N_{max}$. The maximum value of the $N_{data}$ ($N_{max}$) for 4K FFT mode may be 4096.

The memory-index check may not use output from the modulo operator when a memory-index generated by the spreader and the randomizer is greater than $N_{data}$ or the maximum value of the $N_{data}(N_{max})$ and may repeatedly operate the spreader and the randomizer to adjust the output memory-index such that the output memory-index does not exceed $N_{data}$ or the maximum value of the $N_{data}(N_{max})$.

Locations of the illustrated memory-index check and modulo operator can be changed according to a designer's intention.

FIG. 85 illustrates expressions representing an operation of a 4K FFT mode random interleaving-sequence generator according to an embodiment of the present invention.

The expressions illustrated in an upper portion of FIG. 85 show initial value setting and primitive polynomial of a randomizer. In this case, the primitive polynomial may be $11^{th}$ primitive polynomial and the initial value may be changed by arbitrary values. That is, the expressions illustrated in an upper portion shows binary word sequences or binary bits used to define the main-PRBS generator which can generate main-PRBS sequence.

The expressions illustrated in a lower portion of FIG. 85 show procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

The expressions illustrated in a lower portion of FIG. 85 show procedures of calculating and outputting main-interleaving sequence for an output signal of the spreader and the randomizer. As illustrated in the expression, one random symbol-offset may be applied to each OFDM symbol pair in the same way.

As above described, the random symbol-offset generator according to an embodiment of the present invention may include k bits-spreader and (X-k) bits-randomizer.

The k bits-spreader may be operated through a $2^k$ multiplexer and may be optimally designed to maximize inter-symbol spreading properties (or to minimize correlation properties).

The randomizer may be operated through an N bits-PN generator (or N bits-sub-PRBS generator) and designed to provide randomness.

The 4K FFT mode random symbol-offset generator may include a 0/1/2 bits-spreader and a 12/11/10 bits-random generator (or a PN generator). It can be changed according to the designer's intention.

Figure 86:
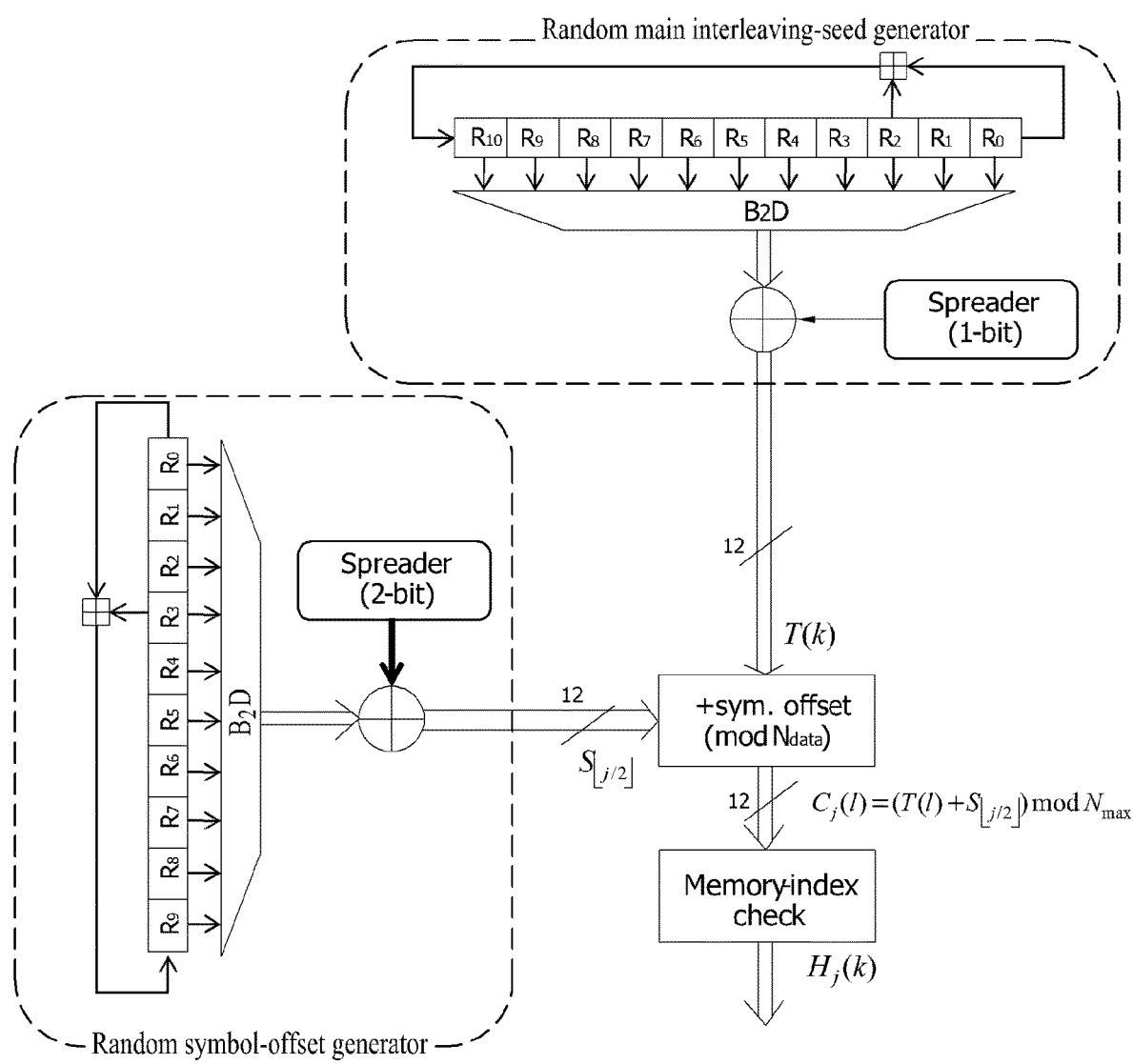
FIG. 86 is a view illustrating logical composition of a 4K FFT mode random interleaving-sequence generator according to an embodiment of the present invention.

FIG. 86 is a view illustrating logical composition of a 4K FFT mode random interleaving-sequence generator according to an embodiment of the present invention.

As described above, the 4K FFT mode random interleaving-sequence generator according to an embodiment of the present invention may include a random main interleaving-seed generator, a random symbol-offset generator, a memory index check, and a modulo operator.

FIG. 86 illustrates the logical composition of a 4K FFT mode random interleaving-sequence generator formed by combining a random main interleaving-seed generator and a random symbol-offset generator. FIG. 86 illustrates an embodiment of the random main interleaving-seed generator including a 1 bit-spreader and an 11 bits-randomizer, and an embodiment of the random symbol-offset generator including a 2 bits-spreader and a 10 bits-randomizer. Details thereof have been described above and thus will be omitted here.

Hereinafter, a random interleaving-sequence generator for 4K FFT mode according to another embodiment of the present invention will be described.

the random interleaving-sequence generator for 4K FFT mode according to another embodiment of the present invention includes random main interleaving-sequence generator which have a randomizer including bit shuffling.

Figure 87:
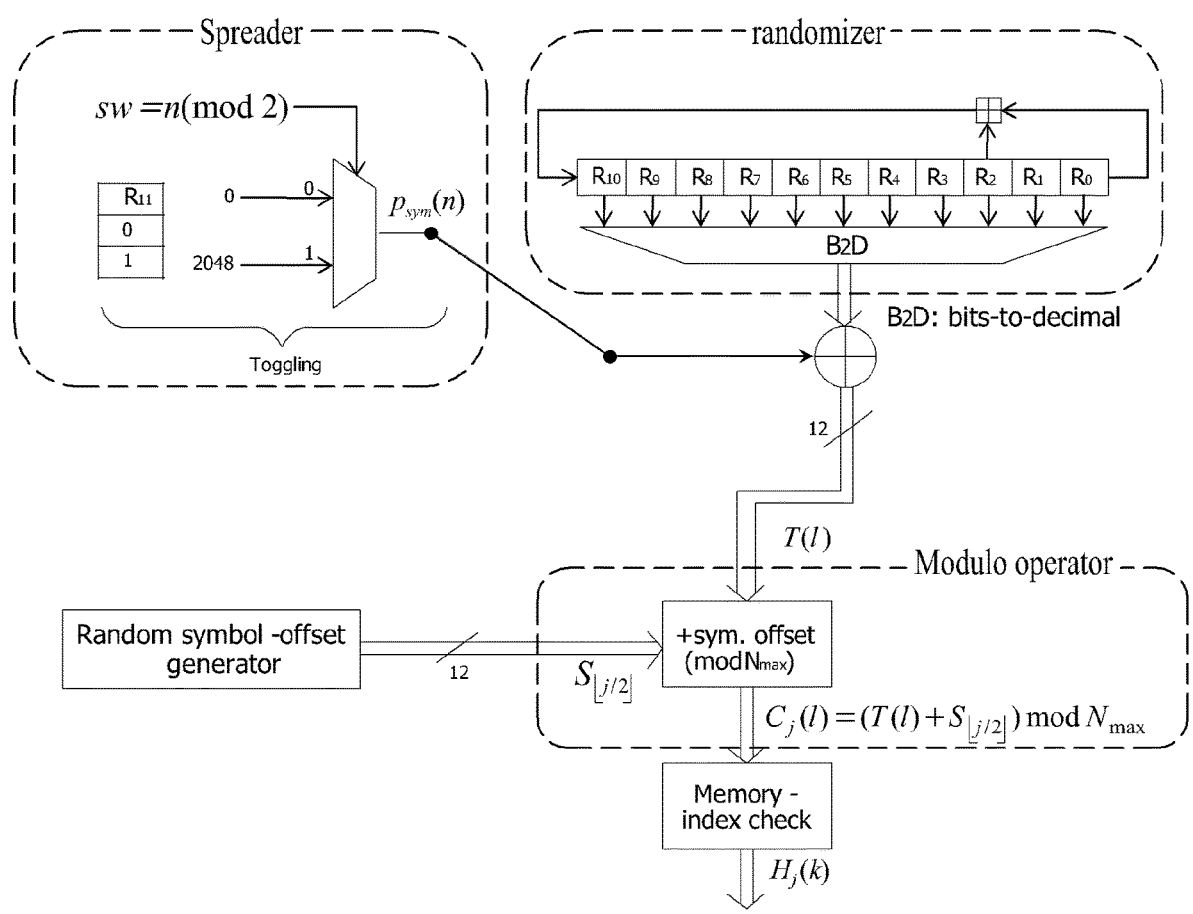
FIG. 87 is a view illustrating a 4K FFT mode random interleaving-sequence generator according to another embodiment of the present invention.

FIG. 87 is a view illustrating a 4K FFT mode random interleaving-sequence generator according to another embodiment of the present invention.

The 4K FFT mode random interleaving-sequence generator according to another embodiment of the present invention may include a spreader (1-bit toggling), a randomizer, a random symbol-offset generator, a modulo operator and a memory-index check. As described above, the random main interleaving-sequence generator may include a spreader and a randomizer.

Details thereof except bit shuffling have been described above and thus will be omitted here.

The randomizer may be operated via a PN generator and may provide full randomness during interleaving. As described above, the randomizer according to an embodiment of the present invention may include bit shuffling. The bit shuffling optimizes spreading properties or random properties and is designed in consideration of $N_{data}$. In the case of 4K FFT mode, the bit shuffling may use a 11-bit PN generator, which can be changed.

FIG. 88 is expressions representing operations of 4K FFT mode bit shuffling and 4K FFT mode random interleaving-sequence generator according to another embodiment of the present invention.

(a) illustrates an expression representing an operation of the 4K FFT mode bit shuffling and (b) illustrates an expression representing an operation of the 4K FFT random interleaving-sequence generator.

The upper portion of (a) shows an operation of the 4K FFT mode bit shuffling and the lower portion of (a) shows an embodiment of the 4K FFT mode bit shuffling for 11 bits.

As illustrated in (a), the 4K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $12^{th}$ primitive polynomial and the initial value may be changed by arbitrary values. That is, the expressions illustrated in an upper portion shows binary word sequences or binary bits used to define the main-PRBS generator which can generate main-PRBS sequence.

An expression illustrated in a lower portion of (b) shows procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

Hereinafter, the random interleaving-sequence generator for an 8K FFT mode will be described. The random interleaving-sequence generator according to an embodiment of the present invention may be included in the frequency interleaver 7020 and is similar to the random seed generator mentioned (mentioned above), the random interleaving-sequence generator has a different structure from the random seed generator.

The random main-sequence generator according to an embodiment of the present invention may include a spreader and a randomizer and perform rendering a full randomness in frequency-domain. According to an embodiment of the present invention, in the case of 8K FFT mode, the random main-sequence generator may include a 1 bit spreader and an 12 bit-randomizer. The random main-sequence generator or the randomizer according to an embodiment of the present invention may be referred as a main-PRBS generator which is defined based on the 12-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 8K FFT mode, a (13-k) bit-randomizer may be used. The (X-k) bits-randomizer according to an embodiment of the present invention may be referred as a sub-PRBS generator which is defined based on (13-k) bit binary word sequence (or binary sequence).

The aforementioned spreader and randomizer may be used to achieve spreading and random effects during generation of the interleaving seed.

In this embodiment, in generating of interleaving-value, PRBS operation order is modified to cope with the case of that the number of active carriers vary at start and last OFDM symbols within a single frame.

Figure 89:
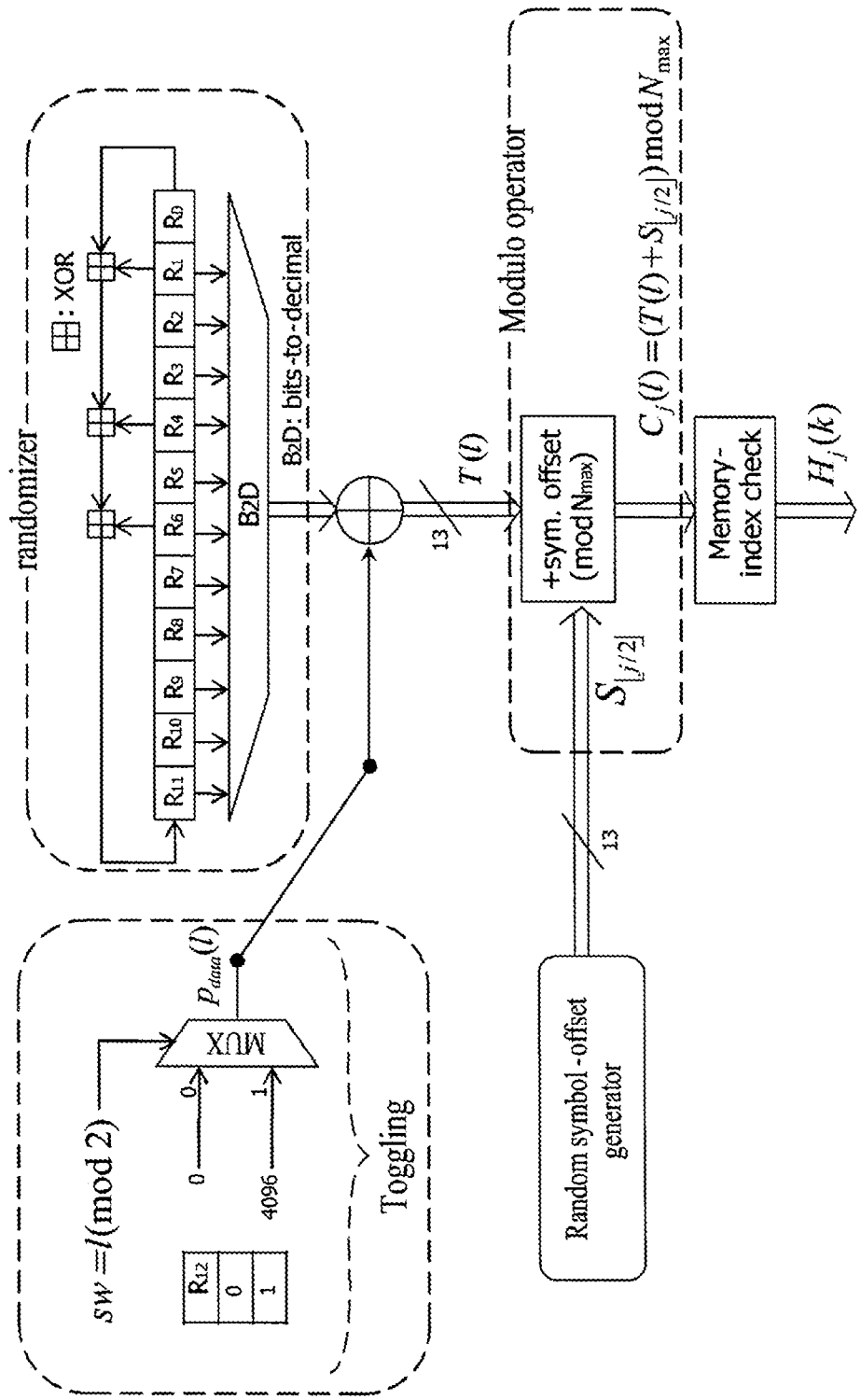
FIG. 89 is a view of an 8K FFT mode random interleaving-sequence generator according to an embodiment of the present invention.

FIG. 89 is a view of an 8K FFT mode random interleaving-sequence generator according to an embodiment of the present invention.

The 8K FFT mode random interleaving-sequence generator according to an embodiment of the present invention may include a spreader (1-bit toggling), a randomizer, a random symbol-offset generator, a modulo operator and a memory-index check. As described above, the random main-sequence generator may include a spreader and a randomizer.

As shown in FIG. 89, the locations of the modulo operator and the memory-index check is changed as compared with the 8K FFT mode random main-seed generator as described above.

The changed locations of the modulo operator and the memory-index check as shown in FIG. 89 is to increase a frequency deinterleaving performance of the frequency deinterleaver having single memory. As above described, a signal frame (or frame) according to the present invention may have normal data symbol (normal data symbol), frame edge symbol and frame signaling symbol and a length of the frame edge symbol and the frame signaling symbol may be shorter than the normal data symbol. For this reason, a frequency deinterleaving performance of the frequency deinterleaver having single memory can be decreased. In order to increase the frequency deinterleaving performance of the frequency deinterleaver with a single memory, the present invention may provide the changed locations of the modulo operator and the memory-index check.

Hereinafter, an operation of each block will be described.

The (cell) spreader may be operated using an upper portion of n-bit of total 13-bit and may function as a multiplexer based on a look-up table. In the case of 8K FFT mode, the (cell) spreader may be a 1-bit multiplexer (or toggling).

The randomizer may be operated via a PN generator and may provide full randomness during interleaving. As described above, in the case of 8K FFT mode, the randomizer may be a PN generator that considers 12-bit. This can be changed according to a designer's intention. Also the spreader and the randomizer are operated through multiplexer and PN generator, respectively.

The random symbol-offset generator may generate a symbol-offset for cyclic-shifting main interleaving-sequence generated by the main-interleaving sequence generator for each pair-wise OFDM symbol. A detailed operation is the same as those describe above and thus are not described here.

The modulo operator may be operated when input value exceeds $N_{data}$ or $N_{max}$. The maximum value of the $N_{data}$ ($N_{max}$) for 8K FFT mode may be 8192.

The memory-index check may not use output from the modulo operator when a memory-index generated by the spreader and the randomizer is greater than $N_{data}$ or the maximum value of the $N_{data}$($N_{max}$) and may repeatedly operate the spreader and the randomizer to adjust the output memory-index such that the output memory-index does not exceed $N_{data}$ or the maximum value of the $N_{data}(N_{max})$.

Locations of the illustrated memory-index check and modulo operator can be changed according to a designer's intention.

FIG. 90 illustrates expressions representing an operation of an 8K FFT mode random interleaving-sequence generator according to an embodiment of the present invention.

The expressions illustrated in an upper portion of FIG. 90 show initial value setting and primitive polynomial of a randomizer. In this case, the primitive polynomial may be $12^{th}$ primitive polynomial and the initial value may be changed by arbitrary values. That is, the expressions illustrated in an upper portion shows binary word sequences or binary bits used to define the main-PRBS generator which can generate main-PRBS sequence.

The expressions illustrated in a lower portion of FIG. 90 show procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

As above described, the random symbol-offset generator according to an embodiment of the present invention may include k bits-spreader and (X-k) bits-randomizer.

The k bits-spreader may be operated through a $2^k$ multiplexer and may be optimally designed to maximize inter-symbol spreading properties (or to minimize correlation properties).

The randomizer may be operated through an N bits-PN generator (or N bits-sub-PRBS generator) and designed to provide randomness.

The 8K FFT mode random symbol-offset generator may include a 0/1/2 bits-spreader and a 13/12/11 bits-random generator (or a PN generator). It can be changed according to the designer's intention.

Figure 91:
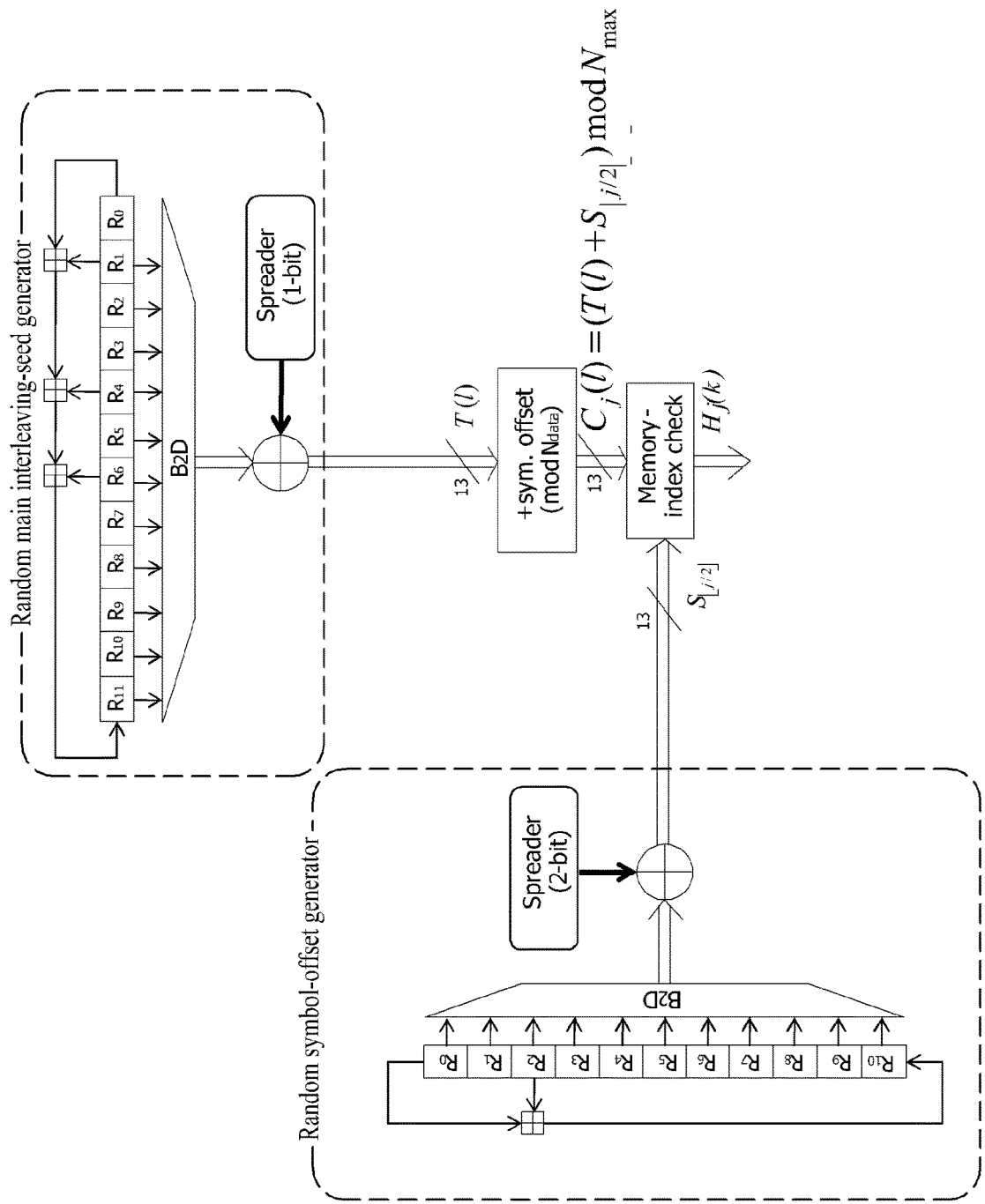
FIG. 91 is a view illustrating logical composition of an 8K FFT mode random interleaving-sequence generator according to an embodiment of the present invention.

FIG. 91 is a view illustrating logical composition of an 8K FFT mode random interleaving-sequence generator according to an embodiment of the present invention.

As described above, the 8K FFT mode random interleaving-sequence generator according to an embodiment of the present invention may include a random main interleaving-seed generator, a random symbol-offset generator, a memory index check, and a modulo operator.

FIG. 91 illustrates the logical composition of an 8K FFT mode random interleaving-sequence generator formed by combining a random main interleaving-seed generator and a random symbol-offset generator. FIG. 91 illustrates an embodiment of the random main interleaving-seed generator including a 1 bit-spreader and a 12 bits-randomizer, and an embodiment of the random symbol-offset generator including a 2 bits-spreader and an 11 bits-randomizer. Details thereof have been described above and thus will be omitted here.

Hereinafter, a random interleaving-sequence generator for 8K FFT mode according to another embodiment of the present invention will be described.

The random interleaving-sequence generator for 8K FFT mode according to another embodiment of the present invention includes random main interleaving-sequence generator which have a randomizer including bit shuffling.

Figure 92:
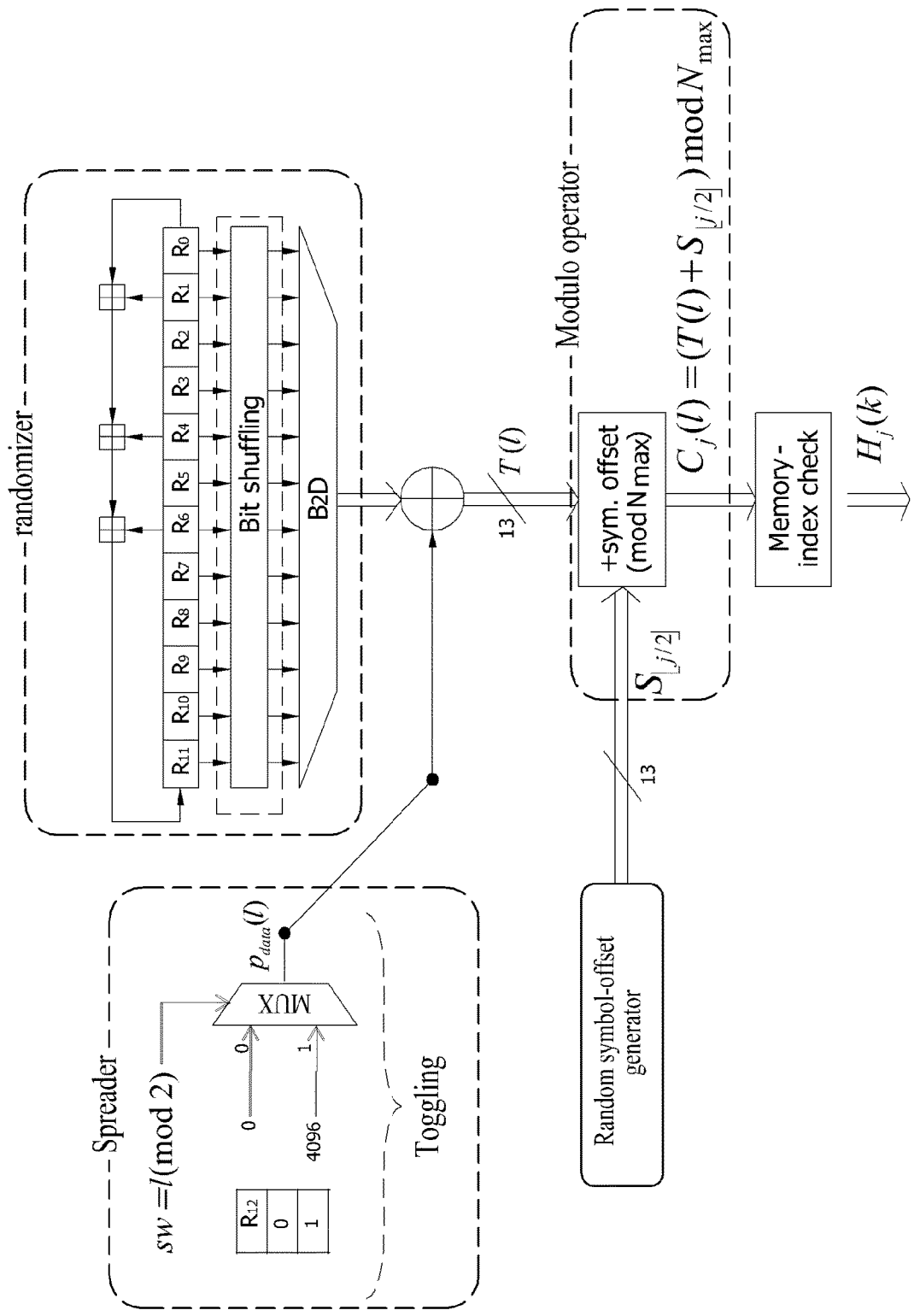
FIG. 92 is a view illustrating an 8K FFT mode random interleaving-sequence generator according to another embodiment of the present invention.

FIG. 92 is a view illustrating an 8K FFT mode random interleaving-sequence generator according to another embodiment of the present invention.

The 8K FFT mode random interleaving-sequence generator according to another embodiment of the present invention may include a spreader (1-bit toggling), a randomizer, a random symbol-offset generator, a modulo operator and a memory-index check. As described above, the random main interleaving-sequence generator may include a spreader and a randomizer.

Details thereof except bit shuffling have been described above and thus will be omitted here.

The randomizer may be operated via a PN generator and may provide full randomness during interleaving. As described above, the randomizer according to an embodiment of the present invention may include bit shuffling. The bit shuffling optimizes spreading properties or random properties and is designed in consideration of $N_{data}$. In the case of 8K FFT mode, the bit shuffling may use a 12-bit PN generator, which can be changed.

Figure 93:
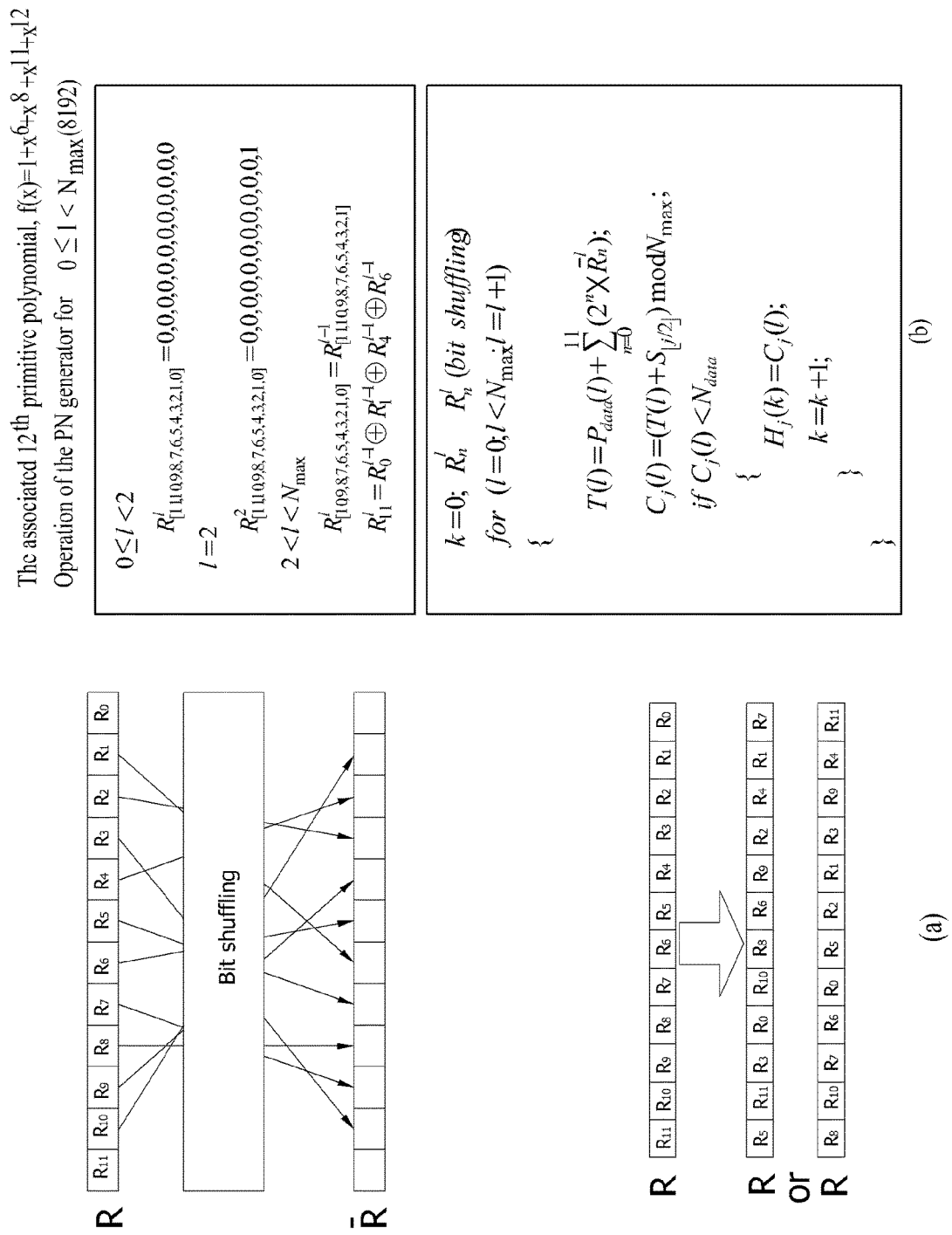
FIG. 93 is expressions representing operations of 8K FFT mode bit shuffling and 8K FFT mode random interleaving-sequence generator according to another embodiment of the present invention.

FIG. 93 is expressions representing operations of 8K FFT mode bit shuffling and 8K FFT mode random interleaving-sequence generator according to another embodiment of the present invention.

(a) illustrates an expression representing an operation of the 8K FFT mode bit shuffling and (b) illustrates an expression representing an operation of the 8K FFT random interleaving-sequence generator.

The upper portion of (a) shows an operation of the 8K FFT mode bit shuffling and the lower portion of (a) shows an embodiment of the 8K FFT mode bit shuffling for 12 bits.

As illustrated in (a), the 8K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $12^{th}$ primitive polynomial and the initial value may be changed by arbitrary values. That is, the expressions illustrated in an upper portion shows binary word sequences or binary bits used to define the main-PRBS generator which can generate main-PRBS sequence.

An expression illustrated in a lower portion of (b) shows procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

An expression illustrated in a lower portion of (b) shows a procedure of calculating and outputting main-interleaving sequence for an output signal of the spreader and the randomizer. As illustrated in the expression, one random symbol-offset may be applied to each OFDM symbol pair in the same way.

Hereinafter, the random interleaving-sequence generator for a 16K FFT mode will be described. The random interleaving-sequence generator according to an embodiment of the present invention may be included in the frequency interleaver 7020 and is similar to the random seed generator mentioned (mentioned above), the random interleaving-sequence generator has a different structure from the random seed generator.

The random main-sequence generator according to an embodiment of the present invention may include a spreader and a randomizer and perform rendering a full randomness in frequency-domain. According to an embodiment of the present invention, in the case of 16K FFT mode, the random main-sequence generator may include a 1 bit spreader and an 13 bit-randomizer. The random main-sequence generator or the randomizer according to an embodiment of the present invention may be referred as a main-PRBS generator which is defined based on the 13-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 16K FFT mode, a (14-k) bit-randomizer may be used. The (X-k) bits-randomizer according to an embodiment of the present invention may be referred as a sub-PRBS generator which is defined based on (14-k) bit binary word sequence (or binary sequence).

The aforementioned spreader and randomizer may be used to achieve spreading and random effects during generation of the interleaving seed.

In this embodiment, in generating of interleaving-value, PRBS operation order is modified to cope with the case of that the number of active carriers vary at start and last OFDM symbols within a single frame.

Figure 94:
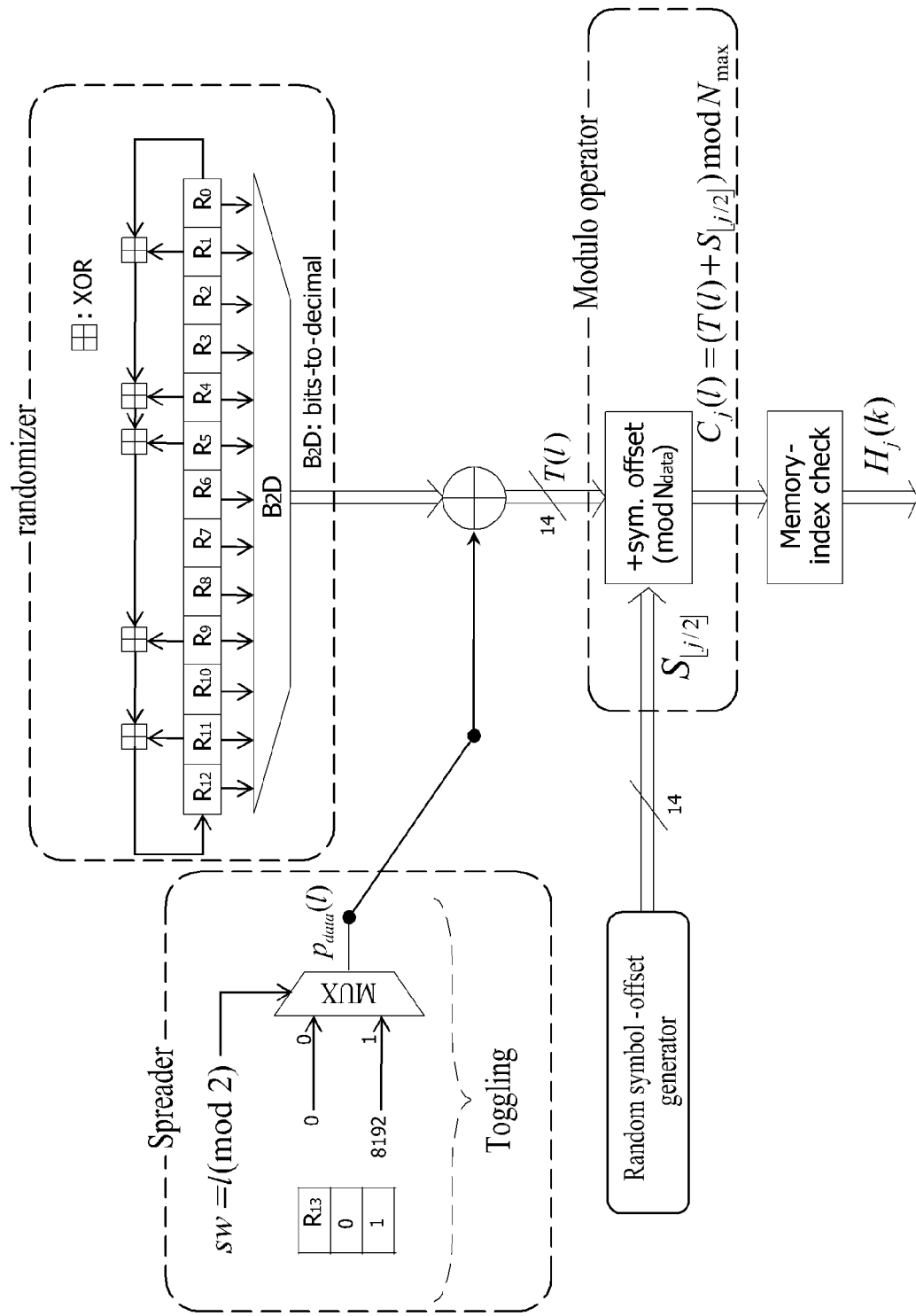
FIG. 94 is a view of a 16K FFT mode random interleaving-sequence generator according to an embodiment of the present invention.

FIG. 94 is a view of a 16K FFT mode random interleaving-sequence generator according to an embodiment of the present invention.

The 16K FFT mode random interleaving-sequence generator according to an embodiment of the present invention may include a spreader (1-bit toggling), a randomizer, a random symbol-offset generator, a modulo operator and a memory-index check. As described above, the random main-sequence generator may include a spreader and a randomizer.

As shown in FIG. 94, the locations of the modulo operator and the memory-index check is changed as compared with the 16K FFT mode random main-seed generator as described above.

The changed locations of the modulo operator and the memory-index check as shown in FIG. 94 is to increase a frequency deinterleaving performance of the frequency deinterleaver having single memory. As above described, a signal frame (or frame) according to the present invention may have normal data symbol (normal data symbol), frame edge symbol and frame signaling symbol and a length of the frame edge symbol and the frame signaling symbol may be shorter than the normal data symbol. For this reason, a frequency deinterleaving performance of the frequency deinterleaver having single memory can be decreased. In order to increase the frequency deinterleaving performance of the frequency deinterleaver with a single memory, the present invention may provide the changed locations of the modulo operator and the memory-index check.

Hereinafter, an operation of each block will be described.

The (cell) spreader may be operated using an upper portion of n-bit of total 14-bit and may function as a multiplexer based on a look-up table. In the case of 16K FFT mode, the (cell) spreader may be a 1-bit multiplexer (or toggling).

The randomizer may be operated via a PN generator and may provide full randomness during interleaving. As described above, in the case of 16K FFT mode, the randomizer may be a PN generator that considers 13-bit. This can be changed according to a designer's intention. Also the spreader and the randomizer are operated through multiplexer and PN generator, respectively.

The random symbol-offset generator may generate a symbol-offset for cyclic-shifting main interleaving-sequence generated by the main-interleaving sequence generator for each pair-wise OFDM symbol. A detailed operation is the same as those describe above and thus are not described here.

The modulo operator may be operated when input value exceeds $N_{data}$ or $N_{max}$. The maximum value of the $N_{data}$ ($N_{max}$) for 16K FFT mode may be 16384.

The memory-index check may not use output from the modulo operator when a memory-index generated by the spreader and the randomizer is greater than $N_{data}$ or the maximum value of the $N_{data}(N_{max})$ and may repeatedly operate the spreader and the randomizer to adjust the output memory-index such that the output memory-index does not exceed $N_{data}$ or the maximum value of the $N_{data}(N_{max})$.

Locations of the illustrated memory-index check and modulo operator can be changed according to a designer's intention.

FIG. 95 illustrates expressions representing an operation of a 16K FFT mode random interleaving-sequence generator according to an embodiment of the present invention.

The expressions illustrated in an upper portion of FIG. 95 show initial value setting and primitive polynomial of a randomizer. In this case, the primitive polynomial may be $13^{th}$ primitive polynomial and the initial value may be changed by arbitrary values. That is, the expressions illustrated in an upper portion shows binary word sequences or binary bits used to define the main-PRBS generator which can generate main-PRBS sequence.

The expressions illustrated in a lower portion of FIG. 95 show procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

As above described, the random symbol-offset generator according to an embodiment of the present invention may include k bits-spreader and (X-k) bits-randomizer.

The k bits-spreader may be operated through a $2^k$ multiplexer and may be optimally designed to maximize inter-symbol spreading properties (or to minimize correlation properties).

The randomizer may be operated through an N bits-PN generator (or N bits-sub-PRBS generator) and designed to provide randomness.

The 16K FFT mode random symbol-offset generator may include a 0/1/2 bits-spreader and a 14/13/12 bits-random generator (or a PN generator). It can be changed according to the designer's intention.

Figure 96:
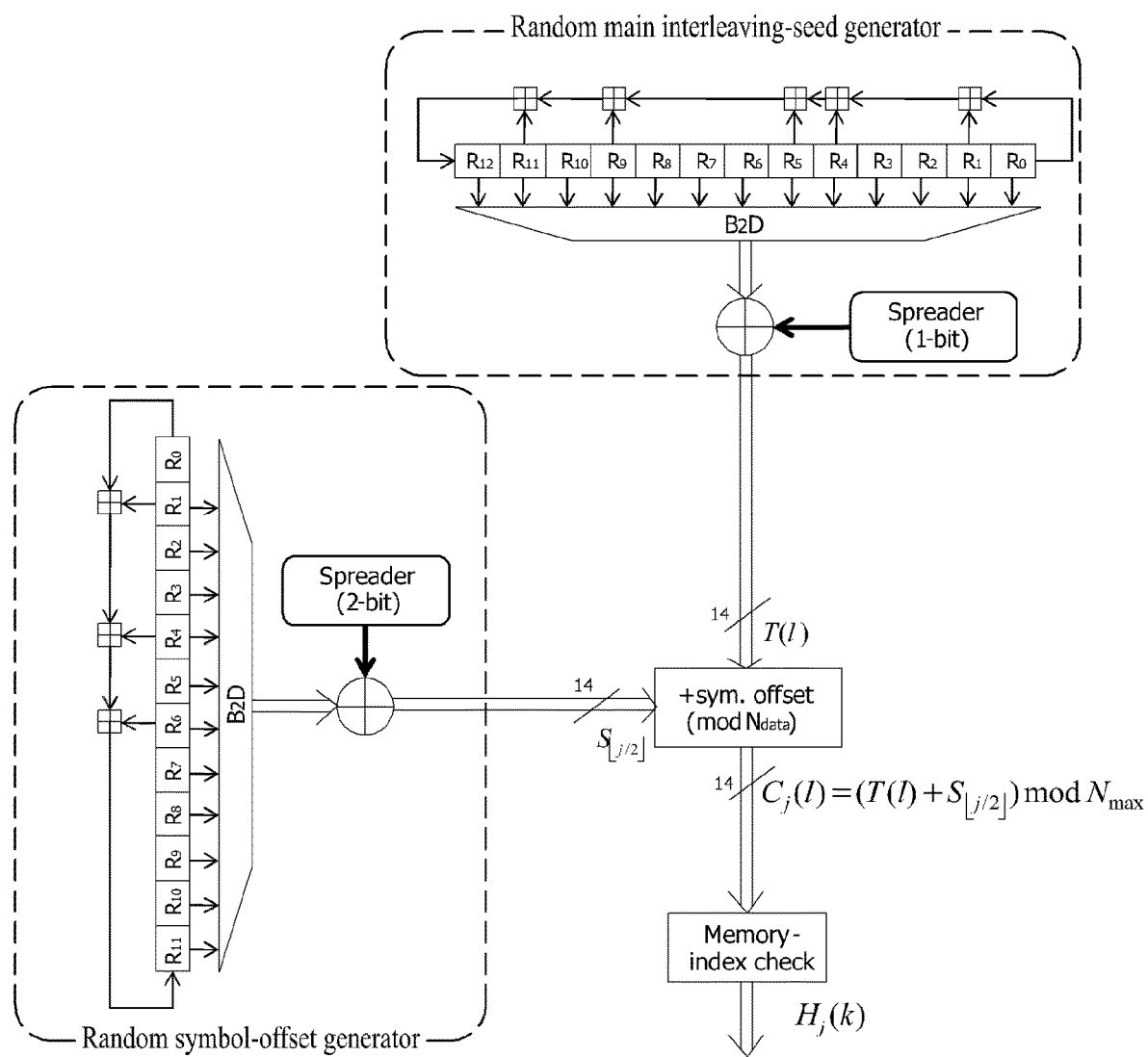
FIG. 96 is a view illustrating logical composition of a 16K FFT mode random interleaving-sequence generator according to an embodiment of the present invention.

FIG. 96 is a view illustrating logical composition of a 16K FFT mode random interleaving-sequence generator according to an embodiment of the present invention.

As described above, the 16K FFT mode random interleaving-sequence generator according to an embodiment of the present invention may include a random main interleaving-seed generator, a random symbol-offset generator, a memory index check, and a modulo operator.

FIG. 96 illustrates the logical composition of a 16K FFT mode random interleaving-sequence generator formed by combining a random main interleaving-seed generator and a random symbol-offset generator. FIG. 96 illustrates an embodiment of the random main interleaving-seed generator including a 1 bit-spreader and a 13 bits-randomizer, and an embodiment of the random symbol-offset generator including a 2 bits-spreader and a 12 bits-randomizer. Details thereof have been described above and thus will be omitted here.

Hereinafter, a random interleaving-sequence generator for 16K FFT mode according to another embodiment of the present invention will be described.

the random interleaving-sequence generator for 16K FFT mode according to another embodiment of the present invention includes random main interleaving-sequence generator which have a randomizer including bit shuffling.

Figure 97:
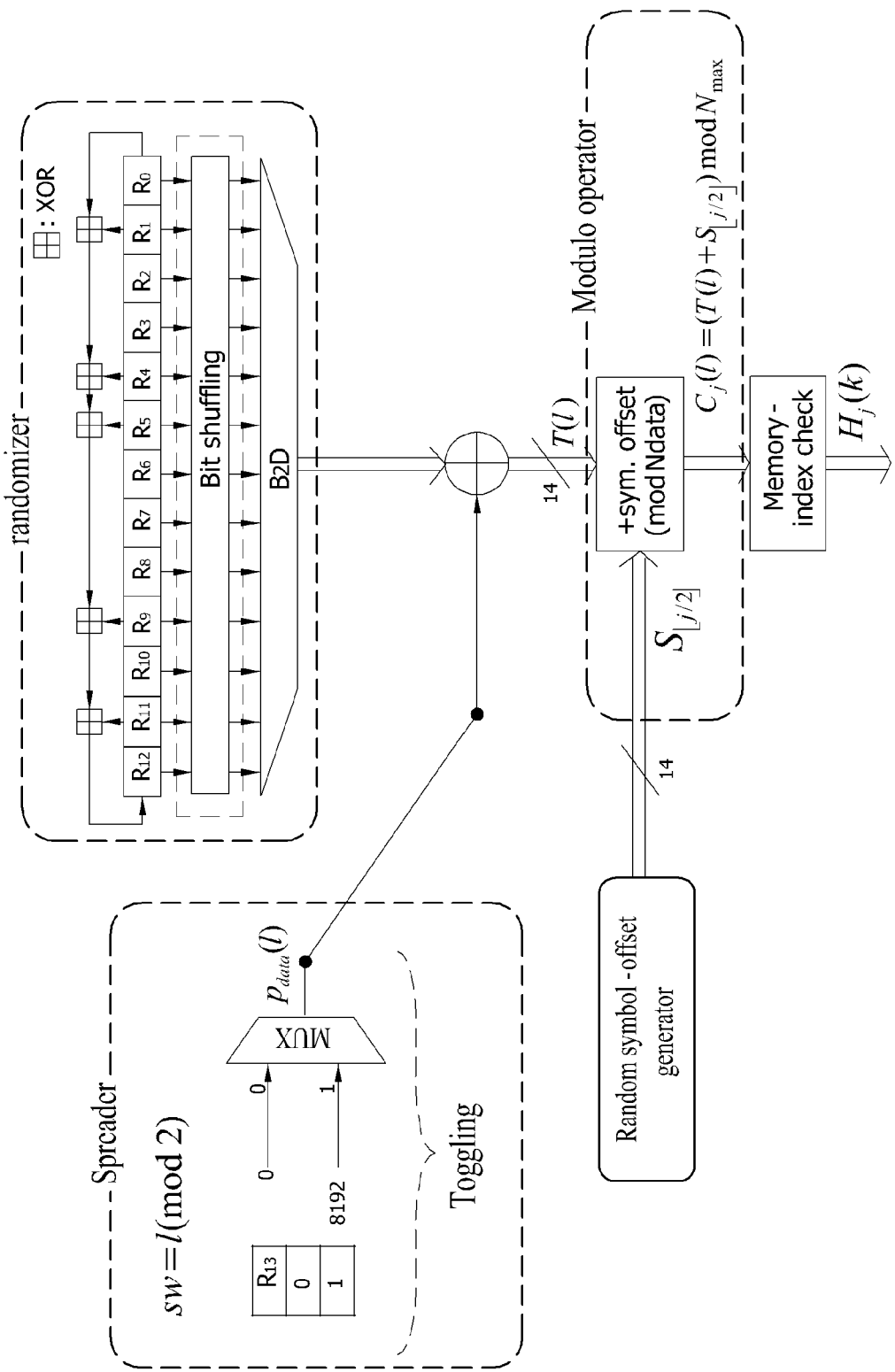
FIG. 97 is a view illustrating a 16K FFT mode random interleaving-sequence generator according to another embodiment of the present invention.

FIG. 97 is a view illustrating a 16K FFT mode random interleaving-sequence generator according to another embodiment of the present invention.

The 16K FFT mode random interleaving-sequence generator according to another embodiment of the present invention may include a spreader (1-bit toggling), a randomizer, a random symbol-offset generator, a modulo operator and a memory-index check. As described above, the random main interleaving-sequence generator may include a spreader and a randomizer.

Details thereof except bit shuffling have been described above and thus will be omitted here.

The randomizer may be operated via a PN generator and may provide full randomness during interleaving. As described above, the randomizer according to an embodiment of the present invention may include bit shuffling. The bit shuffling optimizes spreading properties or random properties and is designed in consideration of $N_{data}$. In the case of 16K FFT mode, the bit shuffling may use a 13-bit PN generator, which can be changed.

FIG. 98 is expressions representing operations of 16K FFT mode bit shuffling and 16K FFT mode random interleaving-sequence generator according to another embodiment of the present invention.

(a) illustrates an expression representing an operation of the 16K FFT mode bit shuffling and (b) illustrates an expression representing an operation of the 16K FFT random interleaving-sequence generator.

The upper portion of (a) shows an operation of the 16K FFT mode bit shuffling and the lower portion of (a) shows an embodiment of the 16K FFT mode bit shuffling for 13 bits.

As illustrated in (a), the 16K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $13^{th}$ primitive polynomial and the initial value may be changed by arbitrary values. That is, the expressions illustrated in an upper portion shows binary word sequences or binary bits used to define the main-PRBS generator which can generate main-PRBS sequence.

An expression illustrated in a lower portion of (b) shows procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

An expression illustrated in a lower portion of (b) shows a procedure of calculating and outputting main-interleaving sequence for an output signal of the spreader and the randomizer. As illustrated in the expression, one random symbol-offset may be applied to each OFDM symbol pair in the same way.

Hereinafter, the random interleaving-sequence generator for a 32K FFT mode will be described. The random interleaving-sequence generator according to an embodiment of the present invention may be included in the frequency interleaver 7020 and is similar to the random seed generator mentioned (mentioned above), the random interleaving-sequence generator has a different structure from the random seed generator.

The random main-sequence generator according to an embodiment of the present invention may include a spreader and a randomizer and perform rendering a full randomness in frequency-domain. According to an embodiment of the present invention, in the case of 32K FFT mode, the random main-sequence generator may include a 1 bit spreader and a 14 bit-randomizer. The random main-sequence generator or the randomizer according to an embodiment of the present invention may be referred as a main-PRBS generator which is defined based on the 14-bit binary word sequence (or binary sequence).

The random symbol-offset generator according to an embodiment of the present invention may change a symbol offset of each OFDM symbol. That is, the random symbol-offset generator may generate the aforementioned symbol offset. The random symbol-offset generator according to an embodiment of the present invention may include k bits-spreader and (X-k) bits-randomizer and perform rendering a spreading as much as $2^k$ cases, in time-domain. X may be differently set for the respective FFT modes. According to an embodiment of the present invention, in the case of 32K FFT mode, a (15-k) bit-randomizer may be used. The (X-k) bits-randomizer according to an embodiment of the present invention may be referred as a sub-PRBS generator which is defined based on (15-k) bit binary word sequence (or binary sequence).

The aforementioned spreader and randomizer may be used to achieve spreading and random effects during generation of the interleaving seed.

In this embodiment, in generating of interleaving-value, PRBS operation order is modified to cope with the case of that the number of active carriers vary at start and last OFDM symbols within a single frame.

Figure 99:
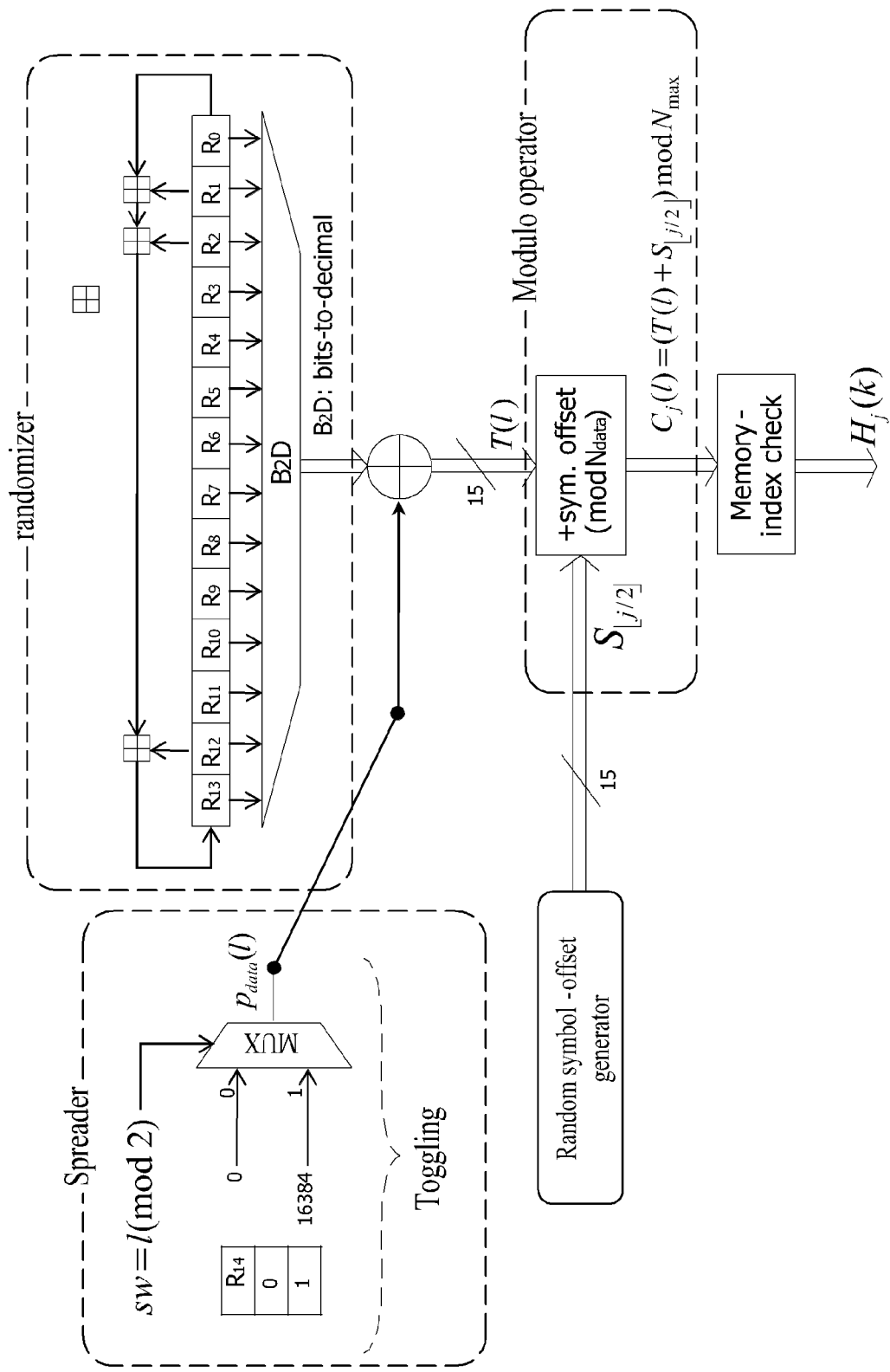
FIG. 99 is a view of a 32K FFT mode random interleaving-sequence generator according to an embodiment of the present invention.

FIG. 99 is a view of a 32K FFT mode random interleaving-sequence generator according to an embodiment of the present invention.

The 32K FFT mode random interleaving-sequence generator according to an embodiment of the present invention may include a spreader (1-bit toggling), a randomizer, a random symbol-offset generator, a modulo operator and a memory-index check. As described above, the random main-sequence generator may include a spreader and a randomizer.

As shown in FIG. 99, the locations of the modulo operator and the memory-index check is changed as compared with the 32K FFT mode random main-seed generator as described above.

The changed locations of the modulo operator and the memory-index check as shown in FIG. 99 is to increase a frequency deinterleaving performance of the frequency deinterleaver having single memory. As above described, a signal frame (or frame) according to the present invention may have normal data symbol (normal data symbol), frame edge symbol and frame signaling symbol and a length of the frame edge symbol and the frame signaling symbol may be shorter than the normal data symbol. For this reason, a frequency deinterleaving performance of the frequency deinterleaver having single memory can be decreased. In order to increase the frequency deinterleaving performance of the frequency deinterleaver with a single memory, the present invention may provide the changed locations of the modulo operator and the memory-index check.

Hereinafter, an operation of each block will be described.

The (cell) spreader may be operated using an upper portion of n-bit of total 15-bit and may function as a multiplexer based on a look-up table. In the case of 32K FFT mode, the (cell) spreader may be a 1-bit multiplexer (or toggling).

The randomizer may be operated via a PN generator and may provide full randomness during interleaving. As described above, in the case of 32K FFT mode, the randomizer may be a PN generator that considers 14-bit. This can be changed according to a designer's intention. Also the spreader and the randomizer are operated through multiplexer and PN generator, respectively.

The random symbol-offset generator may generate a symbol-offset for cyclic-shifting main interleaving-sequence generated by the main-interleaving sequence generator for each pair-wise OFDM symbol. A detailed operation is the same as those describe above and thus are not described here.

The modulo operator may be operated when input value exceeds $N_{data}$ or $N_{max}$. The maximum value of the $N_{data}$ ($N_{max}$) for 32K FFT mode may be 32768.

The memory-index check may not use output from the modulo operator when a memory-index generated by the spreader and the randomizer is greater than $N_{data}$ or the maximum value of the $N_{data}(N_{max})$ and may repeatedly operate the spreader and the randomizer to adjust the output memory-index such that the output memory-index does not exceed $N_{data}$ or the maximum value of the $N_{data}(N_{max})$.

Locations of the illustrated memory-index check and modulo operator can be changed according to a designer's intention.

FIG. 100 illustrates expressions representing an operation of a 32K FFT mode random interleaving-sequence generator according to an embodiment of the present invention.

The expressions illustrated in an upper portion of FIG. 100 show initial value setting and primitive polynomial of a randomizer. In this case, the primitive polynomial may be $14^{th}$ primitive polynomial and the initial value may be changed by arbitrary values. That is, the expressions illustrated in an upper portion shows binary word sequences or binary bits used to define the main-PRBS generator which can generate main-PRBS sequence.

The expressions illustrated in a lower portion of FIG. 100 show procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

As above described, the random symbol-offset generator according to an embodiment of the present invention may include k bits-spreader and (X-k) bits-randomizer.

The k bits-spreader may be operated through a $2^k$ multiplexer and may be optimally designed to maximize inter-symbol spreading properties (or to minimize correlation properties).

The randomizer may be operated through an N bits-PN generator (or N bits-sub-PRBS generator) and designed to provide randomness.

The 32K FFT mode random symbol-offset generator may include a 0/1/2 bits-spreader and a 15/14/13 bits-random generator (or a PN generator). It can be changed according to the designer's intention.

Figure 101:
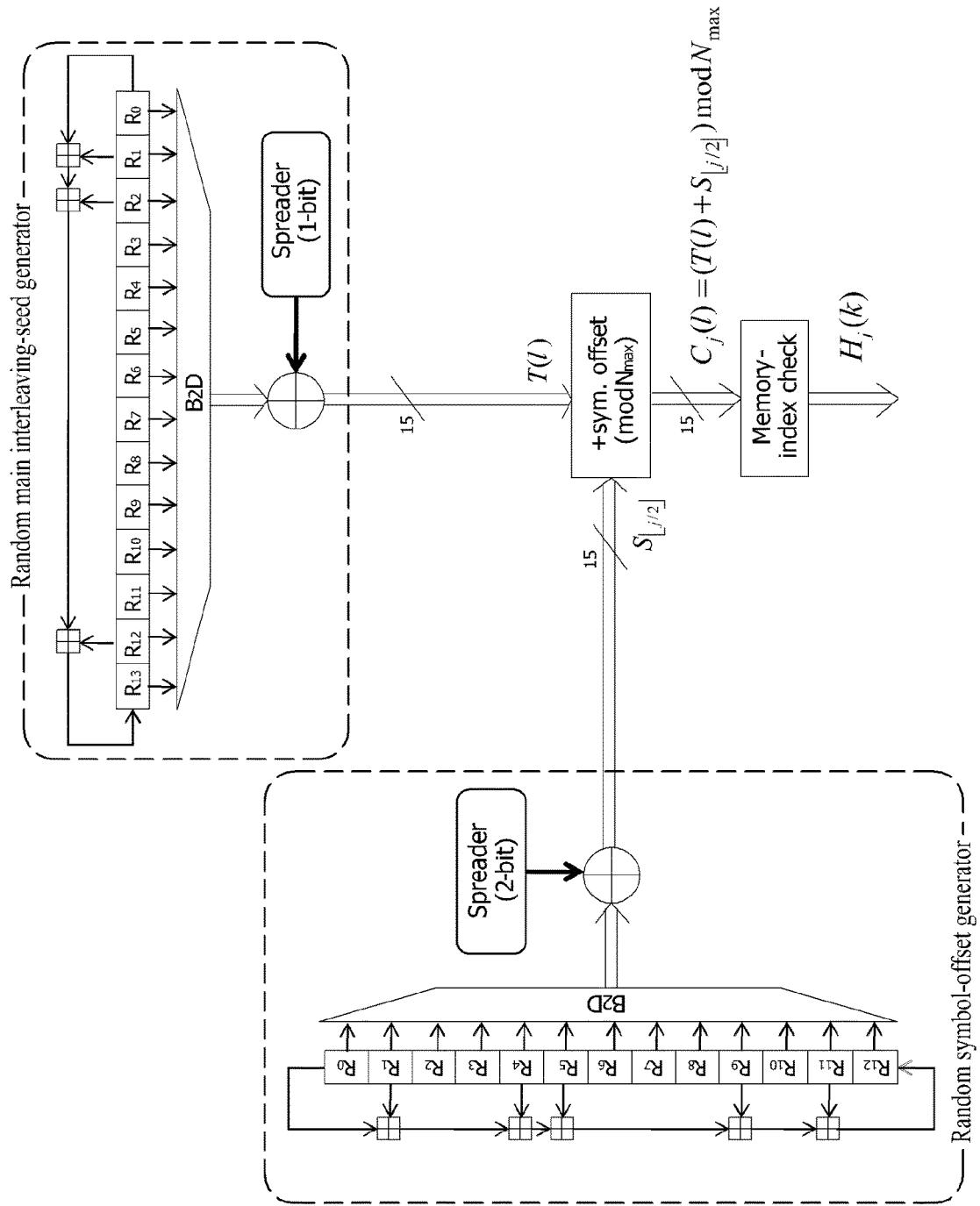
FIG. 101 is a view illustrating logical composition of a 32K FFT mode random interleaving-sequence generator according to an embodiment of the present invention.

FIG. 101 is a view illustrating logical composition of a 32K FFT mode random interleaving-sequence generator according to an embodiment of the present invention.

As described above, the 32K FFT mode random interleaving-sequence generator according to an embodiment of the present invention may include a random main interleaving-seed generator, a random symbol-offset generator, a memory index check, and a modulo operator.

FIG. 101 illustrates the logical composition of a 32K FFT mode random interleaving-sequence generator formed by combining a random main interleaving-seed generator and a random symbol-offset generator. FIG. 101 illustrates an embodiment of the random main interleaving-seed generator including a 1 bit-spreader and a 14 bits-randomizer, and an embodiment of the random symbol-offset generator including a 2 bits-spreader and an 13 bits-randomizer. Details thereof have been described above and thus will be omitted here.

Hereinafter, a random interleaving-sequence generator for 32K FFT mode according to another embodiment of the present invention will be described.

the random interleaving-sequence generator for 32K FFT mode according to another embodiment of the present invention includes random main interleaving-sequence generator which have a randomizer including bit shuffling.

Figure 102:
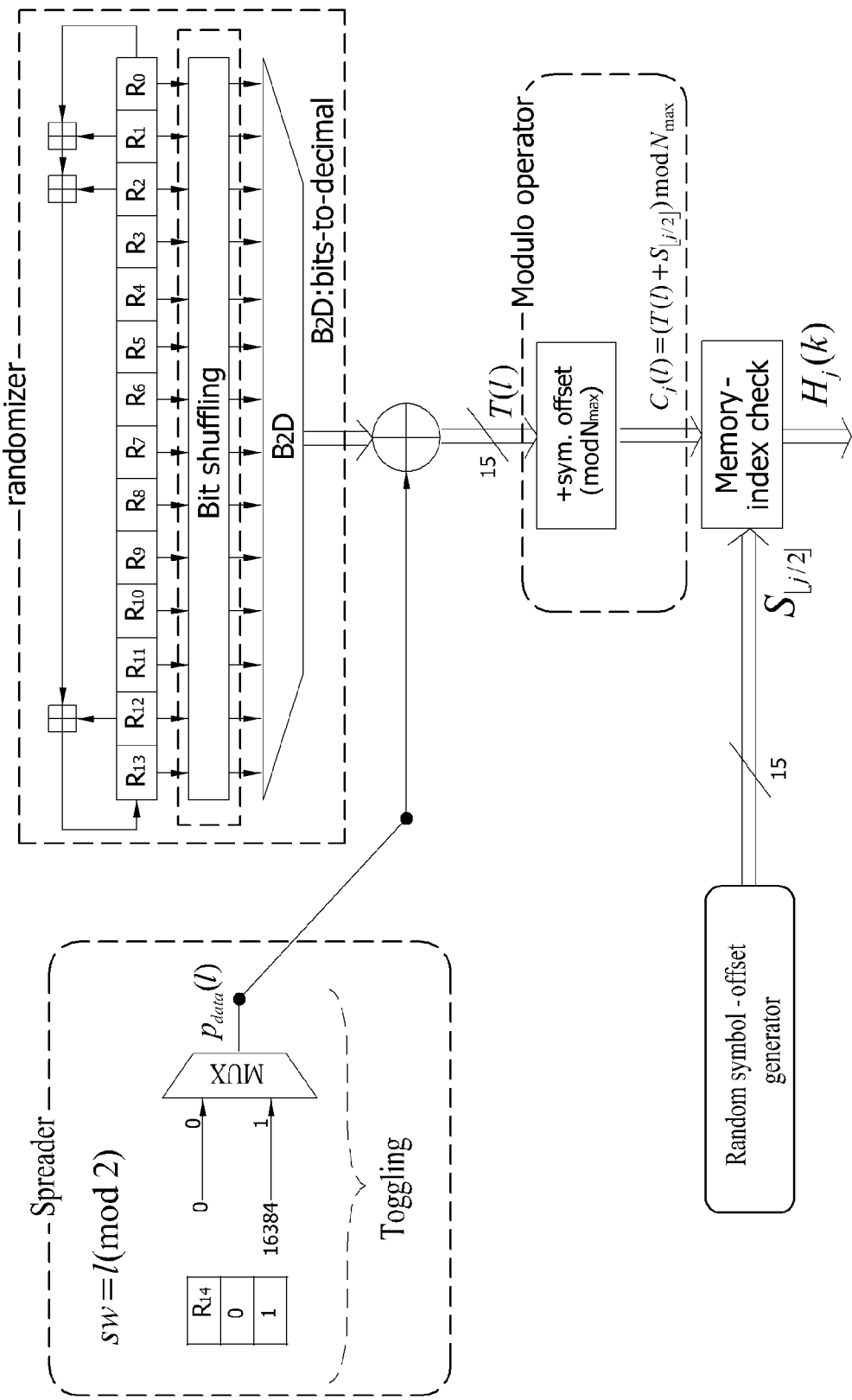
FIG. 102 is a view illustrating a 32KFFT mode random interleaving-sequence generator according to another embodiment of the present invention.

FIG. 102 is a view illustrating a 32K FFT mode random interleaving-sequence generator according to another embodiment of the present invention.

The 32K FFT mode random interleaving-sequence generator according to another embodiment of the present invention may include a spreader (1-bit toggling), a randomizer, a random symbol-offset generator, a modulo operator and a memory-index check. As described above, the random main interleaving-sequence generator may include a spreader and a randomizer.

Details thereof except bit shuffling have been described above and thus will be omitted here.

The randomizer may be operated via a PN generator and may provide full randomness during interleaving. As described above, the randomizer according to an embodiment of the present invention may include bit shuffling. The bit shuffling optimizes spreading properties or random properties and is designed in consideration of $N_{data}$. In the case of 8K FFT mode, the bit shuffling may use a 14-bit PN generator, which can be changed.

Figure 103:
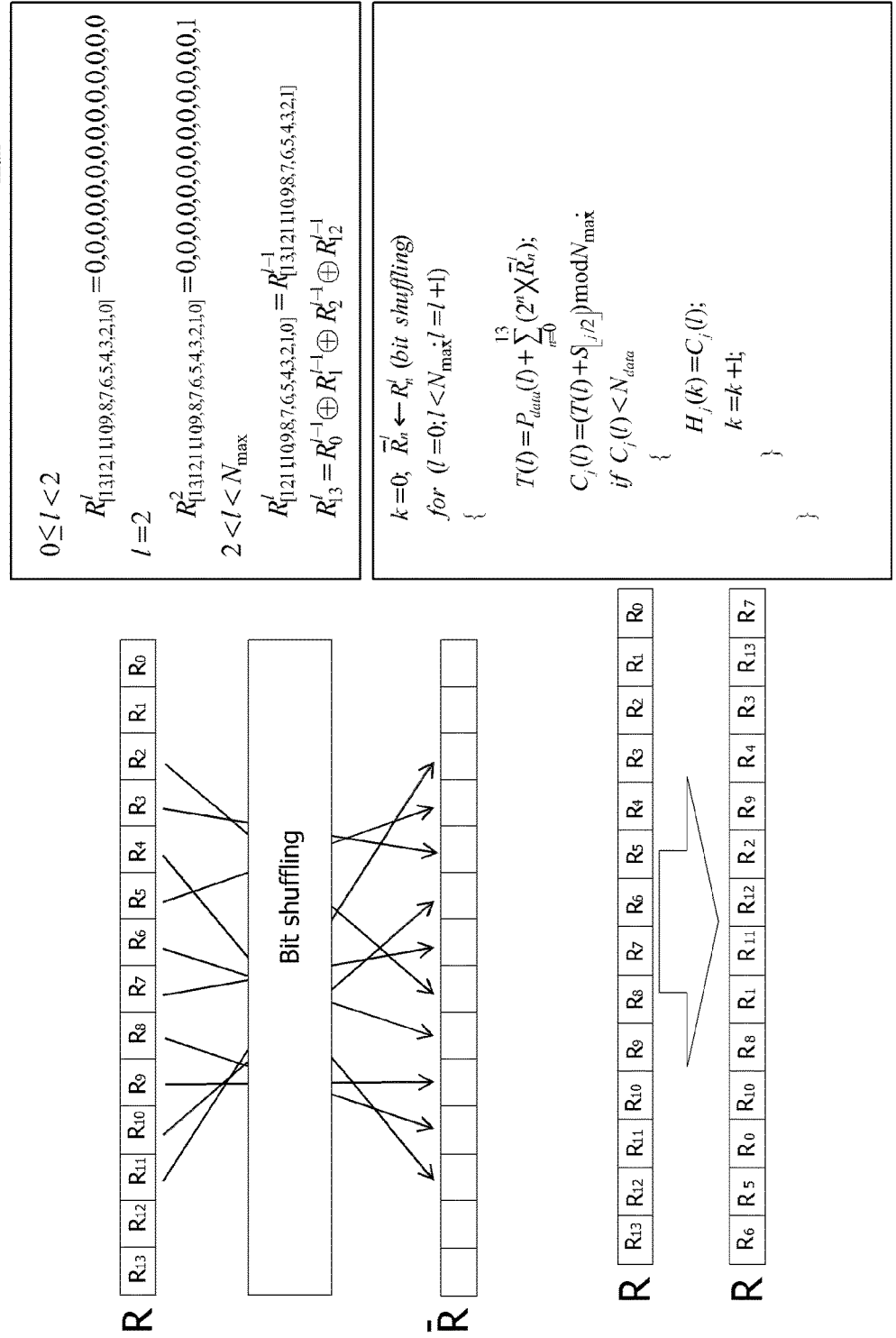
FIG. 103 is expressions representing operations of 32K FFT mode bit shuffling and 32K FFT mode random inter-leaving-sequence generator according to another embodiment of the present invention.

FIG. 103 is expressions representing operations of 32K FFT mode bit shuffling and 32K FFT mode random interleaving-sequence generator according to another embodiment of the present invention.

(a) illustrates an expression representing an operation of the 32K FFT mode bit shuffling and (b) illustrates an expression representing an operation of the 32K FFT random interleaving-sequence generator.

The upper portion of (a) shows an operation of the 32K FFT mode bit shuffling and the lower portion of (a) shows an embodiment of the 32K FFT mode bit shuffling for 14 bits.

As illustrated in (a), the 32K FFT mode bit shuffling may mix bits of registers of a PN generator during calculation of a memory-index.

An expression illustrated in an upper portion of (b) shows initial value setting and primitive polynomial of a randomizer. In this case, the primitive polynomial may be $14^{th}$ primitive polynomial and the initial value may be changed by arbitrary values. That is, the expressions illustrated in an upper portion shows binary word sequences or binary bits used to define the main-PRBS generator which can generate main-PRBS sequence.

An expression illustrated in a lower portion of (b) shows procedures of calculating and outputting the interleaving address for different interleaving sequence for an output signal of the spreader and the randomizer. As illustrated in the expression, one random symbol-offset (or a symbol offset or cyclic shifting value) is used to calculate the different interleaving sequence and the cyclic shifting value may be applied to each OFDM symbol pair in the same way.

Figure 104:
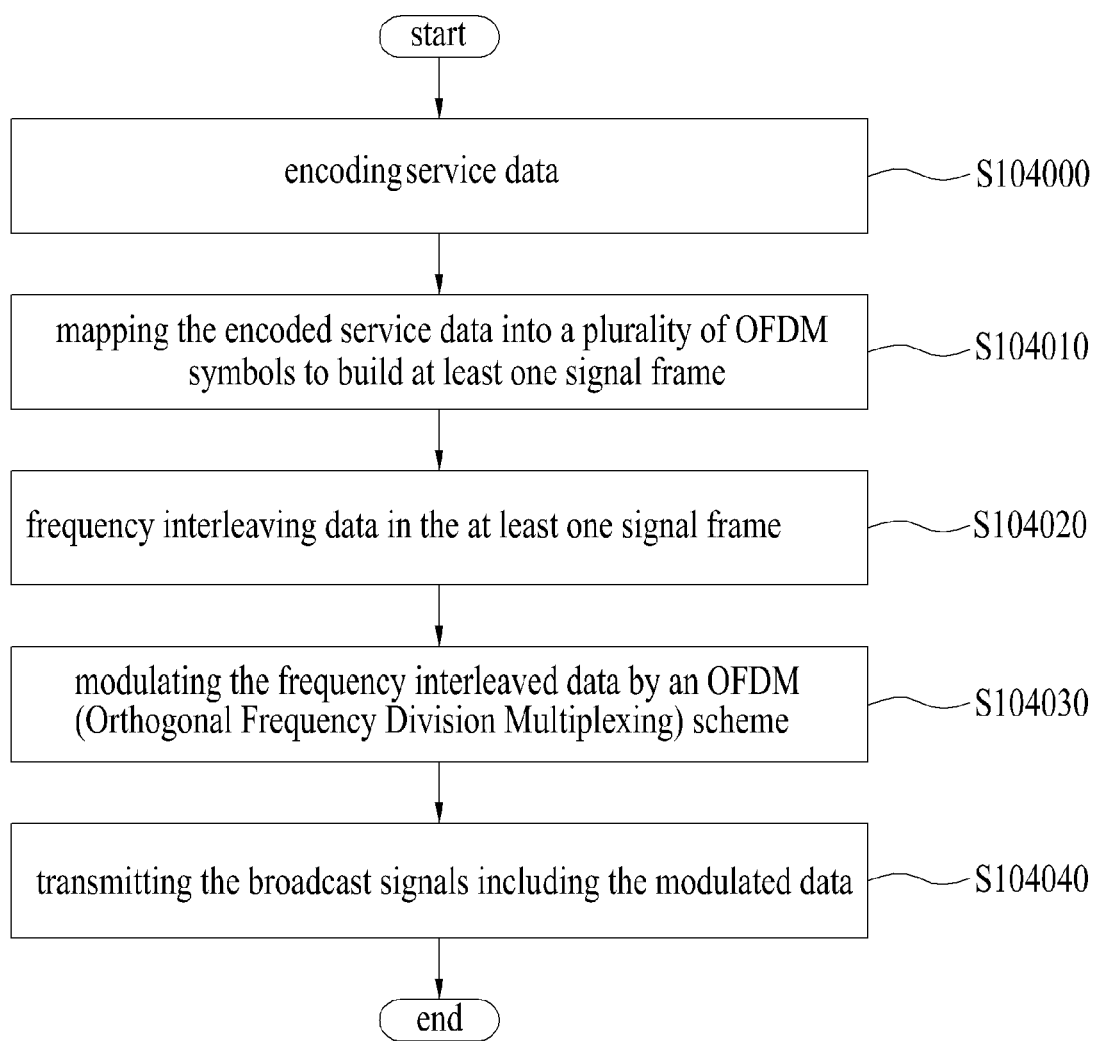
FIG. 104 is a flowchart illustrating a method for transmitting broadcast signals according to an embodiment of the present invention.

FIG. 104 is a flowchart illustrating a method for transmitting broadcast signals according to an embodiment of the present invention.

The apparatus for transmitting broadcast signals according to an embodiment of the present invention can encode service data (S104000). As described above, service data is transmitted through a data pipe which is a logical channel in the physical layer that carries service data or related metadata, which may carry one or multiple service(s) or service component(s). Data carried on a data pipe can be referred to as the DP data or the service data. The detailed process of step S104000 is as described in FIG. 1 or FIG. 5-6, FIG. 22.

The apparatus for transmitting broadcast signals according to an embodiment of the present invention can may map the encoded service data into a plurality of OFDM symbols to build at least one signal frame (S104010). The detailed process of this step is as described in FIG. 7, FIG. 10-21.

Then, the apparatus for transmitting broadcast signals according to an embodiment of the present invention can may use a different interleaving-seed which is used for every OFDM symbol pair comprised of two sequential OFDM symbols. as above described, the basic function of the cell mapper 7010 is to map data cells for each of the DPs, PLS data, if any, into arrays of active OFDM cells corresponding to each of the OFDM symbols within a signal frame. Then, the frequency interleaver 7020 may operate on a single OFDM symbol basis, provide frequency diversity by randomly interleaving the cells received from the cell mapper 7010. The purpose of the frequency interleaver 7020 in the present invention, which operates on a single OFDM symbol, is to provide frequency diversity by randomly interleaving data cells received from the cell mapper 7010. In order to get maximum interleaving gain in a single signal frame (or frame), a different interleaving-seed is used for every OFDM symbol pair comprised of two sequential OFDM symbols. The detailed process of the frequency interleaving is as described in FIG. 30 to 103.

Subsequently, the apparatus for transmitting broadcast signals according to an embodiment of the present invention may modulate the frequency interleaved data by an OFDM scheme (S104030). The detailed process of this step is as described in FIG. 1 or 8.

The apparatus for transmitting broadcast signals according to an embodiment of the present invention can transmit the broadcast signals including the modulated data (S104040). The detailed process of this step is as described in FIG. 1 or 8.

Figure 105:
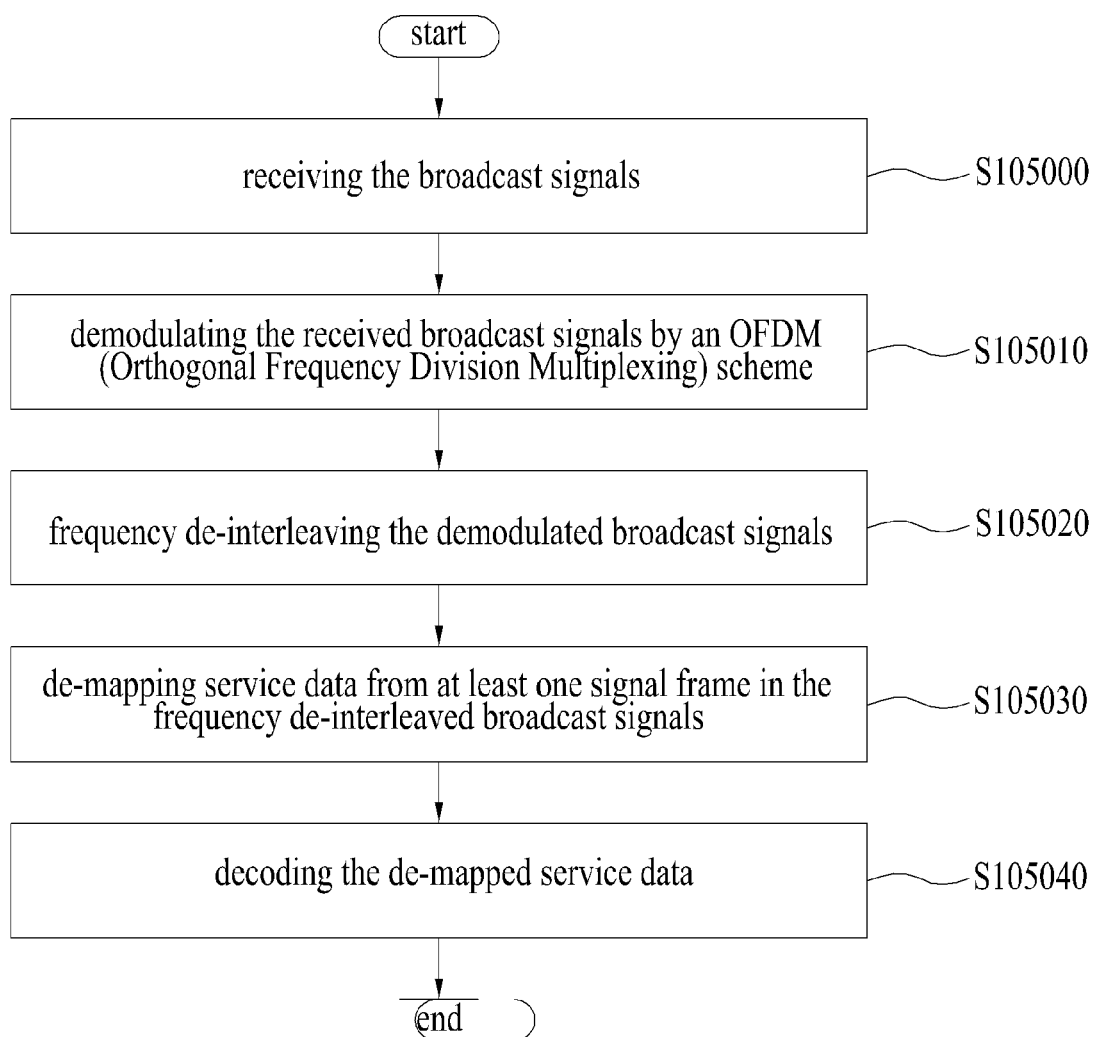
FIG. 105 is a flowchart illustrating a method for receiving broadcast signals ac cording to an embodiment of the present invention.

FIG. 105 is a flowchart illustrating a method for receiving broadcast signals according to an embodiment of the present invention.

The flowchart shown in FIG. 105 corresponds to a reverse process of the broadcast signal transmission method according to an embodiment of the present invention, described with reference to FIG. 104.

The apparatus for receiving broadcast signals according to an embodiment of the present invention can receive broadcast signals (S105000). The apparatus for receiving broadcast signals according to an embodiment of the present invention can demodulate the received broadcast signals using an OFDM (Orthogonal Frequency Division Multiplexing) scheme (S105010). Details are as described in FIG. 9.

The apparatus for receiving broadcast signals according to an embodiment of the present invention may frequency de-interleave the demodulated broadcast signals (S105020). In this case, the apparatus for receiving broadcast signals according to an embodiment of the present invention can perform frequency de-interleaving corresponds to a reverse process of the frequency interleaving as shown in the above. The detailed process of the frequency interleaving is as described in FIG. 30 to 103.

Subsequently, the apparatus for receiving broadcast signals according to an embodiment of the present invention may de-map service data from at least one signal frame in the frequency de-interleaved broadcast signals (S105030). Details are as described in FIG. 9. Subsequently, the apparatus for receiving broadcast signals according to an embodiment of the present invention can decode the demapped service data (S105040). Details are as described in FIG. 9.

As described above, service data is transmitted through a data pipe which is a logical channel in the physical layer that carries service data or related metadata, which may carry one or multiple service(s) or service component(s). Data carried on a data pipe can be referred to as the DP data or the service data.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A frequency deinterleaver, the frequency deinterleaver comprising:
    a deinterleaving sequence generator configured to generate a deinterleaving sequence to frequency deinterleave an OFDM (Orthogonal Frequency Division Multiplexing) symbol demodulated with a 32K FFT size, wherein:
    the deinterleaving sequence is generated by checking a validity of one or more addresses of the deinterleaving sequence generated based on a main sequence and a symbol offset so that the one or more addresses of the deinterleaving sequence are valid, a value of the symbol offset is constant for a pair of two consecutive OFDM symbols; and
    a memory.

2. The frequency deinterleaver of claim 1, wherein:
    the frequency deinterleaver is configured to deinterleave the two consecutive OFDM symbols using the generated deinterleaving sequence,
    the frequency deinterleaver is further configured to write a first OFDM symbol into the memory using the generated deinterleaving sequence, and to read the first OFDM symbol from the memory while writing a second OFDM symbol into a location of the memory from where the first OFDM symbol is read.

3. The frequency deinterleaver of claim 1, wherein:
the frequency deinterleaver is configured to deinterleave the two consecutive OFDM symbols using the generated deinterleaving sequence,
the frequency deinterleaver is further configured to write a first OFDM symbol into the memory and to read the first OFDM symbol using the generated deinterleaving sequence from the memory while writing a second OFDM symbol using the generated deinterleaving sequence into a location of the memory from where the first OFDM symbol is read.

4. A method for frequency deinterleaving, the method comprising:
generating a deinterleaving sequence to frequency deinterleave an OFDM (Orthogonal Frequency Division Multiplexing) symbol demodulated with a 32K FFT size, wherein:
the deinterleaving sequence is generated by checking a validity of one or more addresses of the deinterleaving sequence generated based on a main sequence and a symbol offset so that the one or more addresses of the deinterleaving sequence are valid, a value of the symbol offset is constant for a pair of two consecutive OFDM symbols; and
deinterleaving the two consecutive OFDM symbols using the generated deinterleaving sequence.

5. The method of claim 4, wherein deinterleaving two consecutive OFDM symbols using the generated deinterleaving sequence further includes:
writing a first OFDM symbol into a memory using the generated deinterleaving sequence; and
reading the first OFDM symbol from the memory while writing a second OFDM symbol into a location of the memory from where the first OFDM symbol is read.

6. The method of claim 4, wherein deinterleaving two consecutive OFDM symbols using the generated deinterleaving sequence further includes:
writing a first OFDM symbol into a memory; and
reading the first OFDM symbol using the generated deinterleaving sequence from the memory while writing a second OFDM symbol using the generated deinterleaving sequence into a location of the memory from where the first OFDM symbol is read.

7. A frequency interleaver, the frequency interleaver comprising:
an interleaving sequence generator configured to generate an interleaving sequence to frequency interleave an OFDM (Orthogonal Frequency Division Multiplexing) symbol to be modulated with a 32K FFT size, wherein:
the interleaving sequence is generated by checking a validity of one or more addresses of the interleaving sequence generated based on a main sequence and a symbol offset so that the one or more addresses of the interleaving sequence are valid, a value of the symbol offset is constant for a pair of two consecutive OFDM symbols; and
a memory.

8. The frequency interleaver of claim 7, wherein:
the frequency interleaver is configured to interleave the two consecutive OFDM symbols using the generated interleaving sequence,
the frequency interleaver is further configured to write a first OFDM symbol into the memory using the generated interleaving sequence, and to read the first OFDM symbol from the memory while writing a second OFDM symbol into a location of the memory from where the first OFDM symbol is read.

9. The frequency interleaver of claim 7, wherein:
the frequency interleaver is configured to interleave the two consecutive OFDM symbols using the generated interleaving sequence,
the frequency interleaver is further configured to write a first OFDM symbol into the memory and to read the first OFDM symbol using the generated interleaving sequence from the memory while writing a second OFDM symbol using the generated interleaving sequence into a location of the memory from where the first OFDM symbol is read.

10. A method for frequency interleaving, the method comprising:
generating an interleaving sequence to frequency interleave an OFDM (Orthogonal Frequency Division Multiplexing) symbol to be modulated with a 32K FFT size, wherein:
the interleaving sequence is generated by checking a validity of one or more addresses of the interleaving sequence generated based on a main sequence and a symbol offset so that the one or more addresses of the interleaving sequence are valid, a value of the symbol offset is constant for a pair of two consecutive OFDM symbols; and
interleaving the two consecutive OFDM symbols using the generated interleaving sequence.

11. The method of claim 10, wherein interleaving the two consecutive OFDM symbols using the generated interleaving sequence further includes:
writing a first OFDM symbol into a memory using the generated interleaving sequence; and
reading the first OFDM symbol from the memory while writing a second OFDM symbol into a location of the memory from where the first OFDM symbol is read.

12. The method of claim 10, wherein interleaving the two consecutive OFDM symbols using the generated interleaving sequence further includes:
writing a first OFDM symbol into a memory; and
reading the first OFDM symbol using the generated interleaving sequence from the memory while writing a second OFDM symbol using the generated interleaving sequence into a location of the memory from where the first OFDM symbol is read.

* * * * *